US010381434B1

(12) United States Patent
Pachamuthu et al.

(10) Patent No.: US 10,381,434 B1
(45) Date of Patent: Aug. 13, 2019

(54) SUPPORT PILLAR STRUCTURES FOR LEAKAGE REDUCTION IN A THREE-DIMENSIONAL MEMORY DEVICE

(71) Applicant: SANDISK TECHNOLOGIES LLC, Addison, TX (US)

(72) Inventors: Jayavel Pachamuthu, San Jose, CA (US); Hiroyuki Kinoshita, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/021,831

(22) Filed: Jun. 28, 2018

(51) Int. Cl.

| | |
|---|---|
| ***H01L 29/788*** | (2006.01) |
| ***H01L 29/06*** | (2006.01) |
| ***G11C 16/04*** | (2006.01) |
| ***H01L 27/11582*** | (2017.01) |
| ***H01L 27/11556*** | (2017.01) |

(52) U.S. Cl.
CPC ...... *H01L 29/0607* (2013.01); *G11C 16/0408* (2013.01); *G11C 16/0466* (2013.01); *H01L 27/11556* (2013.01); *H01L 27/11582* (2013.01)

(58) Field of Classification Search
CPC ............. H01L 27/115; H01L 27/11582; H01L 27/11556; H01L 29/0607
See application file for complete search history.

(56) References Cited

U.S. PATENT DOCUMENTS 5,915,167 A 6/1999 Leedy
9,412,749 B1 8/2016 Shimabukuro et al.
9,576,967 B1 2/2017 Kimura et al.
9,659,956 B1 5/2017 Pachamuthu et al.
9,754,963 B1 9/2017 Kawamura et al.
9,768,186 B2 9/2017 Shimabukuro et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Phuc T Dang
(74) *Attorney, Agent, or Firm* — The Marbury Law Group PLLC

(57) ABSTRACT

Multiple tier structures including a respective alternating stack of insulating layers and electrically conductive layers is formed over a substrate. A memory opening fill structure extends through the alternating stacks, and includes a vertical semiconductor channel and a memory film. A support pillar structure extends through at least an upper alternating stack, and includes a dummy memory film and a dummy memory film. The support pillar structure may be narrower than the memory opening fill structure at a bottommost layer of the upper alternating stack. Additionally or alternatively, the dummy memory film may be located above a horizontal plane including a topmost surface of a lower alternating stack. Optionally, another support pillar structure including a dielectric material may be provided underneath the support pillar structure in the lower alternating stack. A dielectric material can be provided at levels of the lower alternating stack in a support pillar structure to reduce inter-level leakage current.

12 Claims, 118 Drawing Sheets

(56) References Cited

U.S. PATENT DOCUMENTS

| | | | | |
|---|---|---|---|---|
| 9,853,038 | B1 | 12/2017 | Cui | |
| 9,881,929 | B1 | 1/2018 | Ravikirthi et al. | |
| 9,978,766 | B1 | 5/2018 | Hosoda et al. | |
| 10,014,316 | B2 | 7/2018 | Yu et al. | |
| 2016/0329341 | A1 | 11/2016 | Shimabukuro et al. | |
| 2017/0040337 | A1* | 2/2017 | Kim | H01L 27/11582 |
| 2017/0133389 | A1* | 5/2017 | Yun | H01L 23/5226 |
| 2017/0352678 | A1* | 12/2017 | Lu | H01L 21/4846 |
| 2018/0108671 | A1 | 4/2018 | Yu et al. | |
| 2018/0130812 | A1 | 5/2018 | Hosoda et al. | |
| 2018/0269225 | A1* | 9/2018 | Huang | H01L 27/11582 |

OTHER PUBLICATIONS

U.S. Appl. No. 15/632,703, filed Jun. 26, 2017, SanDisk Technologies LLC

U.S. Appl. No. 15/943,859, filed Apr. 3, 2018, SanDisk Technologies LLC.

U.S. Appl. No. 16/021,749, filed Jun. 28, 2018, SanDisk Technologies LLC.

* cited by examiner

SUPPORT PILLAR STRUCTURES FOR LEAKAGE REDUCTION IN A THREE-DIMENSIONAL MEMORY DEVICE

FIELD

The present disclosure relates generally to the field of three-dimensional memory devices and specifically to three-dimensional memory devices with support pillar structures for reducing leakage current and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Word line leakage current through support pillar structures in contact regions results in degradation in device performance. Such leakage current can be caused by damages to dummy memory films produced by reaction ion etch processes that are employed during formation of memory stack structures. In addition, insufficient mechanical strength in the support pillar structures can cause various structural deformations during processing steps. Thus, improved support pillar structures are desired which can provide reduced word line leakage current and sufficient structure strength.

SUMMARY

According to an aspect of the present disclosure, a monolithic three-dimensional memory device is provided, which comprises: a first-tier structure located over a top surface of a substrate, wherein the first-tier structure comprises a first alternating stack of first insulating layers and first electrically conductive layers and a first retro-stepped dielectric material portion overlying first stepped surfaces of the first alternating stack; a second-tier structure overlying the first-tier structure, wherein the second-tier structure comprises a second alternating stack of second insulating layers and second electrically conductive layers and a second retro-stepped dielectric material portion overlying second stepped surfaces of the second alternating stack; a memory opening fill structure extending through all layers within the second alternating stack and a subset of layers within the first alternating stack, wherein the memory opening fill structure comprises a vertical semiconductor channel and a memory film, and has a first width that is a maximum lateral dimension of the memory opening fill structure at a horizontal plane including a bottom surface of a bottommost layer of the second alternating stack; and a support pillar structure extending at least through each layer within the second alternating stack, including a dummy semiconductor channel having a same material composition as the semiconductor channel, and having a second width that is a maximum lateral dimension of the support pillar structure at the horizontal plane including the bottom surface of the bottommost layer of the second alternating stack, wherein the second width is less than the first width.

According to another aspect of the present disclosure, a method of forming a three-dimensional memory device is provided, which comprises the steps of: forming a first alternating stack of first insulating layers and first spacer material layers over a top surface of a substrate, wherein the first spacer material layers are formed are, or are subsequently replaced with, first electrically conductive layers; forming a first-tier memory opening fill structure and a first-tier support opening fill structure through the first alternating stack; forming a second alternating stack of second insulating layers and second spacer material layers over the first alternating stack, wherein the second spacer material layers are formed are, or are subsequently replaced with, second electrically conductive layers; forming a second-tier memory opening and a second-tier support opening through the second alternating stack, wherein the second-tier memory opening is formed over the first-tier memory opening fill structure and the second-tier support opening is formed over the first-tier support opening fill structure, wherein the second-tier memory opening has a first width that is a maximum lateral dimension of the second-tier memory opening at a horizontal plane including a bottom surface of a bottommost layer of the second alternating stack, and the second-tier support opening has a second width that is a maximum lateral dimension of the second-tier support opening at the horizontal plane including the bottom surface of the bottommost layer of the second alternating stack, wherein the second width is less than the first width; forming an inter-tier memory opening by removing portions of the first-tier memory opening fill structure from underneath the second-tier memory opening; and forming a memory opening fill structure in the inter-tier memory opening, wherein the memory opening fill structure comprises a vertical semiconductor channel and a memory film.

According to yet another aspect of the present disclosure, a three-dimensional memory device is provided, which comprises: a first-tier structure located over a top surface of a substrate, wherein the first-tier structure comprises a first alternating stack of first insulating layers and first electrically conductive layers and a first retro-stepped dielectric material portion overlying first stepped surfaces of the first alternating stack; a second-tier structure overlying the first-tier structure, wherein the second-tier structure comprises a second alternating stack of second insulating layers and second electrically conductive layers and a second retro-stepped dielectric material portion overlying second stepped surfaces of the second alternating stack; a memory opening fill structure extending through all layers within the second alternating stack and a subset of layers within the first alternating stack, wherein the memory opening fill structure comprises a vertical semiconductor channel and a memory film that extend through the second alternating stack and a subset of layers within the first alternating stack; and a support pillar structure extending through all layers within the second alternating stack and including a dummy semiconductor channel having a same material composition as the semiconductor channel and including a dummy memory film having a same material composition as the memory film, wherein a bottommost surface of the dummy memory film is located above a horizontal plane including a topmost surface of the first alternating stack.

According to even another aspect of the present disclosure, a method of forming a three-dimensional memory device is provided, which comprises the steps of: forming a first alternating stack of first insulating layers and first spacer material layers over a top surface of a substrate, wherein the first spacer material layers are formed are, or are subsequently replaced with, first electrically conductive layers; forming a first-tier memory opening fill structure and a first-tier support opening fill structure through the first alternating stack; forming a second alternating stack of second insulating layers and second spacer material layers over the first alternating stack, wherein the second spacer material layers are formed are, or are subsequently replaced with, second electrically conductive layers; forming a second-tier memory opening and a second-tier support opening through the second alternating stack, wherein the second-tier memory opening is formed over the first-tier memory opening fill structure and the second-tier support opening is formed over the first-tier support opening fill structure; forming an inter-tier memory opening and a cavity, wherein the inter-tier memory opening includes an entire volume of the second-tier memory opening and a predominant portion of an entire volume of the first-tier memory opening fill structure, and the cavity includes an entire volume of the second-tier support opening, and wherein a bottom surface of the cavity is formed above a horizontal plane including a topmost surface of the first alternating stack; and forming a memory opening fill structure in the inter-tier memory opening and filling the cavity with cavity fill material portions, wherein a support pillar structure comprising the cavity fill material portions is provided.

DETAILED DESCRIPTION

Figure 1A:
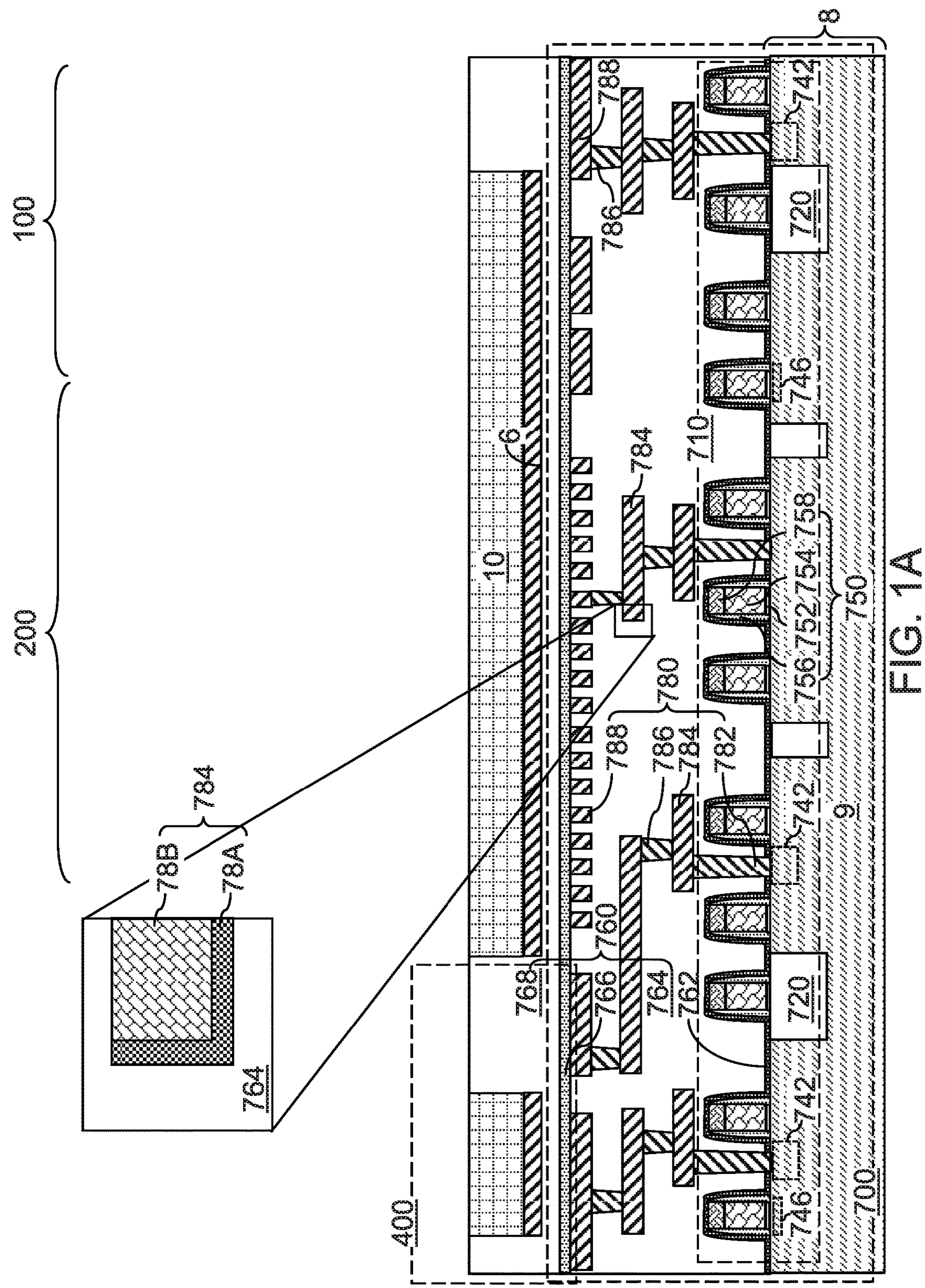
FIG. 1A is a vertical cross-sectional view of a first exemplary structure after formation of semiconductor devices, lower-level dielectric material layers, lower metal interconnect structures, and a planar semiconductor material layer on a semiconductor substrate according to a first embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1B:
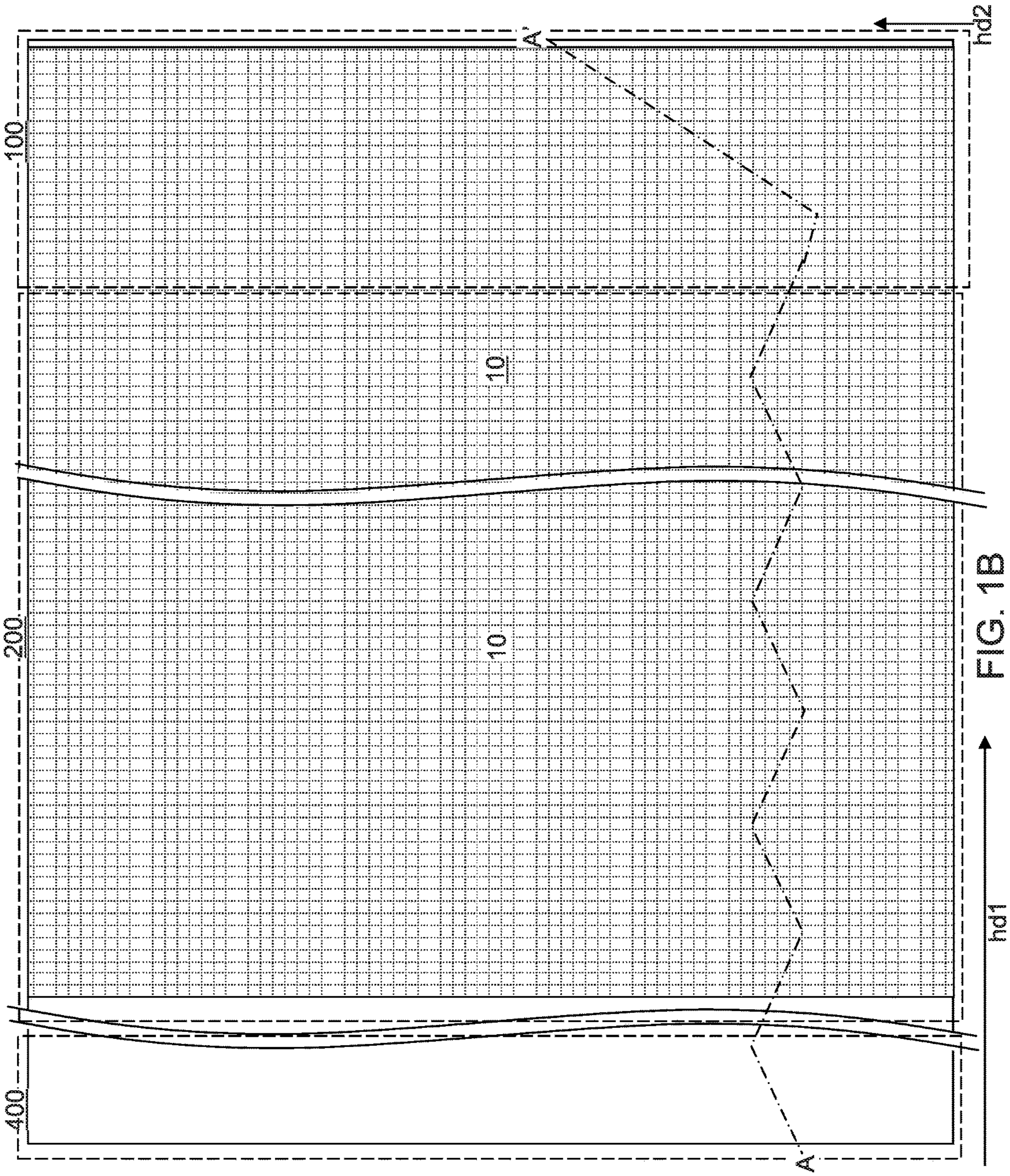
FIG. 1B is a top-down view of the first exemplary structure of FIG. 1A. The zig-zag vertical plane A-A' is the plane of the vertical cross-sectional view of FIG. 1A.

Referring to FIGS. 1A and 1B, a first exemplary structure according to the first embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower-level dielectric material layers 760. The lower-level dielectric material layers 760 constitute a dielectric layer stack in which each lower level dielectric layer 760 overlies or underlies other lower-level dielectric material layers 760. The lower-level dielectric material layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower-level dielectric material layers 760 functions as a matrix for lower metal interconnect structures 780 that provide electrical wiring among the various nodes of the semiconductor devices and landing pads for through-memory-level contact via structures to be subsequently formed. The lower metal interconnect structures 780 are embedded within the dielectric layer stack of the lower-level dielectric material layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-memory-level contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. The planar conductive material layer 6 may function as a special source line in the completed device. Alternatively, the planar conductive material layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-memory-level contact via structures are to be subsequently formed. In one embodiment, the openings through the optional planar conductive material layer 6 and the planar semiconductor material layer 10 can be formed within the area of a memory array region 100, in which a three-dimensional memory array including memory stack structures is to be subsequently formed. Further, additional openings through the optional planar conductive material layer 6 and the planar semiconductor material layer 10 can be formed in a peripheral region 400, which is laterally spaced from the memory array region 100 by a contact region 200 in which contact via structures contacting the word lines of a three-dimensional memory device are to be subsequently formed.

The region of the semiconductor devices 710 and the combination of the lower-level dielectric material layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower-level dielectric material layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower-level dielectric material layers 760. Only a subset of the active nodes is illustrated in FIG. 1 for clarity. Through-memory-level contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-memory-level contact via structures to be subsequently formed.

Figure 2:
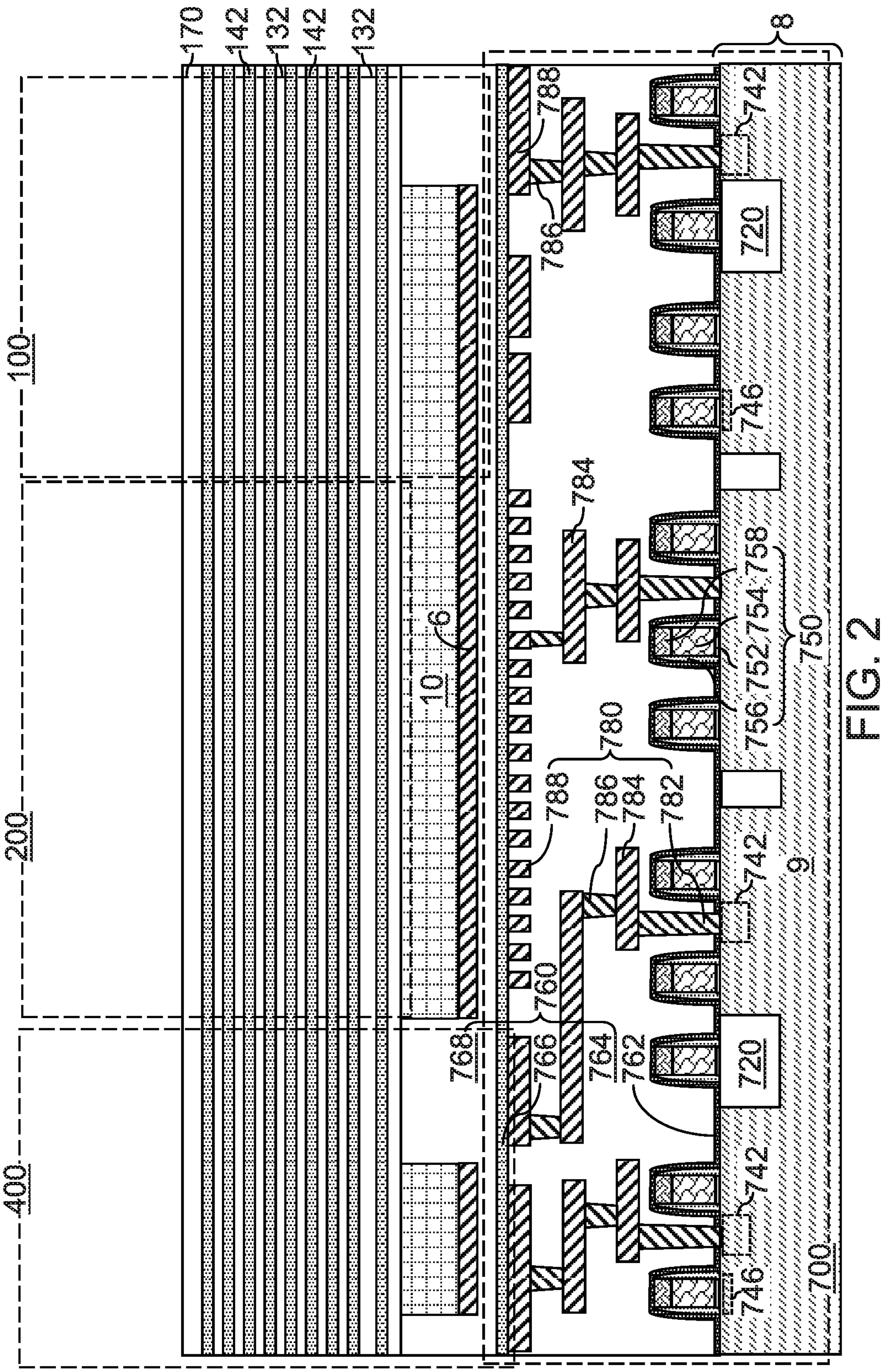
FIG. 2 is a vertical cross-sectional view of a first exemplary structure after formation of a first alternating stack of first insulating layers and first sacrificial material layers and formation of an overlying first insulating cap layer according to a first embodiment of the present disclosure.

Referring to FIG. 2, an alternating stack of first material layers and second material layers is subsequently formed. Each first material layer can include a first material, and each second material layer can include a second material that is different from the first material. The alternating stack is herein referred to as a first alternating stack. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the semiconductor substrate layer 10, which is a portion of a substrate. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first insulating cap layer 170 is sequentially formed. The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
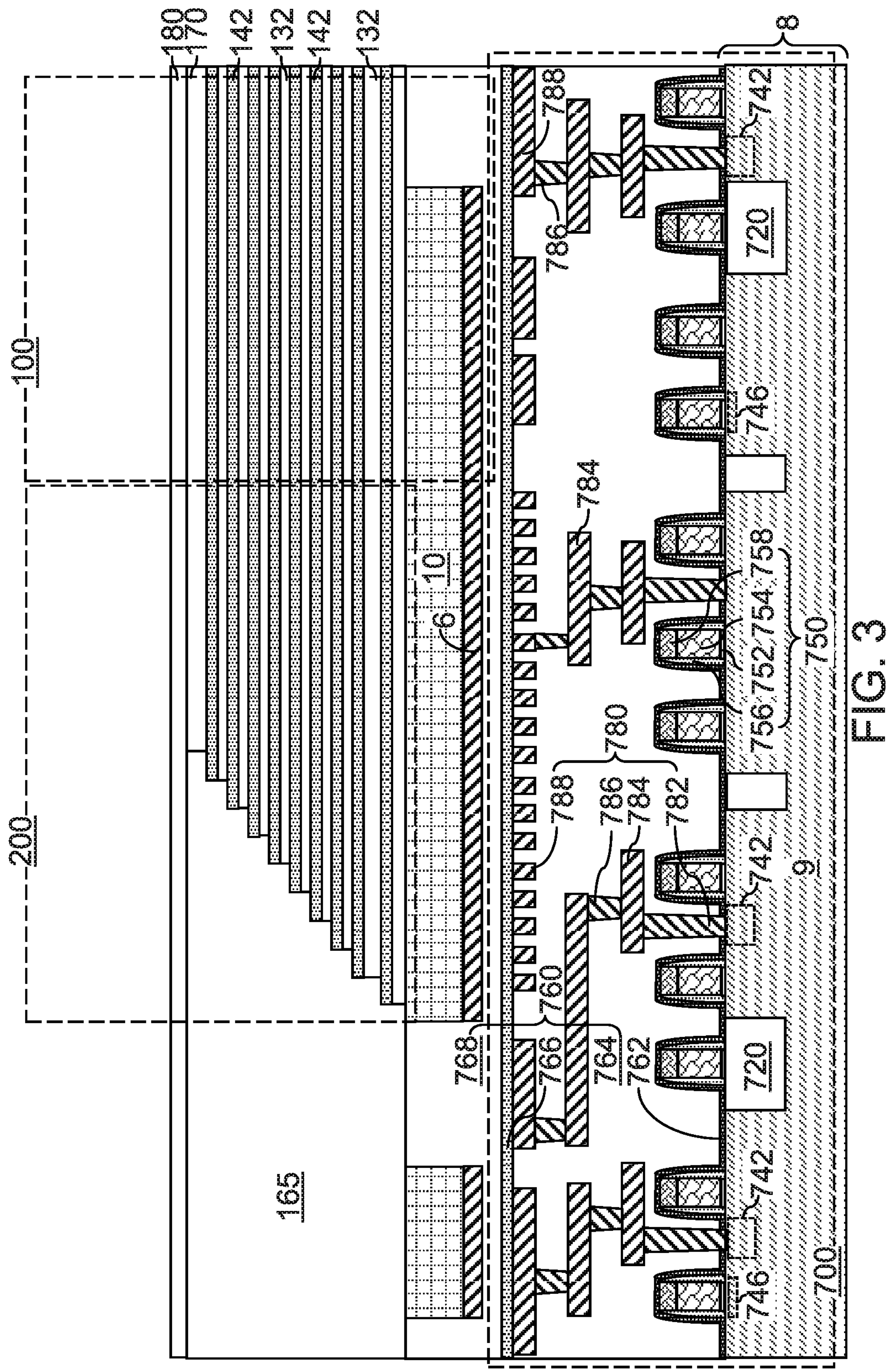
FIG. 3 is a vertical cross-sectional view of the first exemplary structure after formation of first stepped surfaces, a first retro-stepped dielectric material portion, and an inter-tier dielectric layer according to the first embodiment of the present disclosure.

Referring to FIG. 3, the first insulating cap layer 170 and the first alternating stack (132, 142) can be patterned to form first stepped surfaces in a contact region 200. The contact region 200 includes a first stepped area in which the first stepped surfaces are formed, and a second stepped area in which additional stepped surfaces are to be subsequently formed in a second-tier structure (to be subsequently formed over a first-tier structure). The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
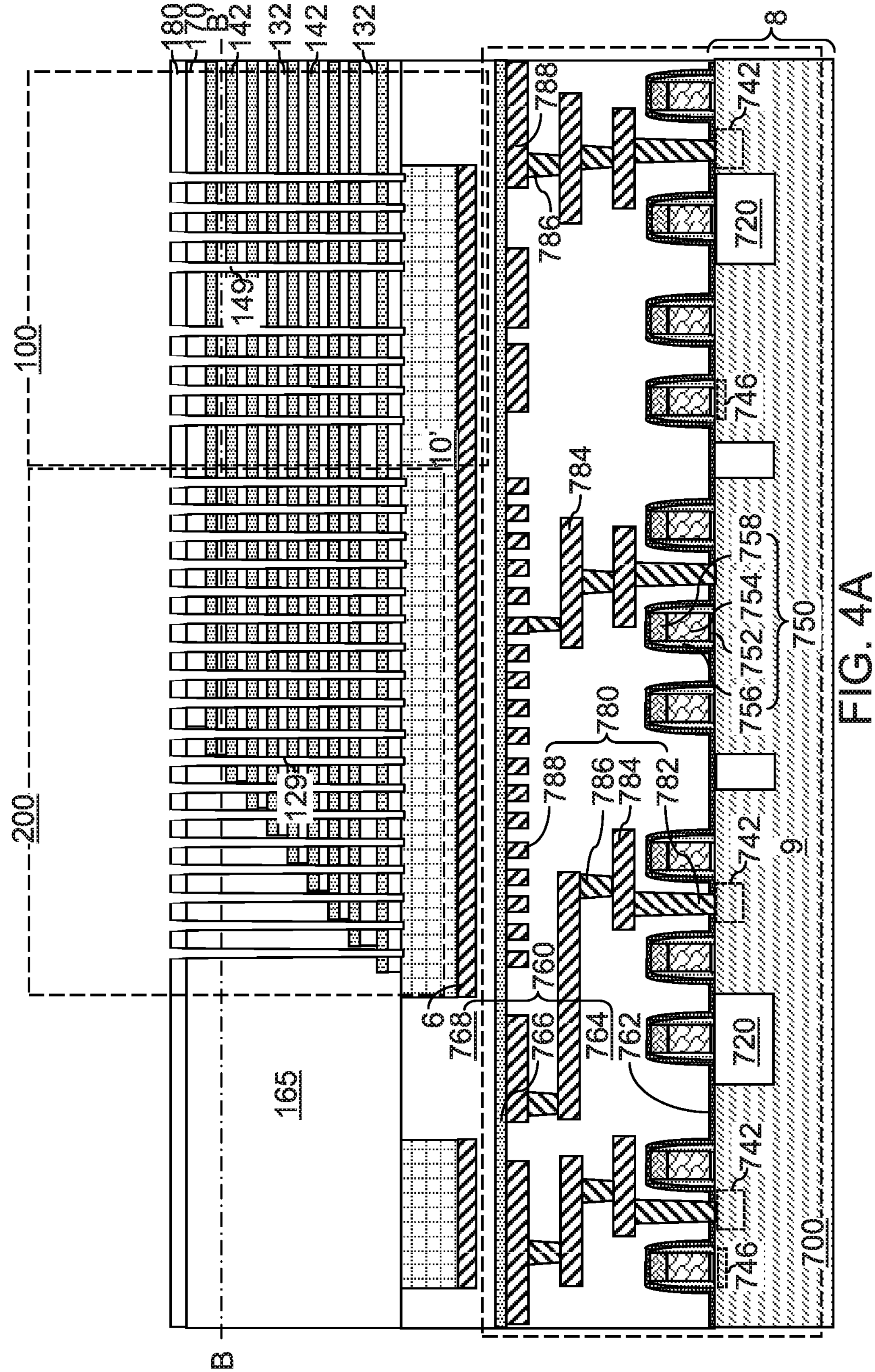
FIG. 4A is a vertical cross-sectional view of the first exemplary structure after formation of first-tier memory openings and first-tier support openings according to the first embodiment of the present disclosure.
Figure 4B:
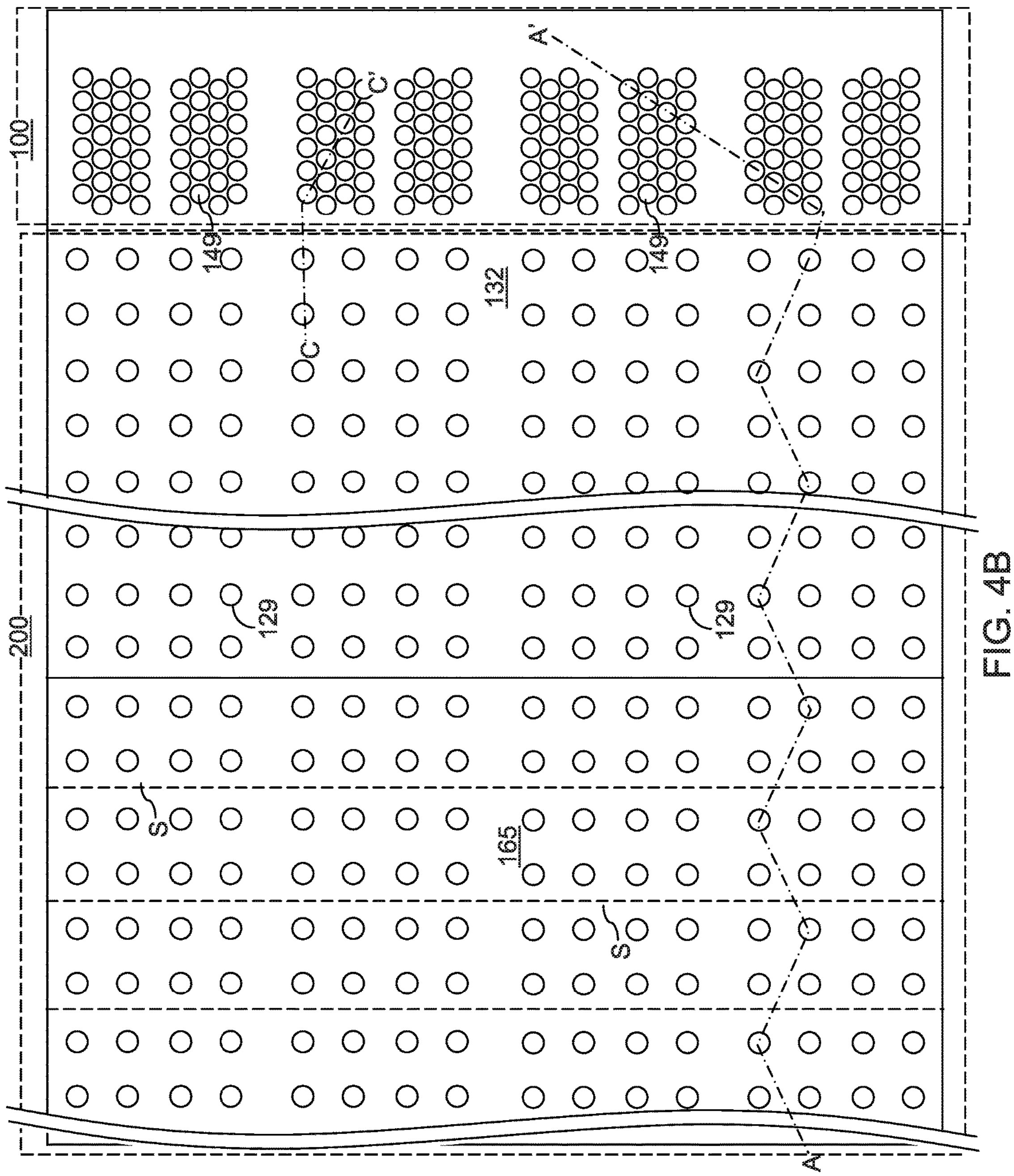
FIG. 4B is a horizontal cross-sectional view of the first exemplary structure along the horizontal plane B-B' of FIG. 4A. The zig-zag vertical plane A-A' is the plane of the vertical cross-sectional view of FIG. 4A.
Figure 4C:
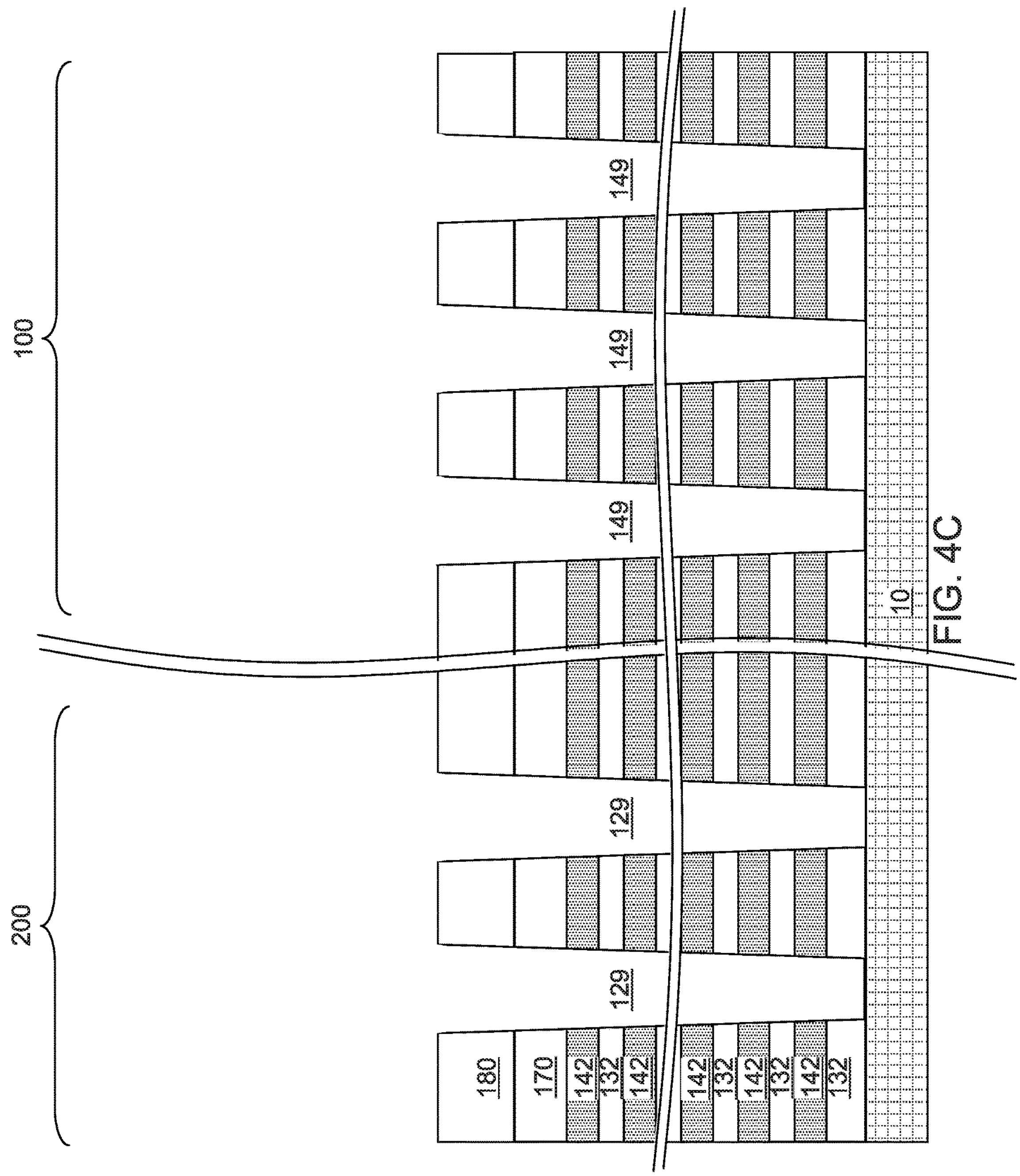
FIG. 4C is a vertical cross-sectional view of the first exemplary structure along the vertical plane C-C' of FIG. 4B.

Referring to FIGS. 4A-4C, various first-tier openings (149, 129) can be formed through the inter-tier dielectric layer 180 and the first-tier structure (132, 142, 170, 165) and into the planar semiconductor material layer 10 and into the at least one second dielectric layer 768. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the planar semiconductor material layer 10 and the at least one second dielectric layer 768 by a first anisotropic etch process to form the various first-tier openings (149, 129) concurrently, i.e., during the first anisotropic etch process. The various first-tier openings (149, 129) can include first-tier memory openings 149 and first-tier support openings 129.

The first-tier memory openings 149 are openings that are formed in the memory array region 100 through each layer within the first alternating stack (132, 142) and are subsequently employed to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142). Locations of steps S in the first-tier alternating stack (132, 142) are illustrated as dotted lines in FIG. 4B.

Figure 5:
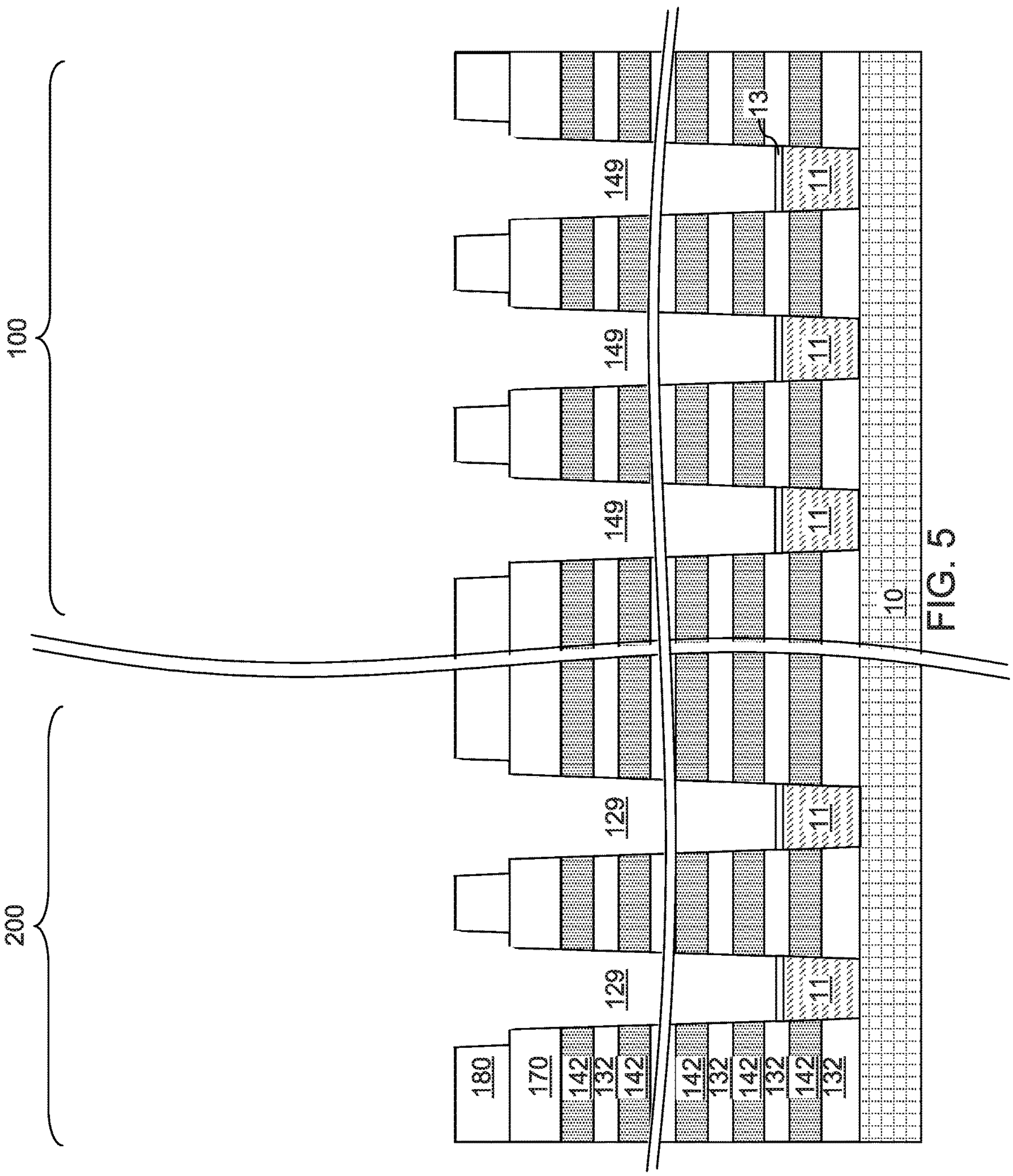
FIG. 5 is a vertical cross-sectional view of the first exemplary structure after recessing the first insulating cap layer according to the first embodiment of the present disclosure.

Referring to FIG. 5, portions of the first-tier memory openings 149 and the first-tier support openings 129 at the level of the inter-tier dielectric layer 180 can be optionally laterally expanded by an isotropic etch. The inter-tier dielectric layer 180 can comprise a dielectric material (such as borosilicate glass) having a greater etch rate than the first insulating layers 132 (that can include undoped silicate glass). An isotropic etch (such as a wet etch employing dilute hydrofluoric acid) can be employed to expand the lateral dimensions of the first-tier memory openings 149 and the first-tier support openings 129 at the level of the inter-tier dielectric layer 180. The portions of the first-tier memory openings 149 and the first-tier support openings 129 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

A selective semiconductor deposition process can be performed to deposit a semiconductor material on physically exposed semiconductor surfaces. For example, pedestal channel portions 11 can grow from the semiconductor surfaces at the bottom of the first-tier memory openings 149 and the first-tier support openings 129 during the selective semiconductor deposition process. If the planar semiconductor material layer 10 includes a polycrystalline semiconductor material, a polycrystalline channel portion can be formed at the bottom of each first-tier memory opening 149 and at the bottom of each first-tier support opening 129. Optionally, a thermal oxidation process or a plasma oxidation process can be performed to oxidize a surface portion of each pedestal channel portion 11, thereby converting the surface portion into a respective semiconductor oxide plate 13. The thickness of the semiconductor oxide plate 13 can be in a range from 1 nm to 6 nm, although lesser and greater thicknesses can also be employed.

Figure 6A:
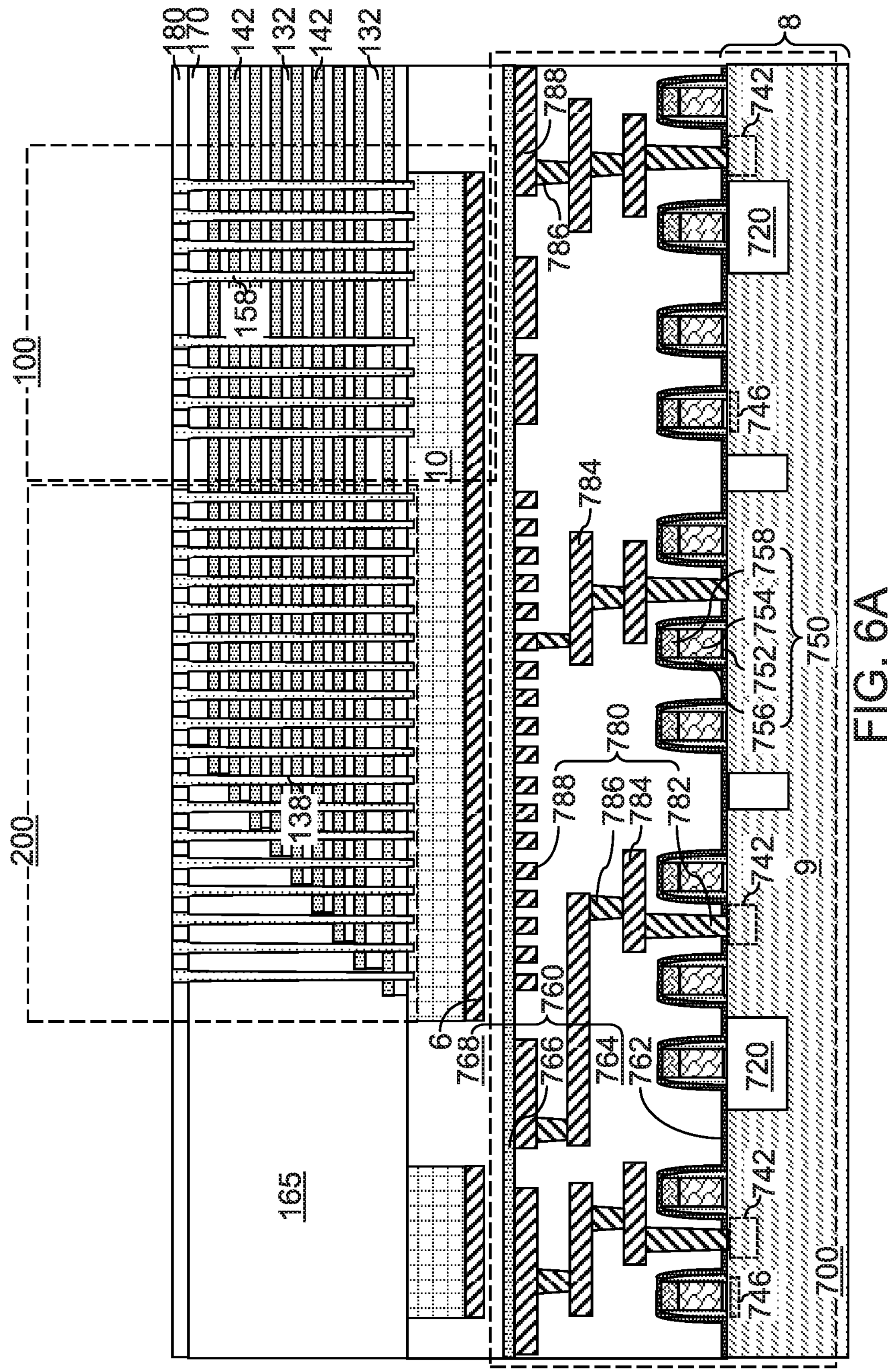
FIG. 6A is a vertical cross-sectional view of the first exemplary structure after formation of first-tier memory opening fill structures and first-tier support opening fill structures according to the first embodiment of the present disclosure.
Figure 6B:
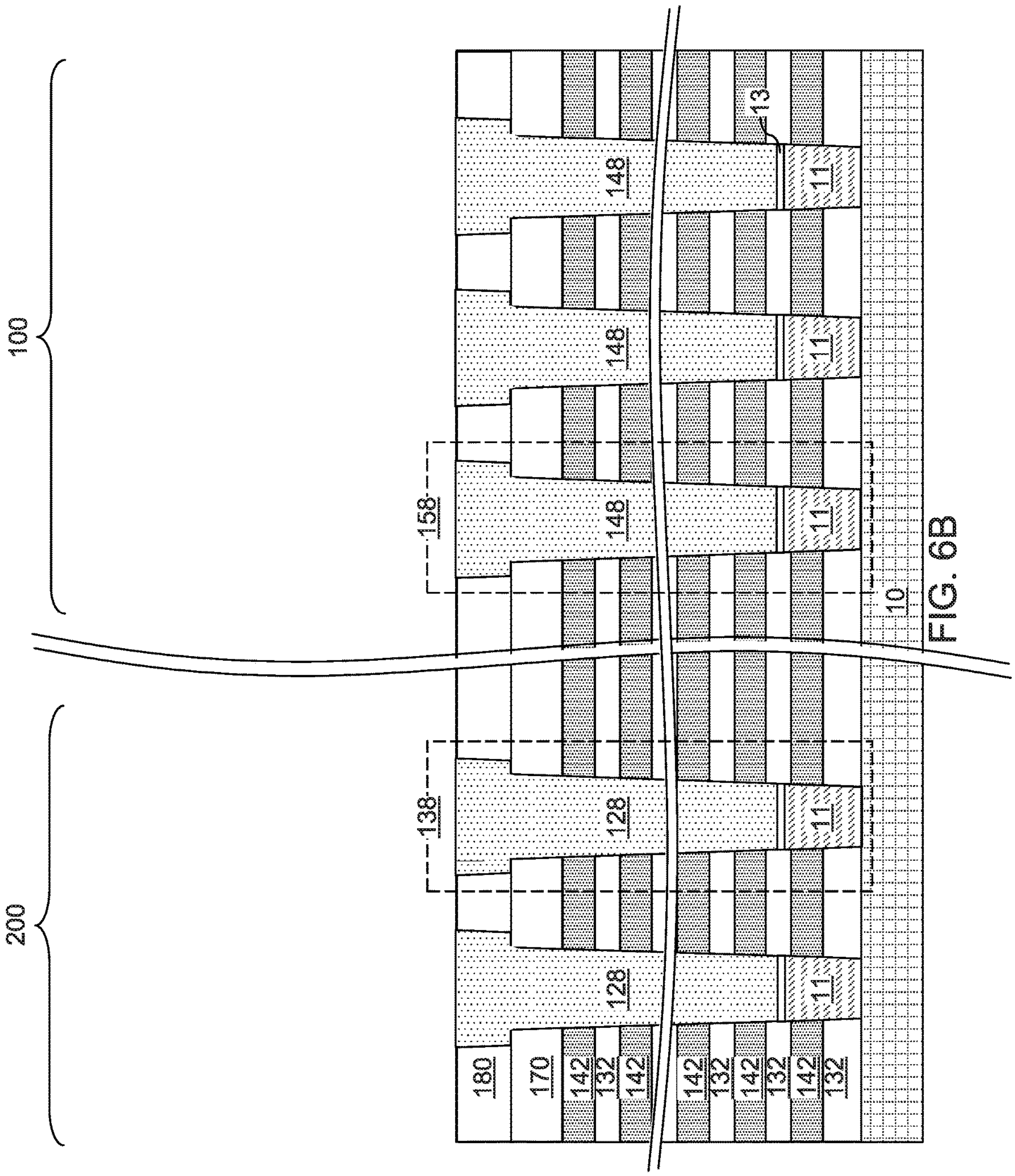
FIG. 6B is vertical cross-sectional view of a region of the first exemplary structure of FIG. 6A.

Referring to FIGS. 6A and 6B, first-tier opening fill portions (148, 128) can be formed in the various first-tier openings (149, 129). For example, a first-tier fill material is deposited concurrently deposited in each unfilled volume of the first-tier openings (149, 129). The first-tier fill material includes a material that can be subsequently removed selective to the materials of the first insulating layers 132 and the first sacrificial material layers 142.

In one embodiment, the first-tier fill material can include a semiconductor material such as silicon (e.g., amorphous silicon or polysilicon), a silicon-germanium alloy, germanium, a III-V compound semiconductor material, or a combination thereof. The first-tier fill material may be formed by a non-conformal deposition or a conformal deposition method.

In another embodiment, the first-tier fill material can include a silicon oxide material having a higher etch rate than the materials of the first insulating layers 132, the first insulating cap layer 170, and the inter-tier insulating layer 180. For example, the first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. The first-tier fill material may be formed by a non-conformal deposition or a conformal deposition method.

In yet another embodiment, the first-tier fill material can include amorphous silicon or a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial material can be removed from above the inter-tier dielectric layer 180. For example, the first-tier fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the first-tier fill material comprise first-tier opening fill portions (148, 128). Specifically, each remaining portion of the first-tier fill material in a first-tier memory opening 149 constitutes a first-tier memory opening fill portion 148. Each remaining portion of the first-tier fill material in a first-tier support opening 129 constitutes a first-tier support opening fill portion 128.

The various first-tier opening fill portions (148, 128) are concurrently formed, i.e., during a same set of processes including the deposition process that deposits the first-tier fill material and the planarization process that removes the first-tier deposition process from above the first alternating stack (132, 142) (such as from above the top surface of the inter-tier dielectric layer 180). The top surfaces of the first-tier opening fill portions (148, 128) can be coplanar with the top surface of the inter-tier dielectric layer 180. Each of the first-tier opening fill portions (148, 128) may, or may not, include cavities therein.

Each contiguous set of a pedestal channel portion 11, a semiconductor oxide plate 13, and a first-tier memory opening fill portion 148 constitutes a first-tier memory opening fill structure 158. Each contiguous set of a pedestal channel portion 11, a semiconductor oxide plate 13, and a first-tier support opening fill portion 128 constitutes a first-tier support opening fill structure 138. The first-tier memory opening fill structures 158 and the first-tier support opening fill structures 138 are collectively referred to as first-tier opening fill structures (158, 138).

Figure 7:
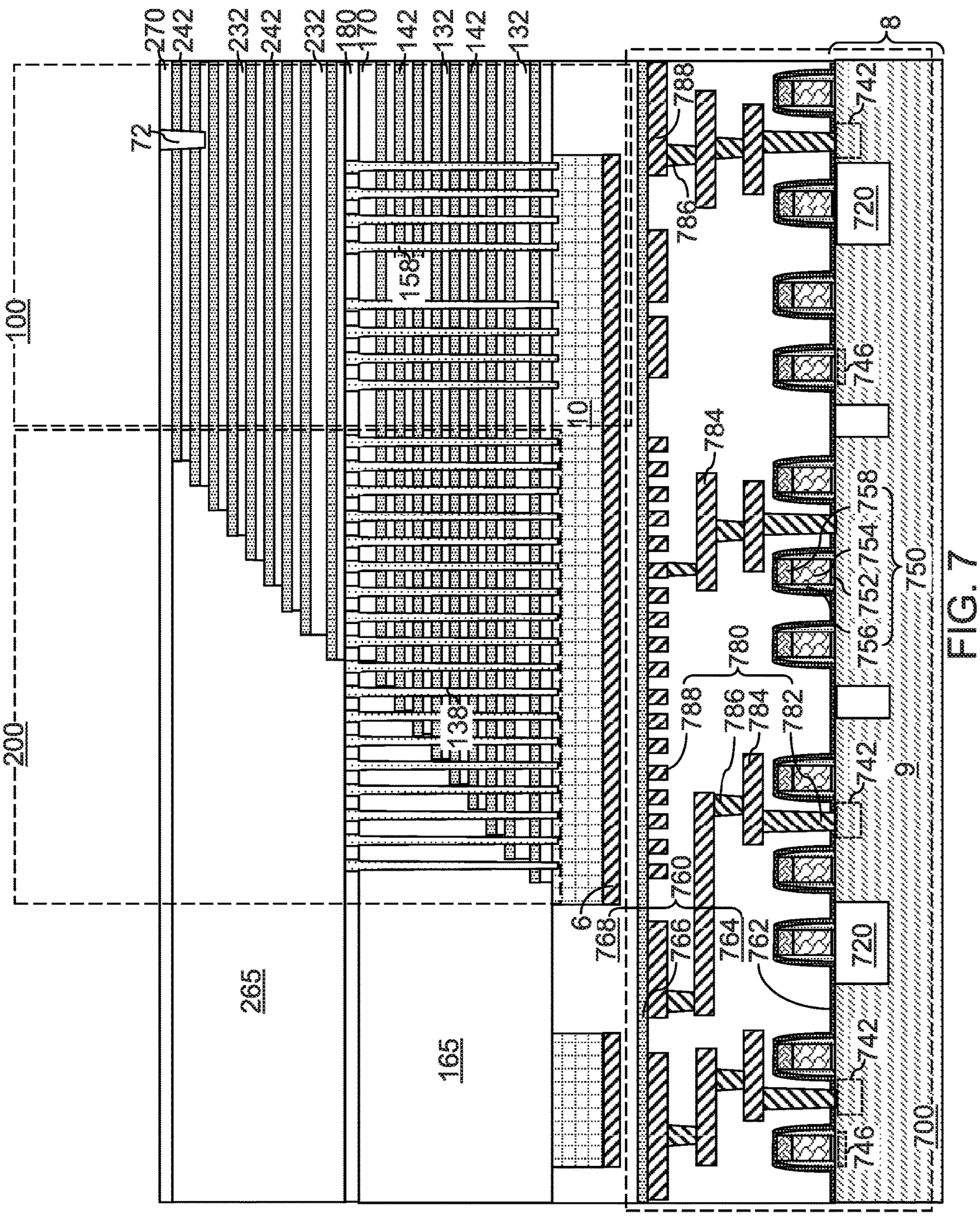
FIG. 7 is a vertical cross-sectional view of the first exemplary structure after formation of a second alternating stack of second insulating layers and second sacrificial material layers, a second retro-stepped dielectric material portion, a second insulating cap layer, and dielectric isolation structures according to the first embodiment of the present disclosure.

Referring to FIG. 7, a second-tier structure can be formed over the first-tier structure (132, 142, 170, 158, 138). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction, and can be laterally spaced apart along a second horizontal direction that is perpendicular to the first horizontal direction. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 8A:
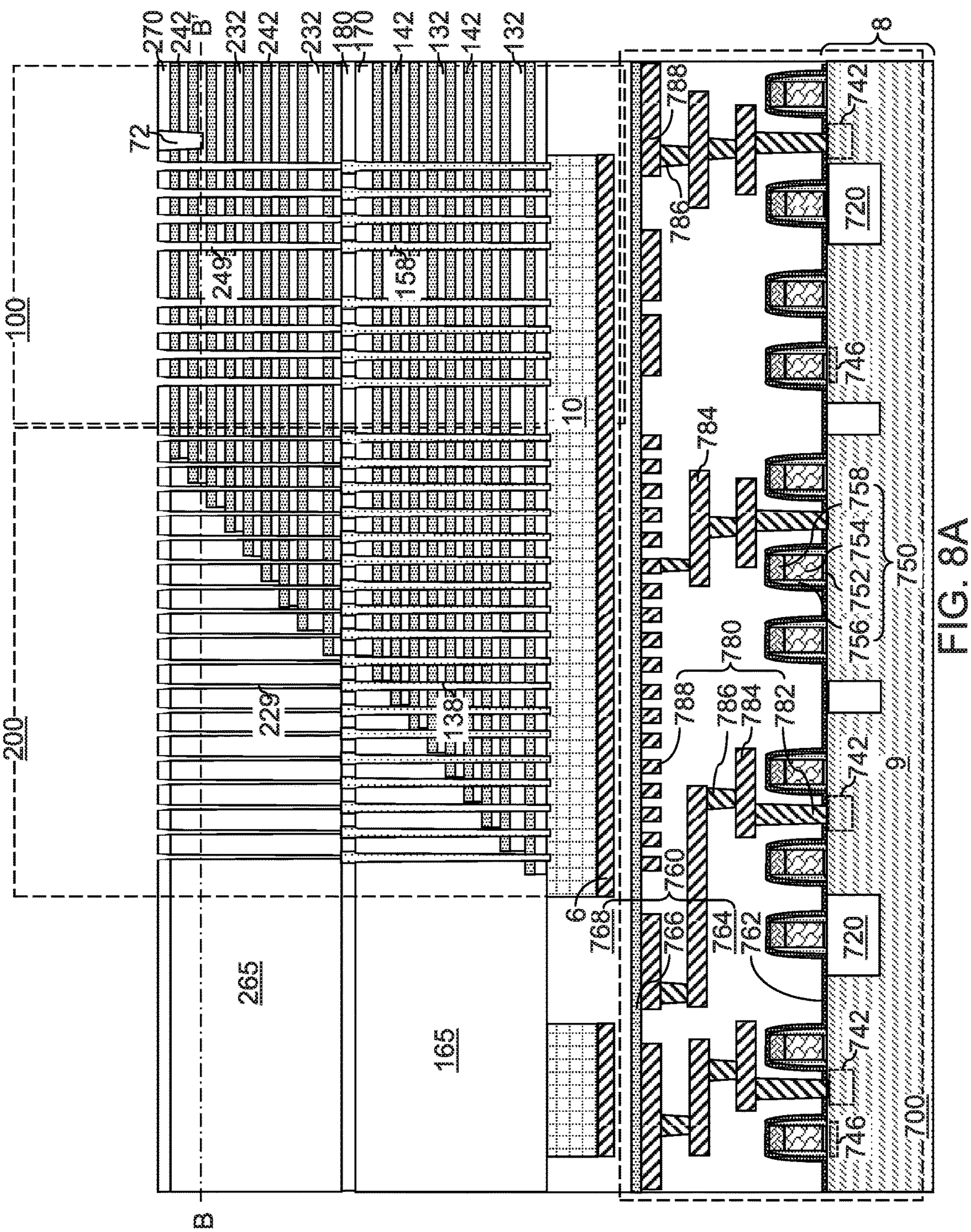
FIG. 8A is a vertical cross-sectional view of the first exemplary structure after formation of second-tier memory openings and second-tier support openings according to the first embodiment of the present disclosure.
Figure 8B:
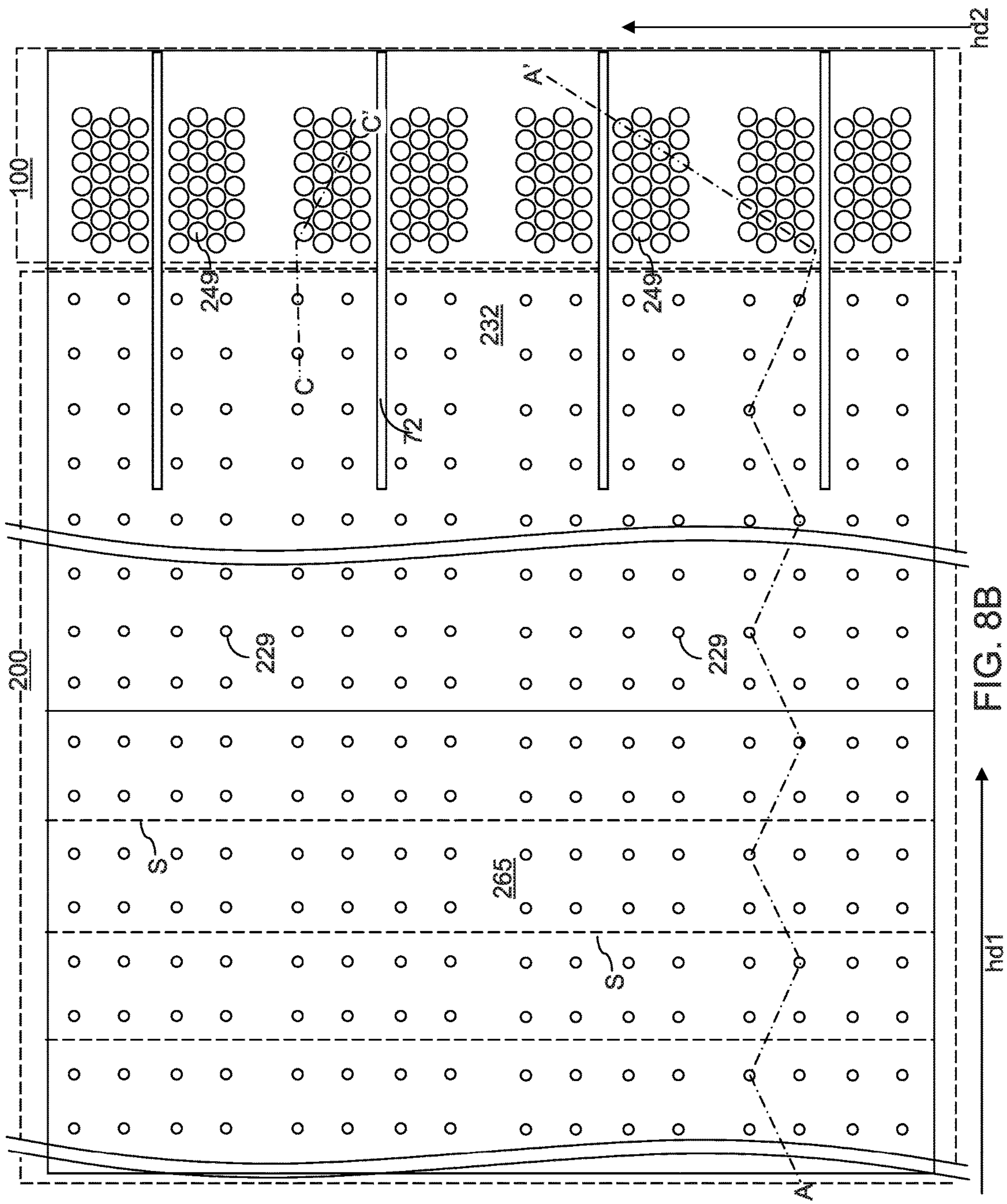
FIG. 8B is a horizontal cross-sectional view of the first exemplary structure along the horizontal plane B-B' of FIG. 8A. The zig-zag vertical plane A-A' is the plane of the vertical cross-sectional view of FIG. 8A.
Figure 8C:
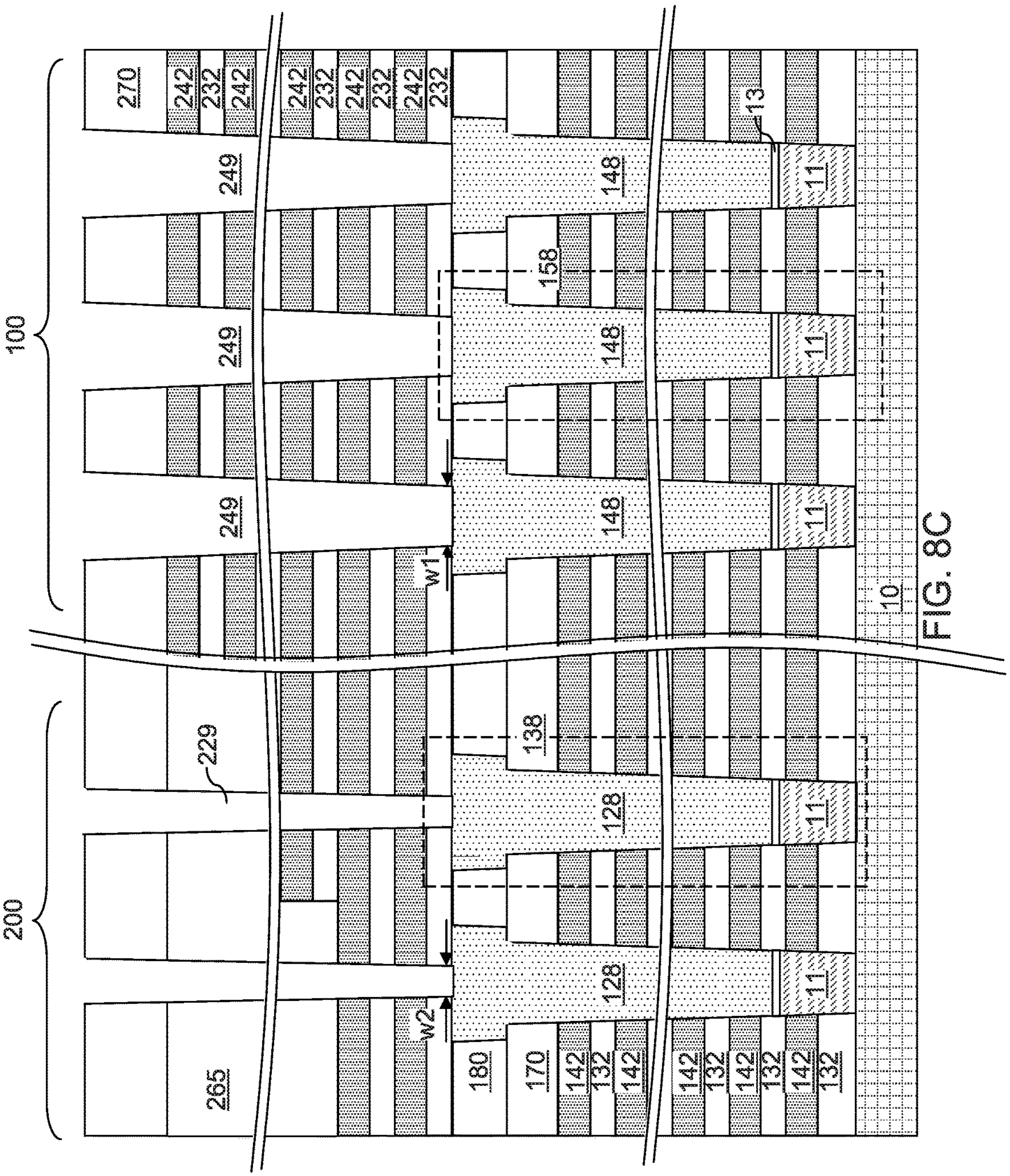
FIG. 8C is a vertical cross-sectional view of the first exemplary structure along the vertical plane C-C' of FIG. 8B.

Referring to FIGS. 8A-8C, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings in the patterned photoresist layer is different from the pattern of the various first-tier openings (149, 129) by the ratio of a maximum lateral dimension of openings overlying the first-tier support opening fill structures 138 to a maximum lateral dimension of openings overlying the first-tier memory opening fill structures 158. Specifically, the ratio of the maximum lateral dimension of openings overlying the first-tier support opening fill structures 138 to the maximum lateral dimension of openings overlying the first-tier memory opening fill structures 158 is less than 1.0, and may be in a range from 0.1 to 0.9 (i.e., from 10% to 90%), such as from 0.15 to 0.6, although lesser and greater ratios can also be employed.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the first-tier memory opening fill structures 158. The second-tier support openings 229 are formed directly on a top surface of a respective one of the first-tier support opening fill structures 138. Further, a subset of the second-tier support openings 229 can be formed through the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 8B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset inward from, and/or may be located entirely within, a periphery of a top surface of an underlying first-tier opening fill structures (158, 138). The photoresist layer can be subsequently removed, for example, by ashing.

The second-tier memory opening 249 and the second-tier support opening 229 are formed through the second alternating stack (232, 242) by the anisotropic etch process. The second-tier memory openings 249 are formed over, and directly on, a respective one of the first-tier memory opening fill structures 158. The second-tier support openings 229 are formed over, and directly on, a respective one of the first-tier support opening fill structures 138. In one embodiment, each second-tier memory opening 249 can have a first width w1 that is the maximum lateral dimension of each second-tier memory opening 249 at a horizontal plane including the bottom surface of the bottommost layer of the second alternating stack (232, 242). Each second-tier support opening 229 can have a second width w2 that is the maximum lateral dimension of each second-tier support opening 229 at the horizontal plane including the bottom surface of the bottommost layer of the second alternating stack (232, 242). The second width w2 is less than the first width w1.

In one embodiment, the ratio of the second width w2 to the first width w1 can be in a range from 0.1 to 0.9 (i.e., from 10% to 90%), such as from 0.15 to 0.6, although lesser and greater ratios can also be employed. In one embodiment, the first width w1 can be in a range from 20 nm to 300 nm, such as from 40 nm to 150 nm, although lesser and greater dimensions can also be employed. In one embodiment, each of the second-tier openings (249, 229) can have a respective circular horizontal cross-sectional shape, of which the size may monotonically increase with the vertical distance from the top surface of the planar semiconductor layer 10.

The drain-select-level isolation structures 72 can laterally extend along the first horizontal direction hd1, and can be laterally spaced apart along the second horizontal direction hd2 that is perpendicular to the first horizontal direction hd1.

Figure 9:
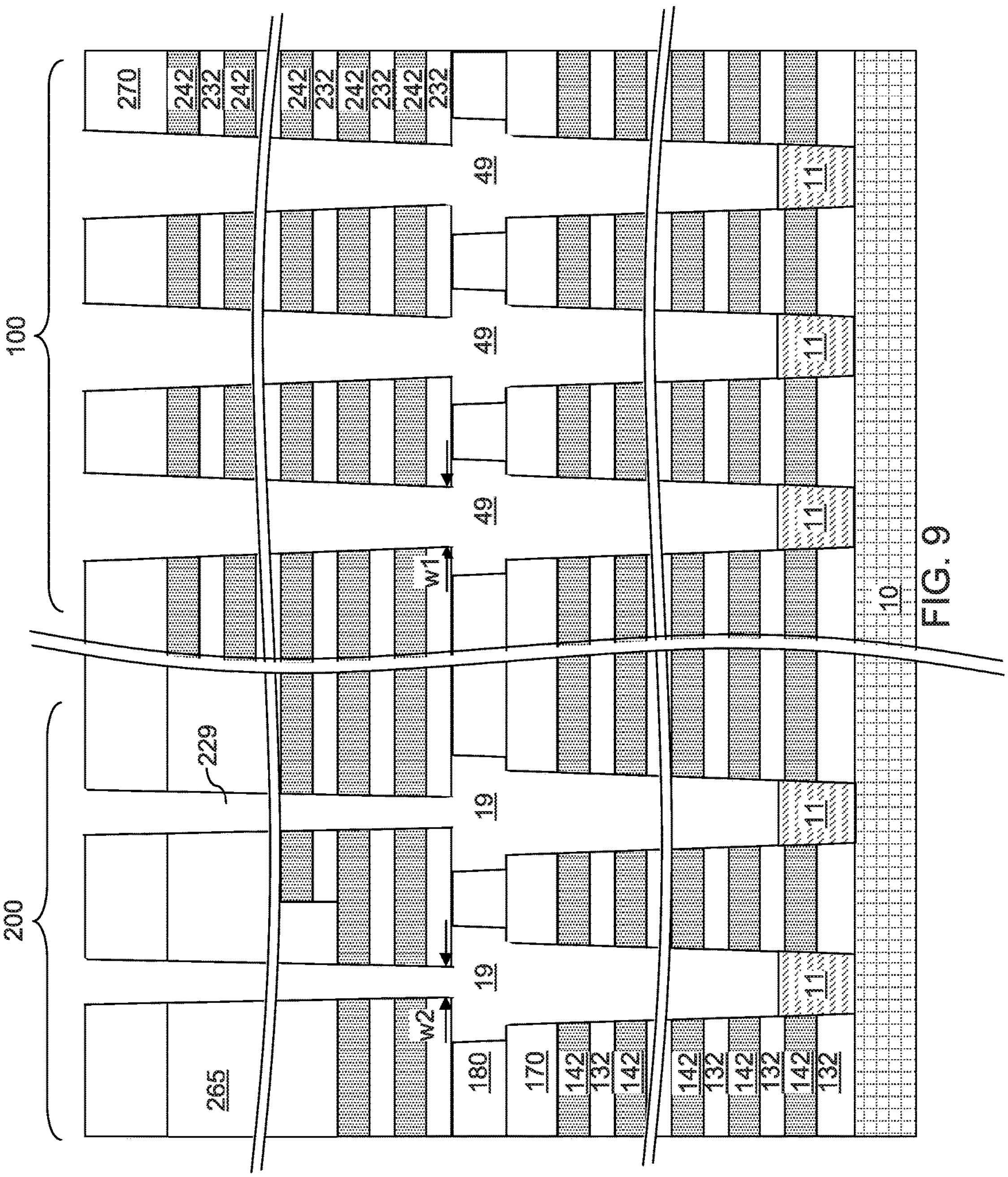
FIG. 9 is a vertical cross-sectional view of a region of the first exemplary structure after formation of inter-tier memory openings and inter-tier support openings according to the first embodiment of the present disclosure.

Referring to FIG. 9, an etch process concurrently applies an etchant that etches a material of the first-tier memory opening fill structures 158 (e.g., the first-tier fill material) into the second-tier memory openings 249 and into the second-tier support openings 229. Specifically, the etch process etches the first-tier fill material selective to the materials of the first and second insulating layers (132, 232), the first and second sacrificial material layers (142,242), the first and second insulating cap layers (170, 270), and the inter-tier dielectric layer 180. The chemistry of the etch process can be selected depending on the composition of the first-tier fill material. For example, if the first-tier fill material comprises amorphous silicon, a wet etch process employing hot trimethyl-2 hydroxyethyl ammonium hydroxide ("hot TMY") or tetramethyl ammonium hydroxide (TMAH) can be employed to remove the first-tier fill material. Subsequently, the semiconductor oxide plates 13 may be optionally removed by an etch process selective to the pedestal channel portions 11. For example, a wet etch employing dilute hydrofluoric acid can be performed to remove the semiconductor oxide plates 13. In one embodiment, the semiconductor oxide plates 13 remain on the pedestal channel portions 11. In another embodiment, the semiconductor oxide plates 13 are removed.

A memory opening 49, which is also referred to as an inter-tier memory opening 49, is formed in each combination of a second-tier memory opening 249 and an underlying volume from which a sacrificial memory opening fill structure 148 and a semiconductor oxide plate 13 is removed. A support opening 19, which is also referred to as an inter-tier support opening 19, is formed in each combination of a second-tier support opening 229 and an underlying volume from which a support opening fill structure 138 and a semiconductor oxide plate 13 is removed.

Each inter-tier memory opening 49 can be formed in the memory array region 100 by removing portions of a respective first-tier memory opening fill structure 158 from underneath a respective second-tier memory opening 249. Each inter-tier support opening 19 is a cavity that is formed in the contact region 200. Each inter-tier memory opening 49 includes an entire volume of a respective second-tier memory opening 249 and a predominant portion (i.e., more than 50%, which may be more than 80% and/or more than 90%) of an entire volume of a respective underlying first-tier memory opening fill structure 158. Each cavity, i.e., each inter-tier support opening 19, includes an entire volume of a respective second-tier support opening 229 and a predominant portion (i.e., more than 50%, which may be more than 80% and/or more than 90%) of an entire volume of a respective underlying first-tier support opening fill structure 138. Thus, the inter-tier support openings 19 can be formed by removing at least an upper portion of each first-tier support opening fill structure 138. Sidewalls of the first insulating layers 132 are physically exposed around each inter-tier support opening 19. The inter-tier memory openings 49 and the cavities (i.e., the inter-tier support openings 19) are provided after the etch process. A bottom surface of each inter-tier support opening 19 is formed below a horizontal plane including a topmost surface of the first alternating stack (132, 142).

Figure 10:
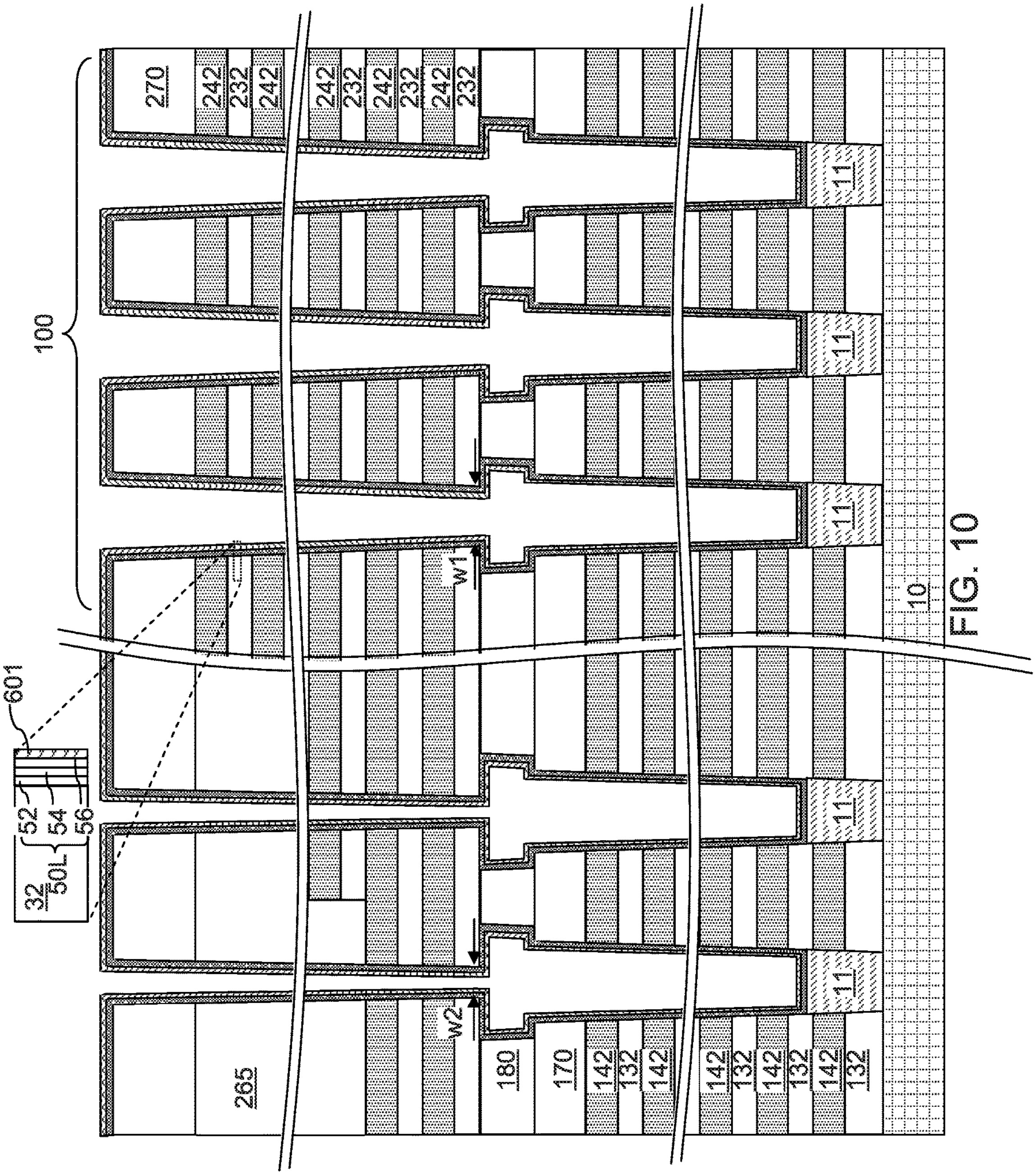
FIG. 10 is a vertical cross-sectional view of a region of the first exemplary structure after formation of a memory film layer and a semiconductor channel material layer according to the first embodiment of the present disclosure.

Referring to FIG. 10, a stack of layers including a blocking dielectric layer 52, a charge storage layer 54, a tunneling dielectric layer 56, and an optional first semiconductor channel layer 601 can be sequentially deposited in the inter-tier memory openings 49 and in the cavities in the contact region 200, i.e., in the inter-tier support openings 19. The stack of the blocking dielectric layer 52, the charge storage layer 54, and the tunneling dielectric layer 56 constitutes a memory film layer 50L.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the first and second sacrificial material layers (142, 242) and the first and second insulating layers (132, 232) can have vertically coincident sidewalls, and the charge storage layer 54 can be formed as a single continuous layer. As used herein, a first surface and a second surface are "vertically coincident" if the second surface overlies or underlies the first surface and if there exists a vertical plane or a tilted plane with less than 5 degrees of tilt angle from the vertical direction that includes the first surface and the second surface.

In another embodiment, the first and second sacrificial material layers (142, 242) can be laterally recessed with respect to the sidewalls of the first and second insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity is formed in the volume of each memory opening 49 that is not filled with the deposited material layers (52, 54, 56, 601).

Figure 11:
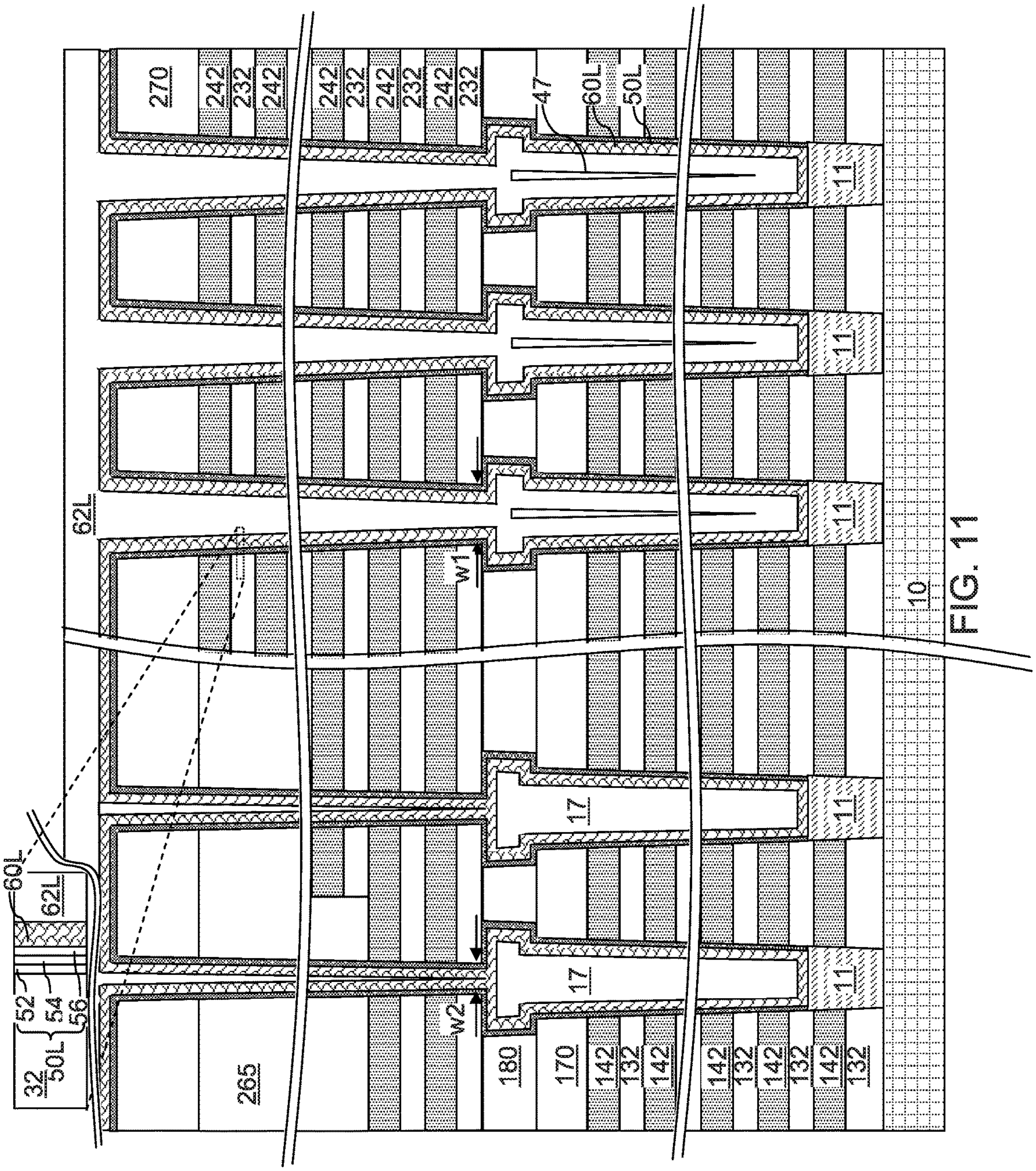
FIG. 11 is a vertical cross-sectional view of a region of the first exemplary structure after formation of a dielectric core material layer according to the first embodiment of the present disclosure.

Referring to FIG. 11, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

According to an aspect of the present disclosure, the second width w2 at the bottom periphery of an upper portion of each inter-tier support opening 19, which is measured at the interface between the inter-tier dielectric layer 180 and the second alternating stack (232, 242), is less than the first width w1 at the bottom periphery of an upper portion of each inter-tier memory opening 49, which is measured at the interface between the inter-tier dielectric layer 180 and the second alternating stack (232, 242). At the step of the anisotropic etch process, the cavity within each inter-tier support opening 19 through which reactive ions pass through has a narrower lateral dimension at the interface between the inter-tier dielectric layer 180 and the second alternating stack (232, 242) than the cavity within each inter-tier memory opening 49 at the height of the interface. Thus, less ions impinge on the sidewalls of the memory film layer 50L at the levels of the first alternating stack (132, 142), the first insulating cap layer 170, and the inter-tier dielectric layer 180 within each inter-tier support opening 19 than within each inter-tier memory opening 49. The reduction in the number of ions that impinge on the sidewalls of the memory film layer 50L within the inter-tier support opening 19 reduces collateral etch damage on the portions of the memory film layer 50L at the levels of the first alternating stack (132, 142), the first insulating cap layer 170, and the inter-tier dielectric layer 180 within the inter-tier support openings 19. In other words, the reduction in the number of ions that impinge on the portions of the memory film layer 50L in the inter-tier support openings 19 reduces the structural damage to the memory films 50 in the inter-tier support openings 19. Thus, leakage current through the portions of the memory film layer 50L in the inter-tier support openings 19 is reduced in a final device structure.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the first and second sacrificial material layers (142, 242) constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity can be vertically recessed so that the recessed semiconductor surface underneath the memory cavity is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in an inter-tier memory opening 49 constitutes a memory film layer 50L, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

A second semiconductor channel layer can be deposited directly on the semiconductor surface of the pedestal channel portion 11 or the semiconductor material layer 10 if the pedestal channel portion 11 is omitted, and directly on the planar semiconductor material layer 10. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the memory cavity in each memory opening, or may fully fill the cavity in each memory opening. In one embodiment, the first semiconductor channel layer 601 may be optionally removed isotropically, for example, by a wet etch process employing hot TMY prior to deposition of the second semiconductor channel layer. The second semiconductor channel layer, or the set of first semiconductor channel layer 601 and the second semiconductor channel layer in case the first semiconductor channel layer 601 is not removed, is referred to as a semiconductor channel material layer 60L.

In case the memory cavity in each memory opening is not completely filled by the second semiconductor channel layer, a dielectric core layer 62L can be deposited in the memory cavity to fill any remaining portion of the memory cavity within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Support pillar cavities 17 can be formed in each inter-tier support openings 19 within the first alternating stack (132, 142). The support pillar cavities 17 are volumes of the inter-tier support openings 19 that are not filled with the materials of the memory film layer 50L, the semiconductor channel material layer 60L, and the dielectric core layer 62L. The maximum lateral dimension of each support pillar cavity can be greater than the second width w2. An encapsulated memory cavity 47 may, or may not, be formed in each inter-tier memory opening 49 within the first alternating stack (132, 142). The encapsulated memory cavities 47 are volumes of the inter-tier memory openings 49 that are not filled with the materials of the memory film layer 50L, the semiconductor channel material layer 60L, and the dielectric core layer 62L. The volume of each encapsulated memory cavity 47 can be less than the volume of each support pillar cavity 17 at least by a factor of 5.

Figure 12A:
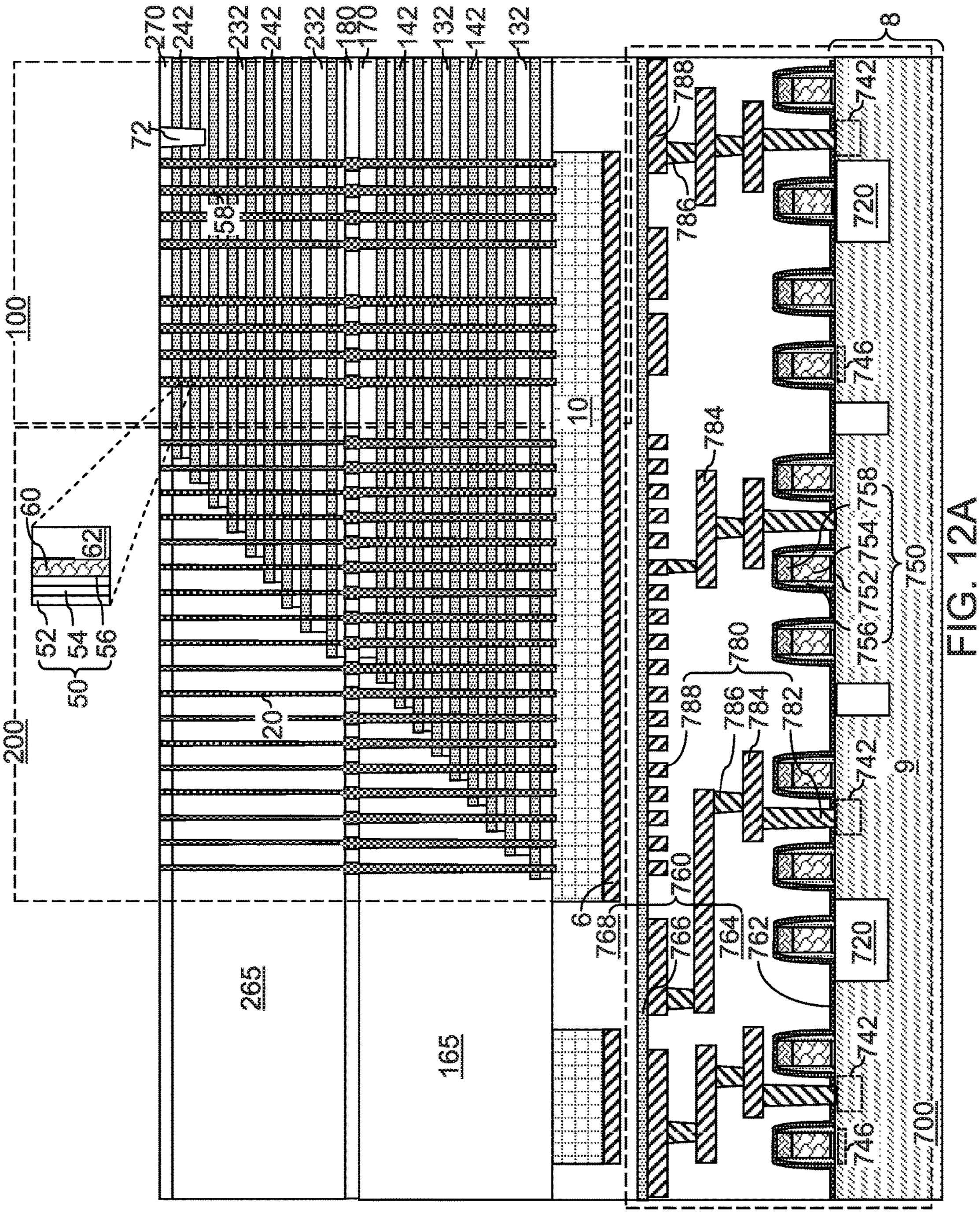
FIG. 12A is a vertical cross-sectional view of the first exemplary structure after formation of memory opening fill structures and support pillar structures according to the first embodiment of the present disclosure.
Figure 12B:
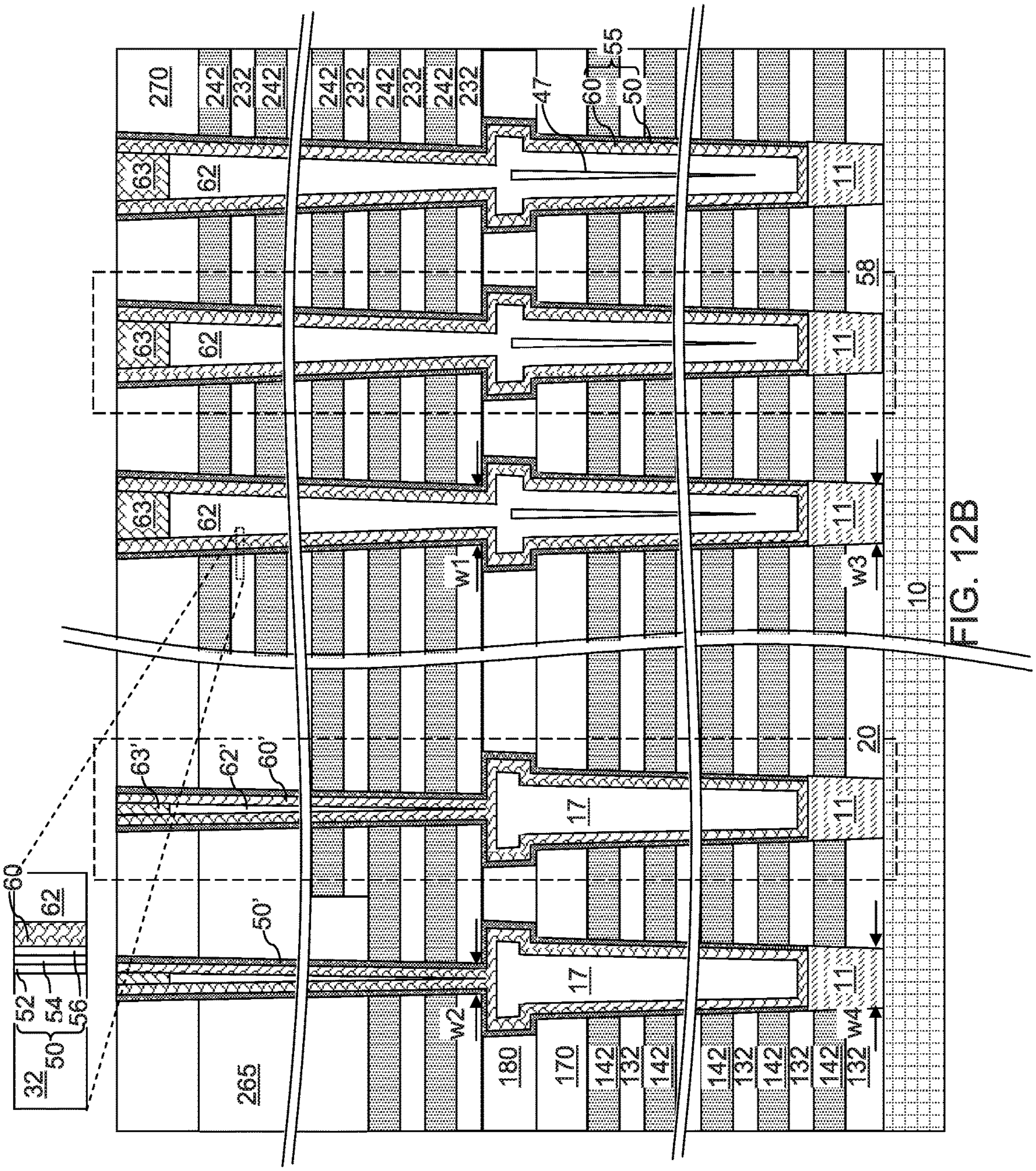
FIG. 12B is a vertical cross-sectional view of a region of the first exemplary structure of FIG. 12A.
Figure 12C:
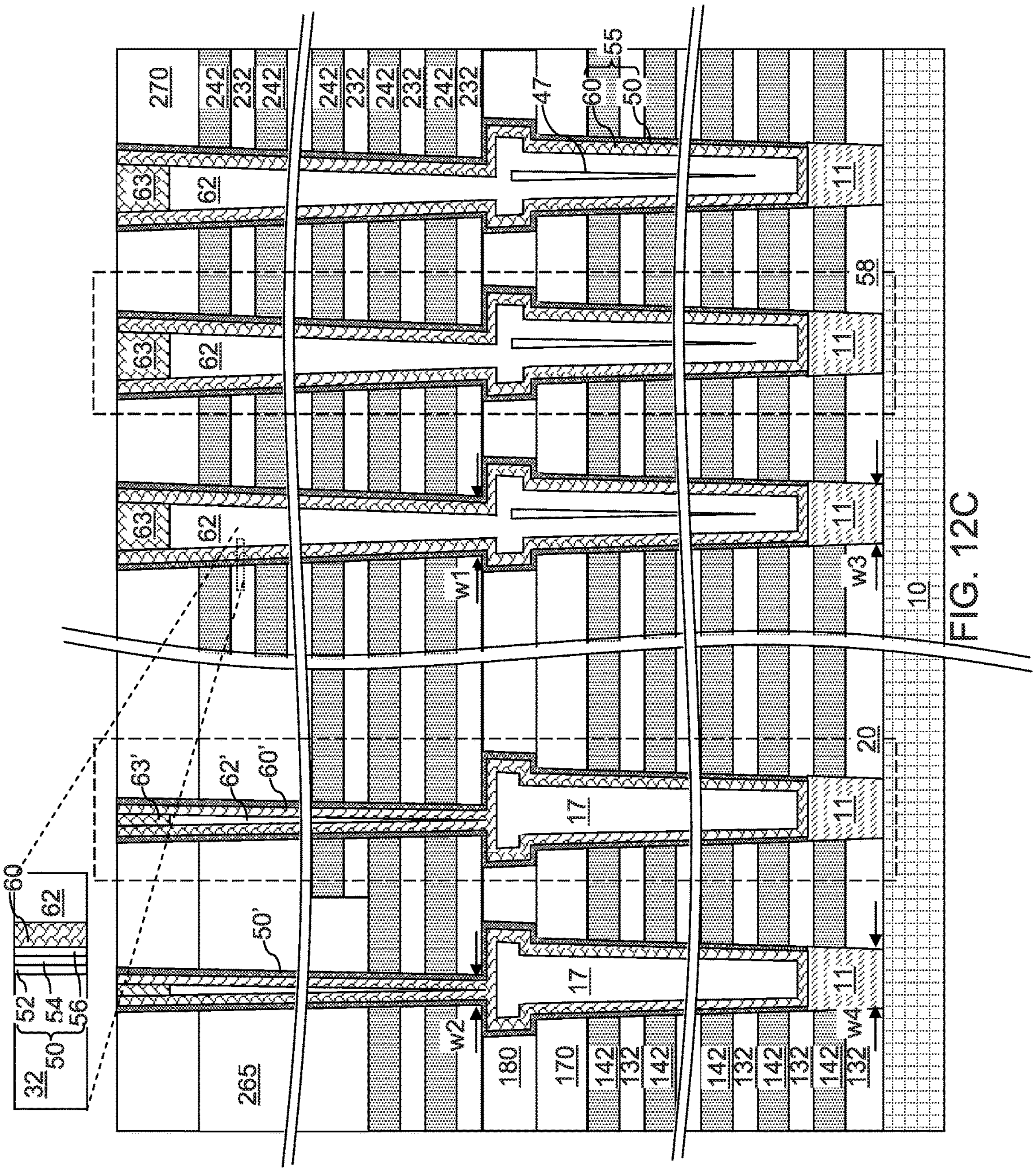
FIG. 12C is a vertical cross-sectional view of an alternative configuration of a region of the first exemplary structure of FIG. 12A in case of a non-zero overlay misalignment.

Referring to FIGS. 12A-12C, the first exemplary structure is illustrated after formation of memory opening fill structures 58 and support pillar structures 20. FIG. 12B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 12C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Specifically, the horizontal portion of the dielectric core layer 62L overlying the second insulating cap layer 270 can be removed, for example, by a recess etch from above the top surface of the second insulating cap layer 270. The material of the dielectric core layer 62L can be further recessed within each inter-tier memory opening 49, for example, by a recess etch to a height between the horizontal plane including the top surface of the second insulating cap layer 270 and the horizontal plane including the bottom surface of the second insulating cap layer 270. Recessed top surfaces of the remaining portions of the dielectric core layer 62 is formed between the horizontal plane including the top surface of the second insulating cap layer 270 and the horizontal plane including the bottom surface of the second insulating cap layer 270. Each remaining portion of the dielectric core layer 62L constitutes a dielectric core 62.

Horizontal portion of the second semiconductor channel layer located above the top surfaces of the dielectric cores 62 can be removed by an etch process, which may be an isotropic etch process such as a wet etch process or an anisotropic etch process such as a reactive ion etch process. Each remaining portion of the second semiconductor channel layer, or each contiguous pair of a remaining portion of the second semiconductor channel layer and a remaining portion of the first semiconductor channel layer 601 in case any portion of the first semiconductor channel layer remains, constitutes a vertical semiconductor channel 60, through which electrical current can flow when a vertical NAND device including the vertical semiconductor channel 60 is turned on. Alternatively, the first semiconductor channel layer 601 can be removed, for example, by a wet etch employing hot TMY, and each vertical semiconductor channel 60 can consist of remaining portions of the second semiconductor channel layer. In this case, the semiconductor oxide plate 13 can prevent, or minimize, collateral etching of the pedestal channel portions 11.

Horizontal portions of the memory film layer 50L overlying the second insulating cap layer 270 can be subsequently removed, for example, by an anisotropic etch process. Each remaining portion of the memory film layer 50L located within the inter-tier memory openings 49 and the inter-tier support openings 19 constitutes a memory film 50 or a dummy memory film 50'. Each memory film 50 and each dummy memory film 50' can include a layer stack of a blocking dielectric layer 52, a charge storage layer 54, and a tunneling dielectric layer 56. Each tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 in an inter-tier memory opening 49 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within each inter-tier memory opening 49 is herein referred to as a memory opening fill structure 58. Each combination of a pedestal channel portion 11 (if present), a memory film 50, a dummy semiconductor channel 60' (that has the same composition as the vertical semiconductor channels 60), a support dielectric core 62' (that has the same composition as the dielectric cores 62), and a dummy drain region 63' (that has the same composition as the drain regions 63) within each inter-tier support opening 19 fills the respective inter-tier support openings 19, and constitutes a support pillar structure 20.

Generally, each of the inter-tier memory openings 49 and the inter-tier support openings 19 is filled with fill material portions (50L, 60L, 62L). Regions of the fill material portions (50L, 60L, 62L) are removed from above a horizontal plane overlying the second alternating stack (232, 242), such as the horizontal plane including the top surface of the second insulating cap layer 270, by a planarization process. Remaining portions of the fill material portions (50L, 60L, 62L) in the inter-tier memory openings 49 comprise the memory stack structures 55 after the planarization process. A support pillar structure 20 including remaining portions of the fill material portions (50L, 60L, 62L) is present in each cavity in the contact region 200, i.e., in each inter-tier support opening 19, after the planarization process. Each support pillar structure 20 extends through the second retro-stepped dielectric material portion 265. In one embodiment, a top surface of each support pillar structure 20 can be formed within a same horizontal plane as the top surfaces of the memory opening fill structures 58. In one embodiment, the support pillar structures 20 can extend from the second-tier structure to the bottommost layer within the second alternating stack (232, 242).

Each memory opening fill structure 58 extends through all layers within the second alternating stack (232, 242) and the first alternating stack (132, 142). Each memory opening fill structure 58 comprises a vertical semiconductor channel 60 and a memory film 50, and has a first width w1 that is a maximum lateral dimension of the memory stack structure 55 at a horizontal plane including a bottom surface of a bottommost layer of the second alternating stack (232, 242) such as the bottommost second insulating layer 232.

Each support pillar structure 20 extends at least through each layer within the second alternating stack (232, 242) and includes a dummy semiconductor channel 60' having a same material composition as the semiconductor channels 60, and has a second width w2 that is a maximum lateral dimension of the support pillar structure 20 at the horizontal plane including the bottom surface of the bottommost layer of the second alternating stack (232, 242). The second width w2 is less than the first width w1.

Each memory film 50 can comprise a layer stack including a tunneling dielectric layer 56, a charge storage layer 54, and a blocking dielectric layer 52. Each support pillar structure 20 can comprise a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

In one embodiment, each memory opening fill structure 58 can have a third width w3 that is a maximum lateral dimension of the memory stack structure at a horizontal plane including a bottom surface of a bottommost layer of the first alternating stack (132, 142). Each support pillar structure 20 can have a fourth width w4 that is a maximum lateral dimension of the support pillar structure 20 at the horizontal plane including the bottom surface of the bottommost layer of the first alternating stack (132, 142). The ratio of the second width w2 to the fourth width w4 is less than the ratio of the first width w1 to the third width w3. For example, the ratio of the first width w1 to the third width w3 may be in a range from 0.8 to 1.2, and the ratio of the second width w2 to the fourth width w4 may be in a range from 0.1 to 0.9, such as from 0.1 to 0.8.

In one embodiment, each support pillar structure 20 comprises a dummy memory film 50' having a same material composition as, and having a same thickness as, each memory film 50. Within each support pillar structure 20, the dummy semiconductor channel 60' and the dummy memory film 50' can vertically extend through a subset of the first sacrificial material layers 142 within the first alternating stack (132, 142). In one embodiment, the dummy memory film 50' contacts sidewalls of a subset of the first insulating layers 132 within the first alternating stack (132, 142).

Figure 13A:
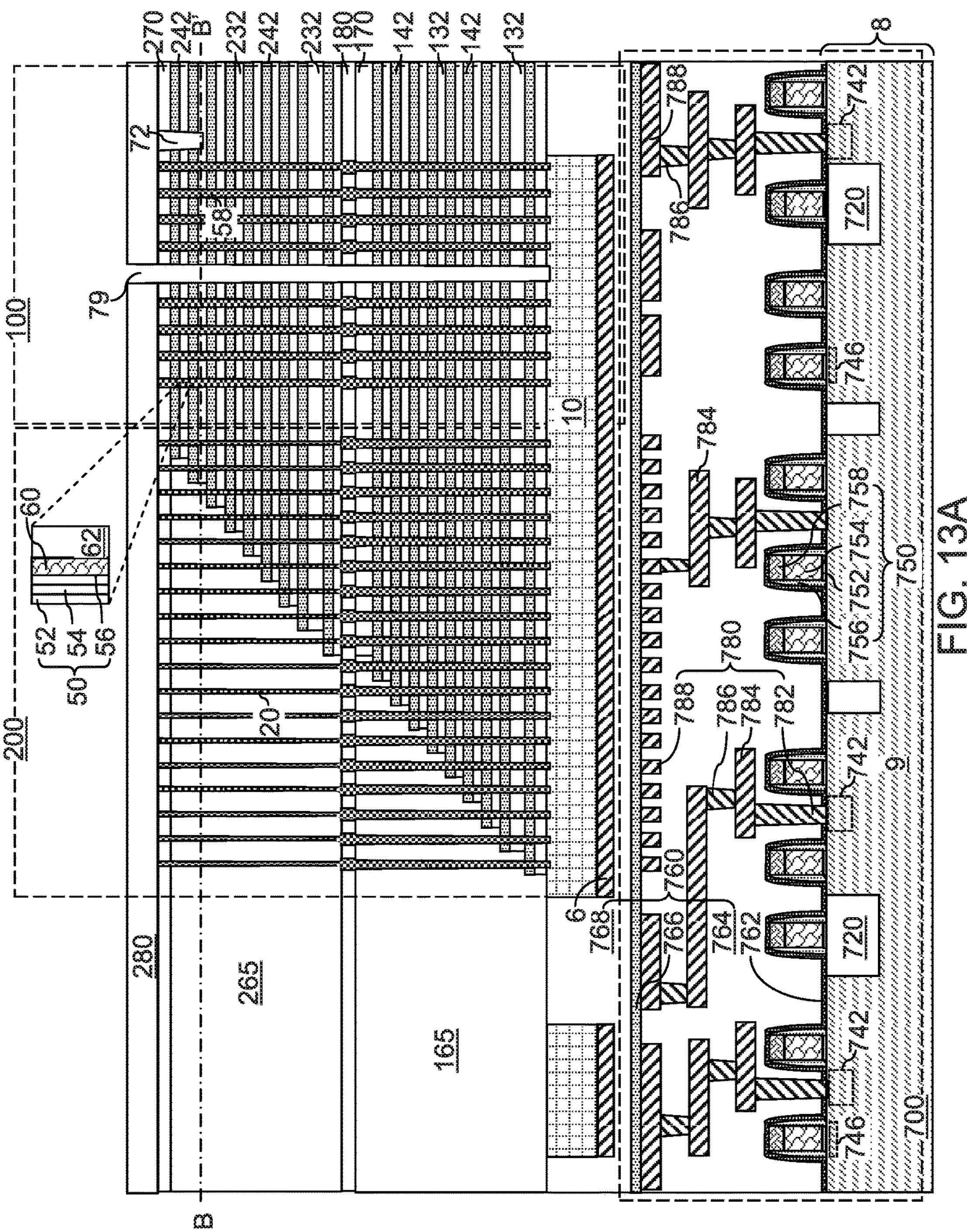
FIG. 13A is a vertical cross-sectional view of the first exemplary structure after formation of backside trenches according to the first embodiment of the present disclosure.
Figure 13B:
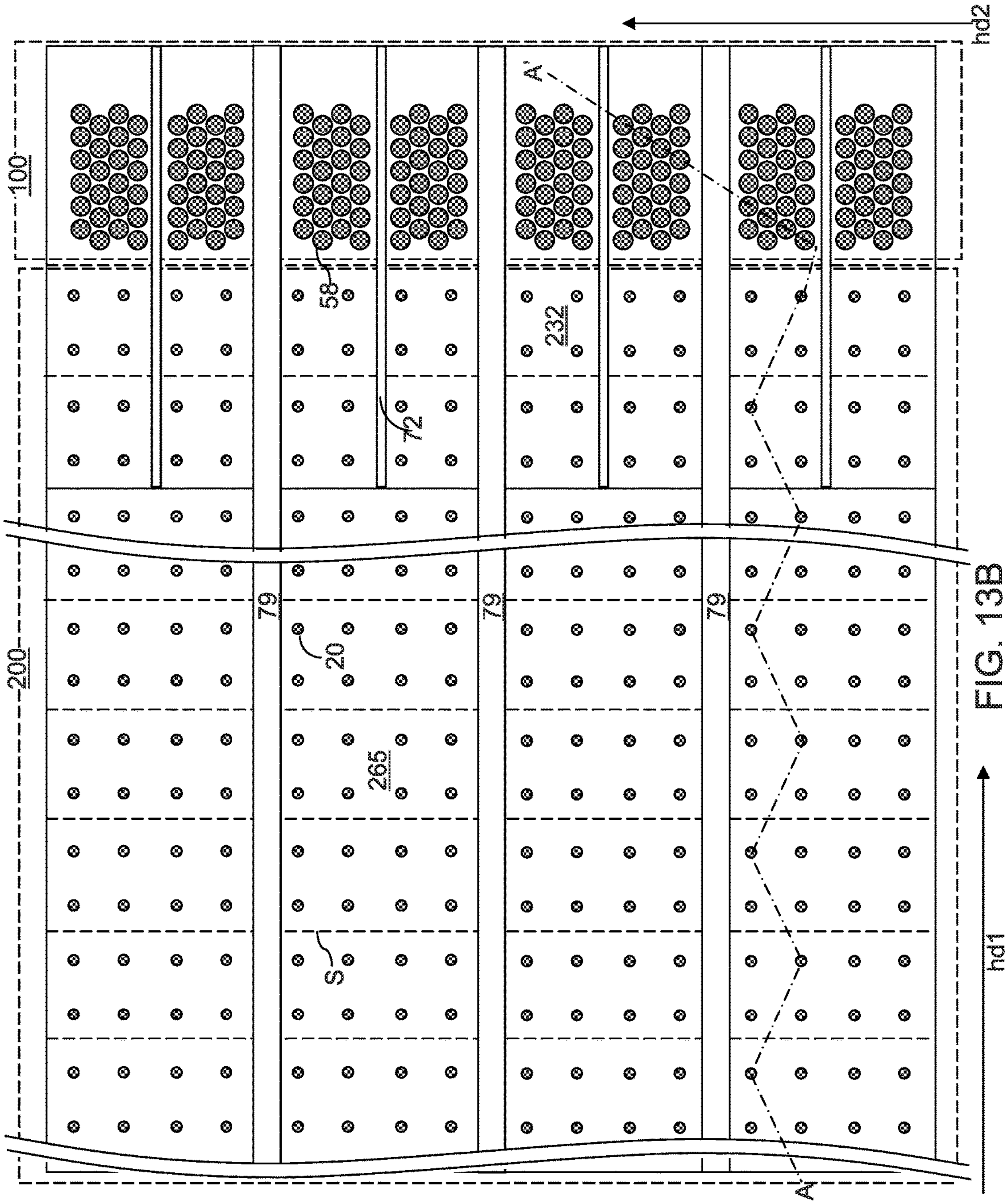
FIG. 13B is a horizontal cross-sectional view of the first exemplary structure along the horizontal plane B-B' of FIG. 13A. The zig-zag vertical plane A-A' is the plane of the vertical cross-sectional view of FIG. 13A.

Referring to FIGS. 13A and 13B, a planarization dielectric layer 280 can be formed over the second insulating tier cap layer 270. The planarization dielectric layer 280 may be selected as an in-process structure that is consumed during subsequent planarization processes. In one embodiment, the planarization dielectric layer 280 can include a silicon oxide material deposited by chemical vapor deposition such as tetraethylorthosilicate (TEOS) silicon oxide. The thickness of the planarization dielectric layer 280 can be in a range from 50 nm to 300 nm, although lesser and greater thicknesses can also be employed.

At least one backside trench 79 can be formed through the upper and first tier structures, for example, by applying a photoresist layer (not shown), lithographically patterning the photoresist layer, and transferring the pattern in the photoresist layer through the upper and first tier structures employing an anisotropic etch. The anisotropic etch that forms the at least one backside trench 79 can stop on the planar semiconductor material layer 10. The photoresist layer can be subsequently removed, for example, by ashing.

Figure 14A:
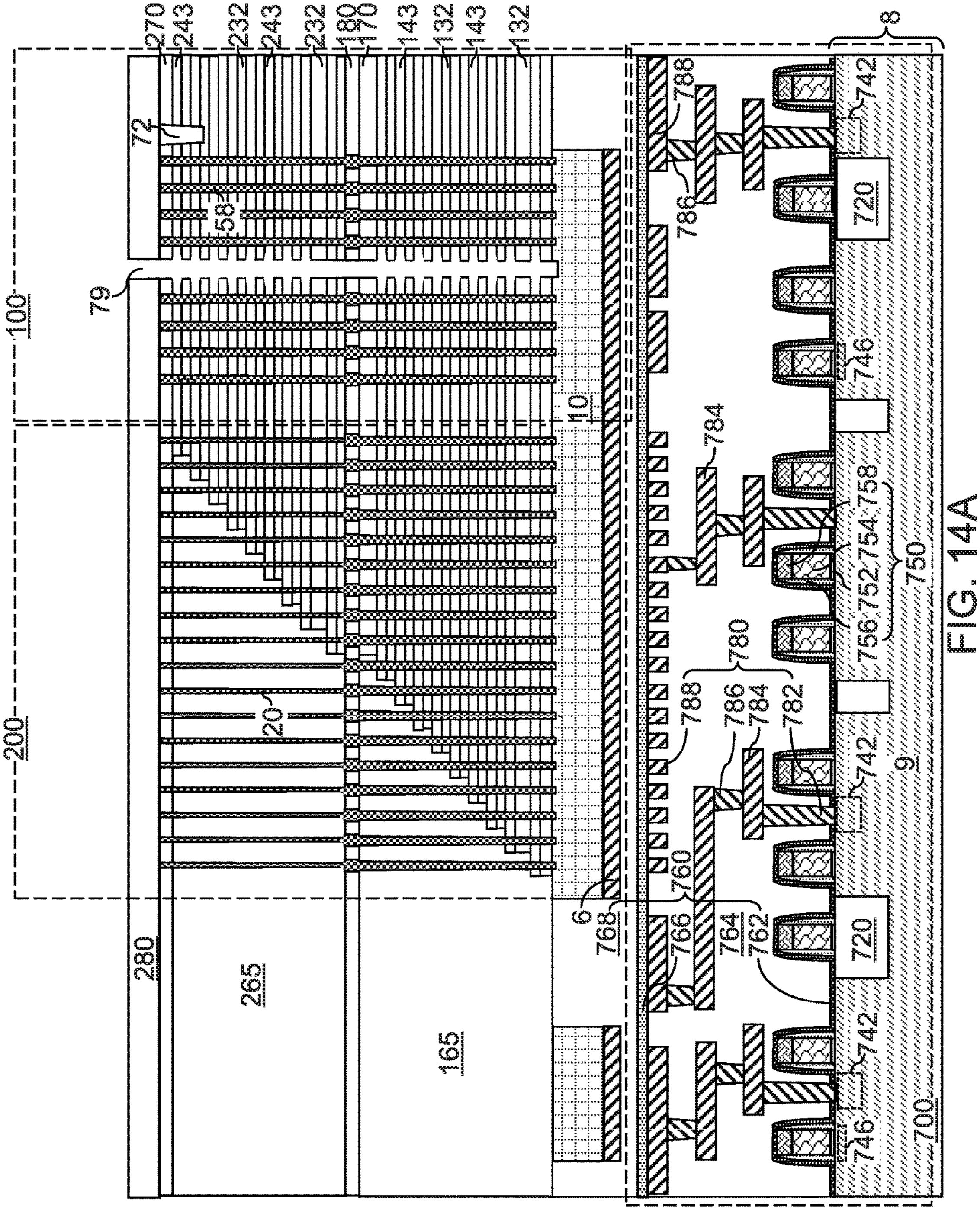
FIG. 14A is a vertical cross-sectional view of the first exemplary structure after formation of backside recesses by removal of the sacrificial material layers according to the first embodiment of the present disclosure.
Figure 14B:
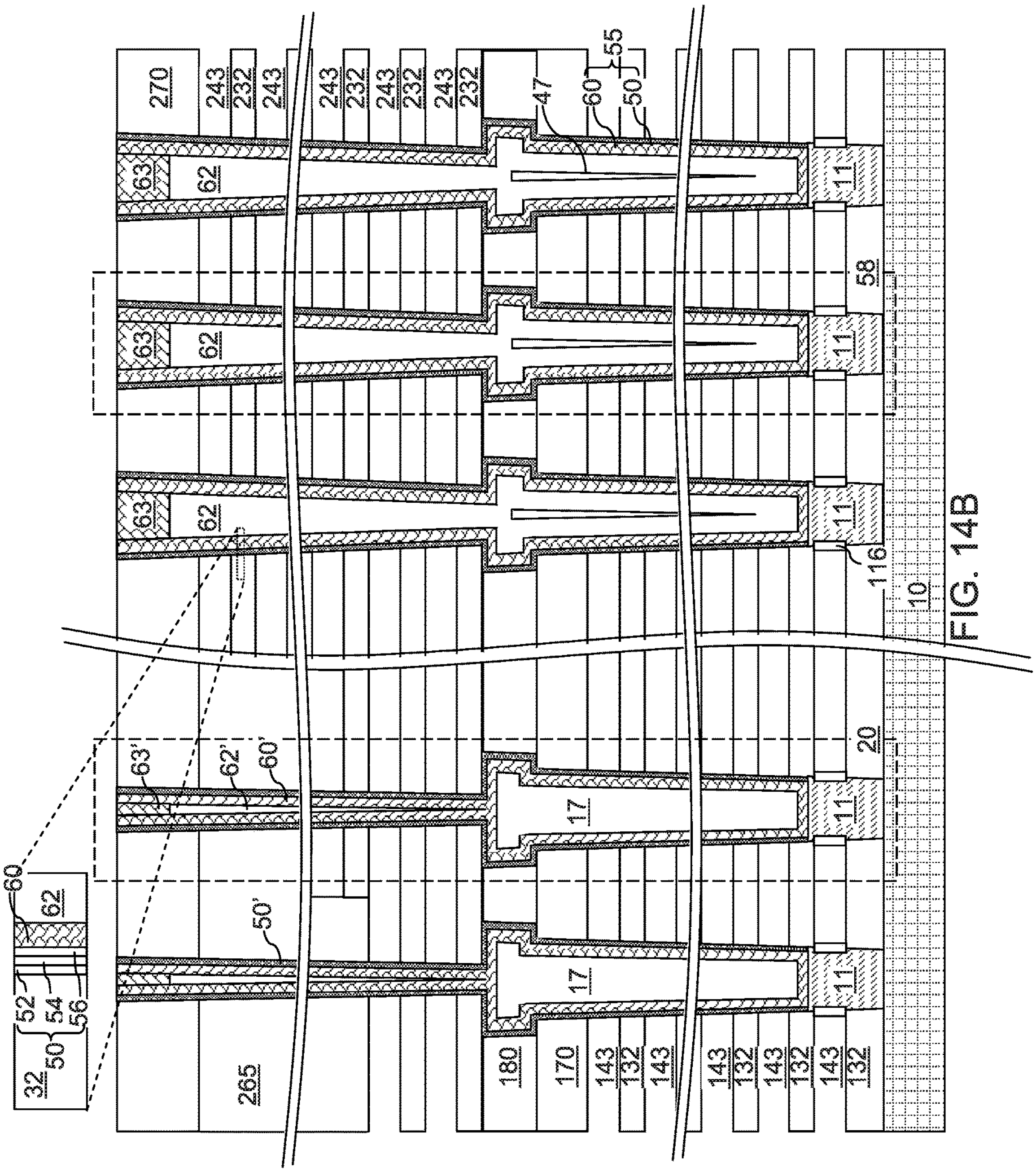
FIG. 14B is a vertical cross-sectional view of a region of the first exemplary structure of FIG. 14A.

Referring to FIGS. 14A and 14B, an etchant that selectively etches the materials of the first and second sacrificial material layers (142, 242) with respect to the materials of the first and second insulating layers (132, 232), the material of the dielectric oxide layer 51L, and the first and second insulating cap layers (170, 270) can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. The removal of the materials of the first and second sacrificial material layers (142, 242) can be selective to the materials of the first and second insulating layers (132, 232), and the material of the dielectric oxide layer 51L. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the planar semiconductor material layer 10. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

In one embodiment, a sidewall surface of each pedestal channel portion 11 and a top surface of a semiconductor material layer in the substrate (i.e., the substrate semiconductor layer 10) can be physically exposed below the bottommost first backside recess 143 after removal of the first and second sacrificial material layers (142, 242).

Physically exposed surface portions of the optional pedestal channel portions 11 and the planar semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the planar semiconductor material layer 10 into a planar dielectric portion (not expressly shown). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion includes a dielectric material that includes the same semiconductor element as the semiconductor material layer and additionally includes at least one non-metallic element such as oxygen and/or nitrogen such that the material of the planar dielectric portions is a dielectric material.

Figure 15A:
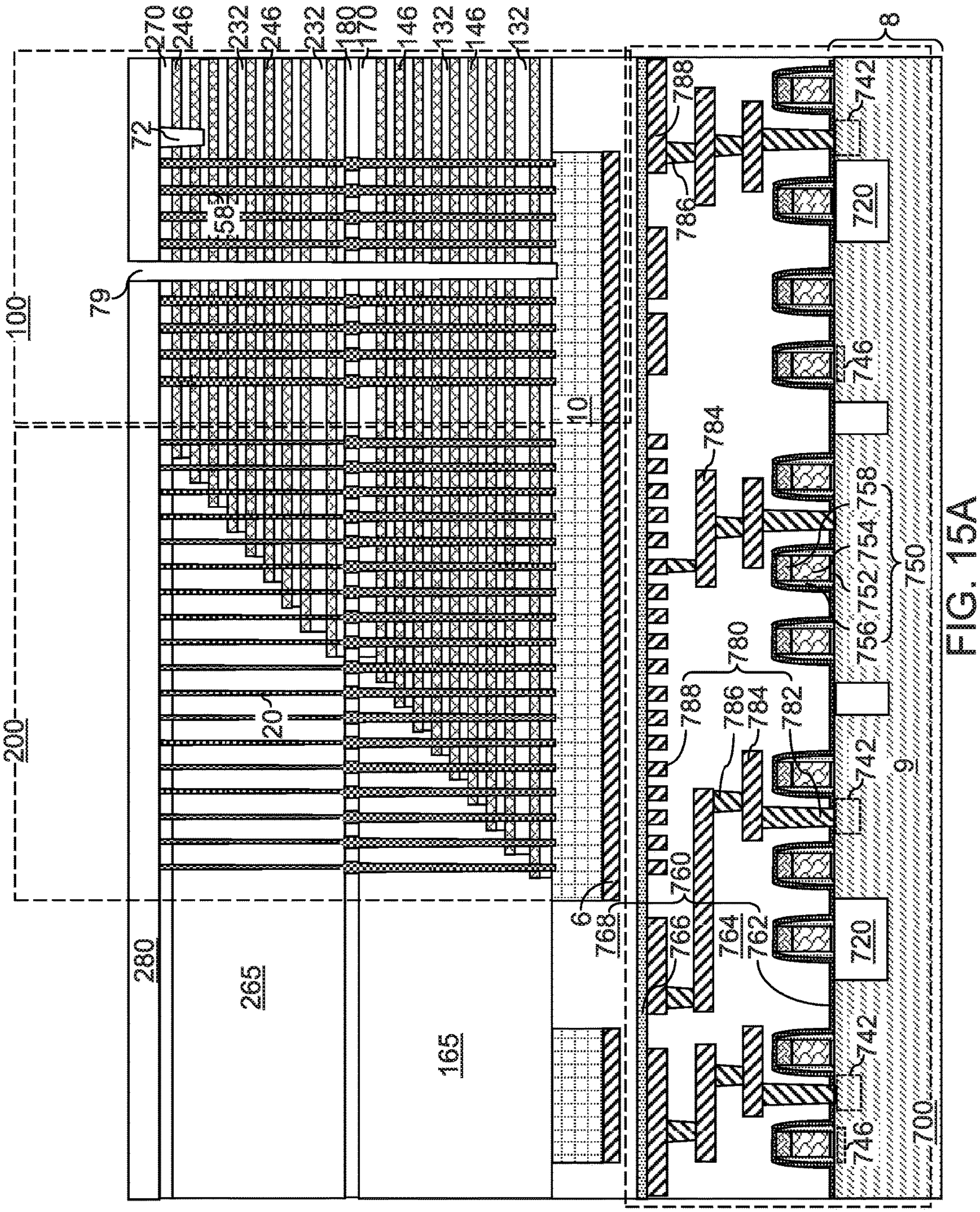
FIG. 15A is a vertical cross-sectional view of the first exemplary structure after formation of electrically conductive layers in the backside recesses according to the first embodiment of the present disclosure.
Figure 15B:
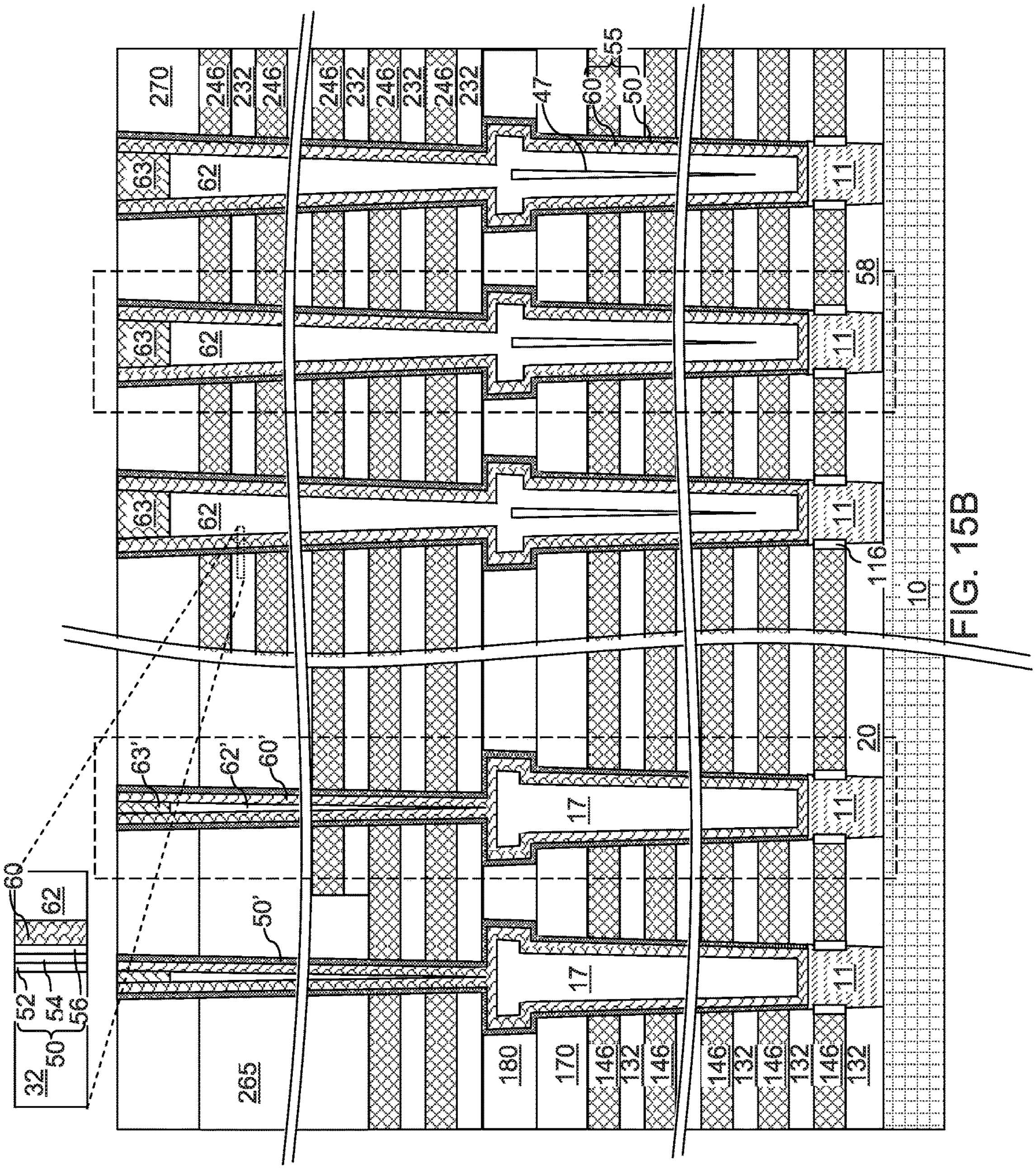
FIG. 15B is a vertical cross-sectional view of a region of the first exemplary structure of FIG. 15A.
Figure 15C:
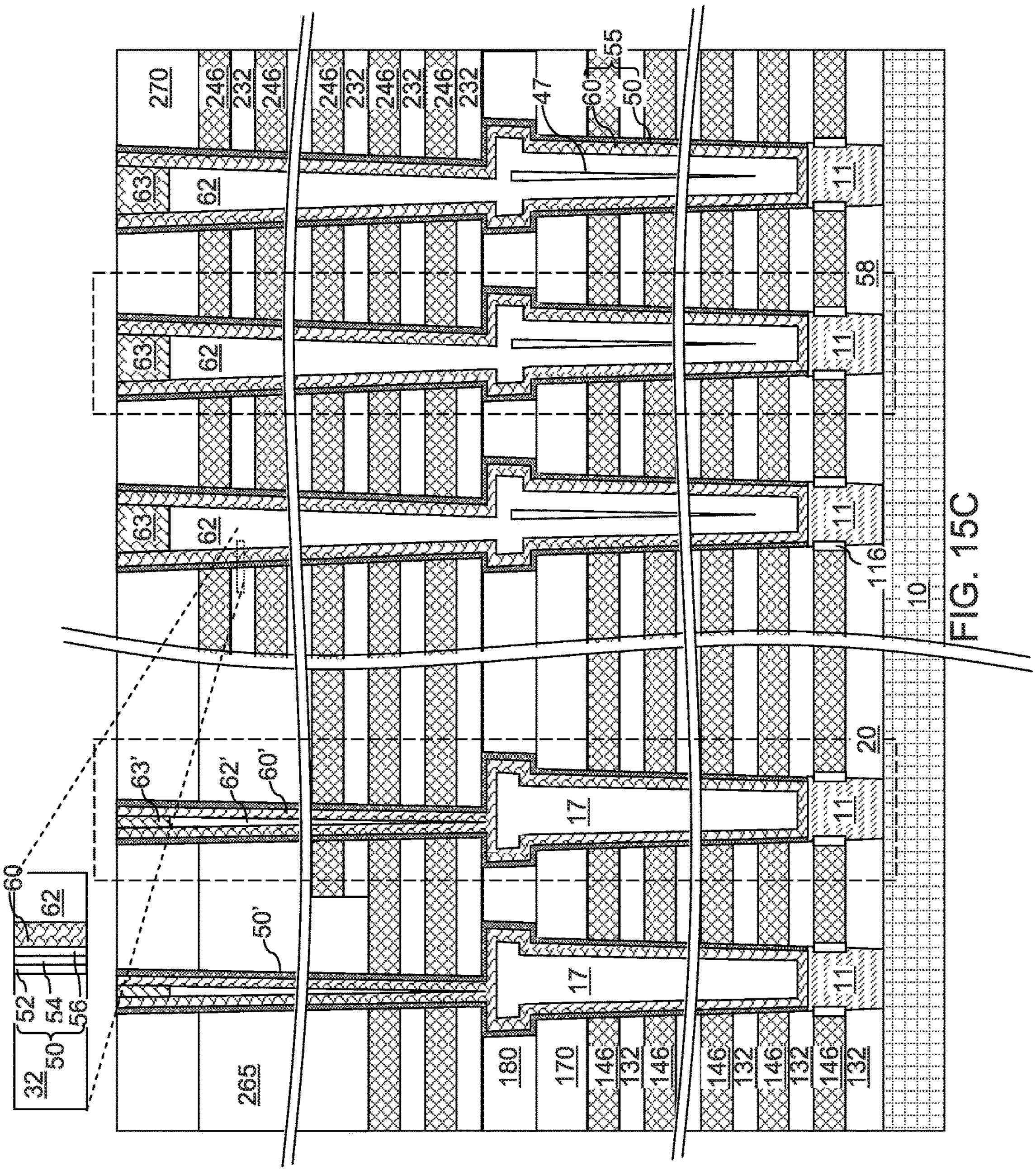
FIG. 15C is a vertical cross-sectional view of an alternative configuration of a region of the first exemplary structure of FIG. 15A in case of a non-zero overlay misalignment.

Referring to FIGS. 15A-15C, the first exemplary structure is illustrated after formation of first and second electrically conductive layers (146, 246) within the first and second backside recesses (143, 243). FIG. 15B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 15C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

A backside blocking dielectric layer (not shown) can be optionally deposited in the backside recesses (143, 243) and the backside trenches 79 and over the planarization dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside trench 79, and over the planarization dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Residual portions of the metallic material can be removed from inside each backside trench 79. Specifically, the deposited metallic material of the continuous metallic material layer can be etched back from the sidewalls of each backside trench 79 and from above the planarization dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure. The planar dielectric portions at the bottom regions of the backside trenches 79 can be removed during removal of the residual portions of the metallic material from inside the backside trenches 79.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structure 55.

The bottommost first electrically conductive layer 146 can be a source select gate electrode, which can control activation of a horizontal channel portion of a semiconductor channel that extends between a source region 61 (which is previously formed or which will be subsequently formed underneath each backside trench 79) and drain regions 63. In one embodiment, the backside blocking dielectric layer may be present as a single continuous material layer. In another embodiment, the vertical portions of the backside blocking dielectric layer may be removed from within the backside trenches 79, and the backside blocking dielectric layer can have a plurality of physically disjoined backside blocking dielectric layer portions that are located at each level of the electrically conductive layers (146, 246).

Figure 16:
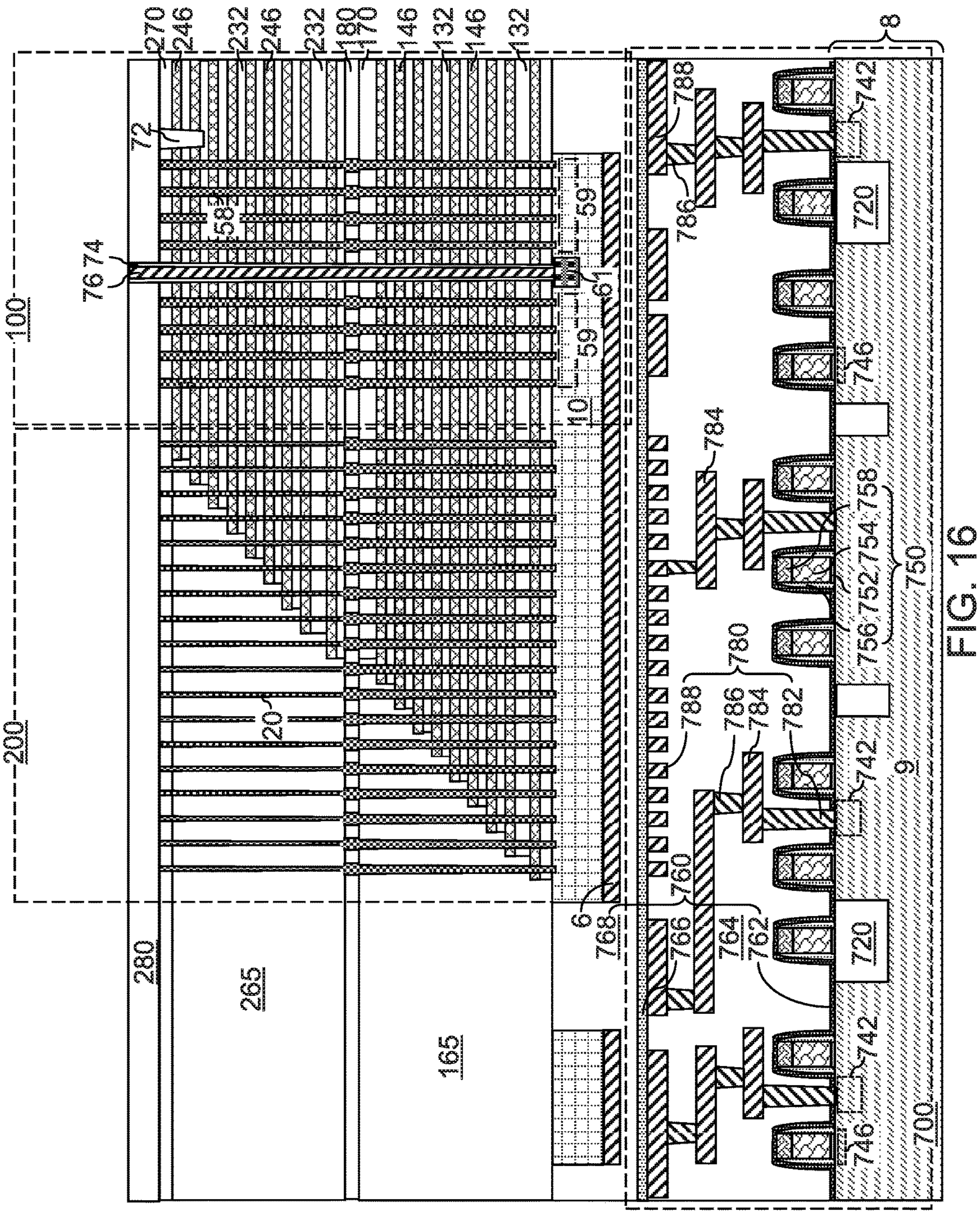
FIG. 16 is a vertical cross-sectional view of the first exemplary structure after formation of source regions and backside contact structures according to the first embodiment of the present disclosure.

Referring to FIG. 16, dopants of a second conductivity type, which is the opposite of the first conductivity type of the substrate semiconductor layer 10, can be implanted into a surface portion of the substrate semiconductor layer 10 to form a source region 61 underneath the bottom surface of each backside trench 79. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material.

A backside contact via structure 76 can be formed in the remaining volume of each backside trench 79, for example, by deposition of at least one conductive material and removal of excess portions of the deposited at least one conductive material from above a horizontal plane including the top surface of the planarization dielectric layer 280 by a planarization process such as chemical mechanical planarization or a recess etch. Optionally, each backside contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside trenches 79 and removing the deposited doped semiconductor material from upper portions of the backside trenches 79. The upper backside contact via portion can include at least one metallic material (such as a combination of a Ti liner and a TiN liner and a W fill material), and can be formed by depositing the at least one metallic material above the lower backside contact via portions, and removing an excess portion of the at least one metallic material from above the horizontal plane including the top surface of the planarization dielectric layer 280. The planarization dielectric layer 280 can be thinned and removed during a latter part of the planarization process, which may employ chemical mechanical planarization (CMP), a recess etch, or a combination thereof. Each backside contact via structure 76 can be formed through the at least one tier structure (132, 146, 232, 246) and on a source region 61, which may be a source region. The top surface of each backside contact via structure 76 can be formed within the horizontal plane that includes the top surfaces of the memory stack structures 55.

Figure 17A:
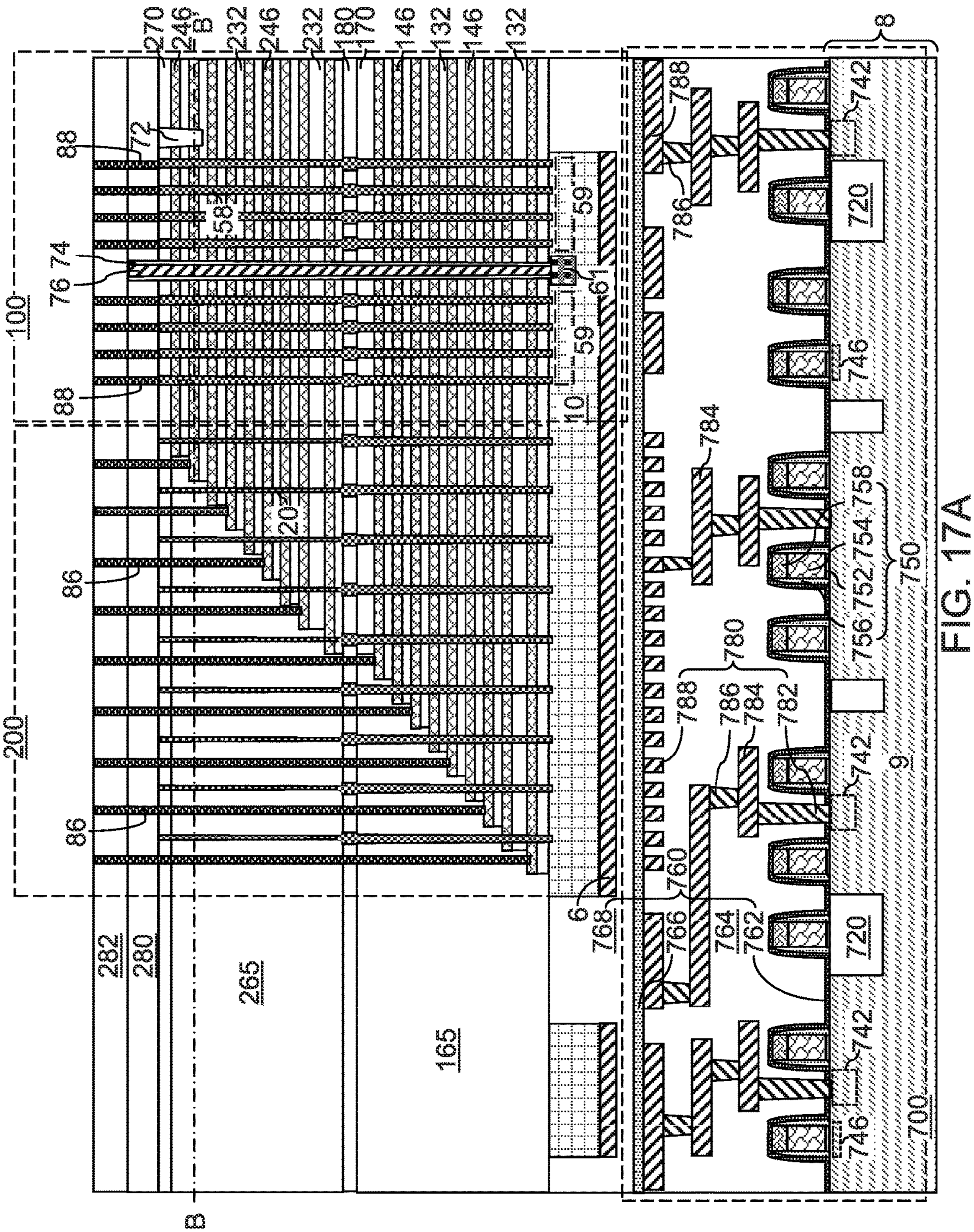
FIG. 17A is a vertical cross-sectional view of the first exemplary structure after formation of conductive layer contact via structures and drain contact via structures according to the first embodiment of the present disclosure.
Figure 17B:
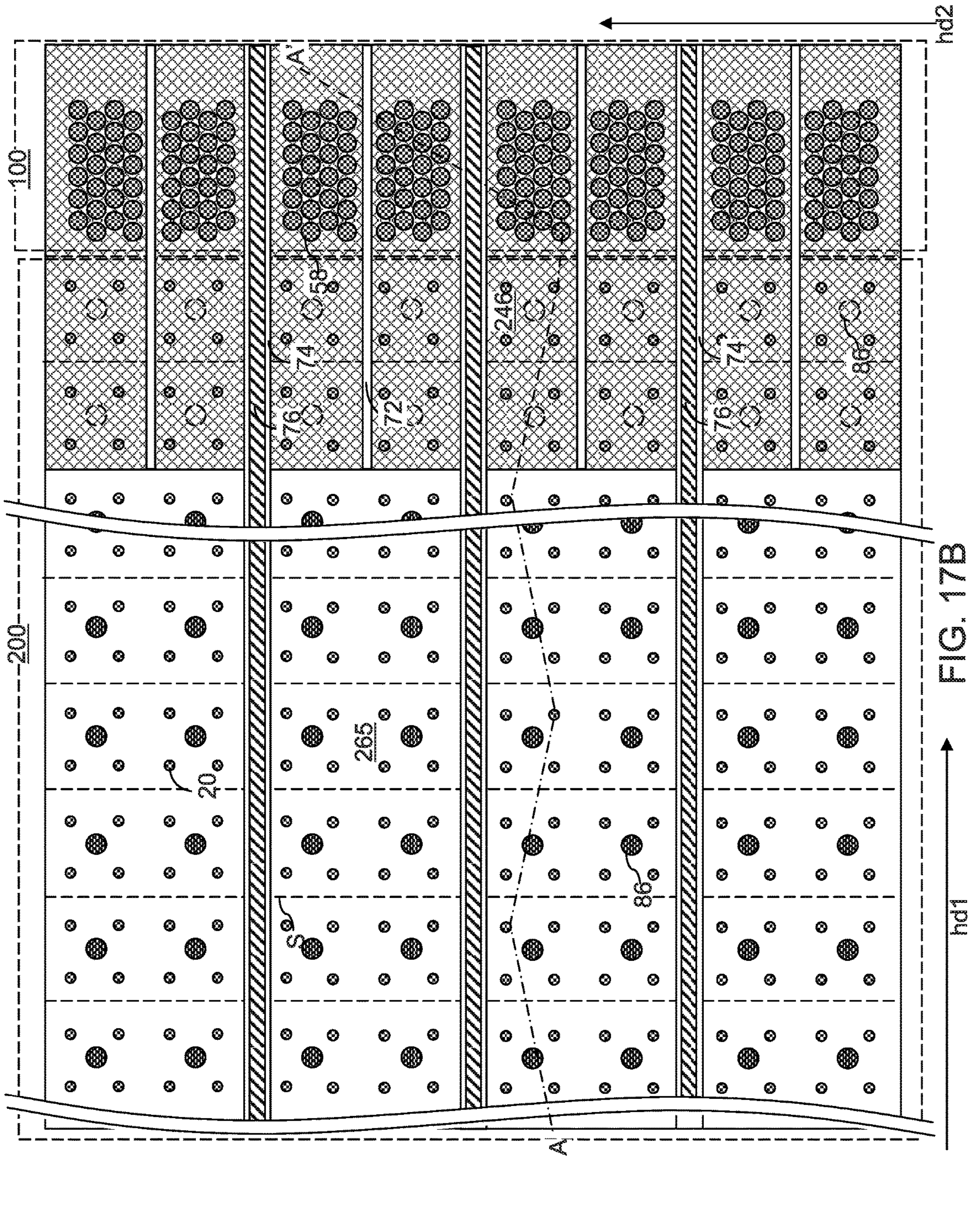
FIG. 17B is a horizontal cross-sectional view of the first exemplary structure along the vertical plane B-B' of FIG. 17A.

Referring to FIGS. 17A and 17B, a contact level dielectric layer 282 can be formed over the planarization dielectric layer 280. In one embodiment, the contact level dielectric layer 282 can include a silicon oxide material deposited by chemical vapor deposition such as tetraethylorthosilicate (TEOS) silicon oxide. The thickness of the contact level dielectric layer 282 can be in a range from 50 nm to 300 nm, although lesser and greater thicknesses can also be employed.

Drain contact via structures 88 and conductive layer contact via structures 86 are formed through the contact level dielectric layer 282, the planarization dielectric layer 280, and the second retro-stepped dielectric material portion 265. Each drain contact via structure 88 contacts a respective drain region 63. Each conductive layer contact via structure 86 contacts a respective electrically conductive layer (146, 246).

A first retro-stepped dielectric material portion 165 overlies first stepped surfaces of a first alternating stack (132, 146) of the first insulating layers 132 and the first electrically conductive layers 146. Further, a second retro-stepped dielectric material portion 265 overlies second stepped surfaces of a second alternating stack (232, 246) of the second insulating layers 232 and the second electrically conductive layers 246. Each conductive layer contact via structure 86 can extend through the second retro-stepped dielectric material portion 265. A subset of the conductive layer contact via structures 86 extends through the first retro-stepped dielectric material portion 165 and contacts a respective one of the first electrically conductive layers 146.

Figure 18:
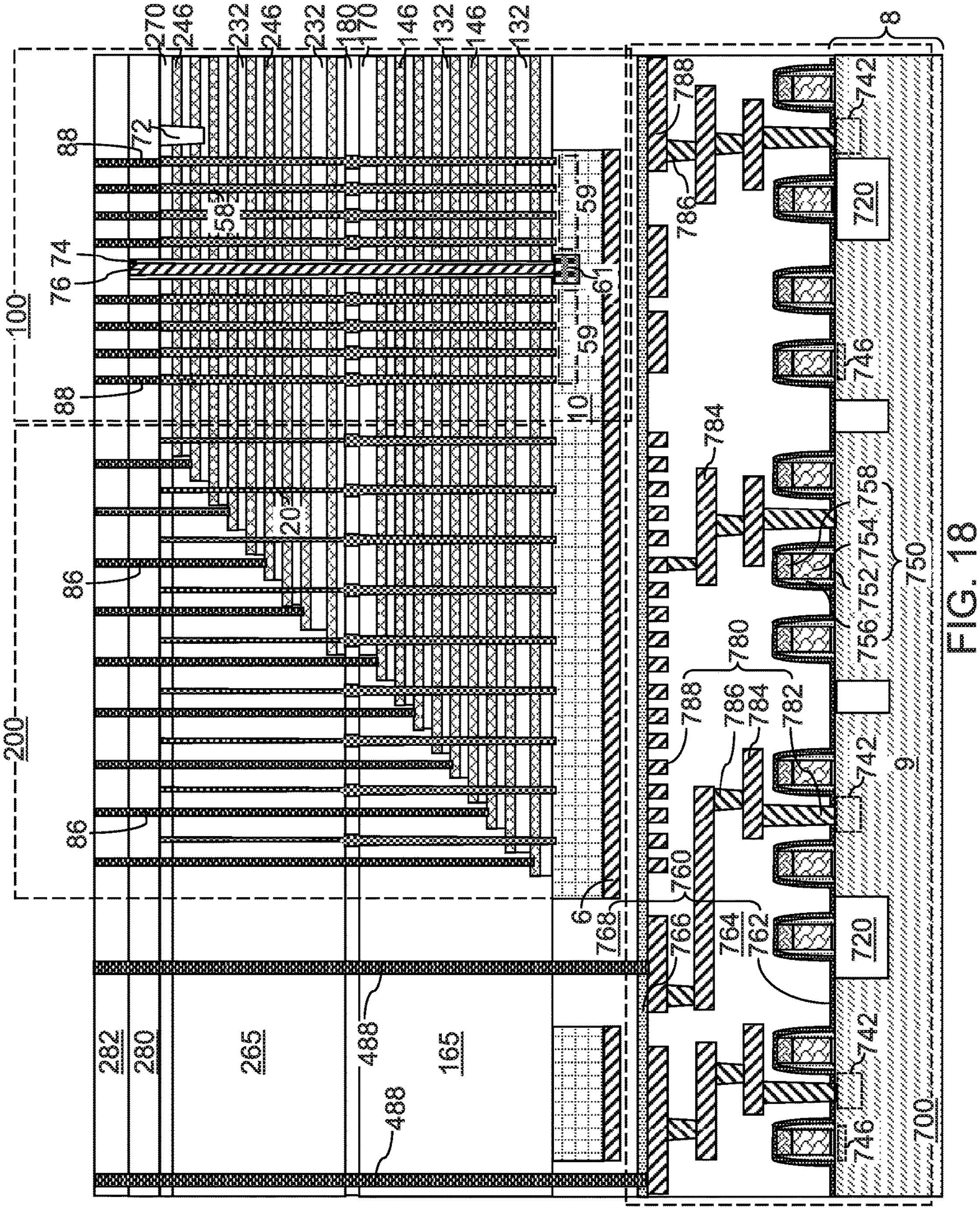
FIG. 18 is a vertical cross-sectional view of the first exemplary structure after formation of through-memory-level contact via structures according to the first embodiment of the present disclosure.

Referring to FIG. 18, peripheral-region contact via structures 488 can be formed through the contact level dielectric layer 282, the planarization dielectric layer 280, the second and first retro-stepped dielectric material portions (265, 165), and the at least one second dielectric layer 768 on a respective one of the lower metal interconnect structure 780 in the peripheral region 400.

Figure 19:
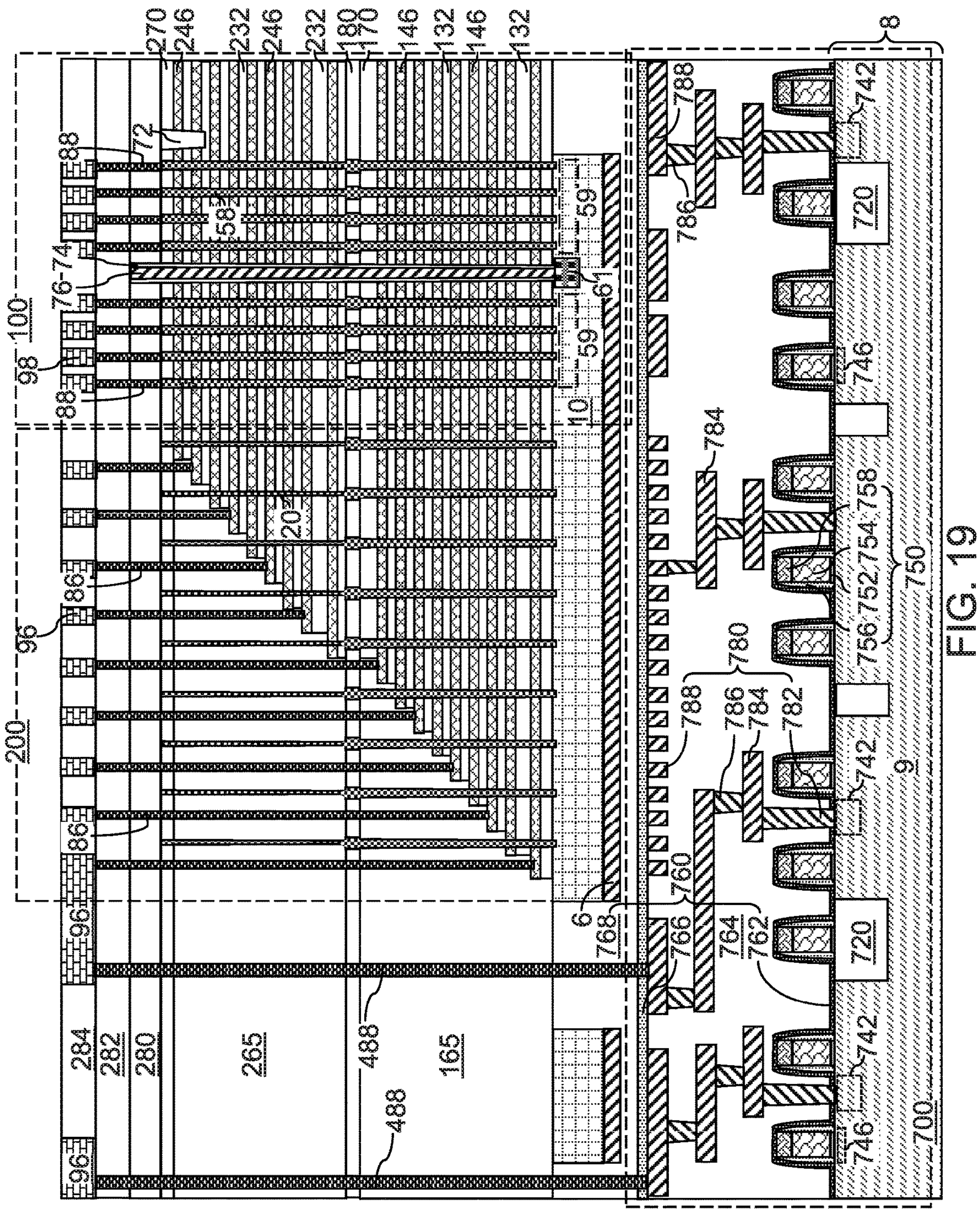
FIG. 19 is a vertical cross-sectional view of the first exemplary structure after formation of a line level dielectric layer and metal interconnect line structures according to the first embodiment of the present disclosure.

Referring to FIG. 19, at least one additional dielectric layer can be formed over the contact level dielectric layer 282, and additional metal interconnect structures (herein referred to as upper-level metal interconnect structures) can be formed in the at least one additional dielectric layer. For example, the at least one additional dielectric layer can include a line-level dielectric layer 284 that is formed over the contact level dielectric layer 282. The upper-level metal interconnect structures can include bit lines 98 contacting, or electrically shorted to, a respective one of the drain contact via structures 88, and interconnection line structures 96 contacting, and/or electrically shorted to, at least one of the conductive layer contact via structures 86 and/or the peripheral region contact via structures 488.

Figure 20:
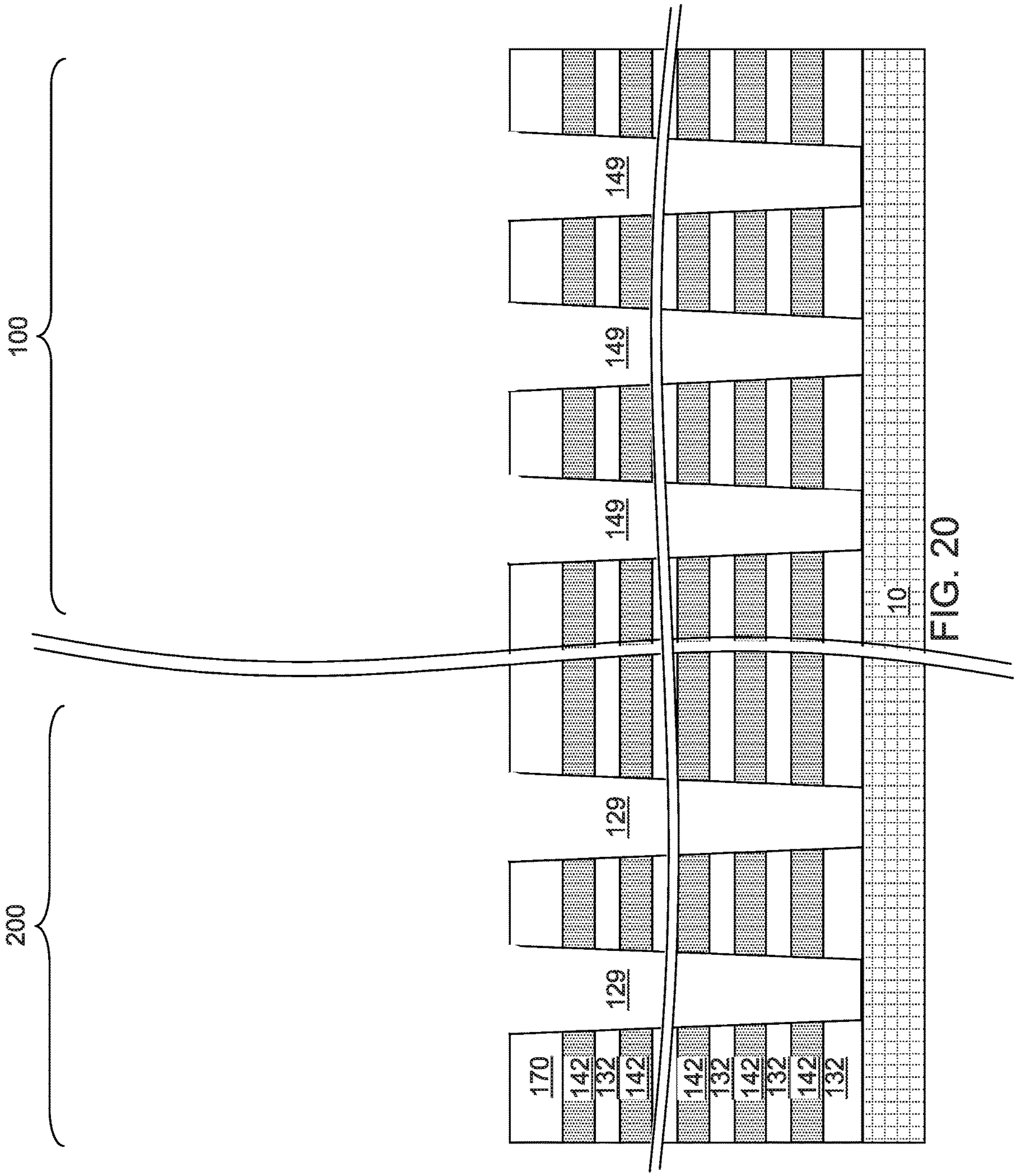
FIG. 20 is a vertical cross-sectional view of a region of a second exemplary structure after formation of first-tier memory openings and first-tier support openings according to a second embodiment of the present disclosure.

Referring to FIG. 20, a region of a second exemplary structure according to a second embodiment of the present disclosure is illustrated after formation of first-tier memory openings 149 and first-tier support openings 129. The second exemplary structure illustrated in FIG. 20 can be derived from the first exemplary structure of FIG. 3 by omitting the processing step for deposition of the inter-tier dielectric material layer 180, and by performing the processing steps of FIGS. 4A-4C of the first exemplary structure.

Figure 21:
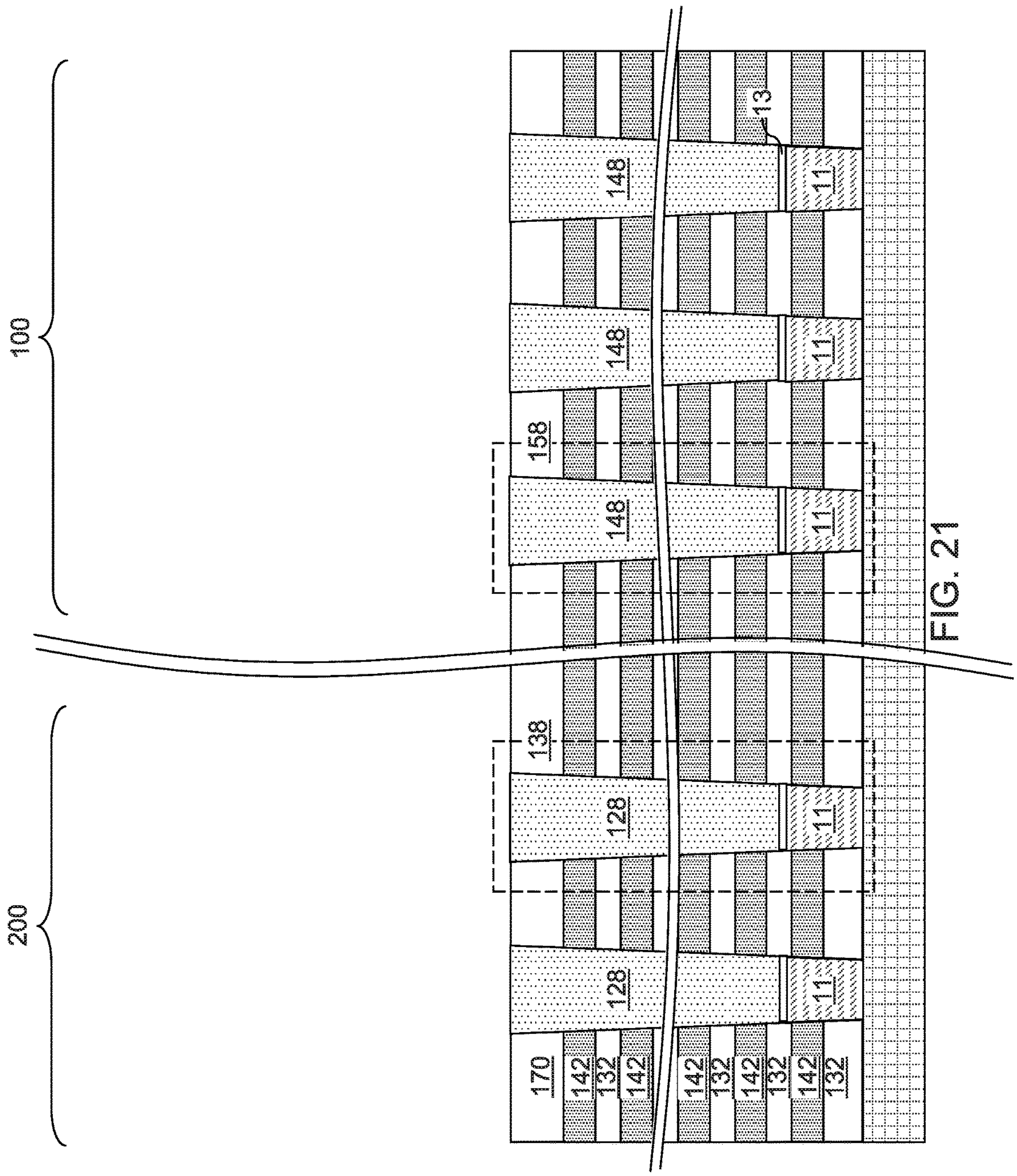
FIG. 21 is a vertical cross-sectional view of a region of the second exemplary structure after formatting of first-tier memory opening fill structures and first-tier support opening fill structures according to the second embodiment of the present disclosure.

Referring to FIG. 21, the selective semiconductor deposition process of FIG. 5 is performed without performing the isotropic etch process of FIG. 5. Thus, a selective semiconductor deposition process can be performed to grow pedestal channel portions 11 from the semiconductor surfaces at the bottom of the first-tier memory openings 149 and the first-tier support openings 129. Optionally, a thermal oxidation process or a plasma oxidation process can be performed to oxidize a surface portion of each pedestal channel portion 11, thereby converting the surface portion into a respective semiconductor oxide plate 13. The thickness of the semiconductor oxide plate 13 can be in a range from 1 nm to 6 nm, although lesser and greater thicknesses can also be employed.

Subsequently, the processing steps of FIGS. 6A and 6B can be performed to form first-tier opening fill portions (148, 128) in the various first-tier openings (149, 129). A first-tier memory opening fill portion 148 is formed in each first-tier memory opening 149. A first-tier support opening fill portion 128 is formed in each first-tier support opening 129. The various first-tier opening fill portions (148, 128) are concurrently formed, i.e., during a same set of processes including the deposition process that deposits the first-tier fill material and the planarization process that removes the first-tier deposition process from above the first alternating stack (132, 142) (such as from above the top surface of the first insulating cap layer 170).

Each contiguous set of a pedestal channel portion 11, a semiconductor oxide plate 13, and a first-tier memory opening fill portion 148 constitutes a first-tier memory opening fill structure 158. Each contiguous set of a pedestal channel portion 11, a semiconductor oxide plate 13, and a first-tier support opening fill portion 128 constitutes a first-tier support opening fill structure 138. The first-tier memory opening fill structures 158 and the first-tier support opening fill structures 138 are collectively referred to as first-tier opening fill structures (158, 138).

Figure 22:
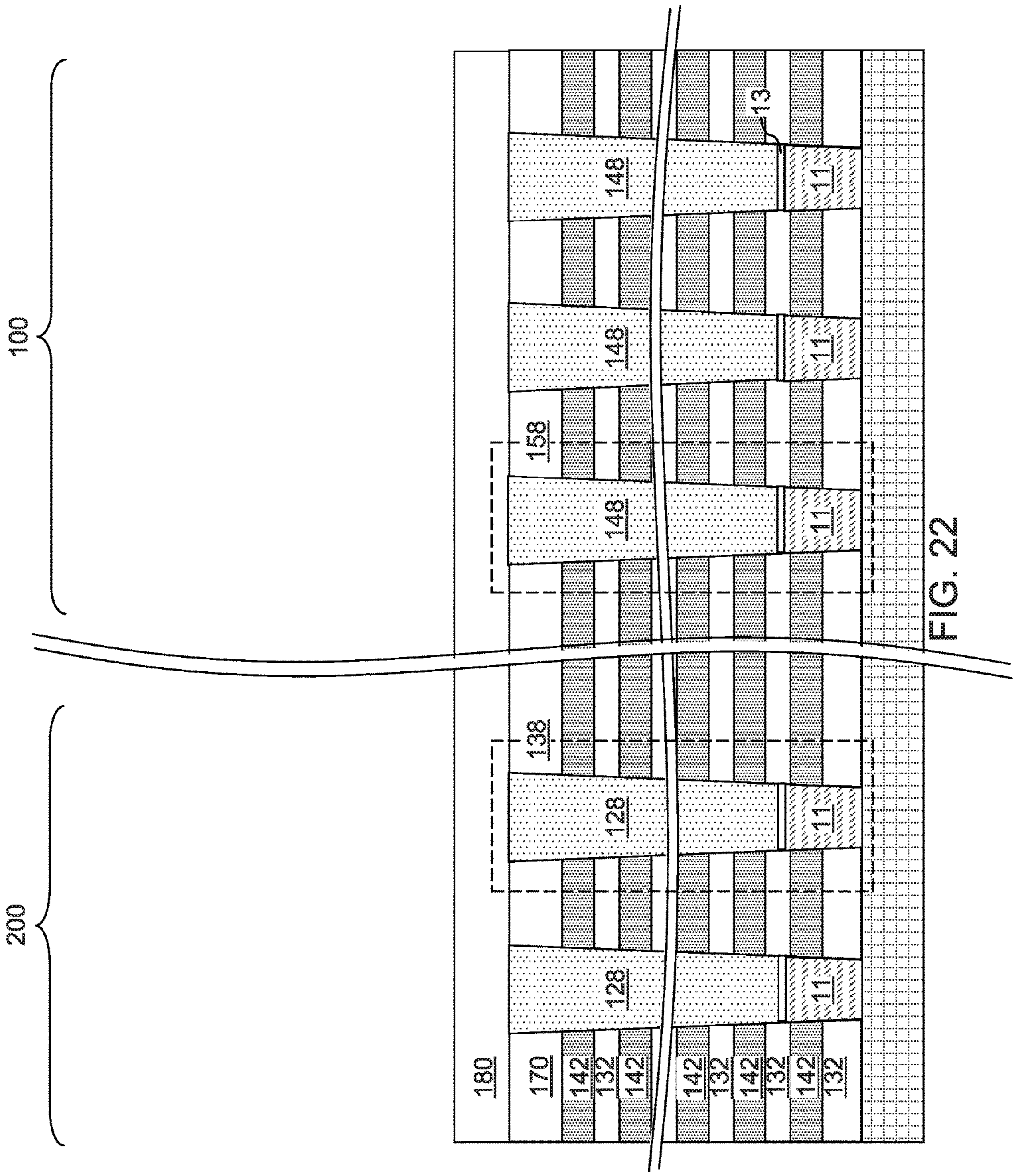
FIG. 22 is a vertical cross-sectional view of a region of the second exemplary structure after formatting of an inter-tier dielectric layer according to the second embodiment of the present disclosure.
Figure 23A:
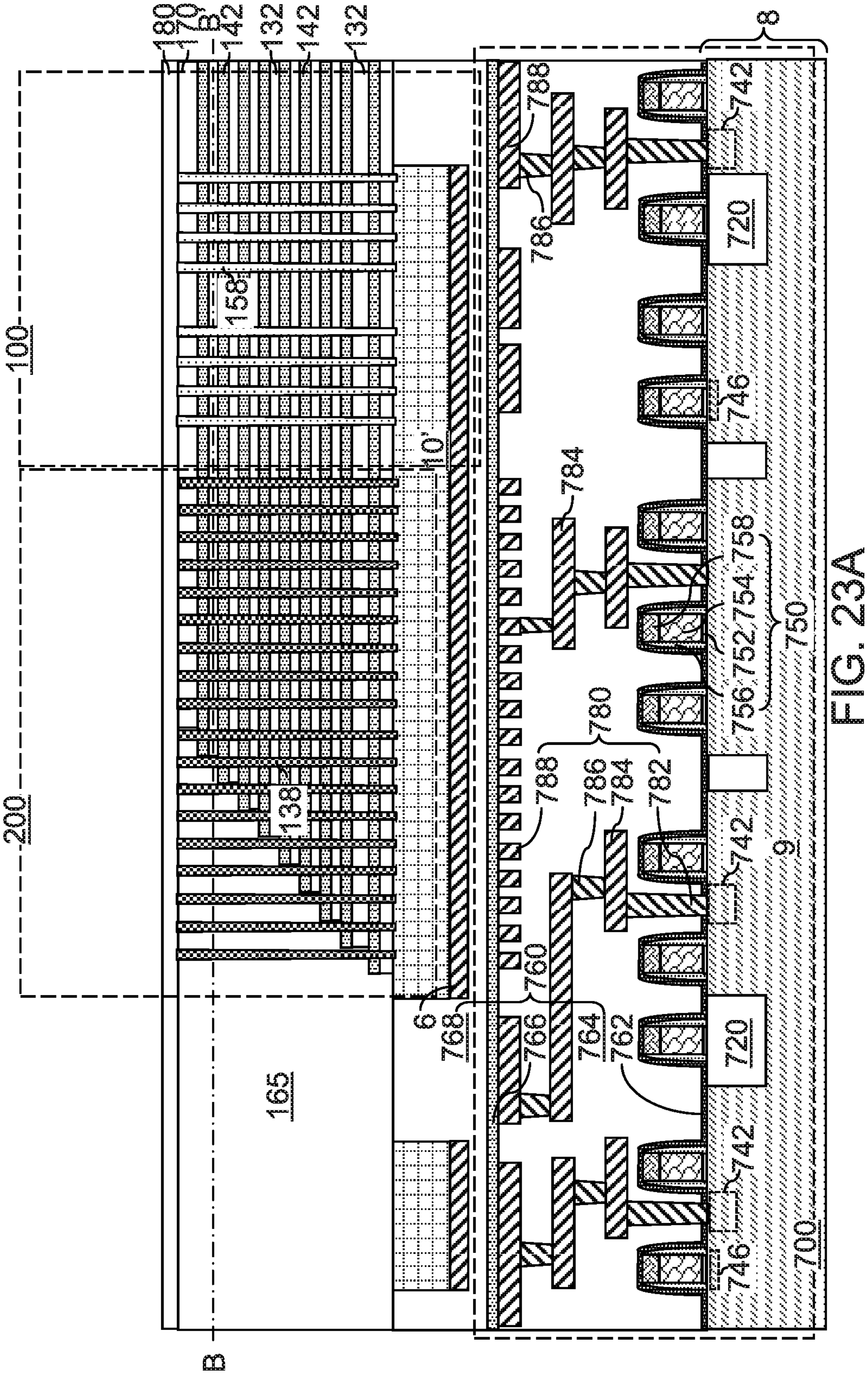
FIG. 23A is a vertical cross-sectional view of the second exemplary structure at the processing steps of FIG. 22.
Figure 23B:
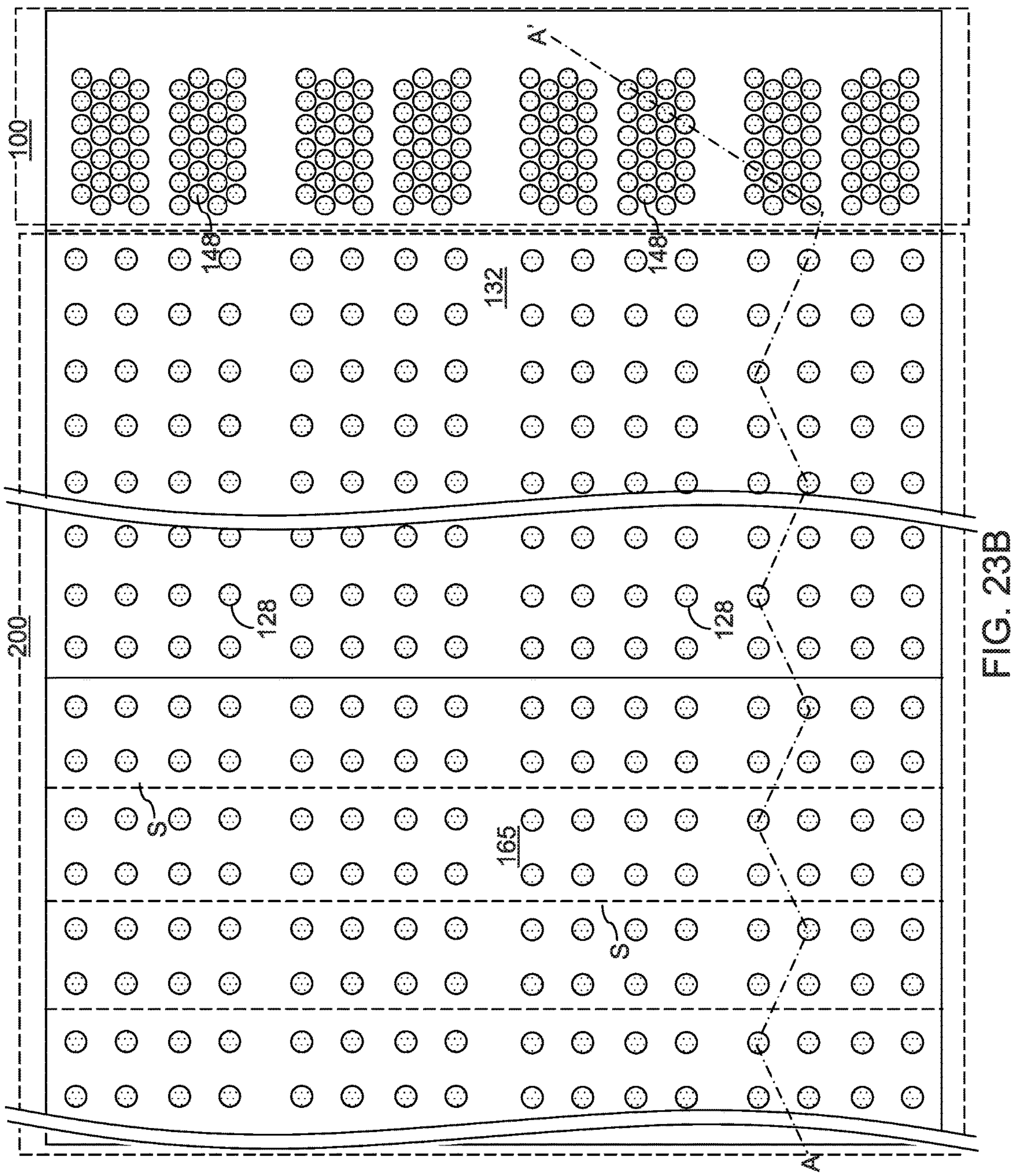
FIG. 23B is a horizontal cross-sectional view of the second exemplary structure along the horizontal plane B-B' of FIG. 23A.

Referring to FIGS. 22, 23A, and 23B, an inter-tier dielectric layer 180 can be deposited over the first-tier structure (132, 142, 170, 165). The inter-tier dielectric layer 180 includes a dielectric material such as silicon oxide. In one embodiment, the inter-tier dielectric layer 180 can include a densified undoped silicate glass. In one embodiment, the etch rate of the dielectric material of the inter-tier dielectric layer 180 of the second embodiment in dilute hydrofluoric acid, i.e., 49% hydrofluoric acid that is subsequently diluted in deionized water by 100:1 dilution) can be not greater than 120% the etch rate of the material of the first insulating layers 132 (which can include an undoped silicate glass) in dilute hydrofluoric acid. In one embodiment, the etch rate of the dielectric material of the inter-tier dielectric layer 180 of the second embodiment in dilute hydrofluoric acid, i.e., 49% hydrofluoric acid that is subsequently diluted in deionized water by 100:1 dilution) can be not greater than 300% of the etch rate of thermal silicon oxide in dilute hydrofluoric acid. Thus, the inter-tier dielectric layer 180 of the second embodiment can include a silicon oxide material that can subsequently function as an effective etch stop material during an anisotropic etch process. The thickness of the inter-tier dielectric layer 180 can be in a range from 30 nm to 300 nm, although lesser and greater thicknesses can also be employed.

Figure 24A:
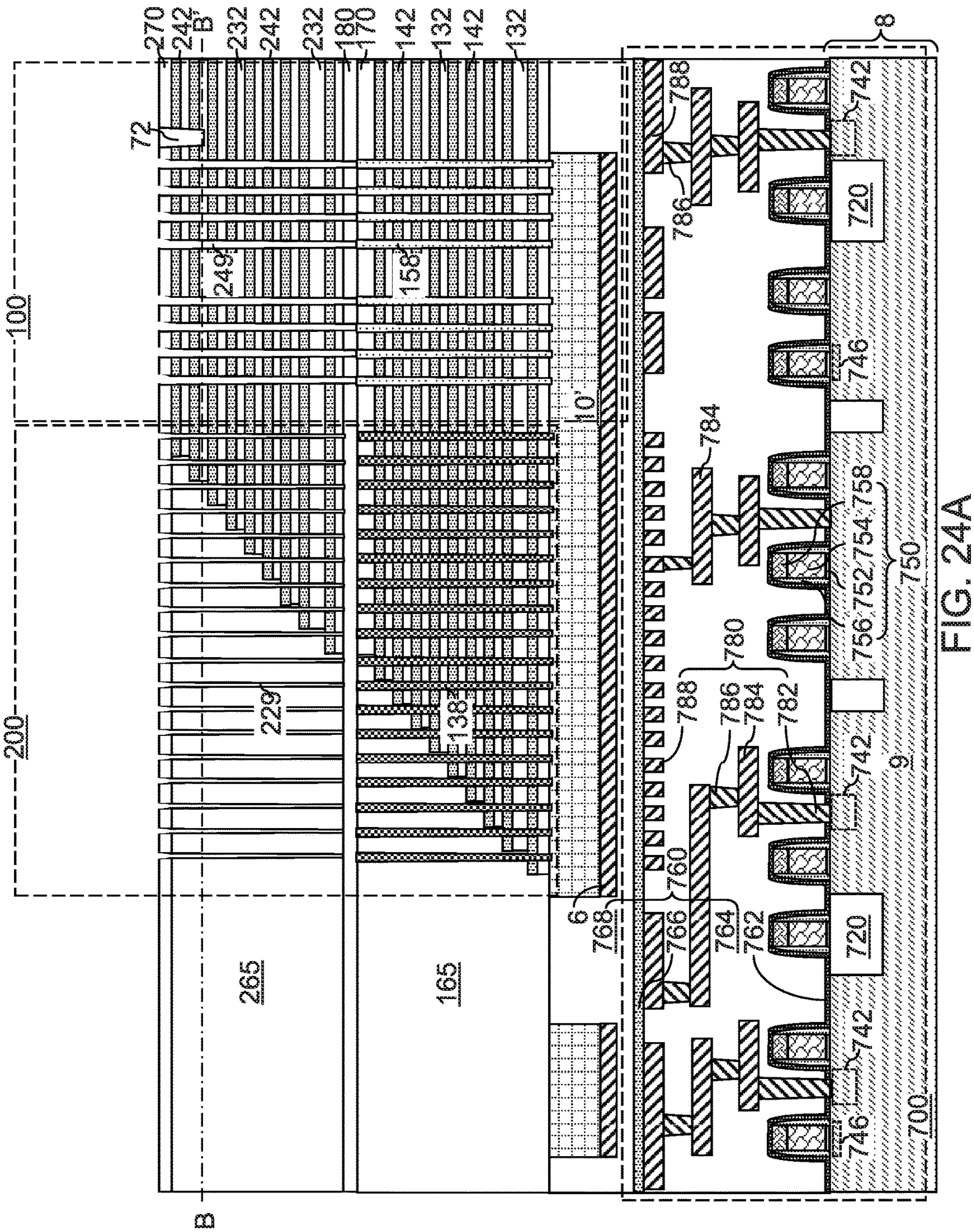
FIG. 24A is a vertical cross-sectional view of the second exemplary structure after formation of a second alternating stack of second insulating layers and second sacrificial material layers, a second retro-stepped dielectric material portion, a second insulating cap layer, dielectric isolation structures, second-tier memory openings, and second-tier support openings according to the second embodiment of the present disclosure.
Figure 24B:
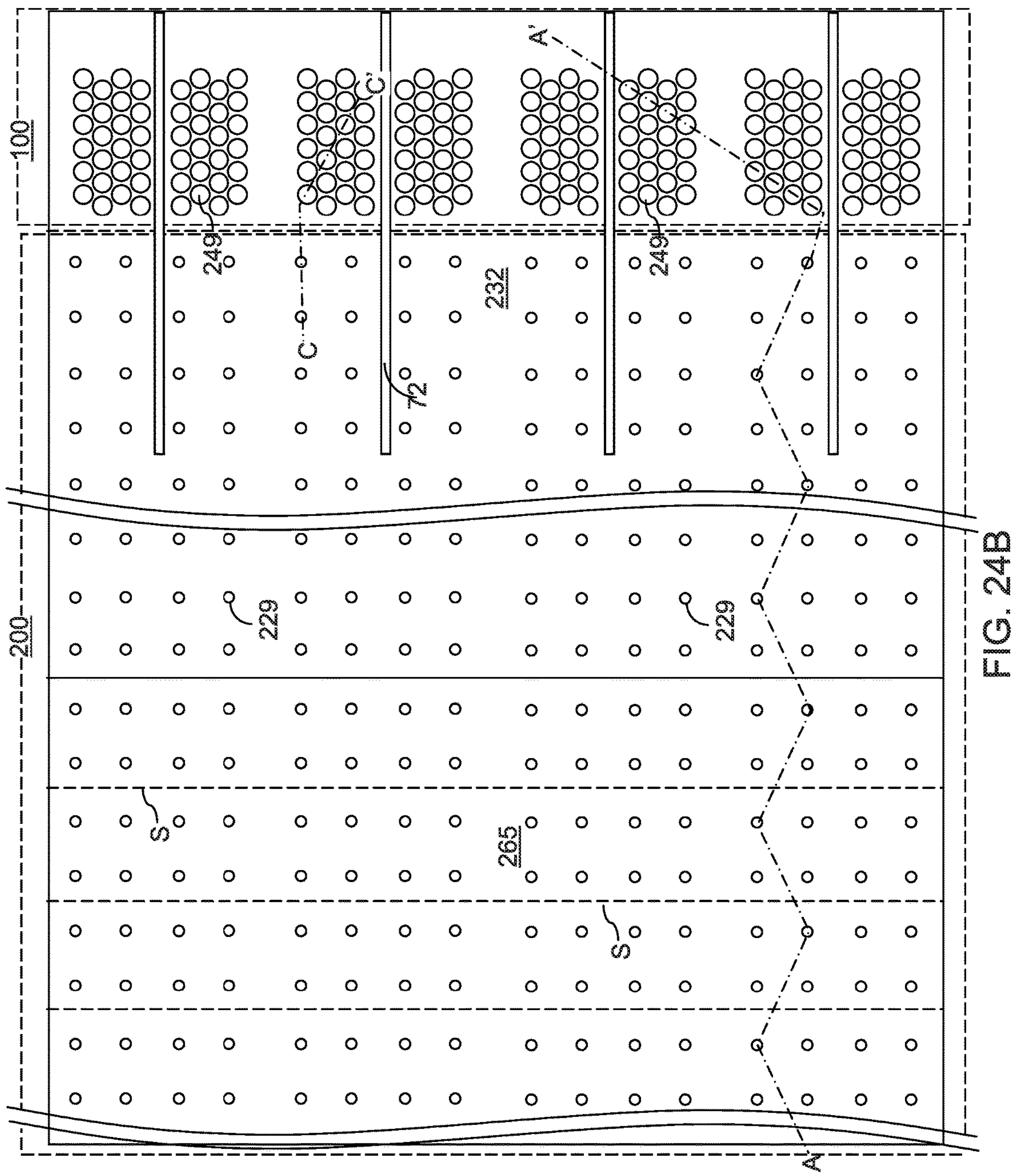
FIG. 24B is a horizontal cross-sectional view of the second exemplary structure along the horizontal plane B-B' of FIG. 24A. The zig-zag vertical plane A-A' is the plane of the vertical cross-sectional view of FIG. 24A.
Figure 24C:
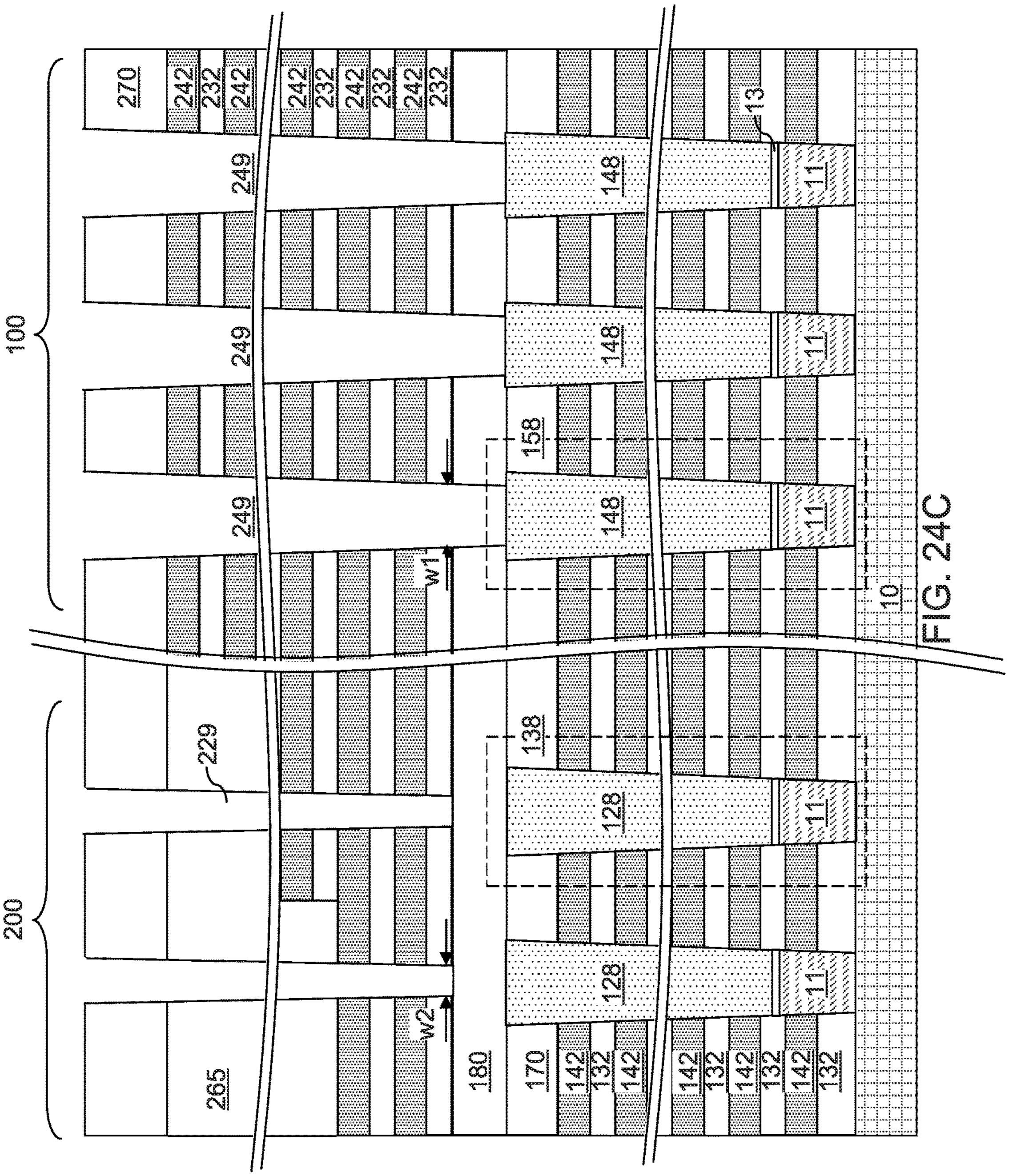
FIG. 24C is a vertical cross-sectional view of the second exemplary structure along the vertical plane C-C' of FIG. 24B.

Referring to FIGS. 24A-24C, the processing steps of FIG. 7 can be performed to form a second alternating stack of second insulating layers 232 and second sacrificial material layers 242, a second retro-stepped dielectric material portion 276, a second insulating cap layer 270, and dielectric isolation structures 72.

Subsequently, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings in the patterned photoresist layer is different from the pattern of the various first-tier openings (149, 129) by the ratio of a maximum lateral dimension of openings overlying the first-tier support opening fill structures 138 to a maximum lateral dimension of openings overlying the first-tier memory opening fill structures 158. Specifically, the ratio of the maximum lateral dimension of openings overlying the first-tier support opening fill structures 138 to the maximum lateral dimension of openings overlying the first-tier memory opening fill structures 158 is less than 1.0, and may be in a range from 0.1 to 0.9 (i.e., from 10% to 90%), such as from 0.15 to 0.6, although lesser and greater ratios can also be employed.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229. The second-tier memory openings 249 are formed in the memory array region 100, and the second-tier support openings 229 are formed in the contact region 200.

The chemistry of the anisotropic etch process can be selected such that the efficiency of the anisotropic etch process depends on availability of etchant ions. Specifically, the anisotropic etch process is performed in a process regime in which the supply of etchant ions is limited, and the depth of the second-tier openings (249, 229) is greater for openings having greater lateral dimensions. Specifically, the openings in the photoresist layer for forming the second-tier memory openings 249 have a first shape (such as a circular shape) with a first maximum lateral dimension (such as the diameter), and the openings in the photoresist layer for forming the second-tier support openings 229 have a second shape (such as a circular shape) with a second maximum lateral dimension (such as the diameter) that is less than the first maximum lateral dimension. The ratio of the second maximum lateral dimension to the first maximum lateral dimension can be in a range from 0.1 to 0.9 (i.e., from 10% to 90%), such as from 0.15 to 0.6, although lesser and greater ratios can also be employed.

Through the dependence of the depth of the second-tier openings (249, 229) on the size of the openings, the second-tier memory openings 249 can be formed directly on a top surface of a respective one of the first-tier memory opening fill structures 158, while the second-tier support openings 229 do not extend through the inter-tier dielectric layer 180. A top surface of a first-tier memory opening fill structure 158 is physically exposed underneath each second-tier memory opening 249. A bottom surface of each second-tier support opening 229 is formed above the horizontal plane including the top surfaces of the first-tier support opening fill structures 138. In one embodiment, a horizontal surface (which may be a topmost surface or a recessed surface) of the inter-tier dielectric layer 180 is physically exposed underneath each second-tier support opening 229. The bottom surfaces of the second-tier support openings 229 can be formed on a top surface of, or at a recessed surface of, the inter-tier dielectric layer 180, or within the bottommost second insulating layer 232. Thus, the second-tier support openings 229 do not extend through the inter-tier dielectric layer 180, and is vertically spaced from the first-tier support opening fill structures 138 by a portion of the inter-tier dielectric layer 180.

The second anisotropic etch process can employ, for example, a series of reactive ion etch processes or a single reaction etch process (e.g., $CF_4/O_2/Ar$ etch). The sidewalls of the various second-tier openings (249, 229) can be substantially vertical, or can be tapered. The photoresist layer can be subsequently removed, for example, by ashing.

The second-tier memory opening 249 and the second-tier support opening 229 are formed through the second alternating stack (232, 242) by the anisotropic etch process. The second-tier memory openings 249 are formed over, and directly on, a respective one of the first-tier memory opening fill structures 158. The second-tier support openings 229 are formed over, and are vertically spaced from, a respective one of the first-tier support opening fill structures 138. In one embodiment, each second-tier memory opening 249 can have a first width w1 that is the maximum lateral dimension of each second-tier memory opening 249 at a horizontal plane including the bottom surface of the bottommost layer of the second alternating stack (232, 242). Each second-tier support opening 229 can have a second width w2 that is the maximum lateral dimension of each second-tier support opening 229 at the horizontal plane including the bottom surface of the bottommost layer of the second alternating stack (232, 242). The second width w2 is less than the first width w1.

In one embodiment, the ratio of the second width w2 to the first width w1 can be in a range from 0.1 to 0.9 (i.e., from 10% to 90%), such as from 0.15 to 0.6, although lesser and greater ratios can also be employed. In one embodiment, the first width w1 can be in a range from 20 nm to 300 nm, such as from 40 nm to 150 nm, although lesser and greater dimensions can also be employed. In one embodiment, each of the second-tier openings (249, 229) can have a respective circular horizontal cross-sectional shape, of which the size may monotonically increase with the vertical distance from the top surface of the planar semiconductor layer 10.

Figure 25:
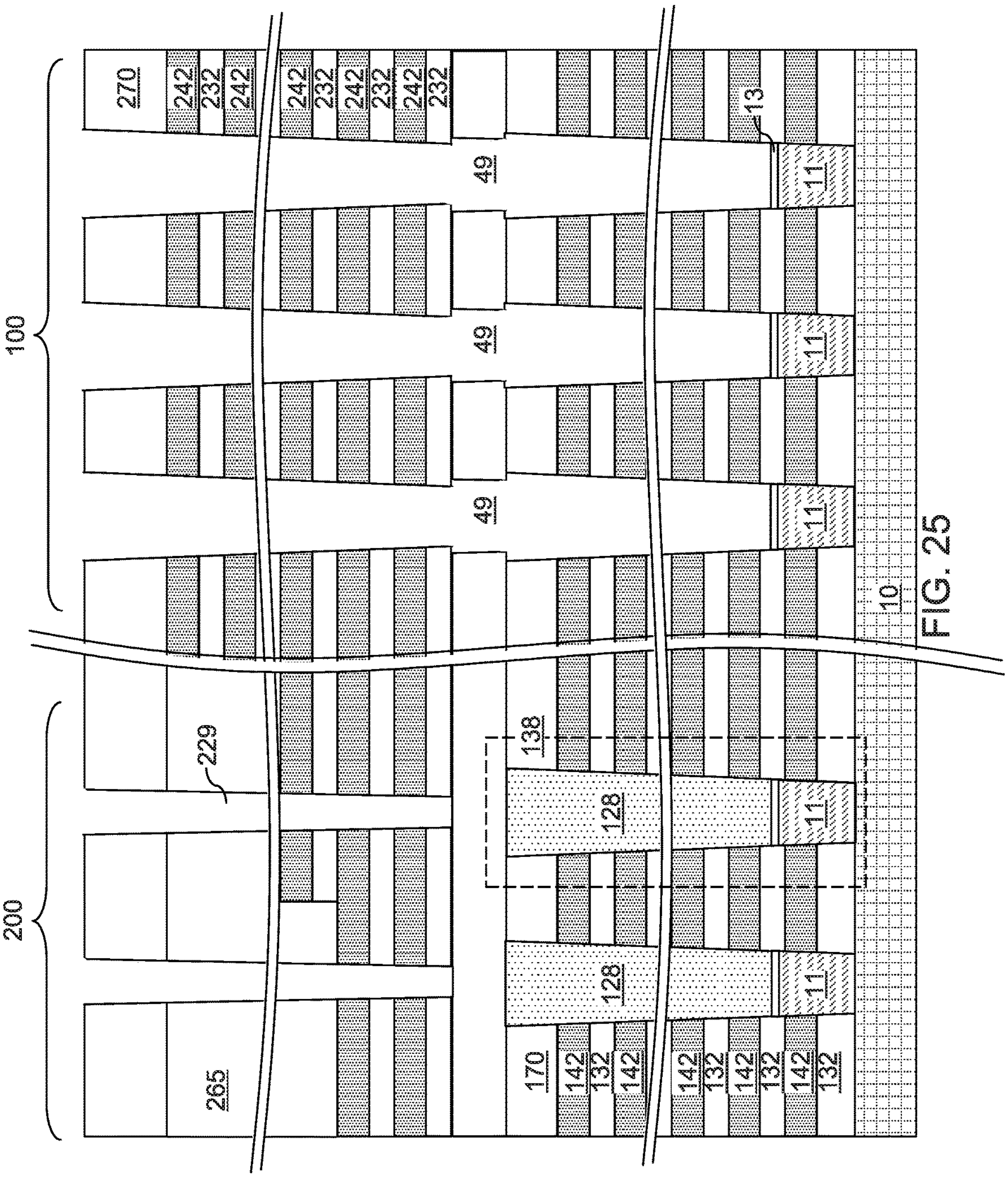
FIG. 25 is a vertical cross-sectional view of a region of the second exemplary structure after formation of inter-tier memory openings according to the second embodiment of the present disclosure.

Referring to FIG. 25, an etch process concurrently applies an etchant that etches a material of the first-tier memory opening fill structures 158 (e.g., the first-tier fill material) into the second-tier memory openings 249 and into the second-tier support openings 229. Specifically, the etch process etches the first-tier fill material selective to the materials of the first and second insulating layers (132, 232), the first and second sacrificial material layers (142,242), the first and second insulating cap layers (170, 270), and the inter-tier dielectric layer 180. Thus, the etch process etches a material of the first-tier memory opening fill structures 158 selective to a material of the inter-tier dielectric layer 180. The chemistry of the etch process can be selected depending on the composition of the first-tier fill material. For example, if the first-tier fill material comprises amorphous silicon, a wet etch process employing hot trimethyl-2 hydroxyethyl ammonium hydroxide ("hot TMY") or tetramethyl ammonium hydroxide (TMAH) can be employed to remove the first-tier fill material. Subsequently, the semiconductor oxide plates 13 may be optionally removed by an etch process selective to the pedestal channel portions 11. For example, a wet etch employing dilute hydrofluoric acid can be performed to remove the semiconductor oxide plates 13.

A memory opening 49, which is also referred to as an inter-tier memory opening 49, is formed in each combination of a second-tier memory opening 249 and an underlying volume from which a sacrificial memory opening fill structure 148 and a semiconductor oxide plate 13 is removed. The inter-tier dielectric layer 180 blocks access to the first-tier fill material in the support opening fill structures 138. Thus, the second-tier support openings 229 are not expanded during the etch process.

Each inter-tier memory opening 49 can be formed in the memory array region 100 by removing portions of a respective first-tier memory opening fill structure 158 from underneath a respective second-tier memory opening 249. Each second-tier support openings 229 is a cavity that is formed in the contact region 200. Each inter-tier memory opening 49 includes an entire volume of a respective second-tier memory opening 249 and a predominant portion (i.e., more than 50%, which may be more than 80% and/or more than 90%) of an entire volume of a respective underlying first-tier memory opening fill structure 158. Each cavity in the contact region 200 can consist of a respective second-tier support opening 229. The inter-tier memory openings 49 and the cavities (i.e., the second-tier support openings 229) are present after the etch process. A bottom surface of each second-tier support opening 229 is located above a horizontal plane including a topmost surface of the first alternating stack (132, 142).

Figure 26:
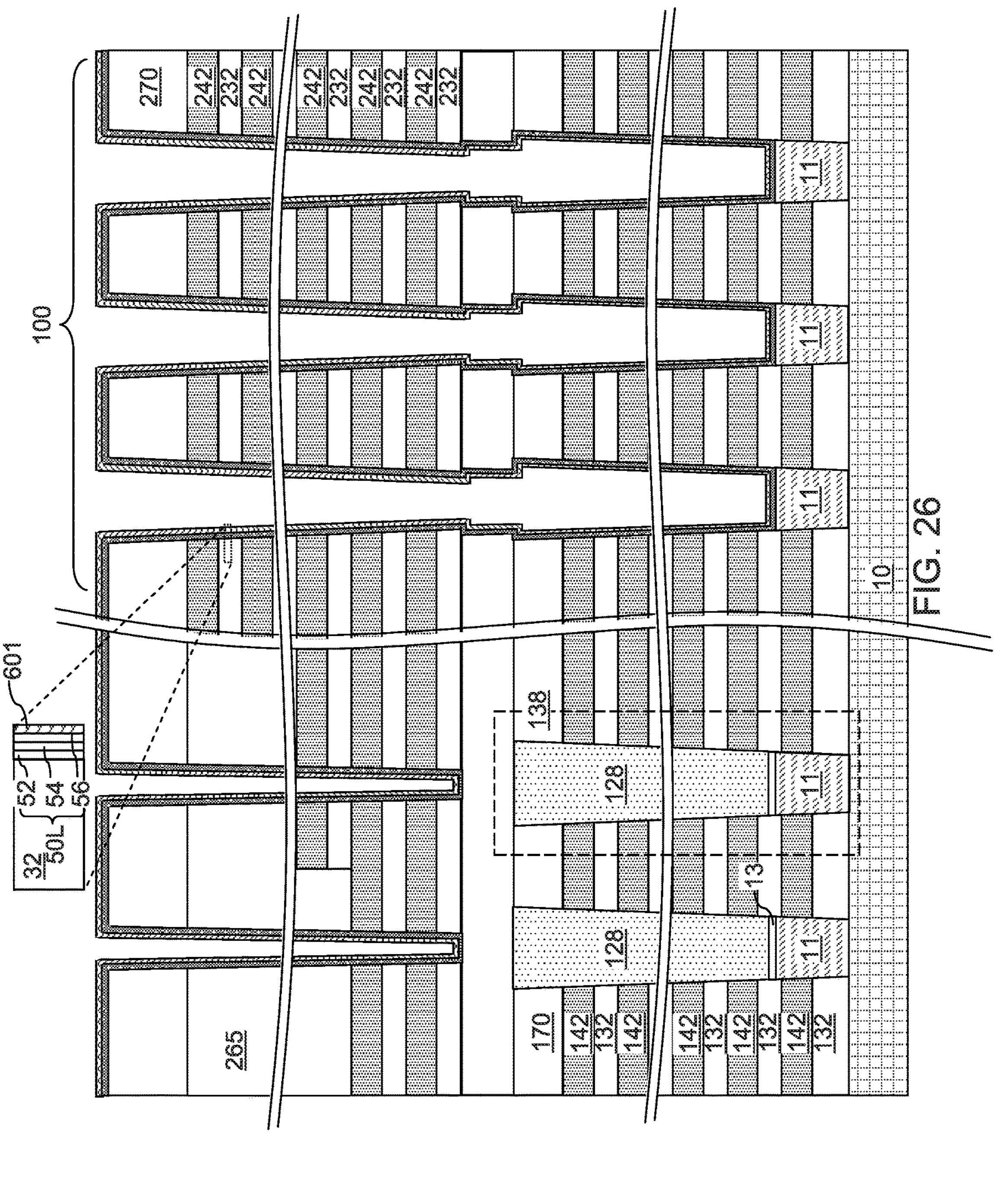
FIG. 26 is a vertical cross-sectional view of a region of the second exemplary structure after formation of a memory film layer and a semiconductor channel material layer according to the second embodiment of the present disclosure.

Referring to FIG. 26, the processing steps of FIG. 10 can be performed to form a memory film layer 50L and an optional first semiconductor channel layer 601 in the inter-tier memory openings 49 and the second-tier support openings 229 and over the second insulating cap layer 270. The memory film layer 50L and the optional first semiconductor channel layer 601 do not extend below the bottom surface of the inter-tier dielectric layer 180 in the contact region 200.

Figure 27:
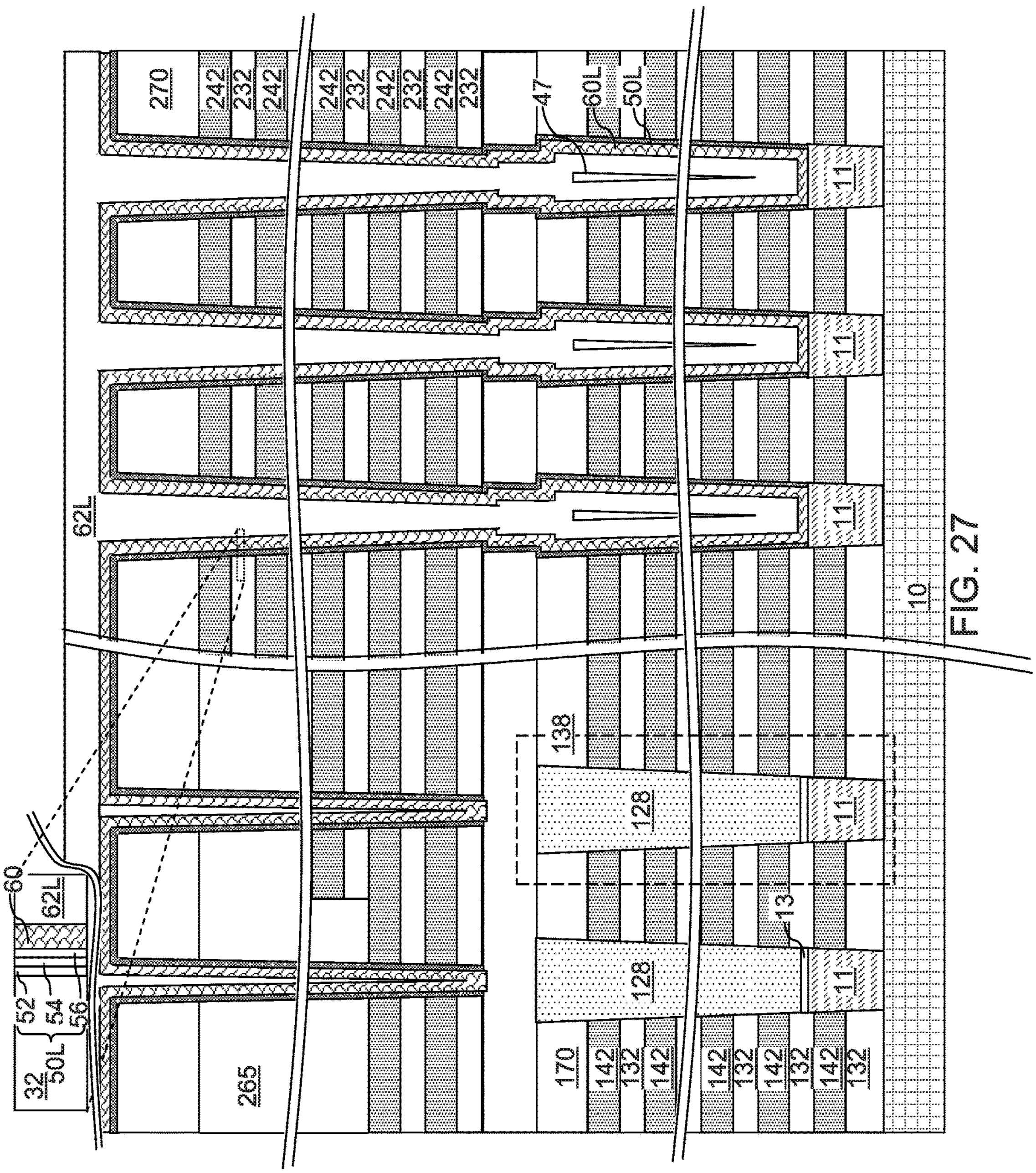
FIG. 27 is a vertical cross-sectional view of a region of the second exemplary structure after formation of a dielectric core material layer according to the second embodiment of the present disclosure.

Referring to FIG. 27, the processing steps of FIG. 11 can be performed to anisotropically etch the optional first semiconductor channel layer 601, the tunneling dielectric layer 56, the charge storage layer 54, and the blocking dielectric layer 52, and to physically expose top surfaces of the pedestal channel portions 11 (or the top surfaces of the planar semiconductor material layer in case the pedestal channel portions 11 are not present).

A second semiconductor channel layer can be deposited as in the processing steps of FIG. 11. In one embodiment, the first semiconductor channel layer 601 may be optionally removed isotropically, for example, by a wet etch process employing hot TMY prior to deposition of the second semiconductor channel layer. The second semiconductor channel layer, or the set of first semiconductor channel layer 601 and the second semiconductor channel layer in case the first semiconductor channel layer 601 is not removed, is referred to as a semiconductor channel material layer 60L. In case the memory cavity in each memory opening is not completely filled by the second semiconductor channel layer, a dielectric core layer 62L can be deposited in the memory cavity to fill any remaining portion of the memory cavity within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

An encapsulated memory cavity 47 may, or may not, be formed in each inter-tier memory opening 49 within the first alternating stack (132, 142). The encapsulated memory cavities 47 are volumes of the inter-tier memory openings 49 that are not filled with the materials of the memory film layer 50L, the semiconductor channel material layer 60L, and the dielectric core layer 62L. The memory film layer 50L and the optional first semiconductor channel layer 601 do not extend below the bottom surface of the inter-tier dielectric layer 180 in the contact region 200.

Figure 28A:
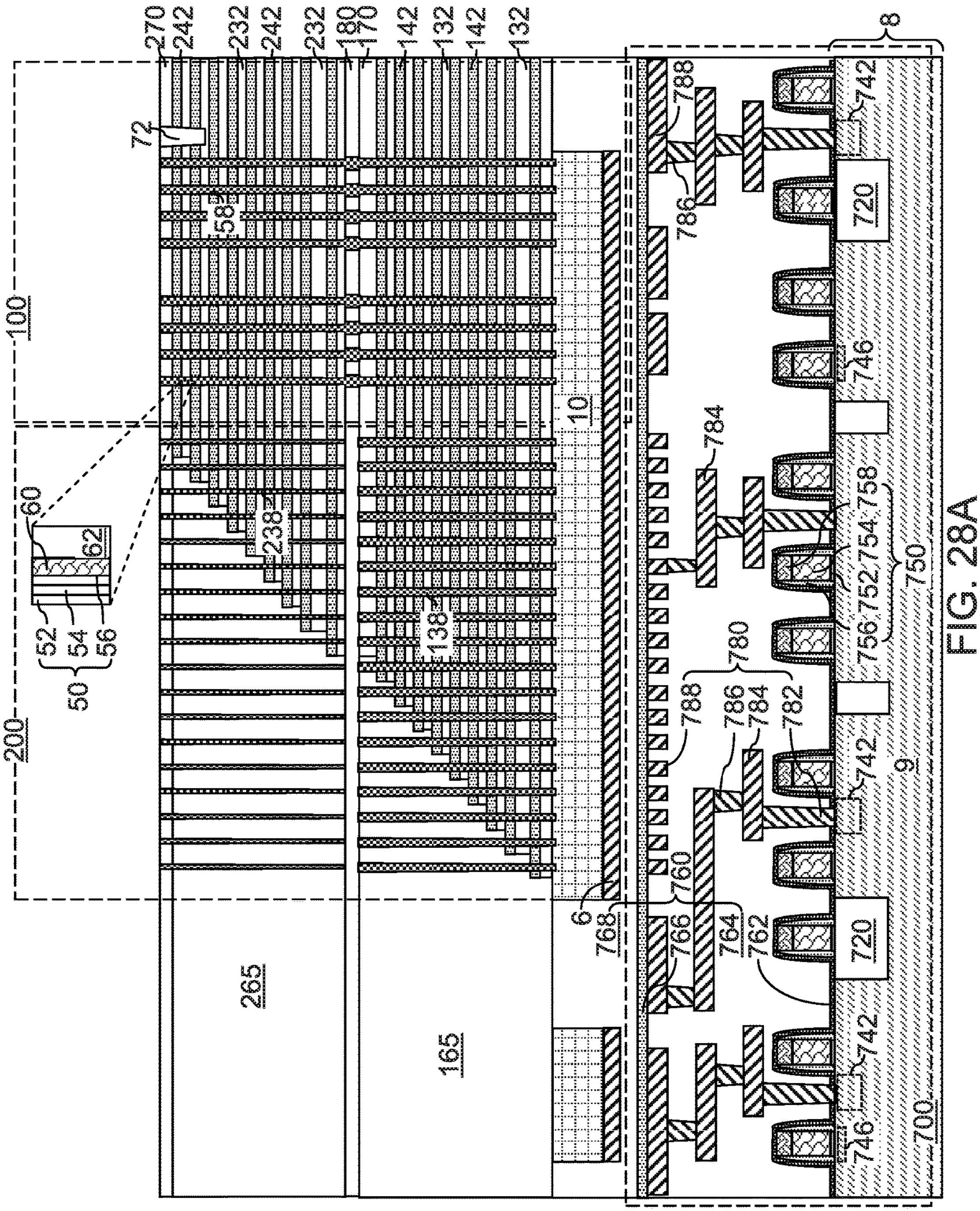
FIG. 28A is a vertical cross-sectional view of the second exemplary structure after formation of memory opening fill structures and support pillar structures according to the second embodiment of the present disclosure.
Figure 28B:
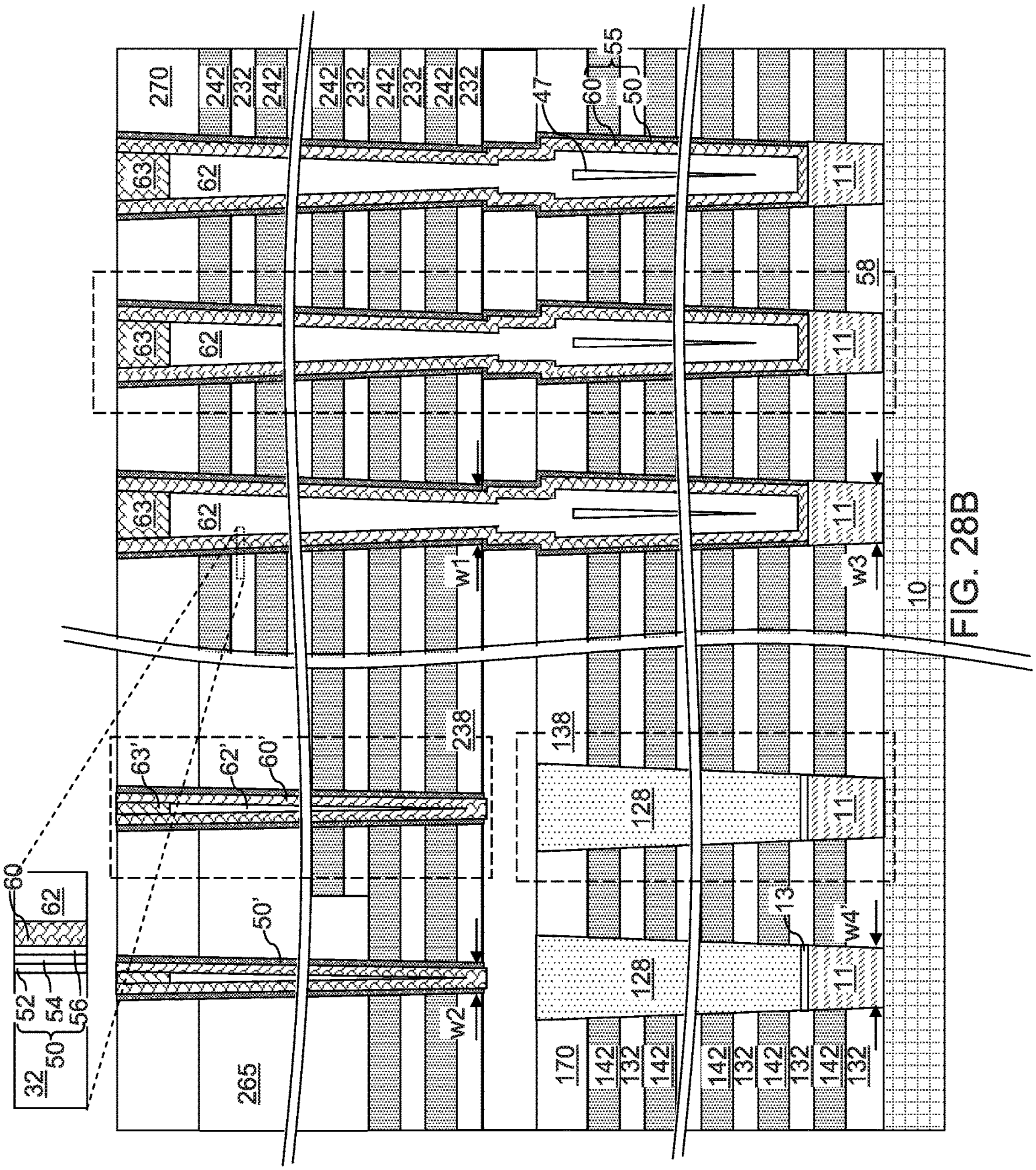
FIG. 28B is a vertical cross-sectional view of a region of the second exemplary structure of FIG. 28A.
Figure 28C:
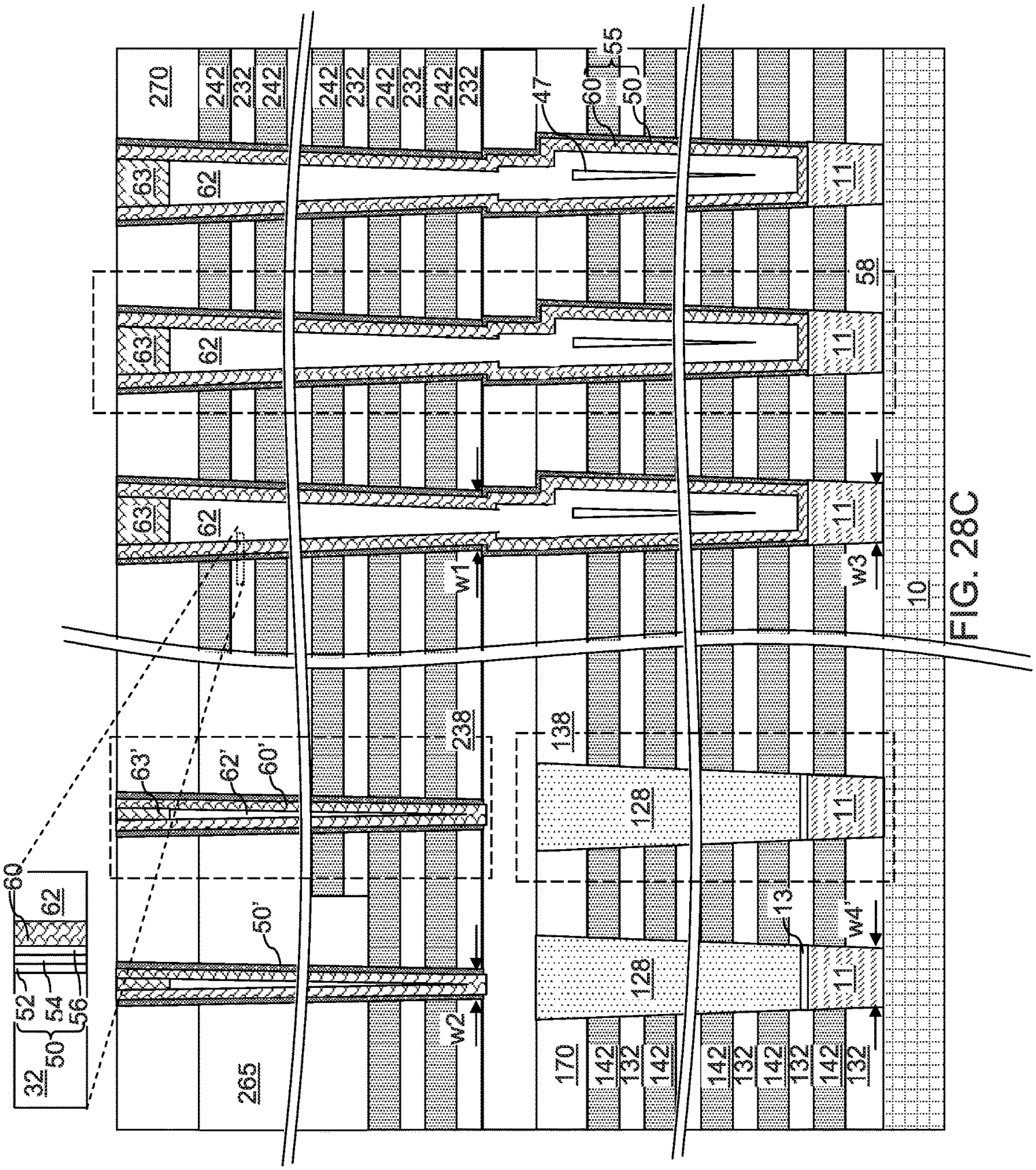
FIG. 28C is a vertical cross-sectional view of an alternative configuration of a region of the second exemplary structure of FIG. 28A in case of a non-zero overlay misalignment.

Referring to FIGS. 28A-28C, the second exemplary structure is illustrated after formation of memory opening fill structures 58 and support pillar structures 238. FIG. 28B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 28C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Specifically, the horizontal portion of the dielectric core layer 62L overlying the second insulating cap layer 270 can be removed, for example, by a recess etch from above the top surface of the second insulating cap layer 270. The material of the dielectric core layer 62L can be further recessed within each inter-tier memory opening 49, for example, by a recess etch to a height between the horizontal plane including the top surface of the second insulating cap layer 270 and the horizontal plane including the bottom surface of the second insulating cap layer 270. Recessed top surfaces of the remaining portions of the dielectric core layer 62 is formed between the horizontal plane including the top surface of the second insulating cap layer 270 and the horizontal plane including the bottom surface of the second insulating cap layer 270. Each remaining portion of the dielectric core layer 62L constitutes a dielectric core 62.

Horizontal portion of the second semiconductor channel layer located above the top surfaces of the dielectric cores 62 can be removed by an etch process, which may be an isotropic etch process such as a wet etch process or an anisotropic etch process such as a reactive ion etch process. Each remaining portion of the second semiconductor channel layer, or each contiguous pair of a remaining portion of the second semiconductor channel layer and a remaining portion of the first semiconductor channel layer 601 in case any portion of the first semiconductor channel layer remains, constitutes a vertical semiconductor channel 60, through which electrical current can flow when a vertical NAND device including the vertical semiconductor channel 60 is turned on. Alternatively, the first semiconductor channel layer 601 can be removed, for example, by a wet etch employing hot TMY, and each vertical semiconductor channel 60 can consist of remaining portions of the second semiconductor channel layer. In this case, the semiconductor oxide plate 13 can prevent, or minimize, collateral etching of the pedestal channel portions 11.

Horizontal portions of the memory film layer 50L overlying the second insulating cap layer 270 can be subsequently removed, for example, by an anisotropic etch process. Each remaining portion of the memory film layer 50L located within the inter-tier memory openings 49 and the second-tier support openings 229 constitutes a memory film 50 or a dummy memory film 50'. Each memory film 50 and each dummy memory film 50' can include a layer stack of a blocking dielectric layer 52, a charge storage layer 54, and a tunneling dielectric layer 56. Each tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 in an inter-tier memory opening 49 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within each inter-tier memory opening 49 is herein referred to as a memory opening fill structure 58. Each combination of a dummy memory film 50', a dummy semiconductor channel 60' (that has the same composition as the vertical semiconductor channels 60), a support dielectric core 62' (that has the same composition as the dielectric cores 62), and a dummy drain region 63' (that has the same composition as the drain regions 63) within each second-tier support opening 229 constitutes a support pillar structure 238.

Generally, each of the inter-tier memory openings 49 and cavities in the contact region 200 (i.e., the second-tier support openings 229) is filled with fill material portions (50L, 60L, 62L). Regions of the fill material portions (50L, 60L, 62L) are removed from above a horizontal plane overlying the second alternating stack (232, 242), such as the horizontal plane including the top surface of the second insulating cap layer 270, by a planarization process. Remaining portions of the fill material portions (50L, 60L, 62L) in the inter-tier memory openings 49 comprise the memory stack structures 55 after the planarization process. A support pillar structure 238 including remaining portions of the fill material portions (50L, 60L, 62L) is present in each cavity in the contact region 200, i.e., in each second-tier support opening 229, after the planarization process. Each support pillar structure 238 extends through the second retro-stepped dielectric material portion 265. In one embodiment, a top surface of each support pillar structure 238 can be formed within a same horizontal plane as the top surfaces of the memory opening fill structures 58. In one embodiment, the support pillar structures 238 can be located entirely above a topmost surface of the first alternating stack (132, 142).

Each memory opening fill structure 58 extends through all layers within the second alternating stack (232, 242) and the first alternating stack (132, 142). Each memory opening fill structure 58 comprises a vertical semiconductor channel 60 and a memory film 50, and has a first width w1 that is a maximum lateral dimension of the memory stack structure 55 at a horizontal plane including a bottom surface of a bottommost layer of the second alternating stack (232, 242) such as the bottommost second insulating layer 232.

Each support pillar structure 238 extends through each layer within the second alternating stack (232, 242) and includes a dummy semiconductor channel 60' having a same material composition as the semiconductor channels 60, and has a second width w2 that is a maximum lateral dimension of the support pillar structure 238 at the horizontal plane including the bottom surface of the bottommost layer of the second alternating stack (232, 242). The second width w2 is less than the first width w1.

Each memory film 50 can comprise a layer stack including a tunneling dielectric layer 56, a charge storage layer 54, and a blocking dielectric layer 52. Each support pillar structure 238 can comprise a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

In one embodiment, each memory opening fill structure 58 can have a third width w3 that is a maximum lateral dimension of the memory stack structure at a horizontal plane including a bottom surface of a bottommost layer of the first alternating stack (132, 142). Each first-tier support opening fill structure 138 can have a fourth width w4 that is a maximum lateral dimension of the first-tier support opening fill structure 138 at the horizontal plane including the bottom surface of the bottommost layer of the first alternating stack (132, 142). The ratio of the second width w2 to the fourth width w4 is less than the ratio of the first width w1 to the third width w3. For example, the ratio of the first width w1 to the third width w3 may be in a range from 0.8 to 1.2, and the ratio of the second width w2 to the fourth width w4 may be in a range from 0.1 to 0.9, such as from 0.1 to 0.8.

The bottommost surface of each support pillar structure 238 is located above the horizontal plane including the topmost surface of the first alternating stack (132, 142). The dummy semiconductor channel 60' and the dummy memory film 50' within each support pillar structure 238 overlie the first alternating stack (132, 142), and do not extend through any of the first sacrificial material layers 142 within the first alternating stack (132, 142). Each first-tier support opening fill structure 138 is a support pillar structure located within the first-tier structure, and is henceforth referred to as a first-tier support pillar structure 138. Each first-tier support pillar structure 138 underlies a respective support pillar structure 238. Each first-tier support pillar structure 38 extends through the first alternating stack (132, 142), has a partial areal overlap with an overlying support pillar structure 238 in a plan view (i.e., a view along a direction perpendicular to the top surface of the planar semiconductor material layer 10), and is not in direct contact with the overlying support pillar structure 238.

The inter-tier dielectric layer 180 is located between the overlying support pillar structure 238 and the first-tier support pillar structure 138. The first-tier support opening fill portions 128 may include a semiconductor material (such as amorphous silicon or polysilicon) or a dielectric material (such as borosilicate glass or organosilicate glass). In one embodiment, the first-tier support pillar structure 138 comprises a dielectric material portion (such as a first-tier support opening fill portions 128) that contacts sidewalls of a subset of the first insulating layers 32 of the first alternating stack (132, 142) and contacts a bottom surface of the inter-tier dielectric layer 180. In one embodiment, the support pillar structures 238 can be vertically spaced from the horizontal plane including the top surfaces of the first-tier support opening fill structures 138.

Figure 29A:
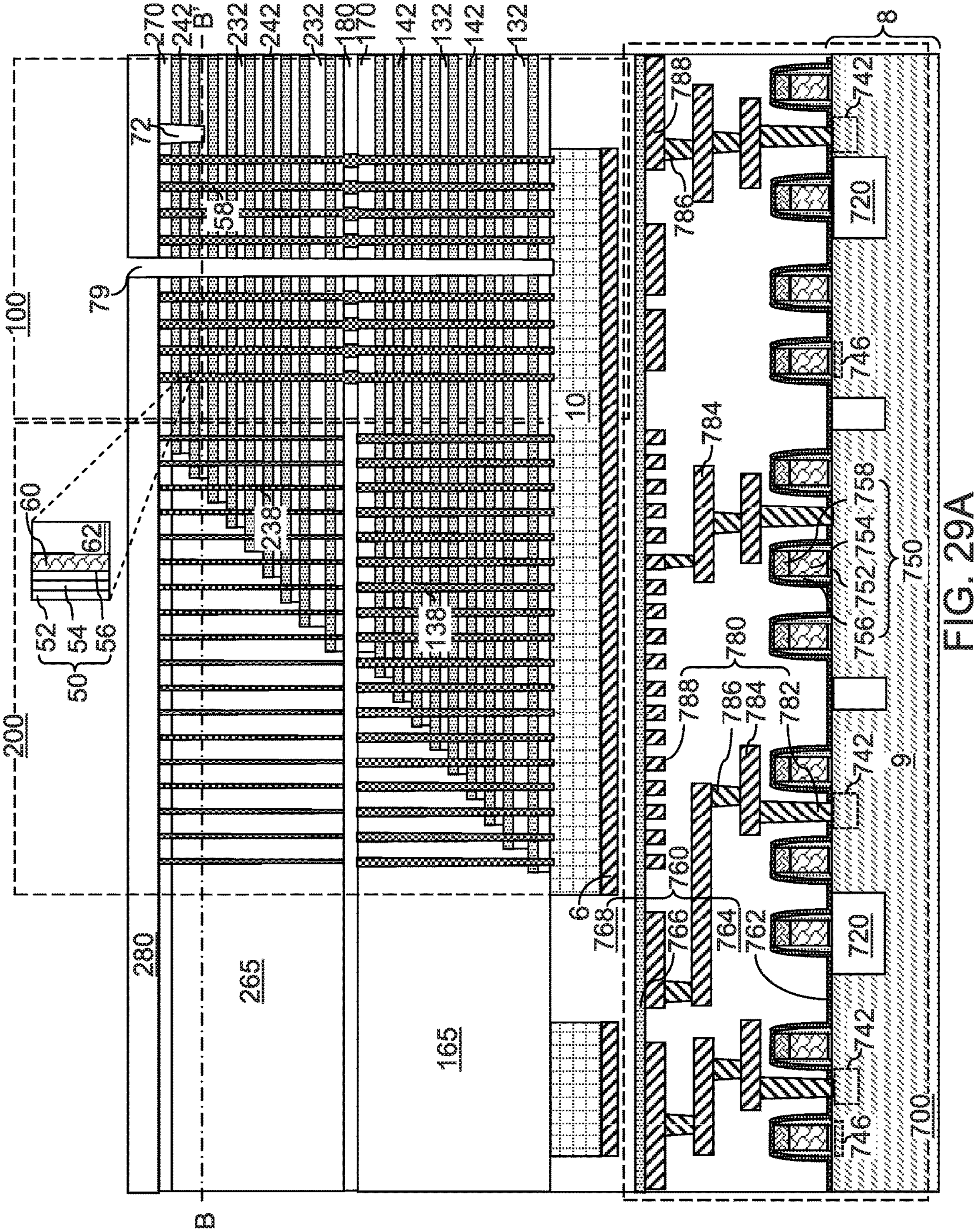
FIG. 29A is a vertical cross-sectional view of the second exemplary structure after formation of backside trenches according to the second embodiment of the present disclosure.
Figure 29B:
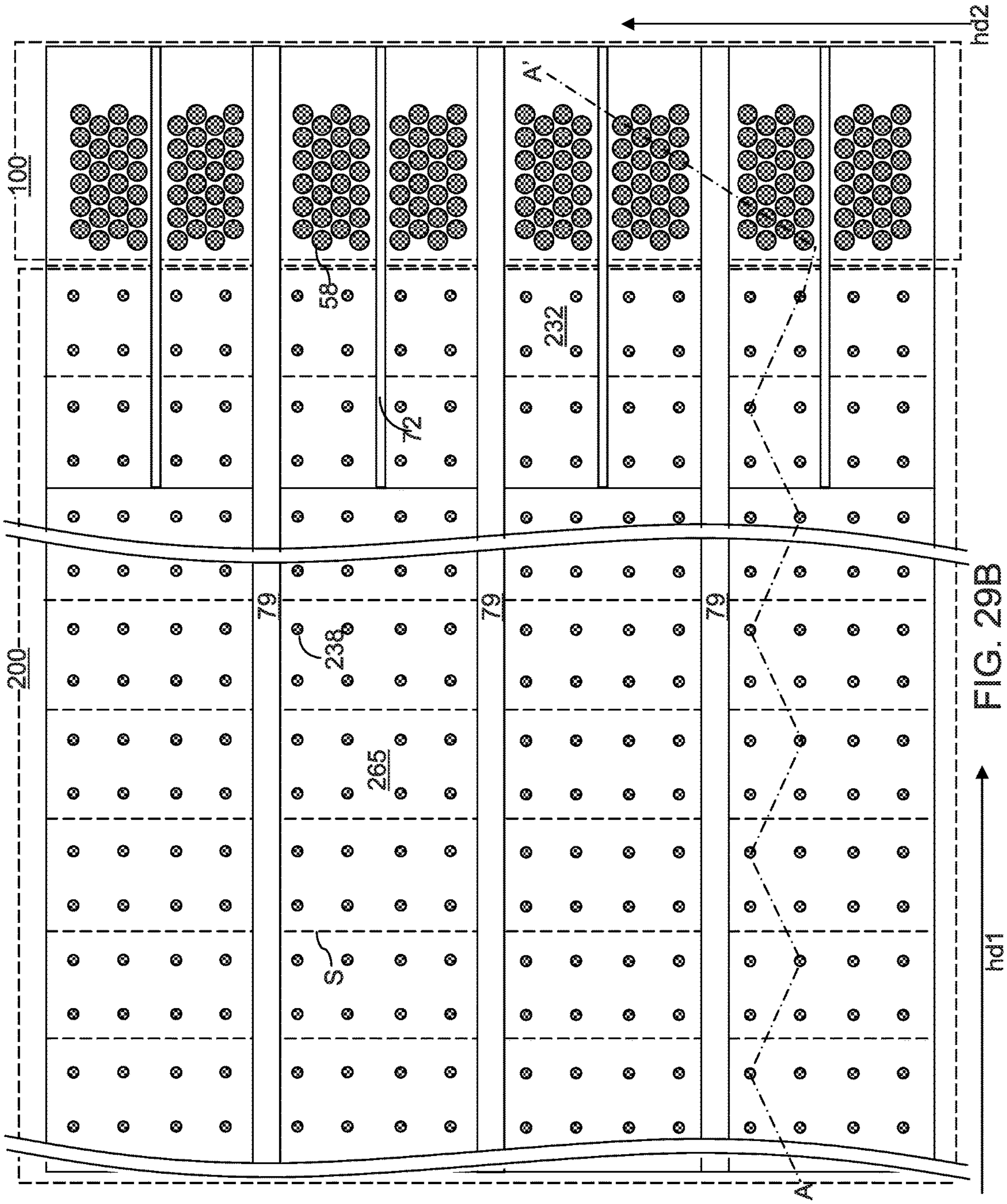
FIG. 29B is a horizontal cross-sectional view of the second exemplary structure along the horizontal plane B-B' of FIG. 29A. The zig-zag vertical plane A-A' is the plane of the vertical cross-sectional view of FIG. 29A.

Referring to FIGS. 29A and 29B, the processing steps of FIGS. 13A and 13B can be performed to form a planarization dielectric layer 280 and backside trenches 79.

Figure 30A:
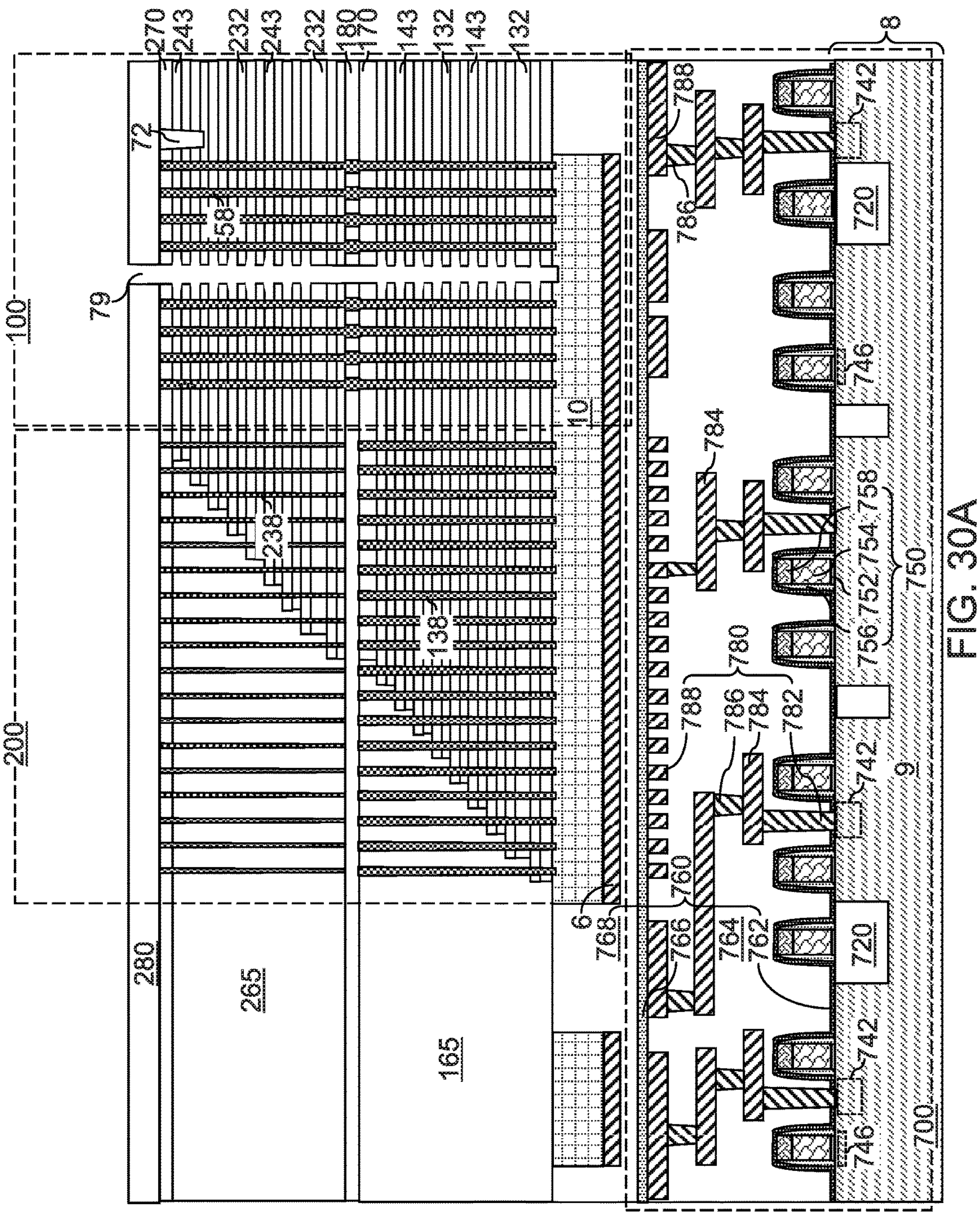
FIG. 30A is a vertical cross-sectional view of the second exemplary structure after formation of backside recesses by removal of the sacrificial material layers according to the second embodiment of the present disclosure.
Figure 30B:
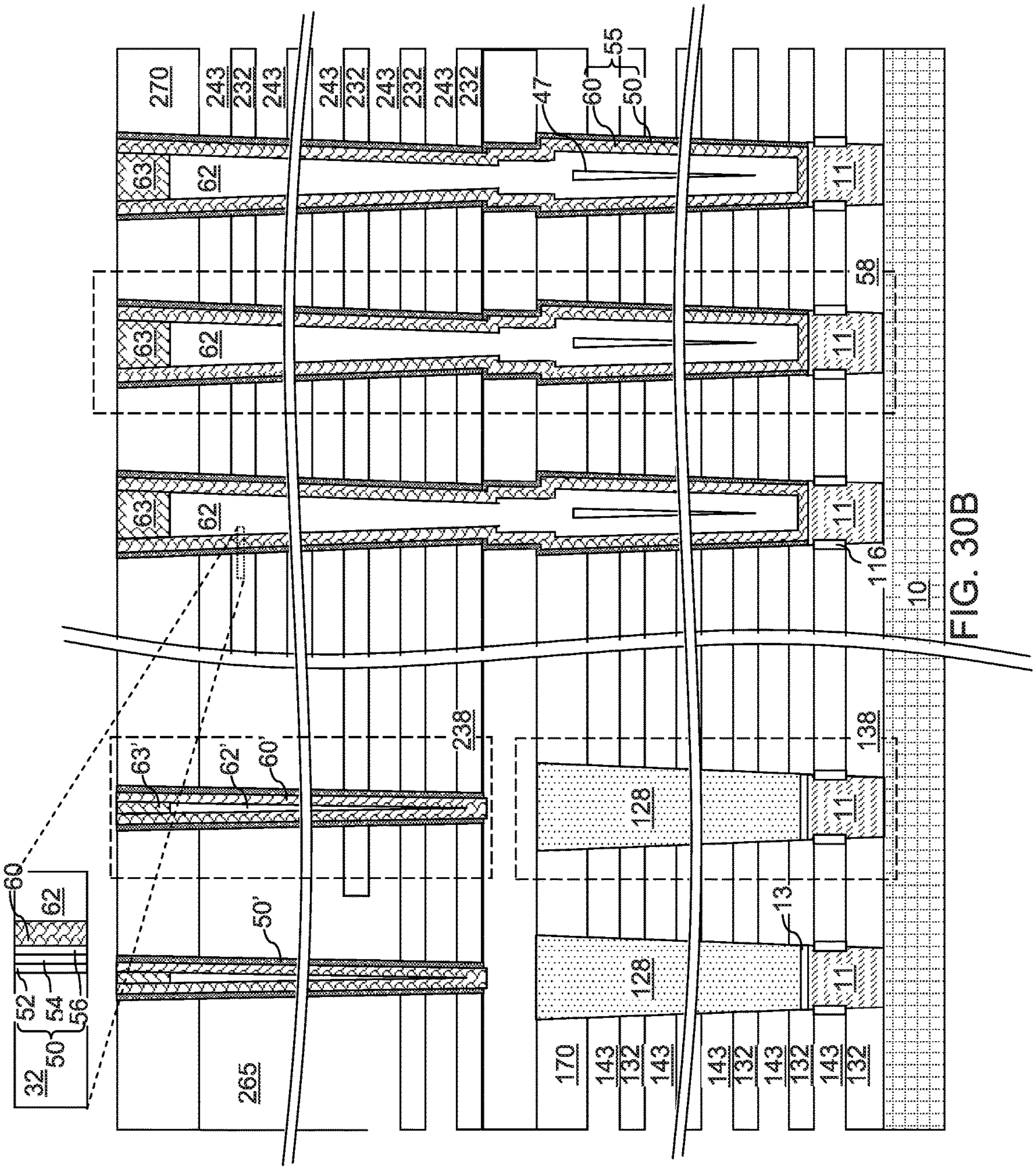
FIG. 30B is a vertical cross-sectional view of a region of the second exemplary structure of FIG. 30A.

Referring to FIGS. 30A and 30B, the processing steps of FIGS. 14A and 14B can be performed to remove the first and second sacrificial material layers (142, 242) and to form first and second backside recesses (143, 243).

Figure 31A:
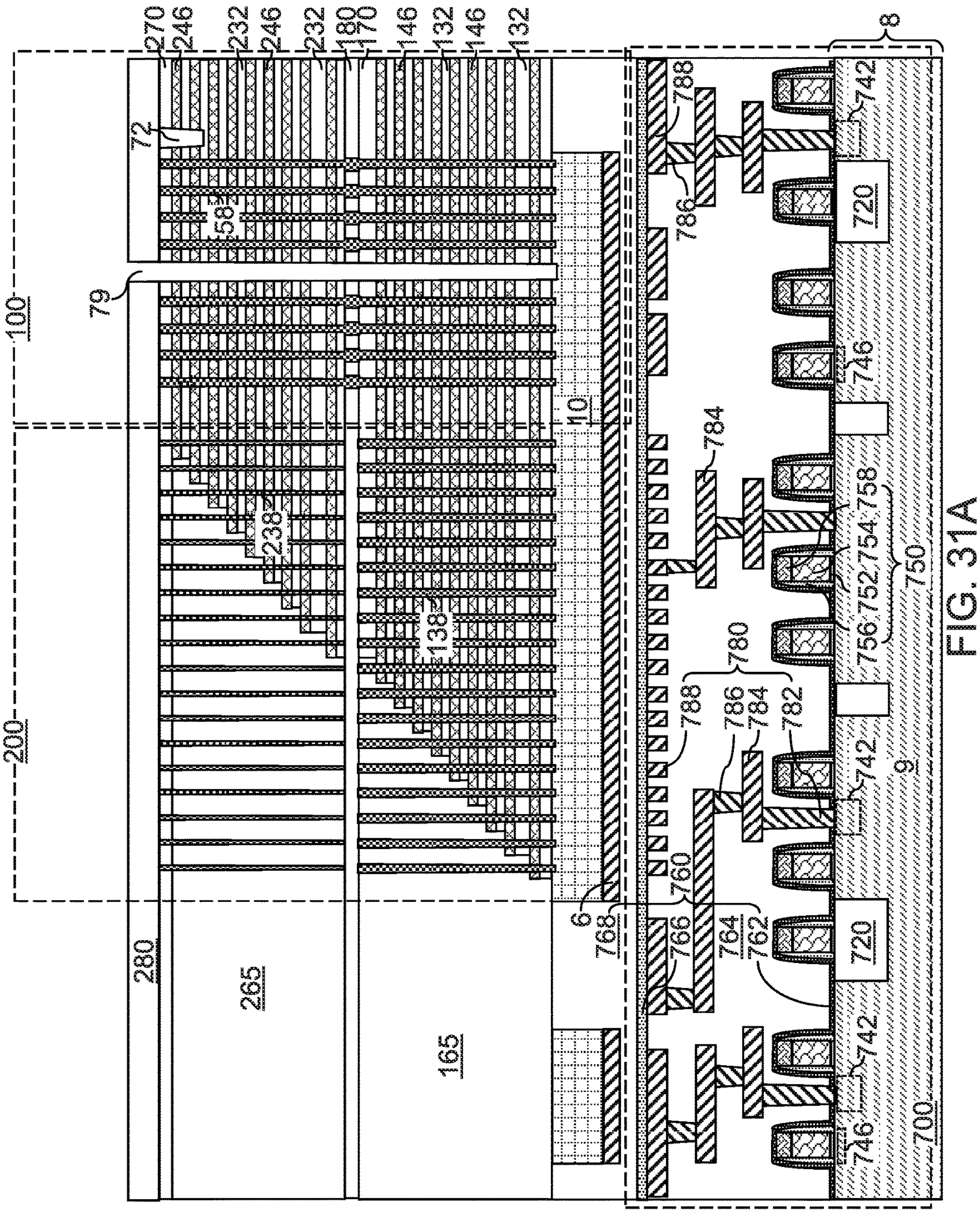
FIG. 31A is a vertical cross-sectional view of the second exemplary structure after formation of electrically conductive layers in the backside recesses according to the second embodiment of the present disclosure.
Figure 31B:
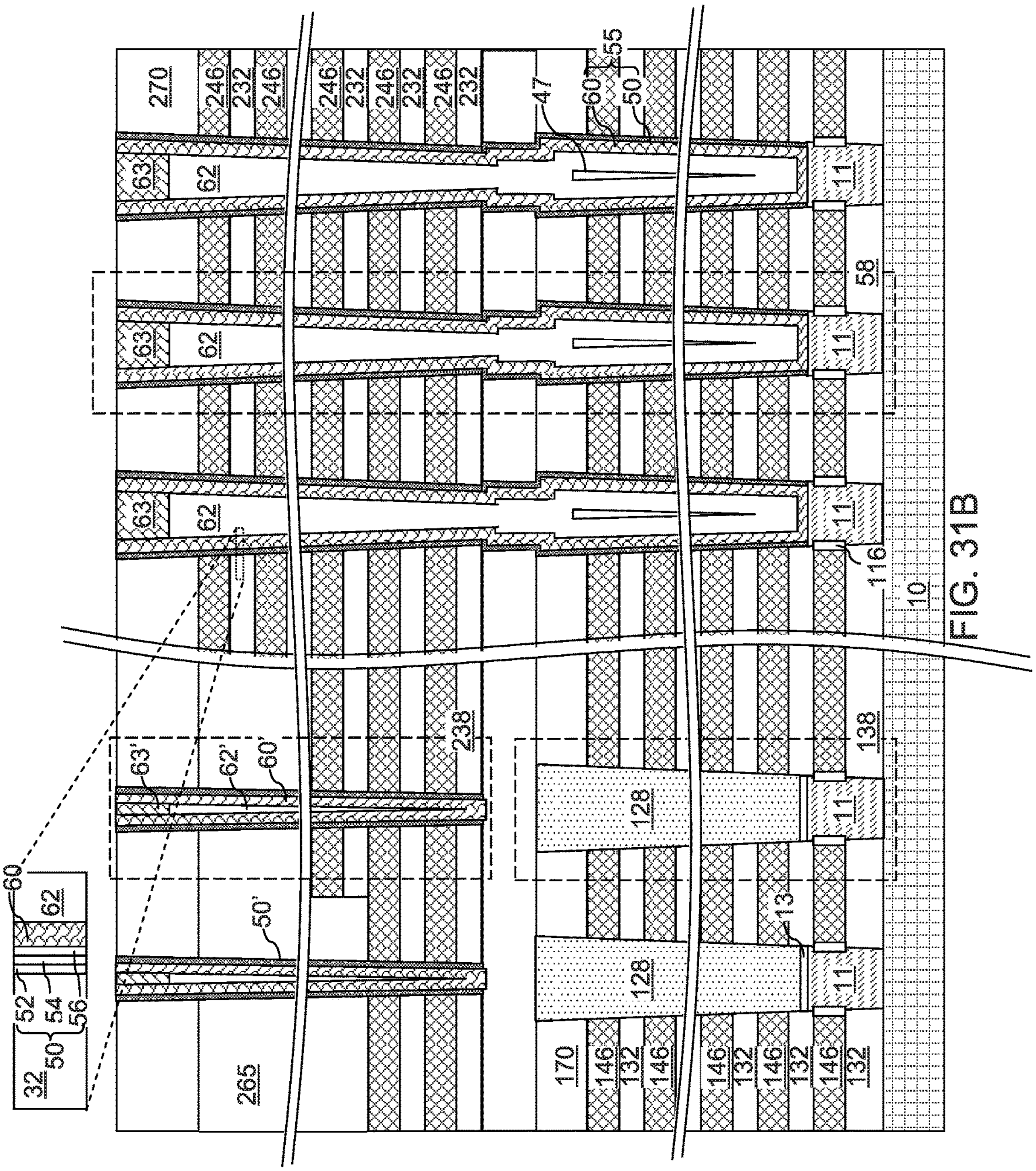
FIG. 31B is a vertical cross-sectional view of a region of the second exemplary structure of FIG. 31A.
Figure 31C:
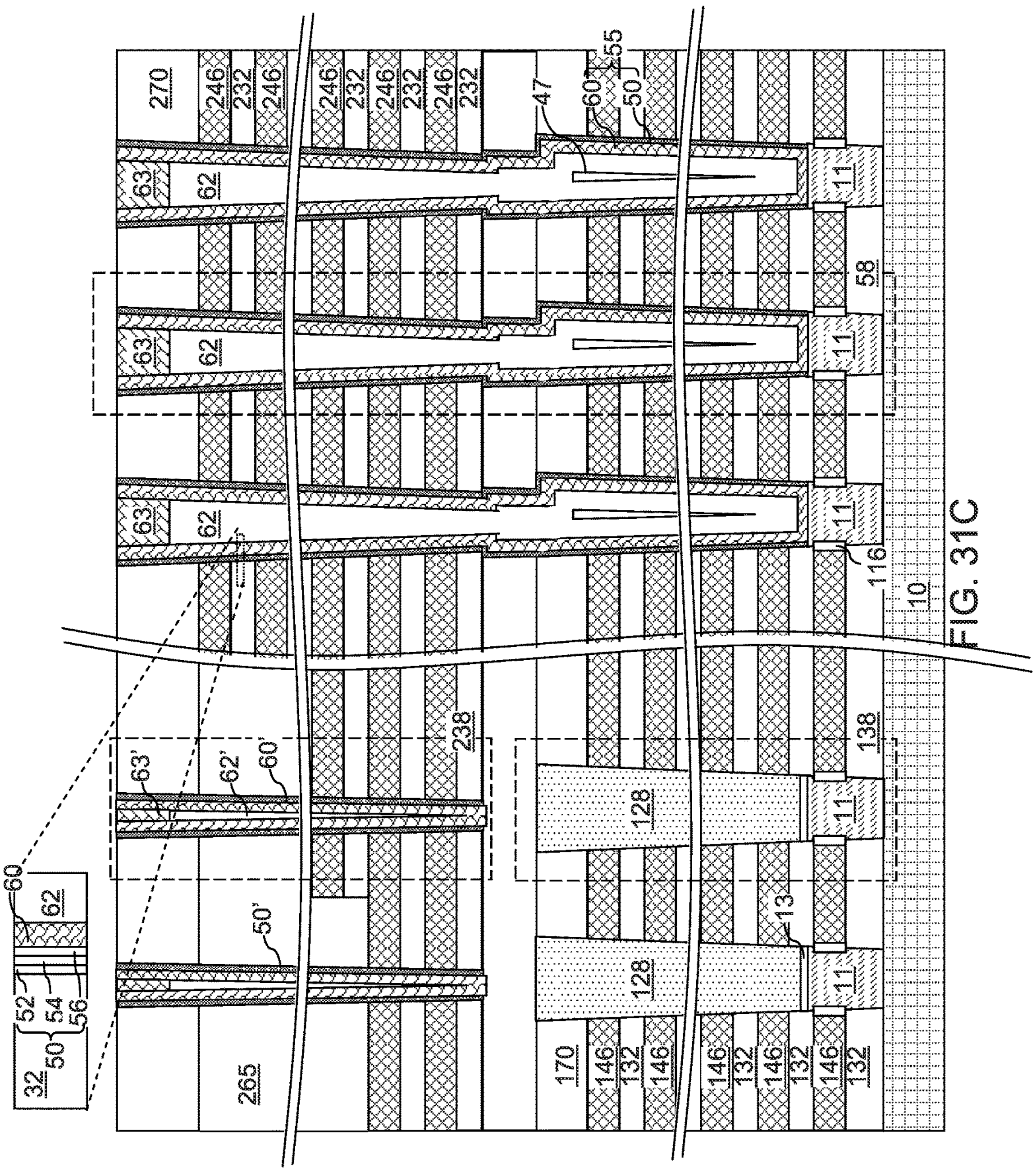
FIG. 31C is a vertical cross-sectional view of an alternative configuration of a region of the second exemplary structure of FIG. 31A in case of a non-zero overlay misalignment.

Referring to FIGS. 31A-31C, the processing steps of FIGS. 15A-15C can be performed to form an optional backside blocking dielectric layer and first and second electrically conductive layers (146, 246). FIG. 31B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 31C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Subsequently, the processing steps of FIGS. 16, 17A and 17B, 18, and 19 can be performed in the same manner as in the first embodiment to provide various additional structural components.

Figure 32:
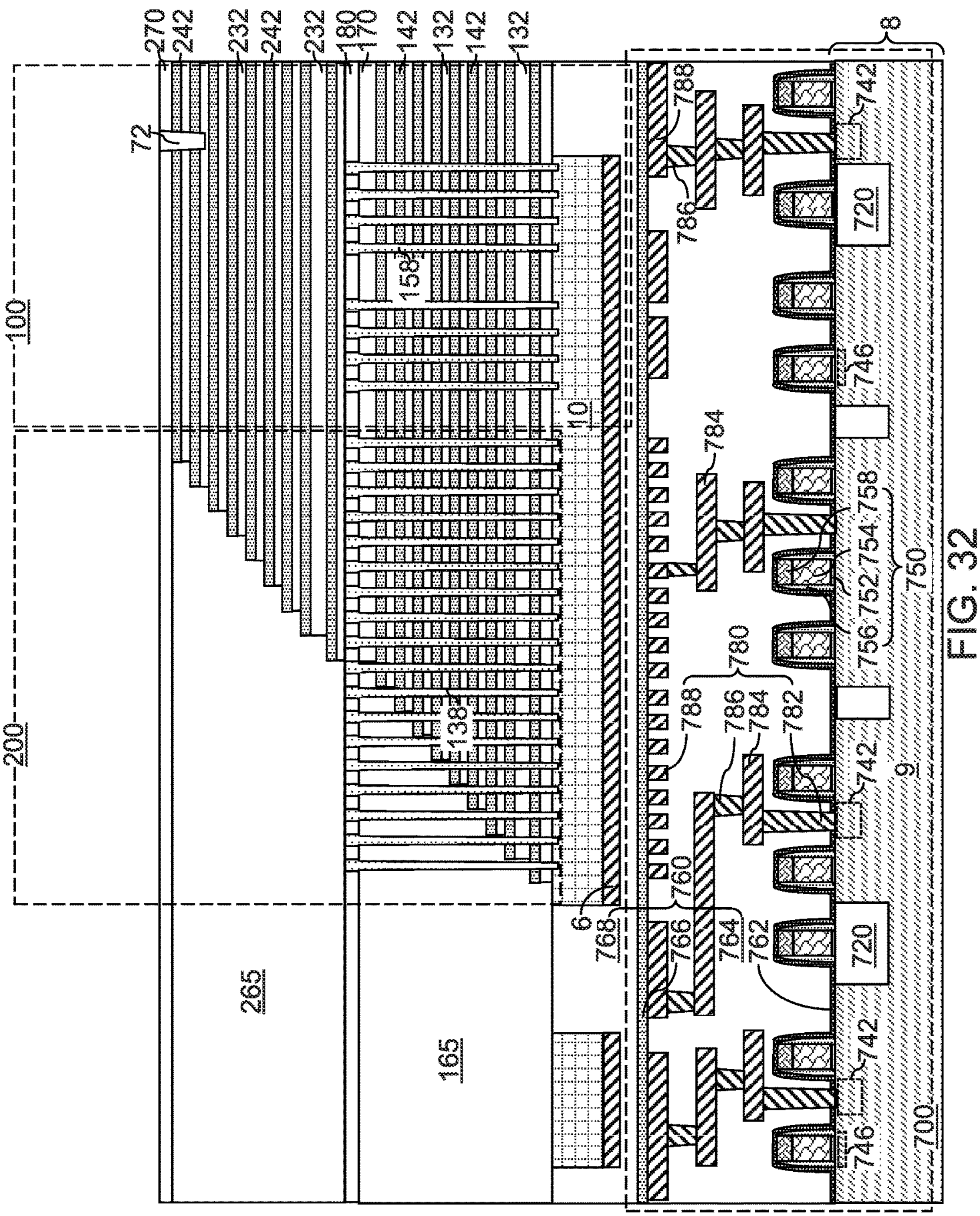
FIG. 32 is a vertical cross-sectional view of a third exemplary structure after formation of a first-tier structure, a second alternating stack of second insulating layers and second sacrificial material layers, a second retro-stepped dielectric material portion, a second insulating cap layer, and dielectric isolation structures according to a third embodiment of the present disclosure.

Referring to FIG. 32, a third exemplary structure according to a third embodiment of the present disclosure is illustrated after formation of a first-tier structure (132, 142, 170, 165, 158, 138), a second alternating stack of second insulating layers 232 and second sacrificial material layers 242, a second retro-stepped dielectric material portion 265, a second insulating cap layer 270, and dielectric isolation structures 72. The third exemplary structure of FIG. 32 may be the same as the first exemplary structure of FIG. 7.

Figure 33A:
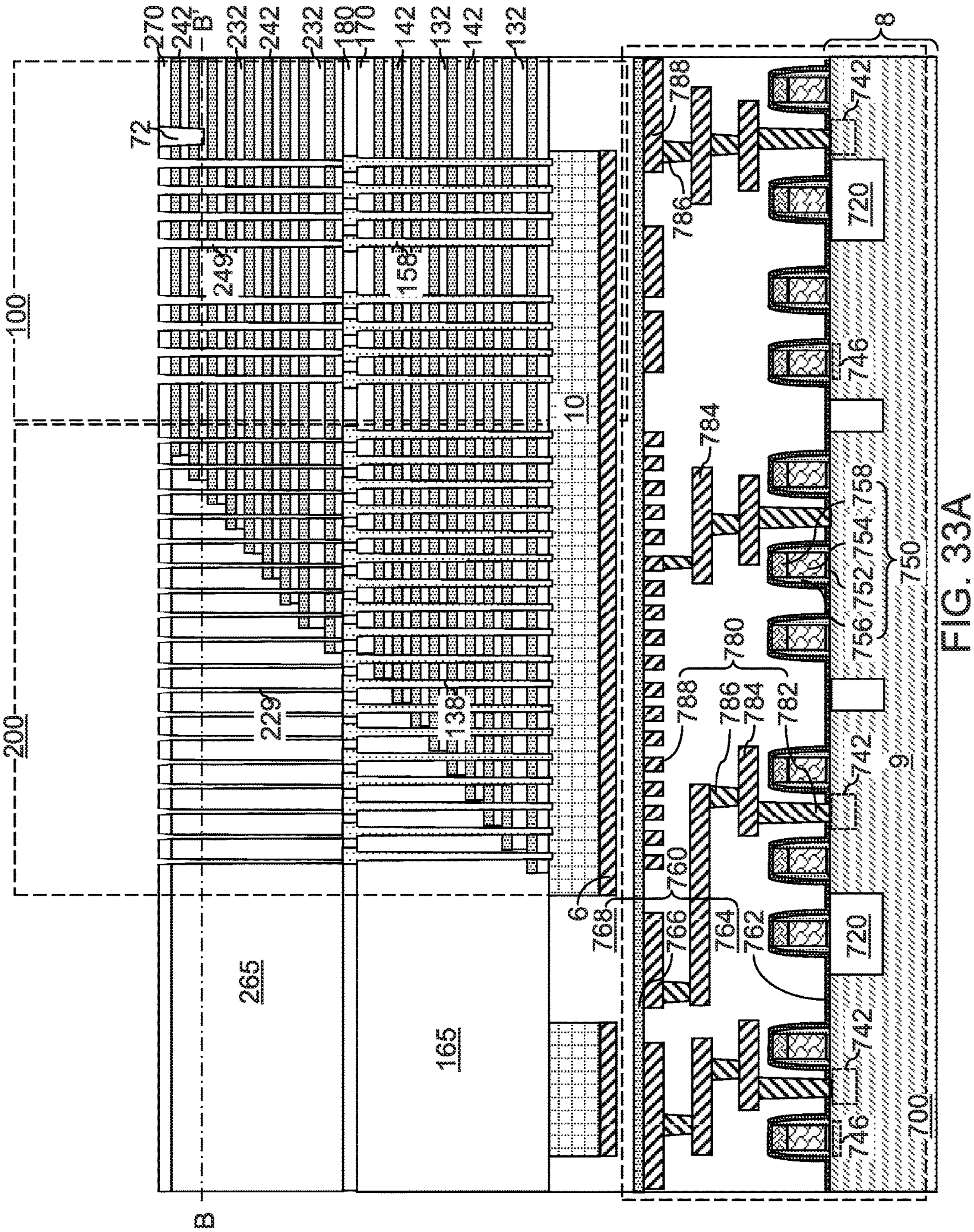
FIG. 33A is a vertical cross-sectional view of the third exemplary structure after formation of second-tier memory openings and second-tier support openings according to the third embodiment of the present disclosure.
Figure 33B:
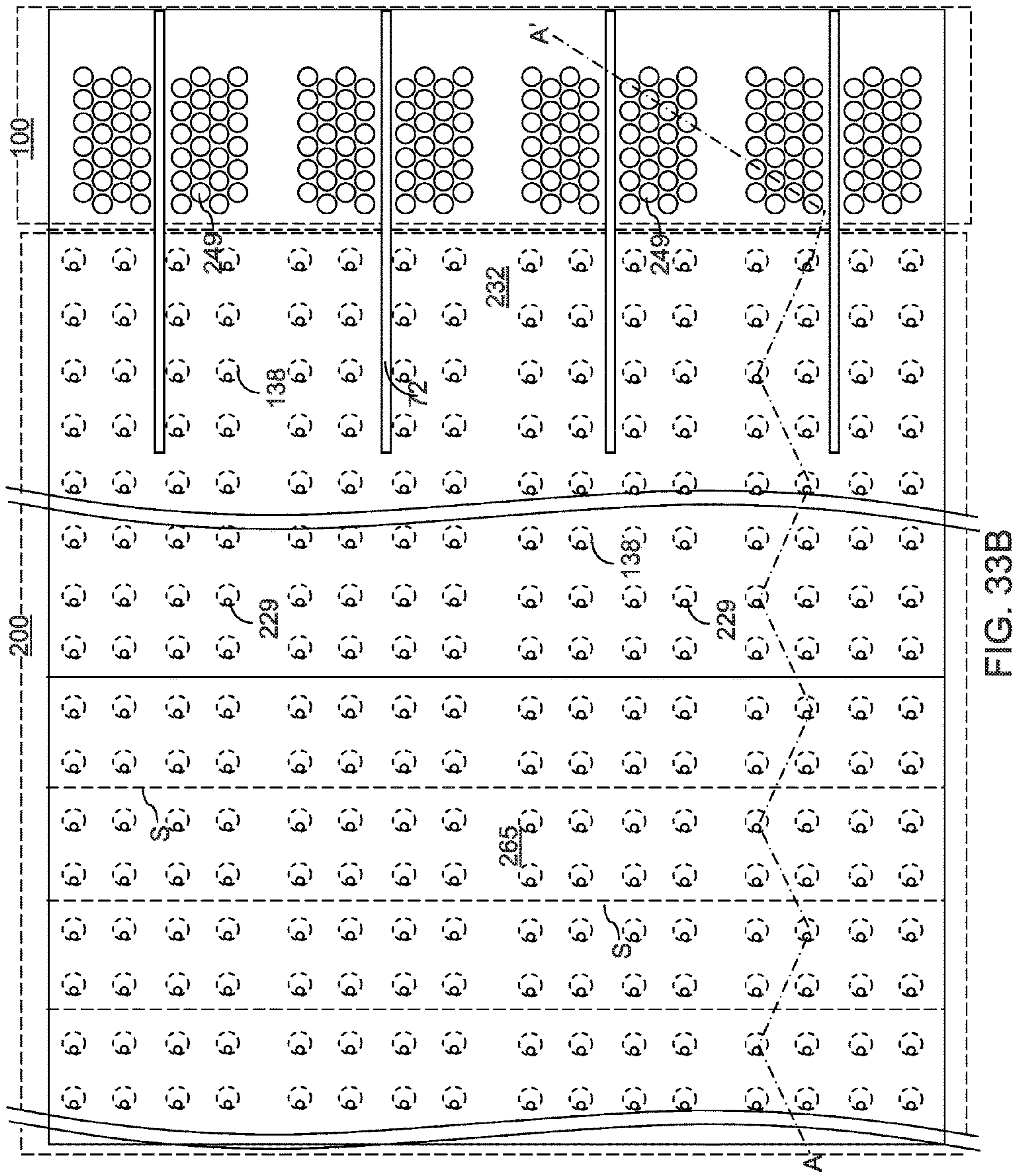
FIG. 33B is a horizontal cross-sectional view of the third exemplary structure along the horizontal plane B-B' of FIG. 33A. The zig-zag vertical plane A-A' is the plane of the vertical cross-sectional view of FIG. 33A.
Figure 33C:
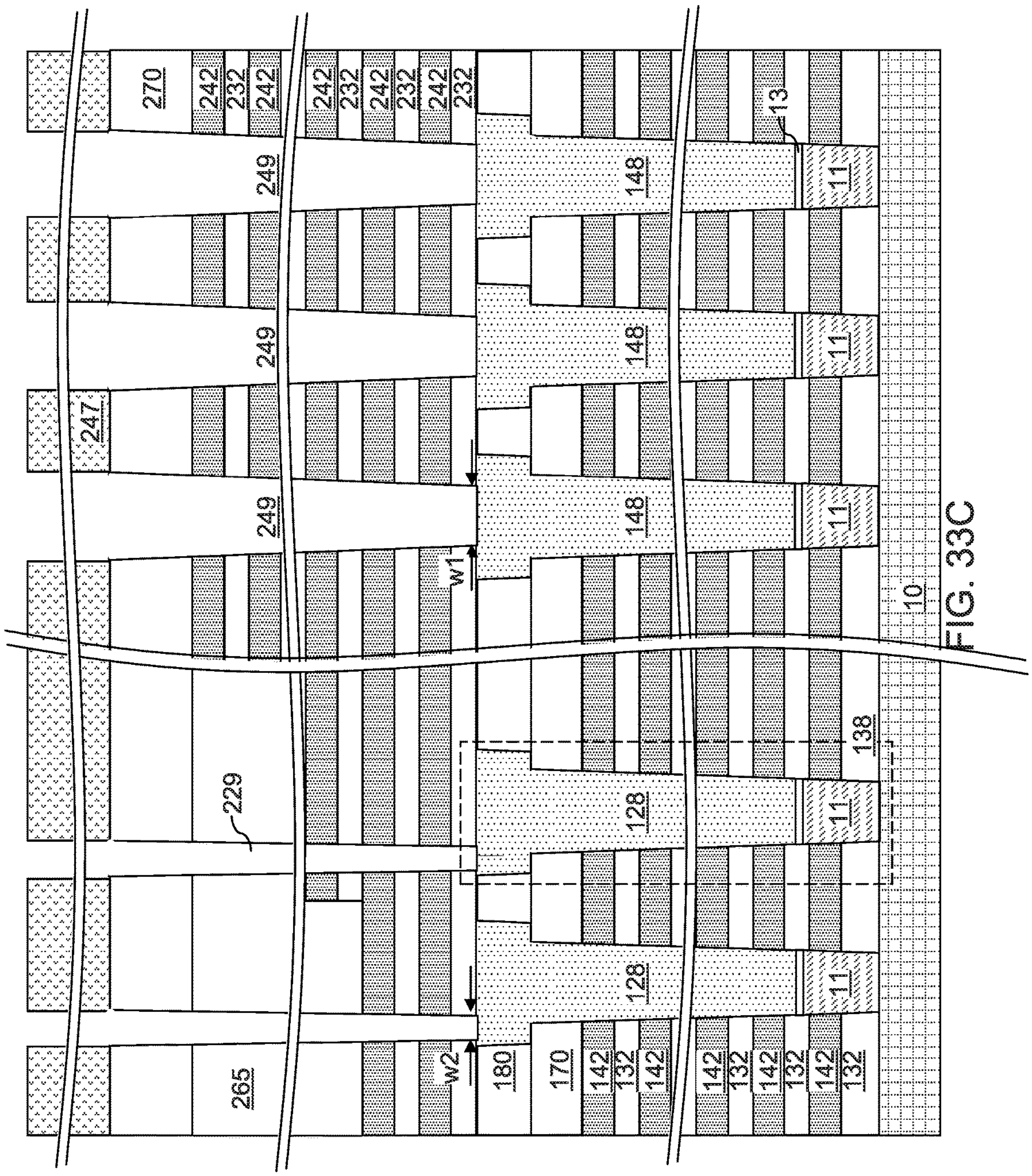
FIG. 33C is a vertical cross-sectional view of the third exemplary structure along the vertical plane C-C' of FIG. 33B.

Referring to FIGS. 33A-33C, various second-tier openings (249, 229) can be formed through the second-tier structure (232, 242, 265, 270, 72). A photoresist layer 247 can be applied over the second insulating cap layer 270, and can be lithographically patterned to form various openings therethrough. The pattern of the openings in the patterned photoresist layer 247 is different from the pattern of the various first-tier openings (149, 129) by the ratio of a maximum lateral dimension of openings overlying the first-tier support opening fill structures 138 to a maximum lateral dimension of openings overlying the first-tier memory opening fill structures 158. Specifically, the ratio of the maximum lateral dimension of openings overlying the first-tier support opening fill structures 138 to the maximum lateral dimension of openings overlying the first-tier memory opening fill structures 158 is less than 1.0, and may be in a range from 0.1 to 0.9 (i.e., from 10% to 90%), such as from 0.15 to 0.6, although lesser and greater ratios can also be employed.

In addition, the pattern of the openings in the patterned photoresist layer 247 is different from the pattern of the various first-tier openings (149, 129) by a lateral shift of positions of openings overlying the first-tier support opening fill structures 138 from the locations of the first-tier support opening fill structures 138, while the positions of the openings overlying the first-tier memory opening fill structures 158 coincide with the geometrical centers of the first-tier memory opening fill structures 158. Thus, the lithographic mask employed to pattern the photoresist layer 247 at the processing steps of FIGS. 33A-33C differ from the lithographic mask employed to pattern the first-tier openings (149, 129) by the relative size of openings in the contact region 200 with respect to the size of openings in the memory array region 100, and by the lateral offset of the locations of the openings in the contact region 200 with respective to the locations of the openings for forming the first-tier support openings 129.

The pattern of openings in the photoresist layer 247 can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a center portion a top surface of a respective one of the first-tier memory opening fill structures 158. The second-tier support openings 229 are formed directly on a peripheral portion of a top surface of a respective one of the first-tier support opening fill structures 138. Further, a subset of the second-tier support openings 229 can be formed through the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 33B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset inward from, and/or may be located entirely within, a periphery of a top surface of an underlying first-tier opening fill structures (158, 138). In one embodiment, the bottom surface of each second-tier support opening 229 can be located entirely outside areas that are defined by removal of materials of the first alternating stack (132, 142) during formation of the first-tier openings (149, 129), i.e., entirely outside areas from which the materials of first alternating stack (132, 142) are removed in a plan view.

The second-tier memory opening 249 and the second-tier support opening 229 are formed through the second alternating stack (232, 242) by the anisotropic etch process. The second-tier memory openings 249 are formed over, and directly on, a respective one of the first-tier memory opening fill structures 158. The second-tier support openings 229 are formed over, and directly on, a respective one of the first-tier support opening fill structures 138. In one embodiment, each second-tier memory opening 249 can have a first width w1 that is the maximum lateral dimension of each second-tier memory opening 249 at a horizontal plane including the bottom surface of the bottommost layer of the second alternating stack (232, 242). Each second-tier support opening 229 can have a second width w2 that is the maximum lateral dimension of each second-tier support opening 229 at the horizontal plane including the bottom surface of the bottommost layer of the second alternating stack (232, 242). The second width w2 is less than the first width w1.

In one embodiment, the ratio of the second width w2 to the first width w1 can be in a range from 0.1 to 0.9 (i.e., from 10% to 90%), such as from 0.15 to 0.6, although lesser and greater ratios can also be employed. In one embodiment, the first width w1 can be in a range from 20 nm to 300 nm, such as from 40 nm to 150 nm, although lesser and greater dimensions can also be employed. In one embodiment, each of the second-tier openings (249, 229) can have a respective circular horizontal cross-sectional shape, of which the size may monotonically increase with the vertical distance from the top surface of the planar semiconductor layer 10.

A surface of the first-tier support opening fill structure 138 is physically exposed at the bottom of each second-tier support opening 229 after formation of the second-tier support openings 229. Each second-tier support opening 229 has a bottom surface above a horizontal plane including the topmost surface of the topmost layer of the first alternating stack (132, 142). The photoresist layer 247 can remain over the second insulating cap layer 270 after formation of the second-tier openings (249, 229).

Figure 34:
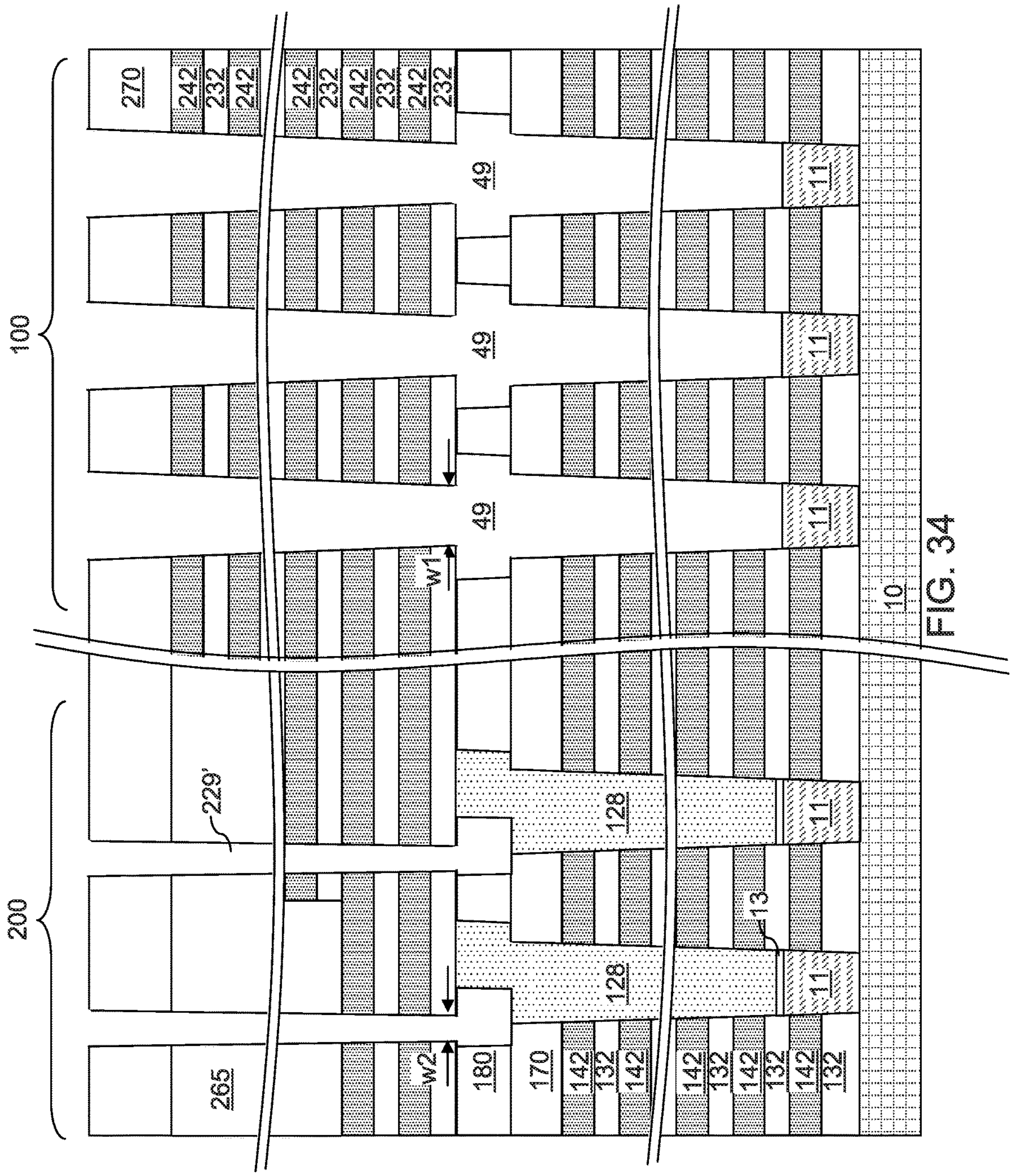
FIG. 34 is a vertical cross-sectional view of a region of the third exemplary structure after formation of inter-tier memory openings and inter-tier support openings according to the third embodiment of the present disclosure.

Referring to FIG. 34, an anisotropic etch process is performed to remove the material of the first-tier memory opening fill structures 158 (e.g., the first-tier fill material). The photoresist layer 247 can function as an etch mask layer at this processing step. The chemistry of the anisotropic etch process is selected such that the first-tier fill material is etched selective to the materials of the first and second insulating layers (132, 232), the first and second sacrificial material layers (142,242), the first and second insulating cap layers (170, 270), and the inter-tier dielectric layer 180. The chemistry of the etch process can be selected depending on the composition of the first-tier fill material. For example, if the first-tier fill material comprises amorphous silicon, a reactive ion etch process employing HBr, $NF_3$, $O_2$, and/or $SF_6$ may be employed to remove the first-tier fill material. In case the first-tier fill material comprises borosilicate glass or organosilicate glass, a combination of $SF_6$ and $O_2$ or inductively coupled plasma generated by $C_4F_8$ or $CHF_3$ may be employed to remove the first-tier fill material. The anisotropic etch process can include a small isotropic etch component that is sufficient to remove portions of the first-tier fill material that are shaded by the second alternating stack (232, 242), such as the portions of the first-tier fill material located at the level of the inter-tier dielectric layer 180. Subsequently, the semiconductor oxide plates 13 may be optionally removed by an etch process selective to the pedestal channel portions 11. For example, a wet etch employing dilute hydrofluoric acid can be performed to remove the semiconductor oxide plates 13. The photoresist mask layer 247 can be subsequently removed, for example, by ashing.

A memory opening 49, which is also referred to as an inter-tier memory opening 49, is formed in each combination of a second-tier memory opening 249 and an underlying volume from which a sacrificial memory opening fill structure 148 and a semiconductor oxide plate 13 is removed. A cavity, which is an extended second-tier opening 229' that extends into the inter-tier dielectric layer 180, is formed in the contact region 200. Each inter-tier memory opening 49 can be formed in the memory array region 100 by removing portions of a respective first-tier memory opening fill structure 158 from underneath a respective second-tier memory opening 249. Each inter-tier memory opening 49 includes an entire volume of a respective second-tier memory opening 249 and a predominant portion (i.e., more than 50%, which may be more than 80% and/or more than 90%) of an entire volume of a respective underlying first-tier memory opening fill structure 158. Each cavity, i.e., each extended second-tier support opening 229', includes an entire volume of a respective second-tier support opening 229 and an additional volume, which can be located at the level of the inter-tier dielectric layer 180 and/or the first insulating cap layer 170. The bottommost surface of the extended second-tier support openings 229' can be located above the horizontal plane including the topmost surface of the first alternating stack (132, 142). Thus, each cavity, i.e., each expanded second-tier support opening 229', can be formed by removing an upper portion of each first-tier support opening fill structure 138 without removing a lower portion of each first-tier support opening fill structure 138. The inter-tier memory openings 49 and the cavities (i.e., the extended second-tier support openings 229') are simultaneously formed by the anisotropic etch process.

Figure 35:
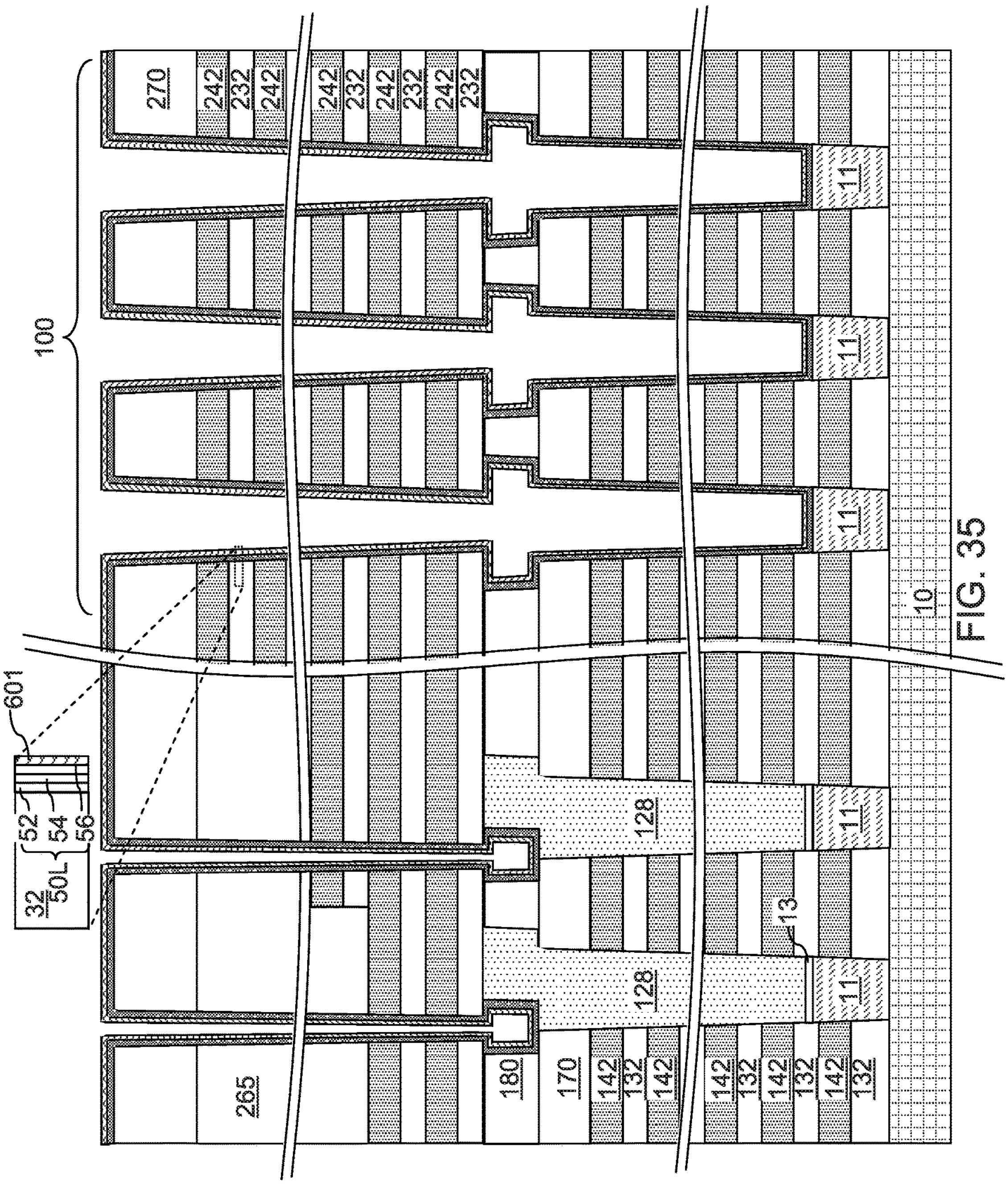
FIG. 35 is a vertical cross-sectional view of a region of the third exemplary structure after formation of a memory film layer and a semiconductor channel material layer according to the third embodiment of the present disclosure.

Referring to FIG. 35, the processing steps of FIG. 10 can be performed to form a memory film layer 50L and an optional first semiconductor channel layer 601 in the inter-tier memory openings 49 and the extended second-tier support openings 229' and over the second insulating cap layer 270. The memory film layer 50L and the optional first semiconductor channel layer 601 do not extend below the bottom surface of the inter-tier dielectric layer 180 in the contact region 200.

Figure 36:
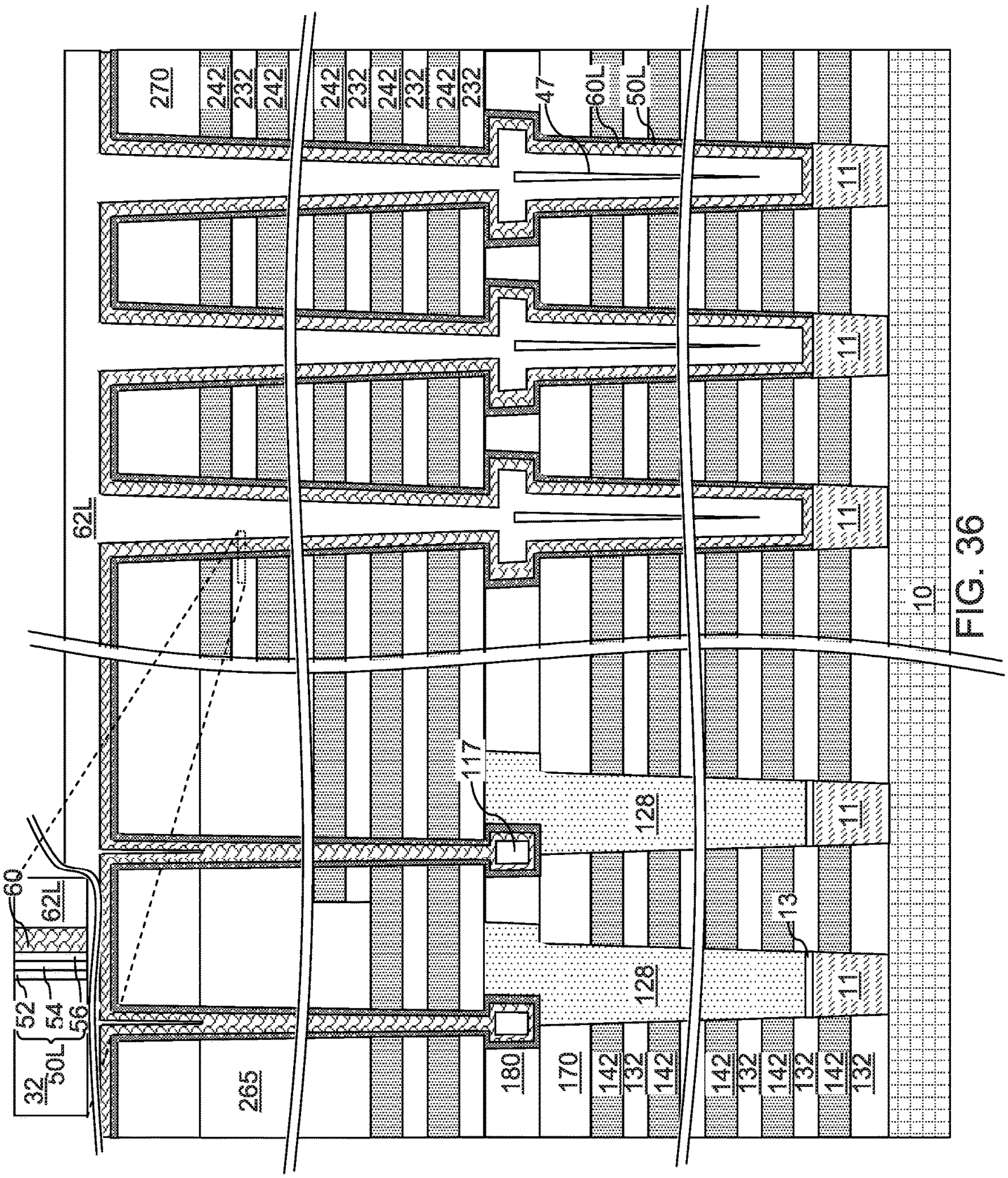
FIG. 36 is a vertical cross-sectional view of a region of the third exemplary structure after formation of a dielectric core material layer according to the third embodiment of the present disclosure.

Referring to FIG. 36, the processing steps of FIG. 11 can be performed to anisotropically etch the optional first semiconductor channel layer 601, the tunneling dielectric layer 56, the charge storage layer 54, and the blocking dielectric layer 52, and to physically expose top surfaces of the pedestal channel portions 11 (or the top surfaces of the planar semiconductor material layer in case the pedestal channel portions 11 are not present).

A second semiconductor channel layer can be deposited as in the processing steps of FIG. 11. In one embodiment, the first semiconductor channel layer 601 may be optionally removed isotropically, for example, by a wet etch process employing hot TMY prior to deposition of the second semiconductor channel layer. The second semiconductor channel layer, or the set of first semiconductor channel layer 601 and the second semiconductor channel layer in case the first semiconductor channel layer 601 is not removed, is referred to as a semiconductor channel material layer 60L. In case the memory cavity in each memory opening is not completely filled by the second semiconductor channel layer, a dielectric core layer 62L can be deposited in the memory cavity to fill any remaining portion of the memory cavity within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

An encapsulated memory cavity 47 may, or may not, be formed in each inter-tier memory opening 49 within the first alternating stack (132, 142). The encapsulated memory cavities 47 are volumes of the inter-tier memory openings 49 that are not filled with the materials of the memory film layer 50L, the semiconductor channel material layer 60L, and the dielectric core layer 62L. The memory film layer 50L and the optional first semiconductor channel layer 601 do not extend below the topmost surface of the first alternating stack (132, 142) in the contact region 200. A support pillar cavity 117 can be formed within the levels of the first insulating cap layer 170 and the inter-tier dielectric layer 180. The topmost surface of each support pillar cavity 117 can be located below the horizontal plane including the bottommost surface of the second alternating stack (232, 242) and above the horizontal plane including the topmost surface of the first alternating stack (132, 142).

Figure 37A:
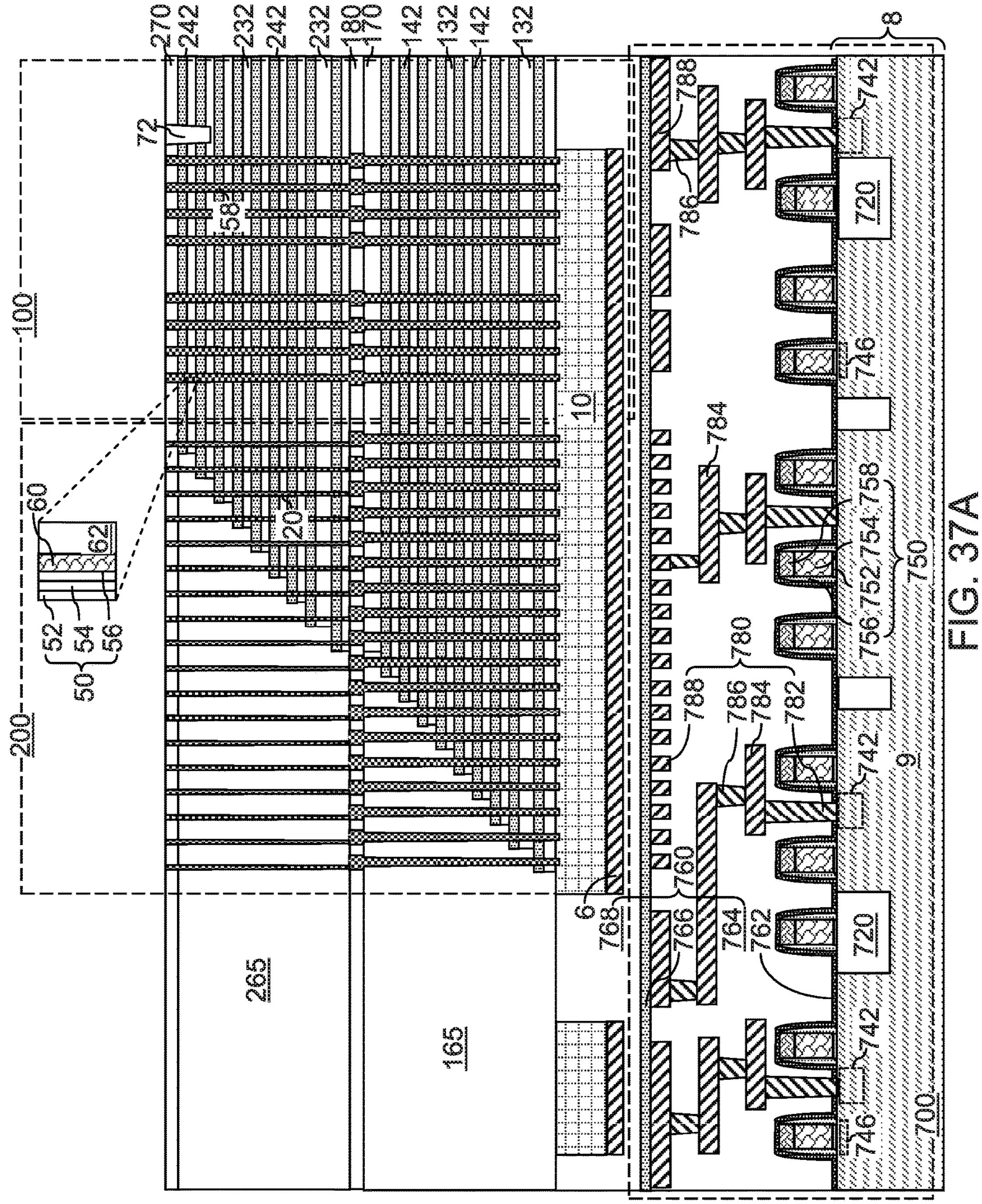
FIG. 37A is a vertical cross-sectional view of the third exemplary structure after formation of memory opening fill structures and support pillar structures according to the third embodiment of the present disclosure.
Figure 37B:
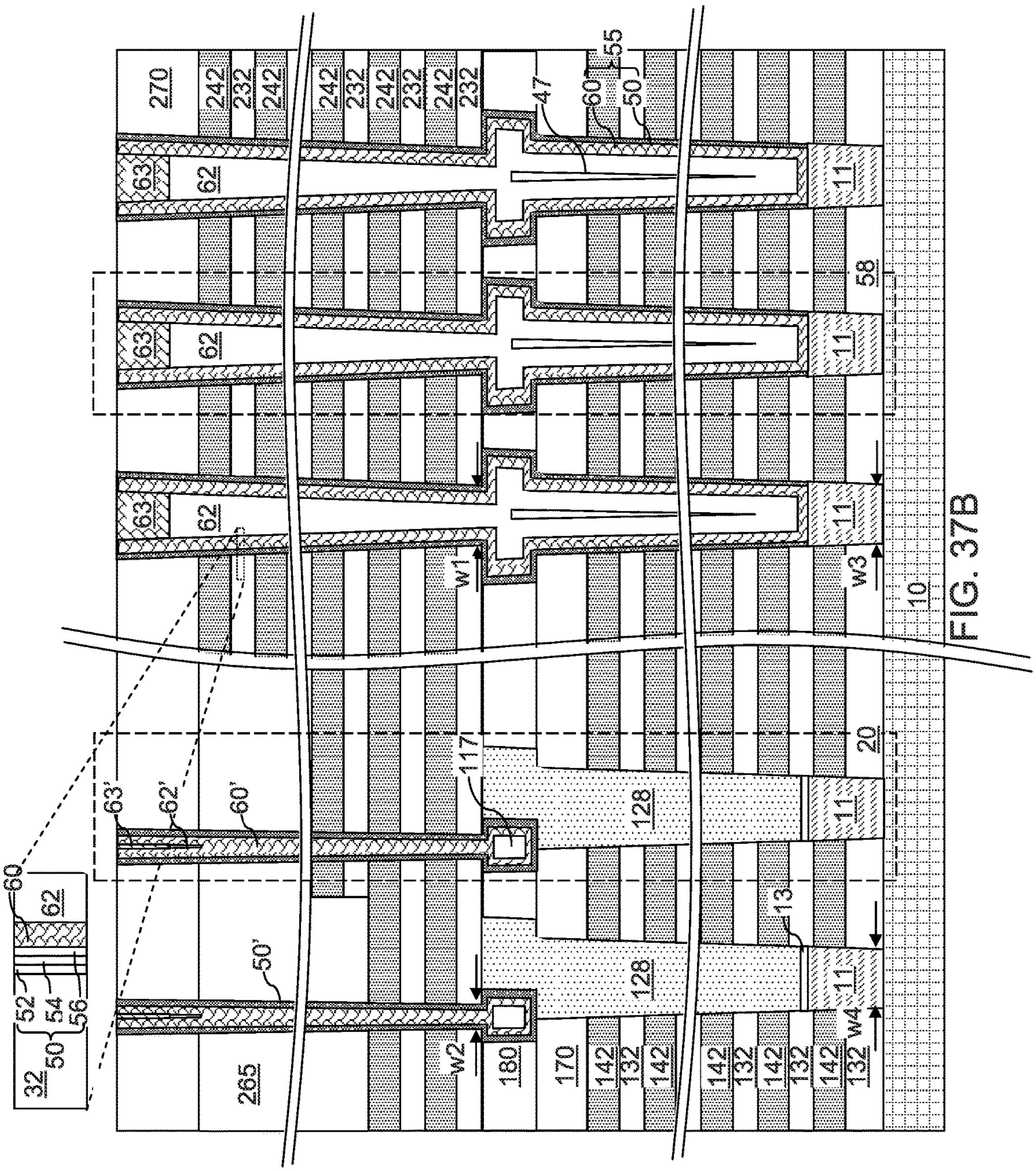
FIG. 37B is a vertical cross-sectional view of a region of the third exemplary structure of FIG. 37A.

Referring to FIGS. 37A and 37B, horizontal portion of the dielectric core layer 62L overlying the second insulating cap layer 270 can be removed, for example, by a recess etch from above the top surface of the second insulating cap layer 270. The material of the dielectric core layer 62L can be further recessed within each inter-tier memory opening 49, for example, by a recess etch to a height between the horizontal plane including the top surface of the second insulating cap layer 270 and the horizontal plane including the bottom surface of the second insulating cap layer 270. Recessed top surfaces of the remaining portions of the dielectric core layer 62 is formed between the horizontal plane including the top surface of the second insulating cap layer 270 and the horizontal plane including the bottom surface of the second insulating cap layer 270. Each remaining portion of the dielectric core layer 62L constitutes a dielectric core 62.

Horizontal portion of the second semiconductor channel layer located above the top surfaces of the dielectric cores 62 can be removed by an etch process, which may be an isotropic etch process such as a wet etch process or an anisotropic etch process such as a reactive ion etch process. Each remaining portion of the second semiconductor channel layer, or each contiguous pair of a remaining portion of the second semiconductor channel layer and a remaining portion of the first semiconductor channel layer 601 in case any portion of the first semiconductor channel layer remains, constitutes a vertical semiconductor channel 60, through which electrical current can flow when a vertical NAND device including the vertical semiconductor channel 60 is turned on. Alternatively, the first semiconductor channel layer 601 can be removed, for example, by a wet etch employing hot TMY, and each vertical semiconductor channel 60 can consist of remaining portions of the second semiconductor channel layer. In this case, the semiconductor oxide plate 13 can prevent, or minimize, collateral etching of the pedestal channel portions 11.

Horizontal portions of the memory film layer 50L overlying the second insulating cap layer 270 can be subsequently removed, for example, by an anisotropic etch process. Each remaining portion of the memory film layer 50L located within the inter-tier memory openings 49 and the second-tier support openings 229 constitutes a memory film 50 or a dummy memory film 50'. Each memory film 50 and each dummy memory film 50' can include a layer stack of a blocking dielectric layer 52, a charge storage layer 54, and a tunneling dielectric layer 56. Each tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 in an inter-tier memory opening 49 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within each inter-tier memory opening 49 is herein referred to as a memory opening fill structure 58. Each combination of a dummy memory film 50', a dummy semiconductor channel 60' (that has the same composition as the vertical semiconductor channels 60), a support dielectric core 62' (that has the same composition as the dielectric cores 62), and a dummy drain region 63' (that has the same composition as the drain regions 63) within each second-tier support opening 229 constitutes a support pillar structure 238.

Generally, each of the inter-tier memory openings 49 and cavities in the contact region 200 (i.e., the extended second-tier support openings 229') is filled with fill material portions (50L, 60L, 62L). The fill material portions (50L, 60L, 62L) are formed on remaining portions of the first-tier support opening fill structures 138. Regions of the fill material portions (50L, 60L, 62L) are removed from above a horizontal plane overlying the second alternating stack (232, 242), such as the horizontal plane including the top surface of the second insulating cap layer 270, by a planarization process. Remaining portions of the fill material portions (50L, 60L, 62L) in the inter-tier memory openings 49 comprise the memory stack structures 55 after the planarization process. Support pillar structures 20 are formed in the contact region 200. Each support pillar structure 20 includes remaining portions of a first-tier support opening fill structure 138 and a contiguous set of remaining portions of the fill material portions (50L, 60L, 62L). Each support pillar structure 20 can extend through the second retro-stepped dielectric material portion 265 and the first alternating stack (132, 142). In one embodiment, a top surface of each support pillar structure 20 can be formed within a same horizontal plane as the top surfaces of the memory opening fill structures 58. In one embodiment, a bottom surface of each support pillar structure 20 can be formed within a same horizontal plane as the bottom surfaces of the memory opening fill structures 58.

Each memory opening fill structure 58 extends through all layers within the second alternating stack (232, 242) and the first alternating stack (132, 142). Each memory opening fill structure 58 comprises a vertical semiconductor channel 60 and a memory film 50, and has a first width w1 that is a maximum lateral dimension of the memory stack structure 55 at a horizontal plane including a bottom surface of a bottommost layer of the second alternating stack (232, 242) such as the bottommost second insulating layer 232.

Each support pillar structure 20 extends through all layers within the second alternating stack (232, 242) and the first alternating stack (132, 142) and includes a dummy semiconductor channel 60' having a same material composition as the semiconductor channels 60, and has a second width w2 that is a maximum lateral dimension of the support pillar structure 238 at the horizontal plane including the bottom surface of the bottommost layer of the second alternating stack (232, 242). The second width w2 is less than the first width w1. The upper portion of each support pillar structure 20 that extends through the second alternating stack (232, 242) can be laterally offset from the vertical axis passing through the geometrical center of the lower portion of the support pillar structure 20 that is located under the horizontal plane including the top surface of the first alternating stack (132, 142).

Each memory film 50 can comprise a layer stack including a tunneling dielectric layer 56, a charge storage layer 54, and a blocking dielectric layer 52. Each support pillar structure 20 can comprise a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

In one embodiment, each memory opening fill structure 58 can have a third width w3 that is a maximum lateral dimension of the memory stack structure at a horizontal plane including a bottom surface of a bottommost layer of the first alternating stack (132, 142). Each support pillar structure 20 can have a fourth width w4 that is a maximum lateral dimension of the support pillar structure 20 at the horizontal plane including the bottom surface of the bottommost layer of the first alternating stack (132, 142). The ratio of the second width w2 to the fourth width w4 is less than the ratio of the first width w1 to the third width w3. For example, the ratio of the first width w1 to the third width w3 may be in a range from 0.8 to 1.2, and the ratio of the second width w2 to the fourth width w4 may be in a range from 0.1 to 0.9, such as from 0.1 to 0.8.

The dummy semiconductor channel 60' and the dummy memory film 50' within each support pillar structure 20 overlie the first alternating stack (132, 142), and do not extend through any of the first sacrificial material layers 142 within the first alternating stack (132, 142). The first-tier support opening fill portions 128 may include a semiconductor material (such as amorphous silicon or polysilicon) or a dielectric material (such as borosilicate glass or organosilicate glass). In one embodiment, the first-tier support pillar structure 138 comprises a dielectric material portion (such as a first-tier support opening fill portions 128) that contacts sidewalls of a subset of the first insulating layers 132 of the first alternating stack (132, 142) and contacts a sidewall of the inter-tier dielectric layer 180 and an outer sidewall of a dummy memory film 50'.

In case the first-tier fill material comprises a dielectric material, each of the first-tier memory opening fill structures 158 and the first-tier support opening fill structures 138 comprises a respective dielectric material portion (such as a first-tier memory opening fill portions 148 or a first-tier support opening fill portions 128) at a respective upper end, a bottom surface of the second-tier support opening 229 is laterally offset outward from a sidewall of an underlying first-tier support opening fill structure 138, and the etch process comprises an anisotropic etch process that removes more than 50% of an entire volume of the first-tier memory opening fill structure 138 without extending the second-tier support openings 229 below the horizontal plane including the topmost surface of the first alternating stack (132, 142). Each support pillar structure 20 can comprise a dielectric pillar structure (such as a first-tier support opening fill portion 128) contacting a bottom surface and a sidewall of the dummy memory film 50' and extending through, and contacting sidewalls of, a subset of the first insulating layers 132 within the first alternating stack (132, 142).

Figure 38:
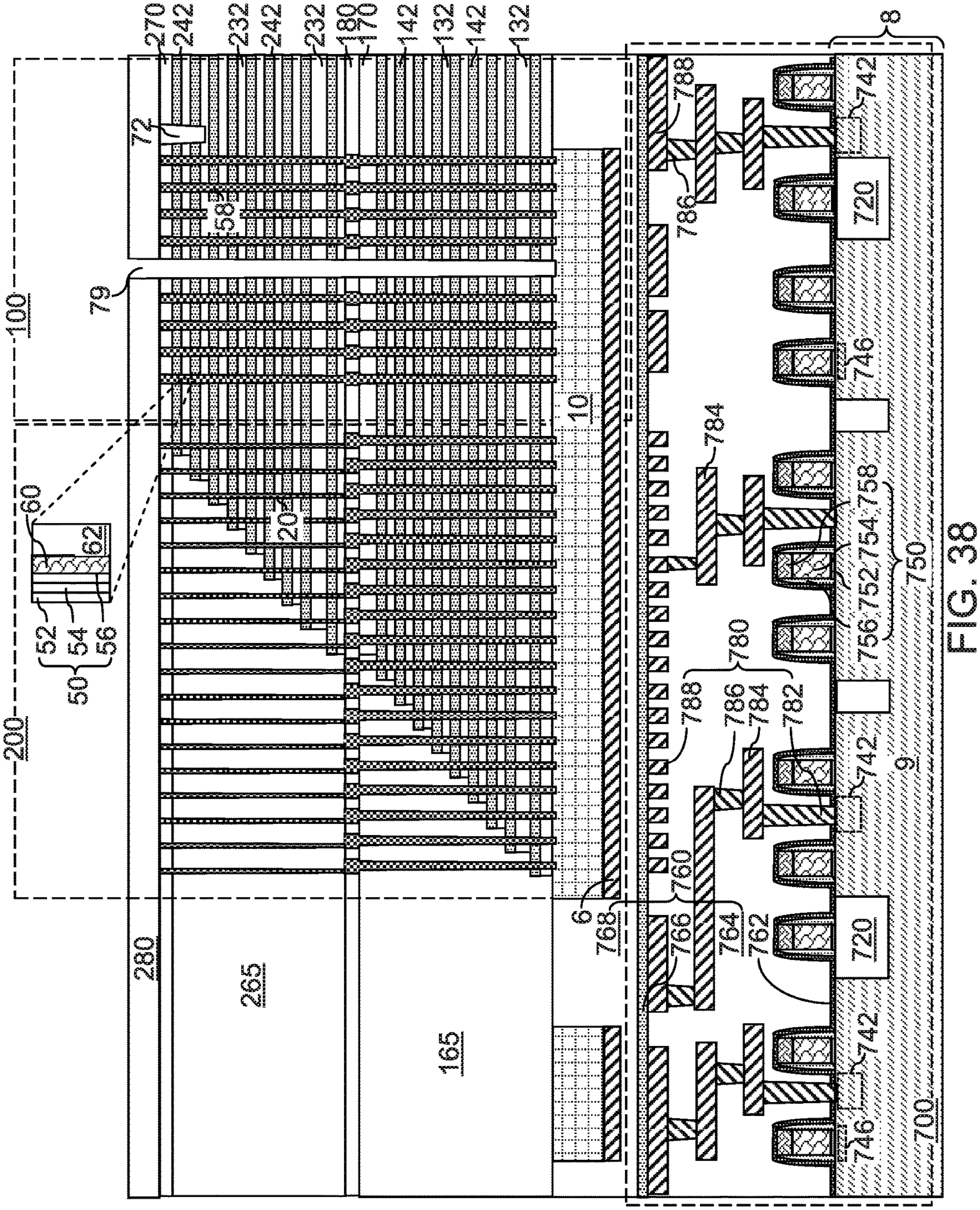
FIG. 38 is a vertical cross-sectional view of the third exemplary structure after formation of backside trenches according to the third embodiment of the present disclosure.

Referring to FIG. 38, the processing steps of FIGS. 13A and 13B can be performed to form a planarization dielectric layer 280 and backside trenches 79.

Figure 39A:
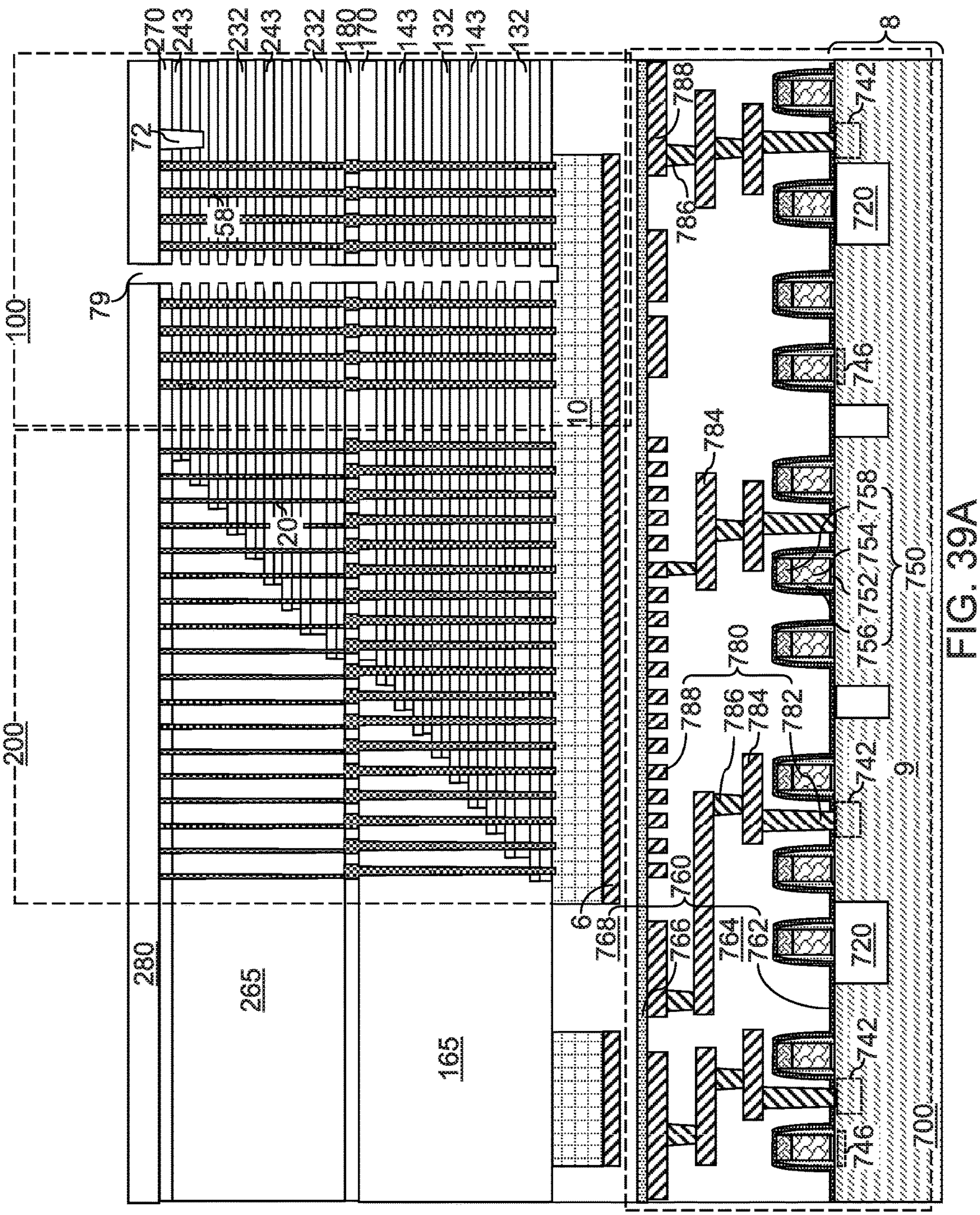
FIG. 39A is a vertical cross-sectional view of the third exemplary structure after formation of backside recesses by removal of the sacrificial material layers according to the third embodiment of the present disclosure.
Figure 39B:
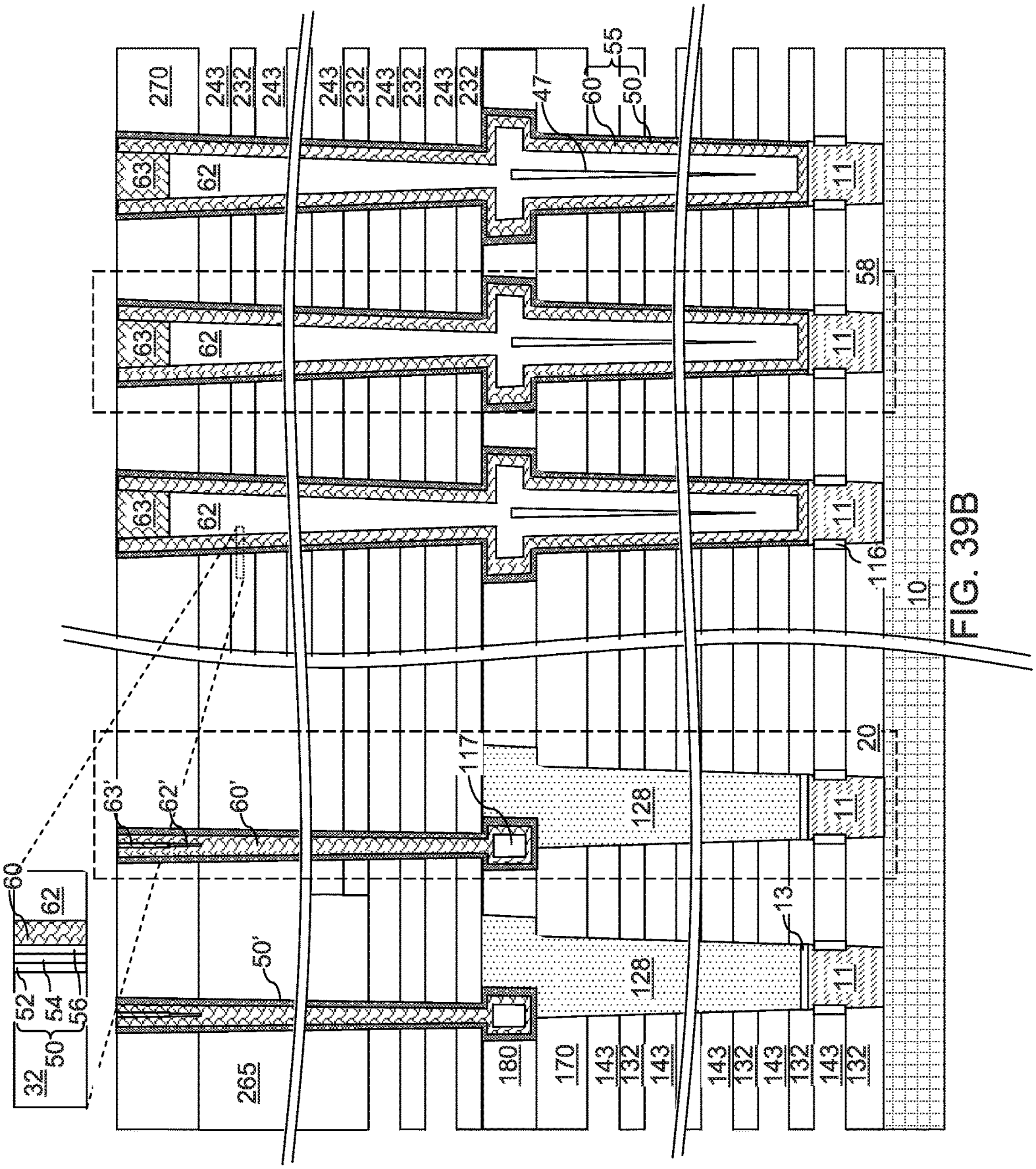
FIG. 39B is a vertical cross-sectional view of a region of the third exemplary structure of FIG. 39A.

Referring to FIGS. 39A and 39B, the processing steps of FIGS. 14A and 14B can be performed to remove the first and second sacrificial material layers (142, 242) and to form first and second backside recesses (143, 243).

Figure 40A:
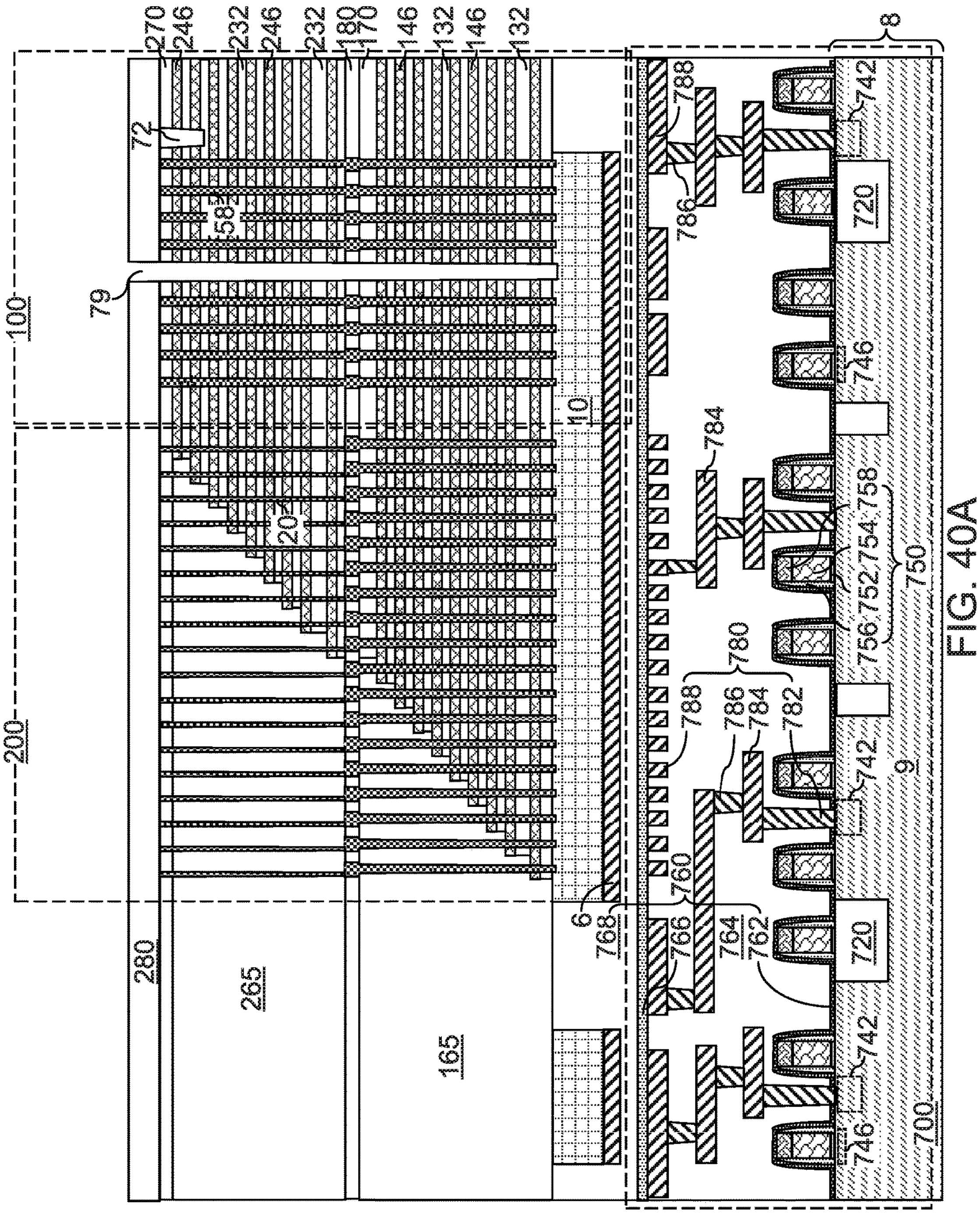
FIG. 40A is a vertical cross-sectional view of the third exemplary structure after formation of electrically conductive layers in the backside recesses according to the third embodiment of the present disclosure.
Figure 40B:
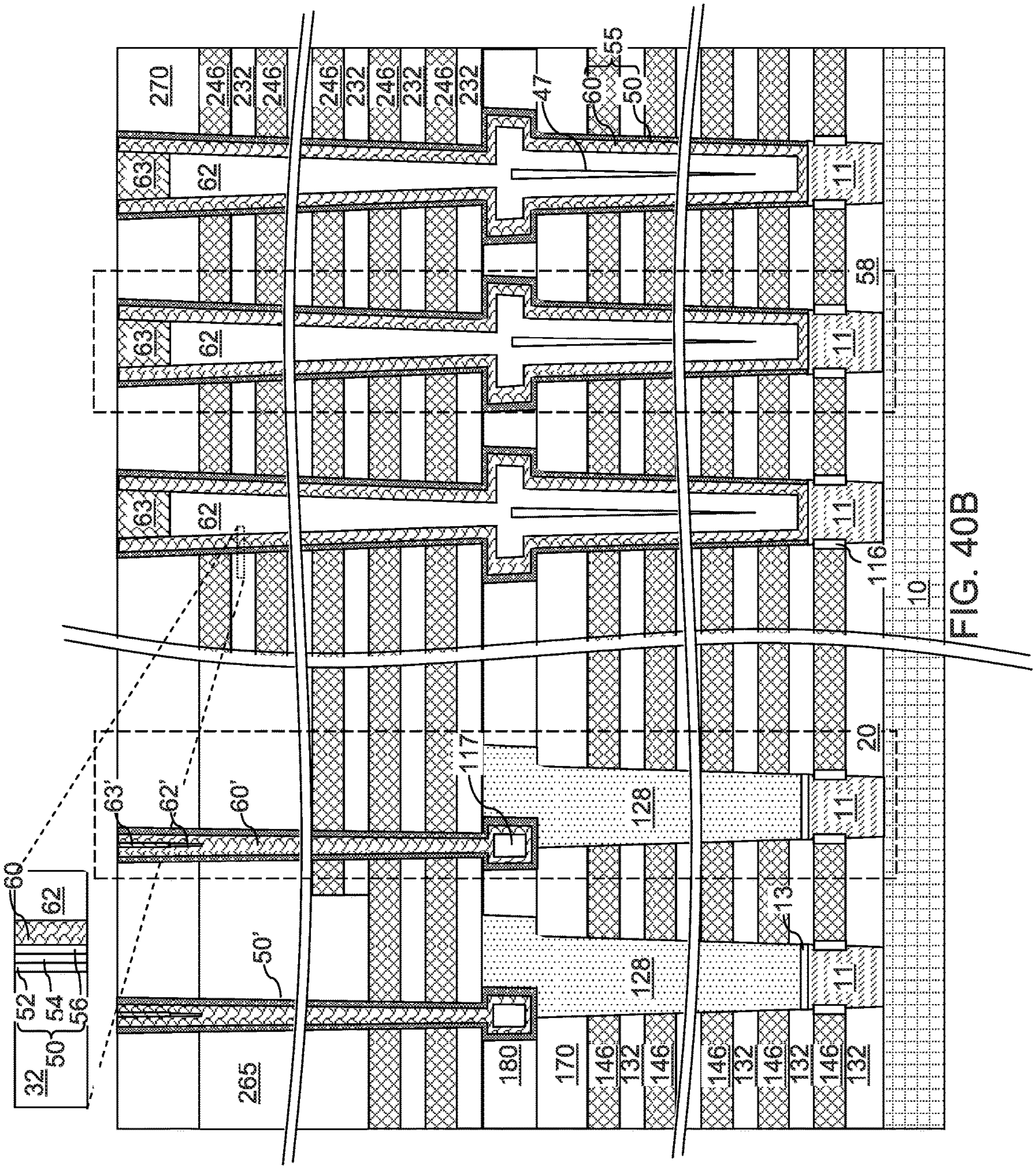
FIG. 40B is a vertical cross-sectional view of a region of the third exemplary structure of FIG. 40A.

Referring to FIGS. 40A and 40B, the processing steps of FIGS. 15A-15C can be performed to form an optional backside blocking dielectric layer and first and second electrically conductive layers (146, 246).

Figure 41:
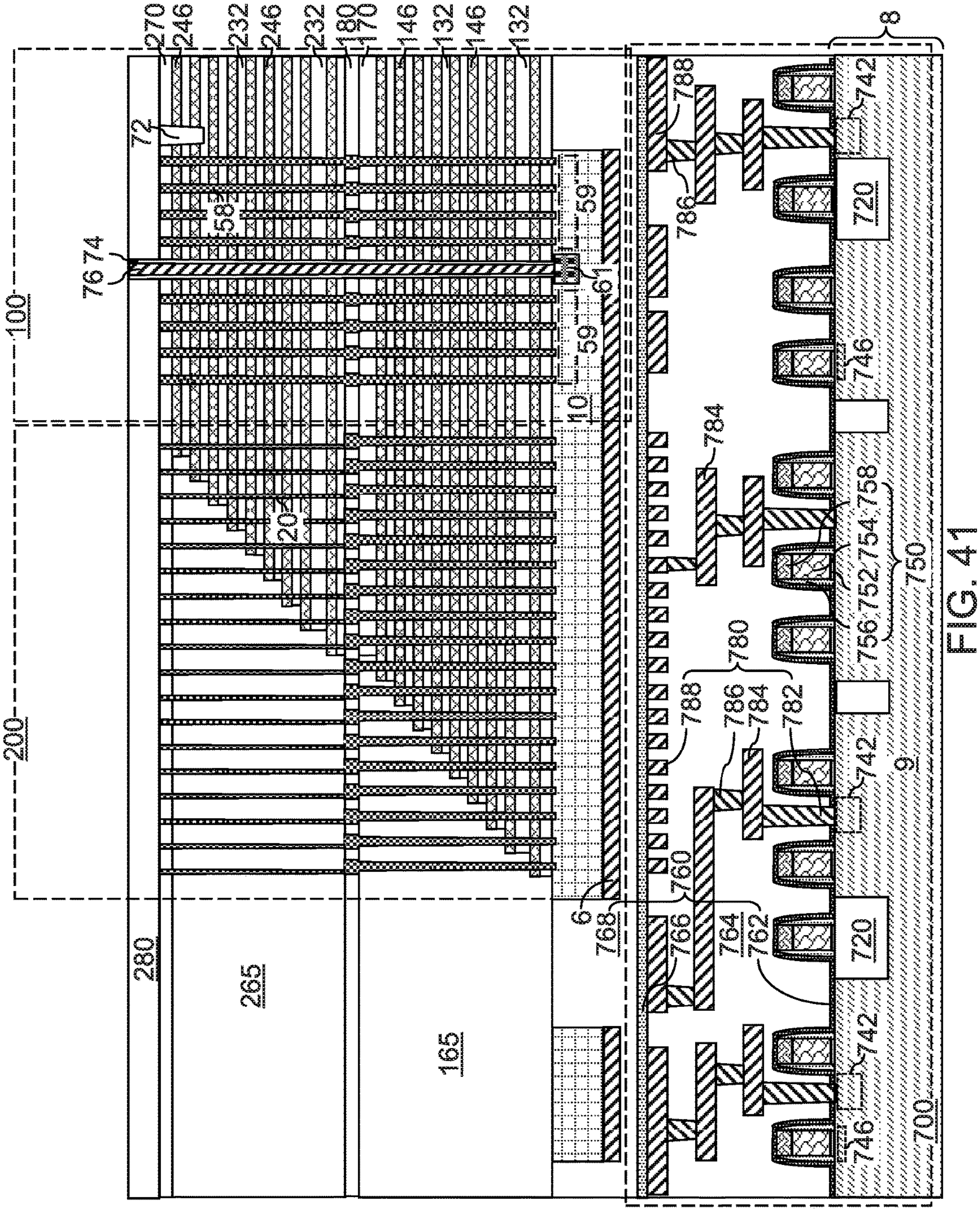
FIG. 41 is a vertical cross-sectional view of the third exemplary structure after formation of source regions and backside contact structures according to the third embodiment of the present disclosure.

Referring to FIG. 41, the processing steps of FIG. 16 can be performed to form source regions 61, insulating spacers 74, and backside contact via structures 76.

Figure 42A:
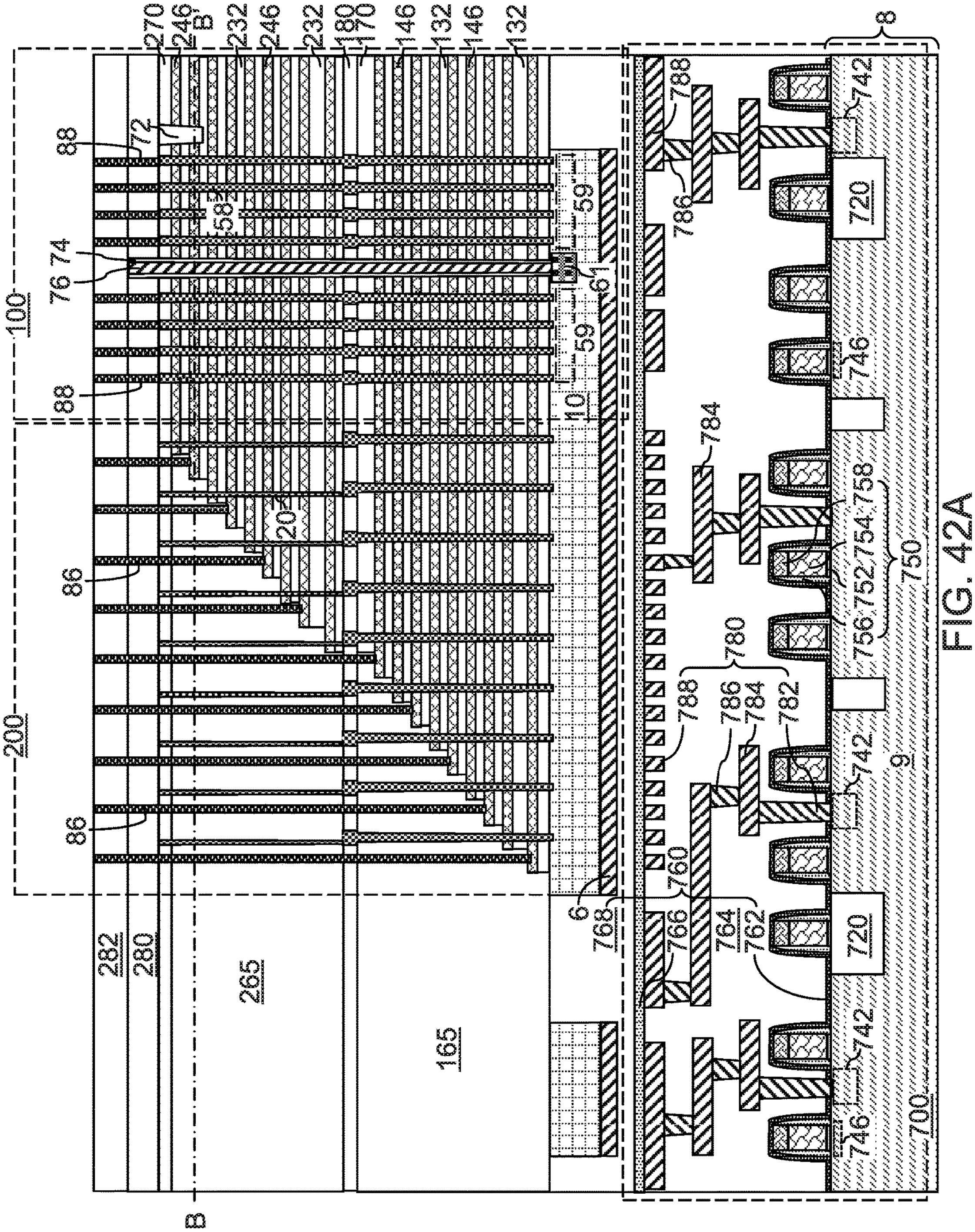
FIG. 42A is a vertical cross-sectional view of the third exemplary structure after formation of conductive layer contact via structures and drain contact via structures according to the third embodiment of the present disclosure.
Figure 42B:
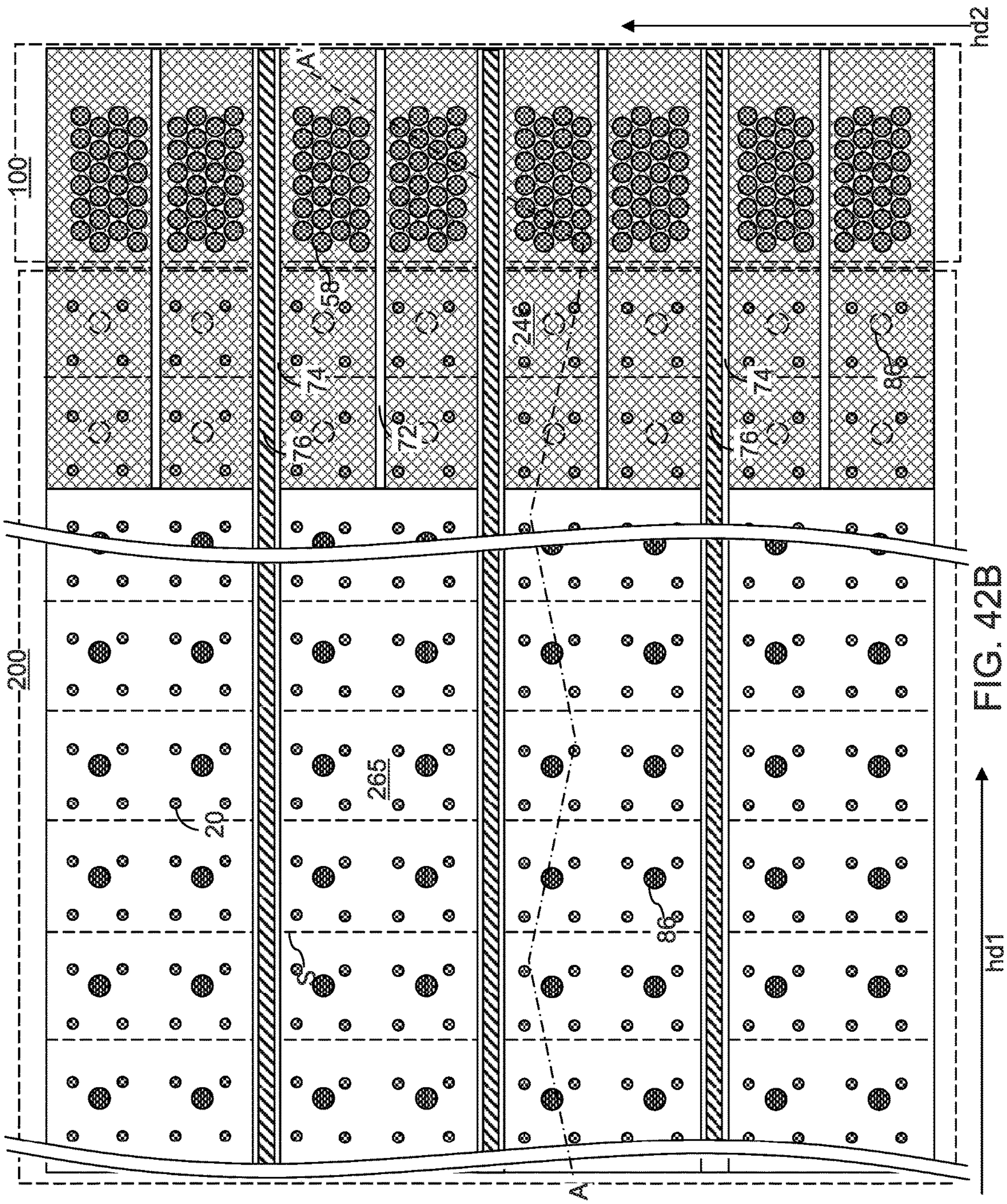
FIG. 42B is a horizontal cross-sectional view of the third exemplary structure along the vertical plane B-B' of FIG. 42A.

Referring to FIGS. 42A and 42B, the processing steps of FIGS. 17A and 17B can be performed to form a contact level dielectric layer 282, a drain contact via structures 88, and conductive layer contact via structures 86.

Referring to FIG. 42, the processing steps of FIG. 18 can be performed to form peripheral-region contact via structures 488.

Figure 43:
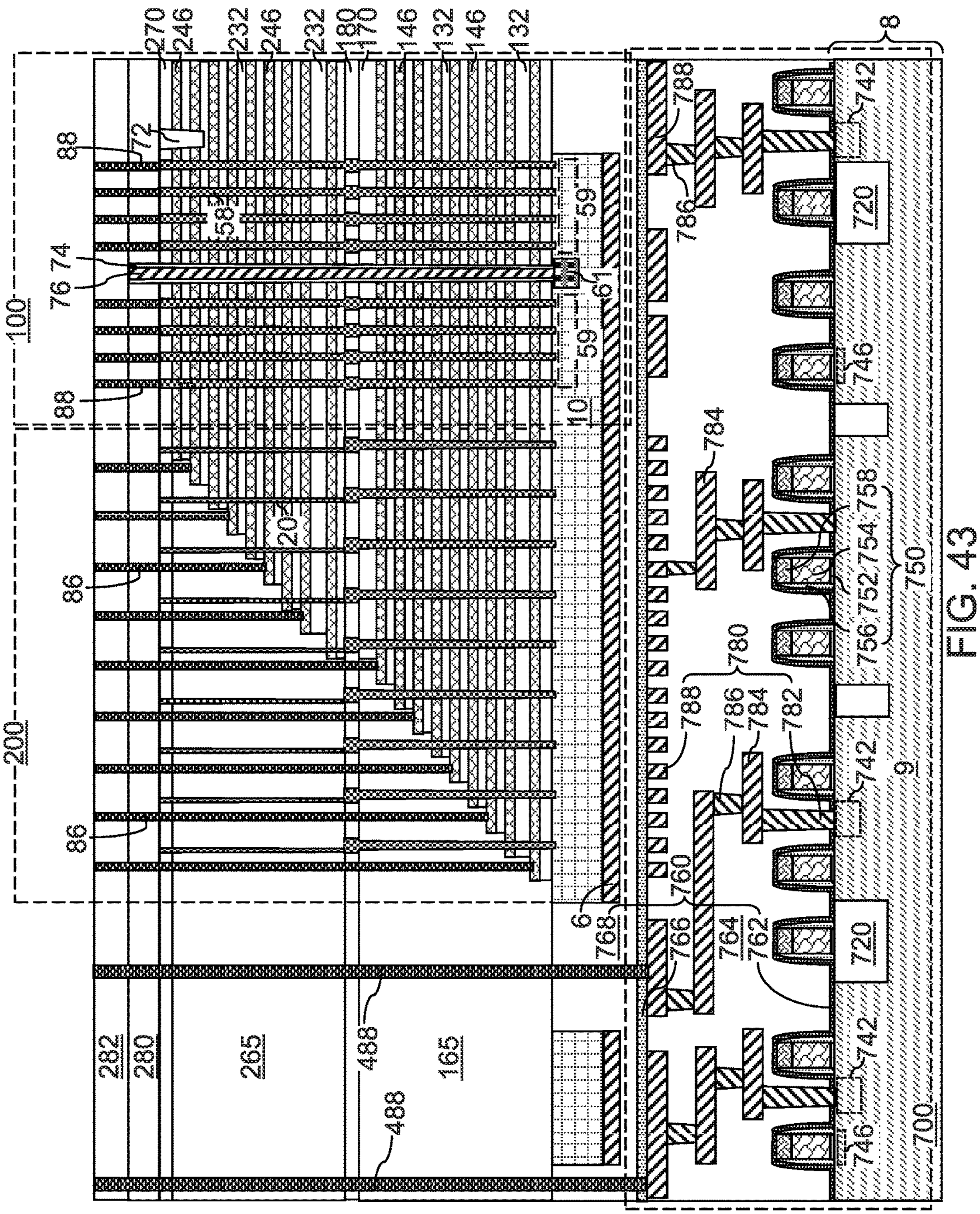
FIG. 43 is a vertical cross-sectional view of the third exemplary structure after formation of through-memory-level contact via structures according to the third embodiment of the present disclosure.

Referring to FIG. 43, the processing steps of FIG. 19 can be performed to form at least one additional dielectric layer over the contact level dielectric layer 282.

Figure 44:
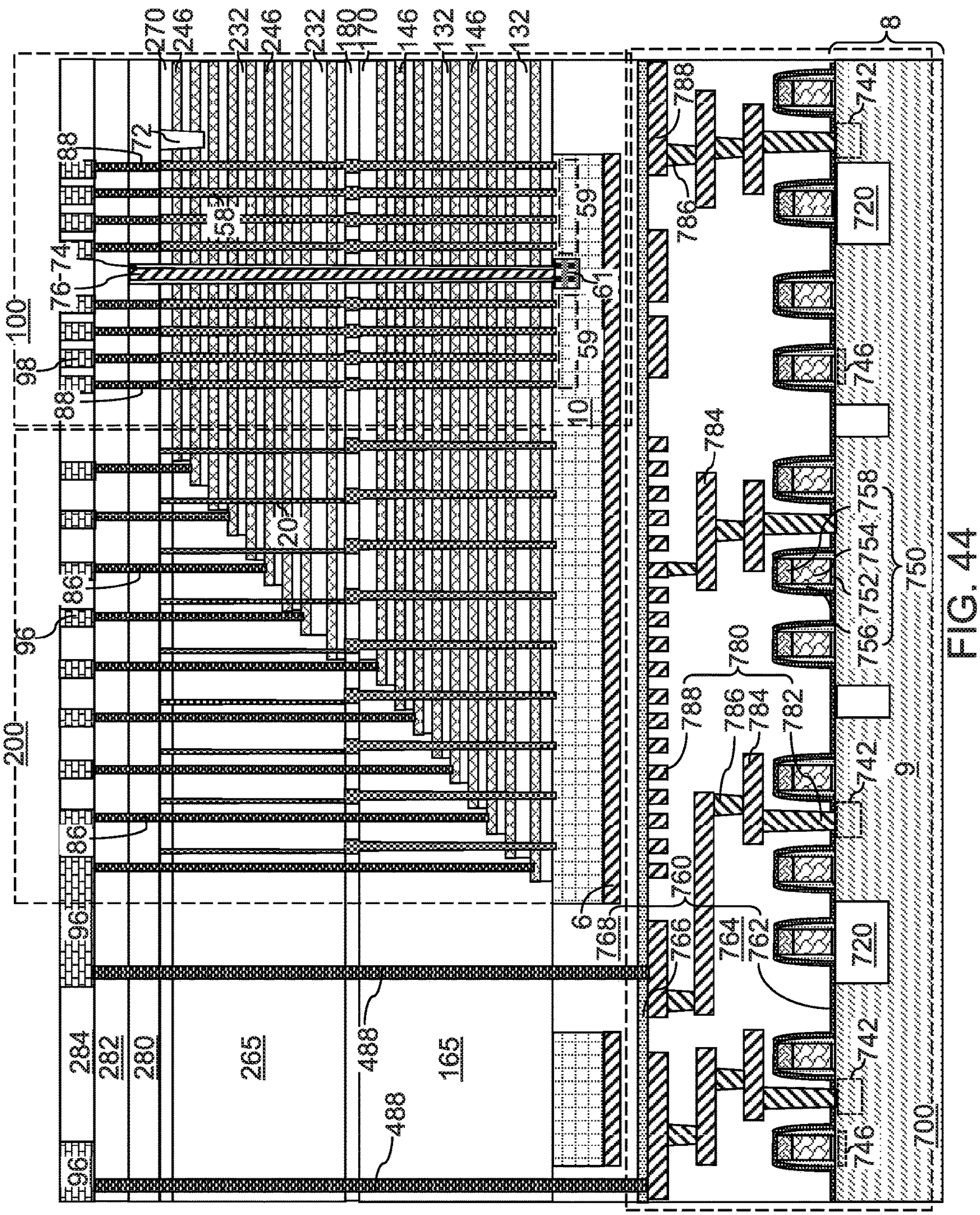
FIG. 44 is a vertical cross-sectional view of the third exemplary structure after formation of a line level dielectric layer and metal interconnect line structures according to the third embodiment of the present disclosure.

Referring to FIG. 44, additional metal interconnect structures (herein referred to as upper-level metal interconnect structures) can be formed in the at least one additional dielectric layer. For example, the at least one additional dielectric layer can include a line-level dielectric layer 284 that is formed over the contact level dielectric layer 282. The upper-level metal interconnect structures can include bit lines 98 contacting, or electrically shorted to, a respective one of the drain contact via structures 88, and interconnection line structures 96 contacting, and/or electrically shorted to, at least one of the conductive layer contact via structures 86 and/or the peripheral region contact via structures 488.

Figure 45:
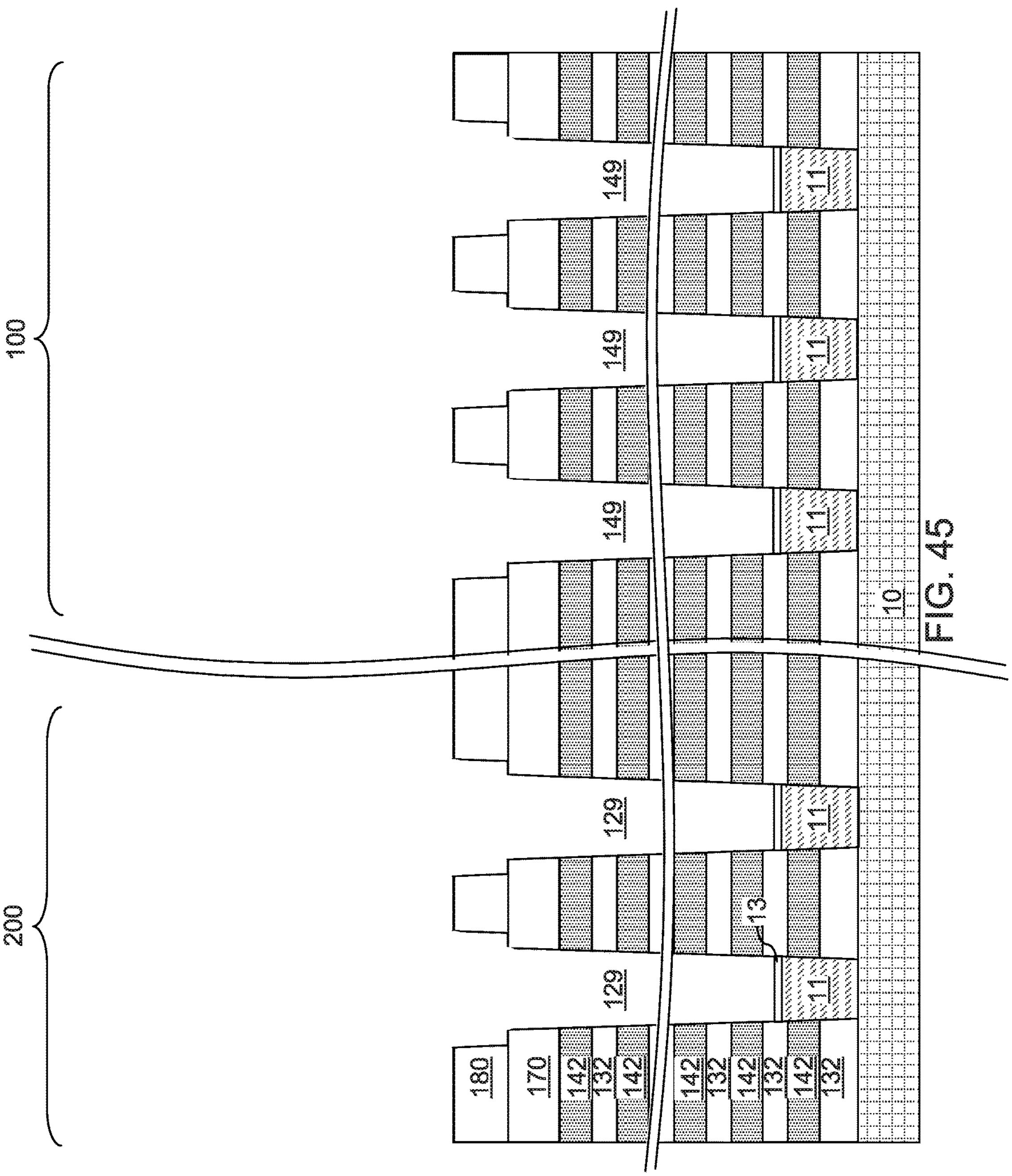
FIG. 45 is a vertical cross-sectional view of a fourth exemplary structure after formation of first-tier memory openings and first-tier support openings and expansion of upper portions thereof according to a fourth embodiment of the present disclosure.

Referring to FIG. 45, a fourth exemplary structure according to a fourth embodiment of the present disclosure is illustrated after formation of first-tier memory openings 149 and first-tier support openings 129 and expansion of upper portions thereof. The fourth exemplary structure at the step of FIG. 45 can be the same as the first exemplary structure of FIG. 5.

Figure 46A:
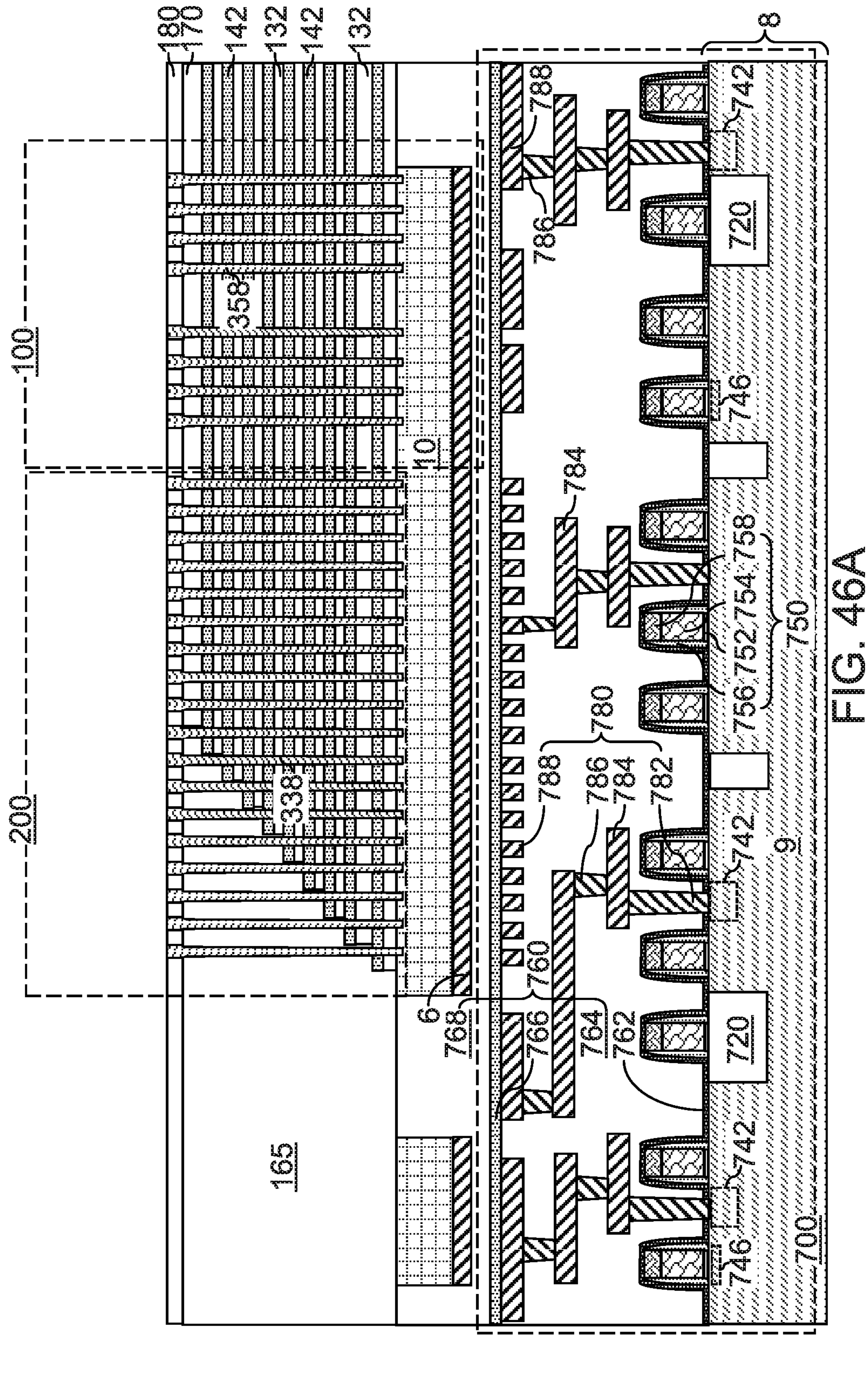
FIG. 46A is a vertical cross-sectional view of the fourth exemplary structure after formation of first-tier memory opening fill structures and first-tier support opening fill structures according to the fourth embodiment of the present disclosure.
Figure 46B:
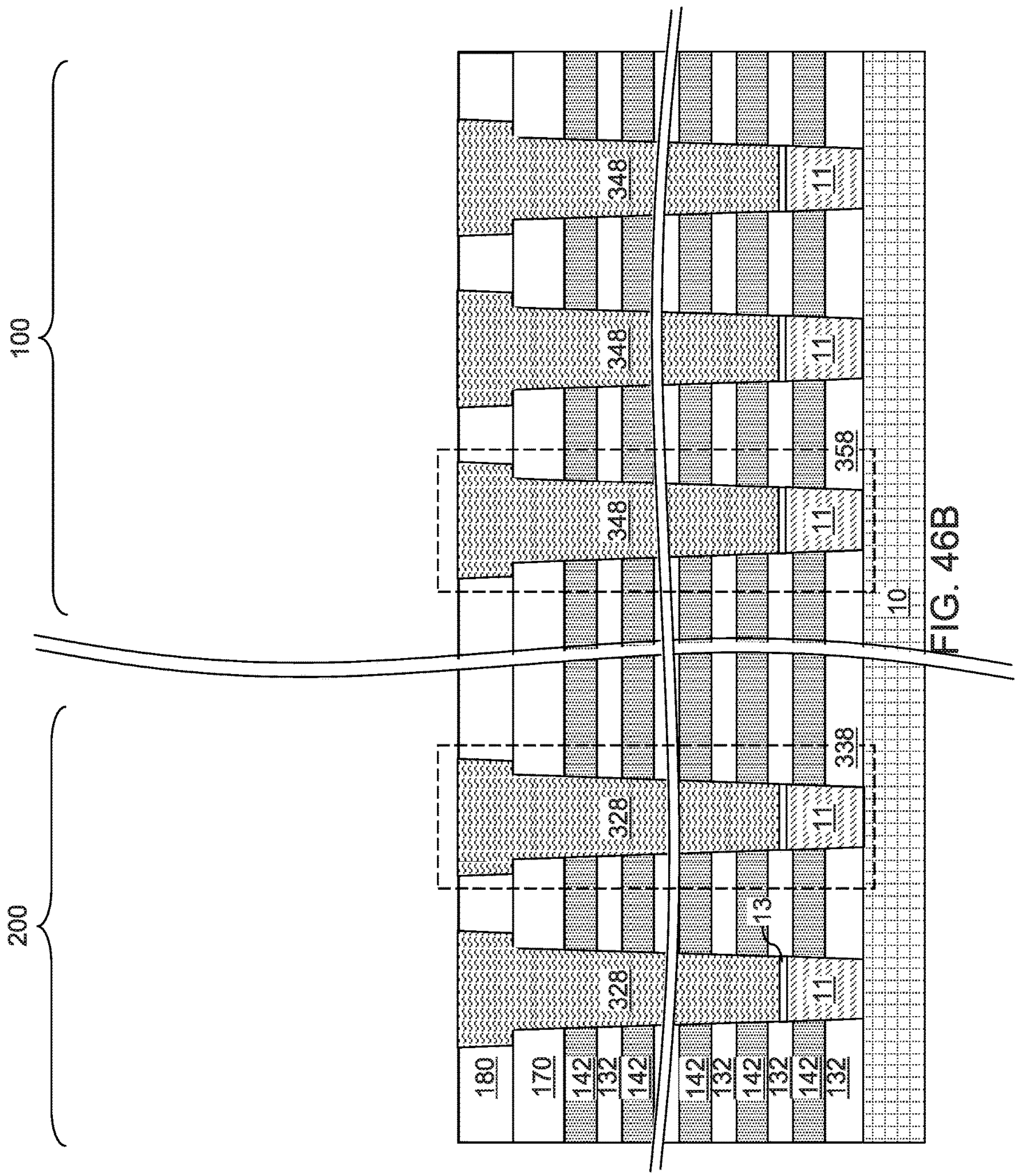
FIG. 46B is a vertical cross-sectional view of a region of the third exemplary structure of FIG. 46A.

Referring to FIGS. 46A and 46B, first-tier opening fill portions (348, 328) can be formed in the various first-tier openings (149, 129). A first-tier fill material is deposited concurrently deposited in each unfilled volume of the first-tier openings (149, 129). The first-tier fill material includes a material that can be subsequently removed selective to the materials of the first insulating layers 132 and the first sacrificial material layers 142. In one embodiment, the first-tier fill material can include a semiconductor material such as silicon (e.g., amorphous silicon or polysilicon), a silicon-germanium alloy, germanium, a III-V compound semiconductor material, or a combination thereof. In one embodiment, the first-tier fill material can comprise amorphous semiconductor material including silicon at an atomic concentration greater than 80%. In one embodiment, a semiconductor material including electrical dopants at a dopant concentration less than $1.0\times10^{17}/cm^3$, and/or less than $3.0\times10^{15}/cm^3$ and/or less than $1.0\times10^{14}/cm^3$, can be deposited thin the first-tier memory opening and the first-tier support opening. The first-tier fill material may be formed by a non-conformal deposition or a conformal deposition method.

Portions of the deposited sacrificial material can be removed from above the inter-tier dielectric layer 180. For example, the first-tier fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the first-tier fill material comprise first-tier opening fill portions (348, 328). Specifically, each remaining portion of the first-tier fill material in a first-tier memory opening 149 constitutes a first-tier memory opening fill portion 348. Each remaining portion of the first-tier fill material in a first-tier support opening 129 constitutes a first-tier support opening fill portion 328.

The various first-tier opening fill portions (348, 328) are concurrently formed, i.e., during a same set of processes including the deposition process that deposits the first-tier fill material and the planarization process that removes the first-tier deposition process from above the first alternating stack (132, 142) (such as from above the top surface of the inter-tier dielectric layer 180). The top surfaces of the first-tier opening fill portions (348, 328) can be coplanar with the top surface of the inter-tier dielectric layer 180. Each of the first-tier opening fill portions (348, 328) may, or may not, include cavities therein.

Each contiguous set of a pedestal channel portion 11, a semiconductor oxide plate 13, and a first-tier memory opening fill portion 348 constitutes a first-tier memory opening fill structure 358. Each contiguous set of a pedestal channel portion 11, a semiconductor oxide plate 13, and a first-tier support opening fill portion 328 constitutes a first-tier support opening fill structure 338. The first-tier memory opening fill structures 358 and the first-tier support opening fill structures 138 are collectively referred to as first-tier opening fill structures (358, 338).

Figure 47:
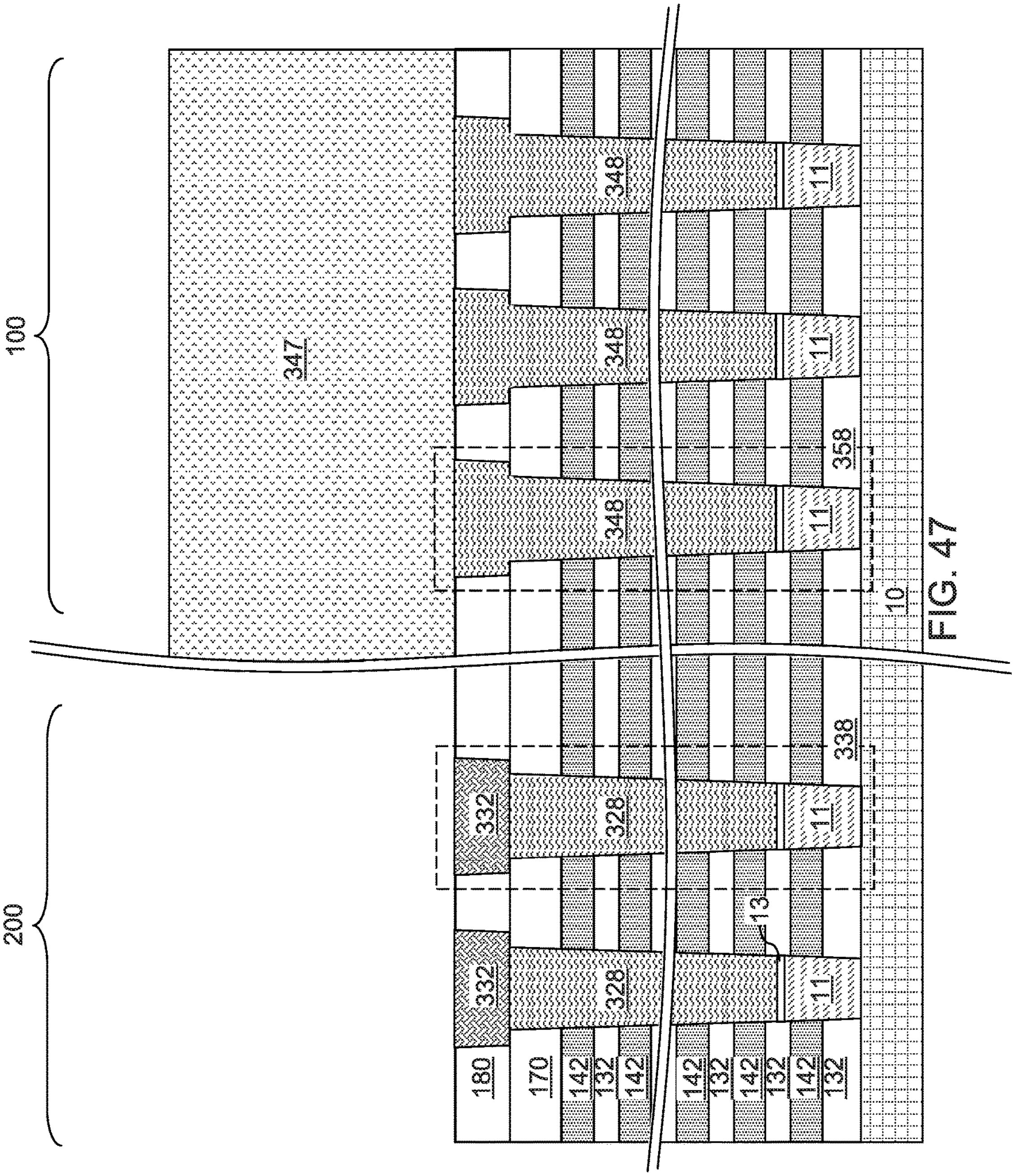
FIG. 47 is a vertical cross-sectional view of a region of the third exemplary structure after formation of doped semiconductor material regions employing a masked ion implantation process according to the fourth embodiment of the present disclosure.

Referring to FIG. 47, a photoresist layer 347 can be applied over the inter-tier dielectric layer 180, and can be lithographically patterned to cover the memory array region 100 while not covering the contact region 200. Doped semiconductor material regions 332 can be formed by implanting electrical dopants into upper regions of the first-tier support opening fill portion 328 employing a masked ion implantation process. Specifically, electrical dopants (which may be p-type dopants or n-type dopants) can be implanted into the upper region of each first-tier support opening fill portion 328 (which are portions of the deposited semiconductor material within the first-tier support openings 129) while preventing implantation of the electrical dopants into the first-tier memory opening fill portion 348 (which are portion of the deposited material within the first-tier memory openings 149). Each implanted upper region of the first-tier support opening fill portions 328 within the first-tier support openings 149 constitutes a doped semiconductor material portion 332. Upon conversion of upper regions of the first-tier support opening fill portions 328 into doped semiconductor material portions 332, each contiguous set of a doped semiconductor material portion 332, a first-tier support opening fill portion 328, a semiconductor oxide plate 13, and a pedestal channel portion 11 constitutes a first-tier support opening fill structure 338.

In one embodiment, the dose and the implantation depth of the electrical dopants implanted into the upper regions of the first-tier support opening fill portions 328 can be selected such that each doped semiconductor material portion 332 includes electrical dopants at a dopant concentration in a range from $5.0\times10^{19}/cm^3$ and $2.0\times10^{21}/cm^3$. The first-tier memory opening fill portions 348 and the first-tier support opening fill portions 328 can include electrical dopants at a dopant concentration less than $1.0\times10^{17}/cm^3$, such as less than $3.0\times10^{15}/cm^3$, and/or less than $1.0\times10^{14}/cm^3$. The photoresist layer 347 can be subsequently removed, for example, by ashing.

Figure 48:
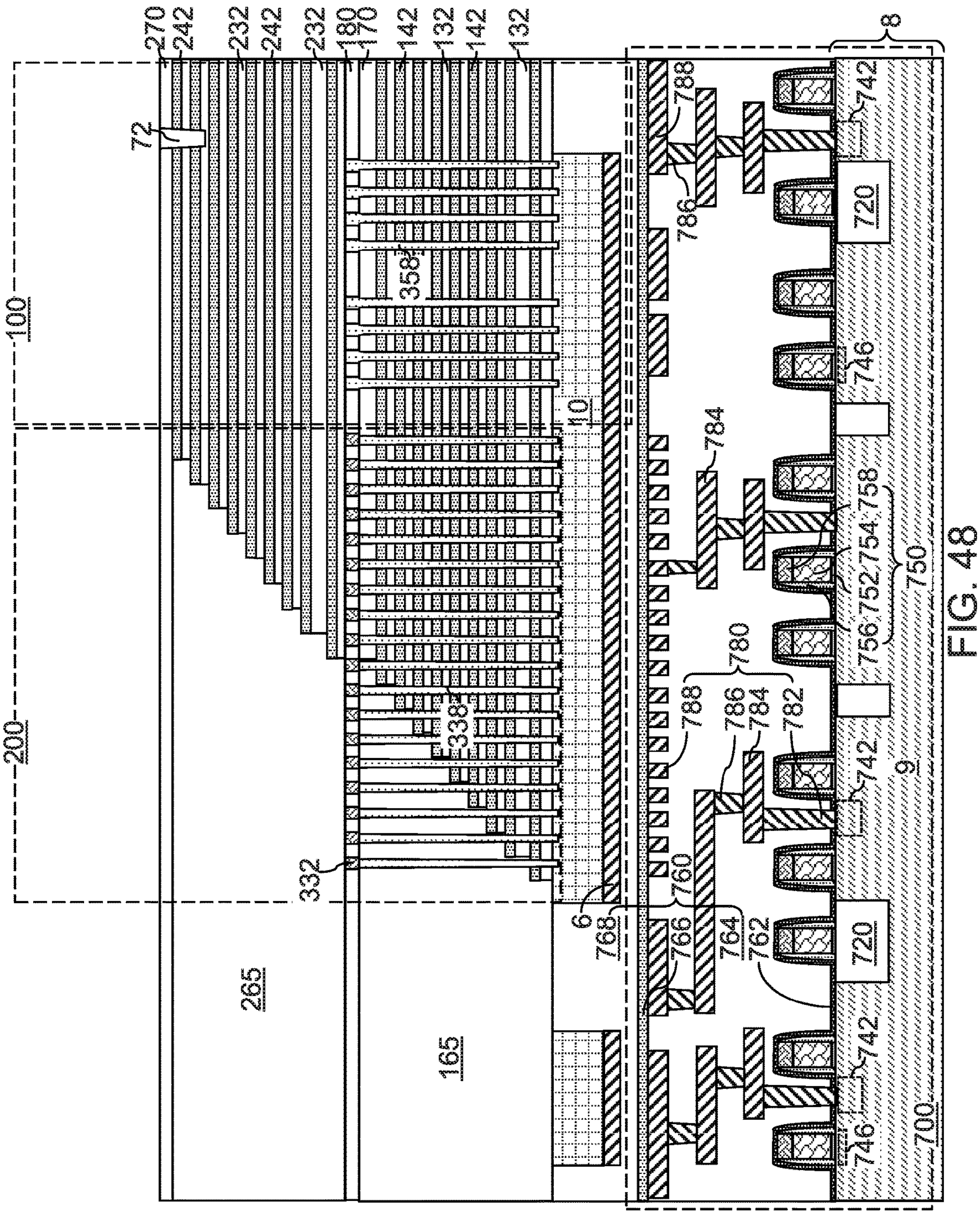
FIG. 48 is a vertical cross-sectional view of the fourth exemplary structure after formation of a second alternating stack of second insulating layers and second sacrificial material layers, a second retro-stepped dielectric material portion, a second insulating cap layer, and dielectric isolation structures according to the fourth embodiment of the present disclosure.

Referring to FIG. 48, the processing steps of FIG. 7 can be performed to form a second-tier structure over the first-tier structure (132, 142, 170, 358, 338) and the inter-tier dielectric layer 180. The second-tier structure can include a second alternating stack of second insulating layers 232 and second sacrificial material layers 242 having second stepped surfaces, a second retro-stepped dielectric material portion 265, a second insulating cap layer 270, and drain-select-level isolation structures 72.

Figure 49A:
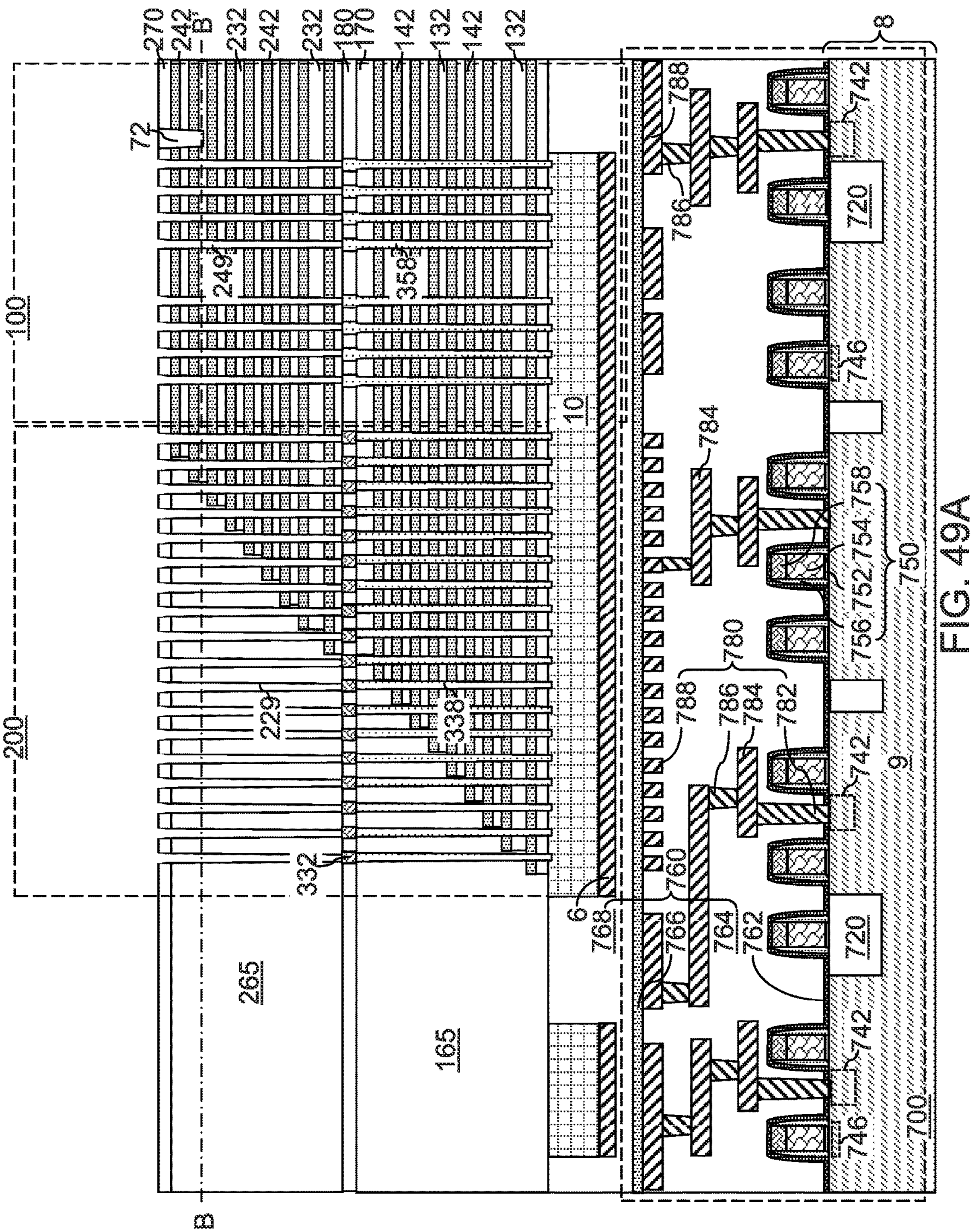
FIG. 49A is a vertical cross-sectional view of the fourth exemplary structure after formation of second-tier memory openings and second-tier support openings according to the fourth embodiment of the present disclosure.
Figure 49B:
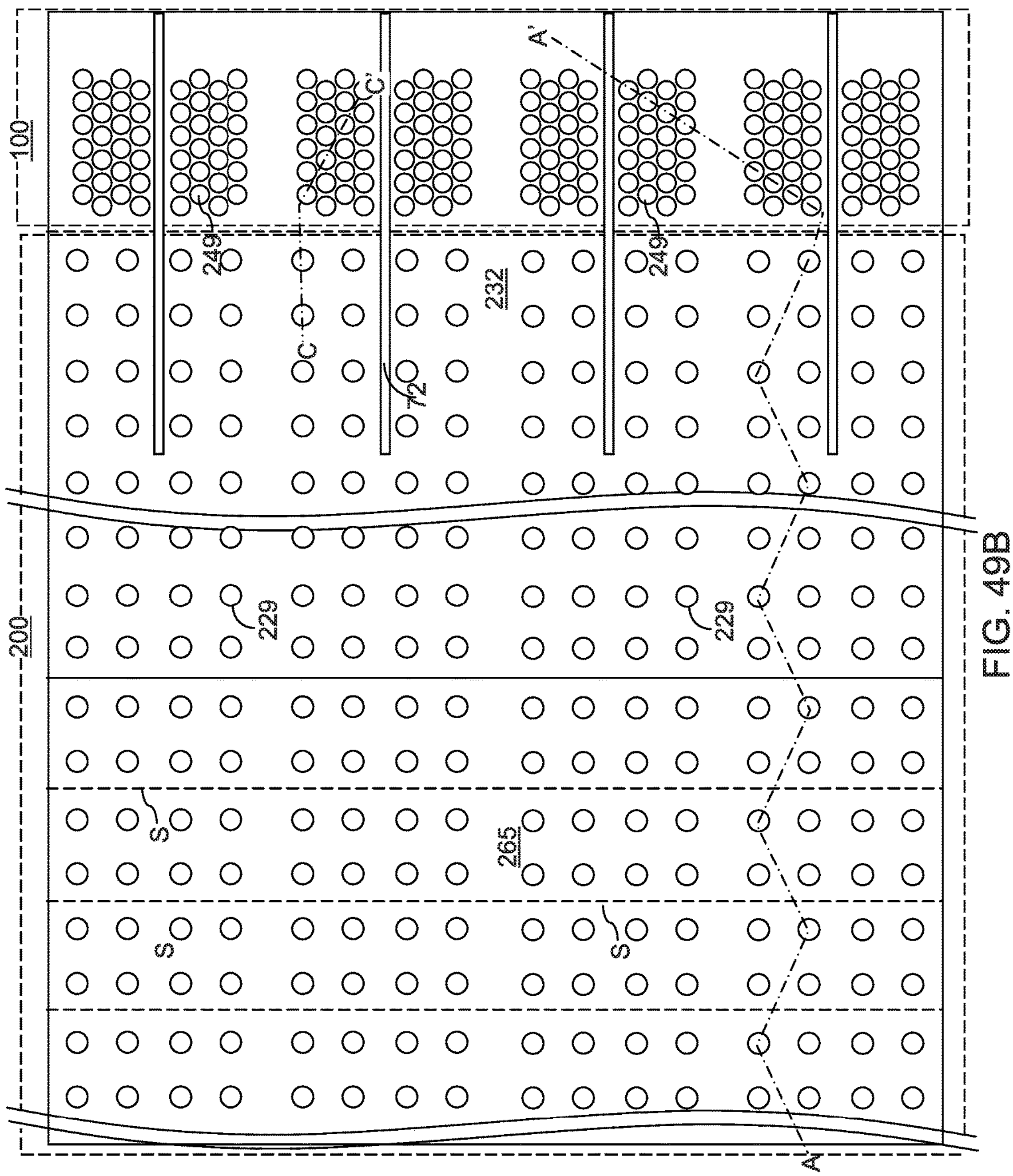
FIG. 49B is a horizontal cross-sectional view of the fourth exemplary structure along the horizontal plane B-B' of FIG. 49A. The zig-zag vertical plane A-A' is the plane of the vertical cross-sectional view of FIG. 49A.
Figure 49C:
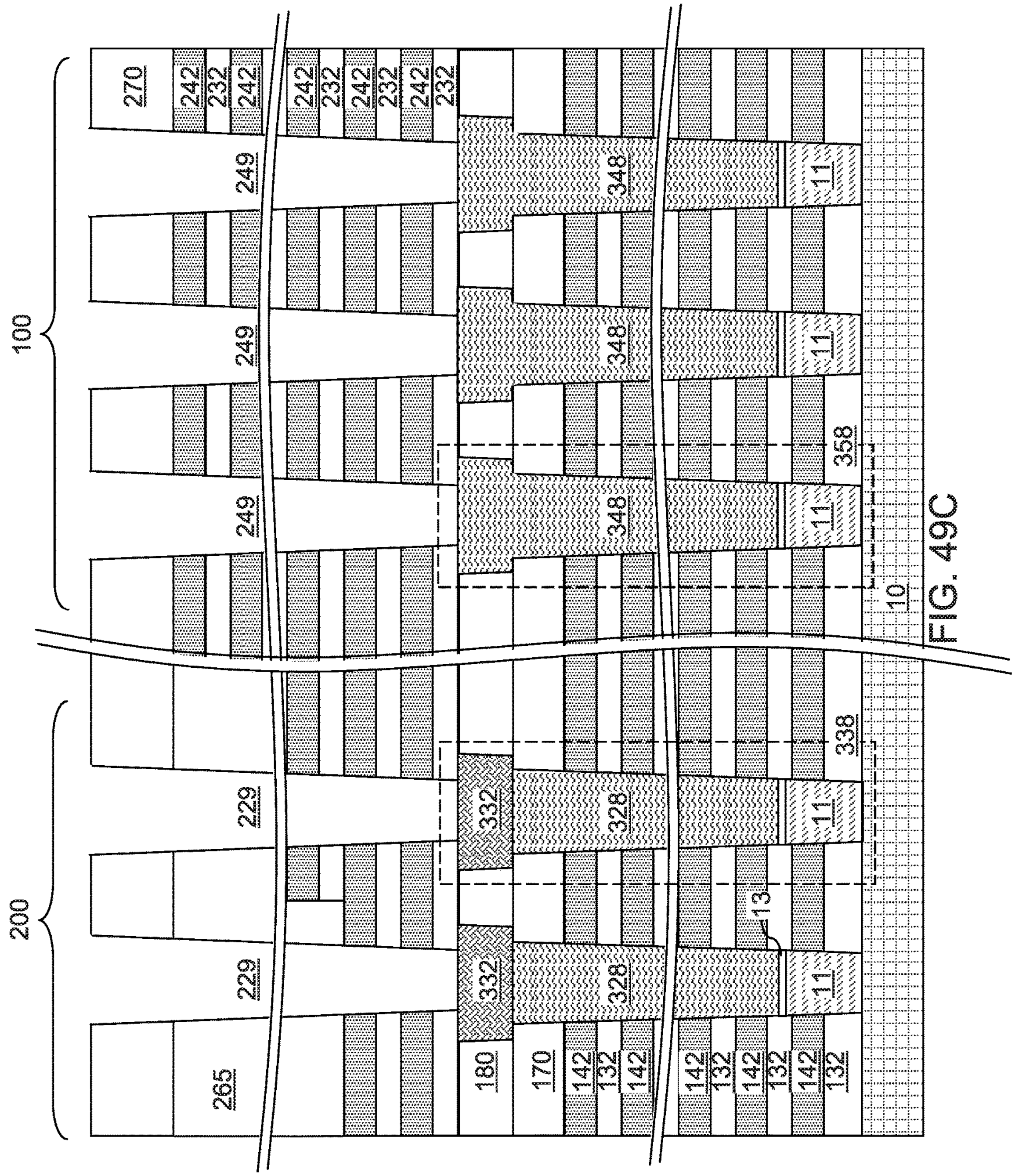
FIG. 49C is a vertical cross-sectional view of the fourth exemplary structure along the vertical plane C-C' of FIG. 49B.

Referring to FIGS. 49A-49C, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings in the patterned photoresist layer can be the same as the pattern of the various first-tier openings (149, 129). Thus, the lithographic mask employed to pattern the first-tier openings (149, 129) can be employed for pattern the photoresist layer, which is subsequently employed as an etch mask for forming the second-tier openings (249, 229).

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the first-tier memory opening fill structures 358. The second-tier support openings 229 are formed directly on a top surface of a respective one of the first-tier support opening fill structures 338. Further, a subset of the second-tier support openings 229 can be formed through the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 49B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset inward from, and/or may be located entirely within, a periphery of a top surface of an underlying first-tier opening fill structures (358, 338). The photoresist layer can be subsequently removed, for example, by ashing.

The second-tier memory opening 249 and the second-tier support opening 229 are formed through the second alternating stack (232, 242) by the anisotropic etch process. The second-tier memory openings 249 are formed over, and directly on, a respective one of the first-tier memory opening fill structures 358. The second-tier support openings 229 are formed over, and directly on, a respective one of the first-tier support opening fill structures 338.

Figure 50:
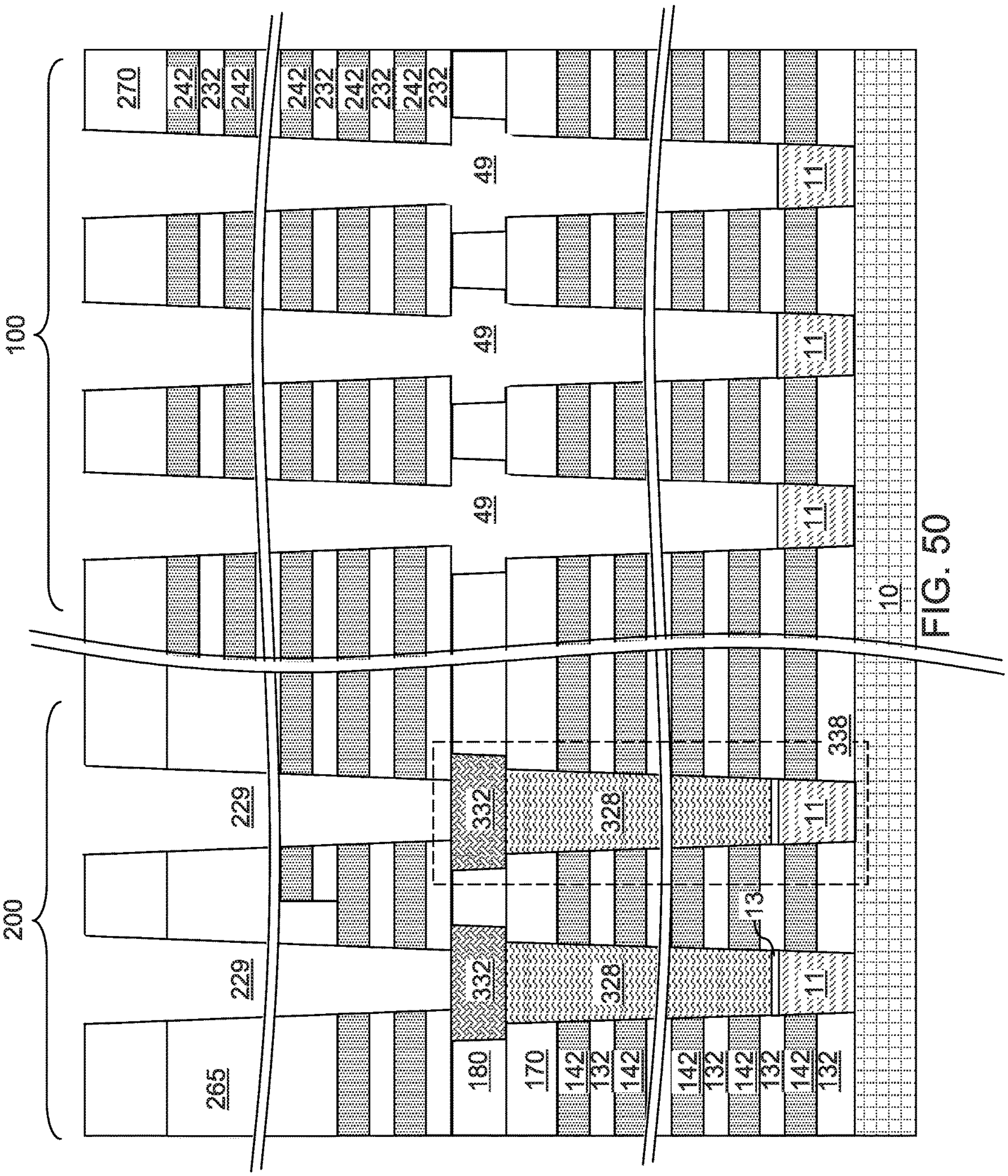
FIG. 50 is a vertical cross-sectional view of a region of the fourth exemplary structure after formation of inter-tier memory openings according to the fourth embodiment of the present disclosure.

Referring to FIG. 50, an etch process concurrently applies an etchant that etches a material of the first-tier memory opening fill structures 358 (e.g., the first-tier fill material) into the second-tier memory openings 249 and into the second-tier support openings 229. Specifically, the etch process etches the first-tier fill material of the sacrificial memory opening fill structures 348 selective to the materials of the doped semiconductor material portions 332, the first and second insulating layers (132, 232), the first and second sacrificial material layers (142,242), the first and second insulating cap layers (170, 270), and the inter-tier dielectric layer 180. If the first-tier fill material comprises amorphous silicon, a wet etch process employing hot trimethyl-2 hydroxyethyl ammonium hydroxide ("hot TMY") or tetramethyl ammonium hydroxide (TMAH) can be employed to remove the first-tier fill material. The semiconductor oxide plates 13 in the first-tier memory openings 149 may be optionally removed by an etch process selective to the pedestal channel portions 11. For example, a wet etch employing dilute hydrofluoric acid can be performed to remove the semiconductor oxide plates 13.

A cavity, which is a second-tier opening 229 that extends down to a top surface of a respective doped semiconductor material portion 332, is formed in the contact region 200. Each inter-tier memory opening 49 can be formed in the memory array region 100 by removing portions of a respective first-tier memory opening fill structure 358 from underneath a respective second-tier memory opening 249. Each inter-tier memory opening 49 includes an entire volume of a respective second-tier memory opening 249 and a predominant portion (i.e., more than 50%, which may be more than 80% and/or more than 90%) of an entire volume of a respective underlying first-tier memory opening fill structure 358. Each cavity, i.e., each second-tier support opening 229, includes an entire volume of a respective second-tier support opening 229 as provided at the processing steps of FIGS. 49A-49C. The bottommost surface of the second-tier support openings 229 can be located above the horizontal plane including the topmost surface of the first alternating stack (132, 142). Thus, each cavity in the contact region 200, i.e., each second-tier support opening 229, can be formed without removing an underlying first-tier support opening fill structure 338. The inter-tier memory openings 49 and the cavities (i.e., the second-tier support openings 229) are simultaneously formed by the anisotropic etch process.

Figure 51:
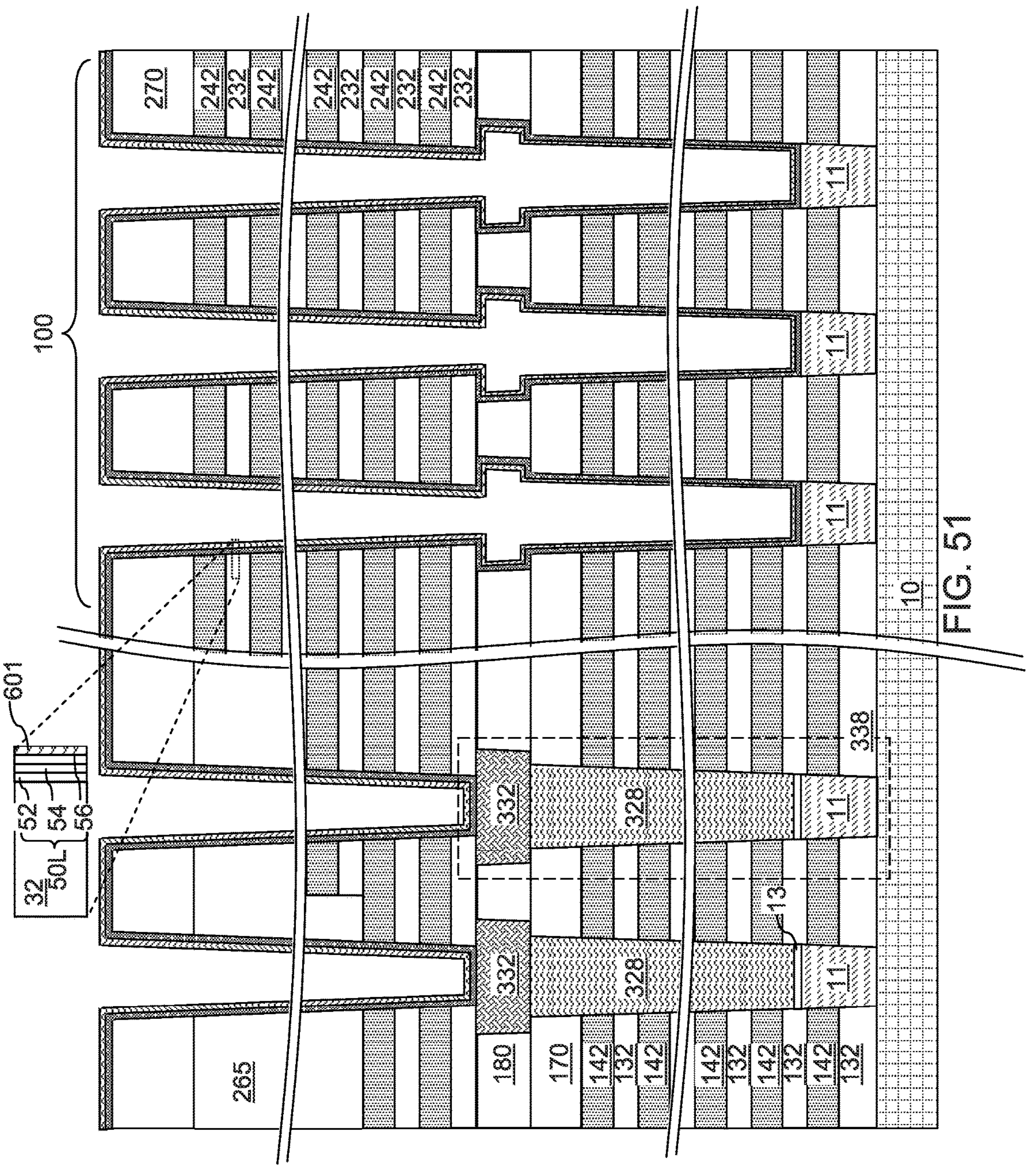
FIG. 51 is a vertical cross-sectional view of a region of the fourth exemplary structure after formation of a memory film layer and a semiconductor channel material layer according to the fourth embodiment of the present disclosure.

Referring to FIG. 51, the processing steps of FIG. 10 can be performed to form a memory film layer 50L and an optional first semiconductor channel layer 601 in the inter-tier memory openings 49 and the second-tier support openings 229 and over the second insulating cap layer 270. The memory film layer 50L and the optional first semiconductor channel layer 601 do not extend below the bottom surface of the inter-tier dielectric layer 180 in the contact region 200.

Figure 52:
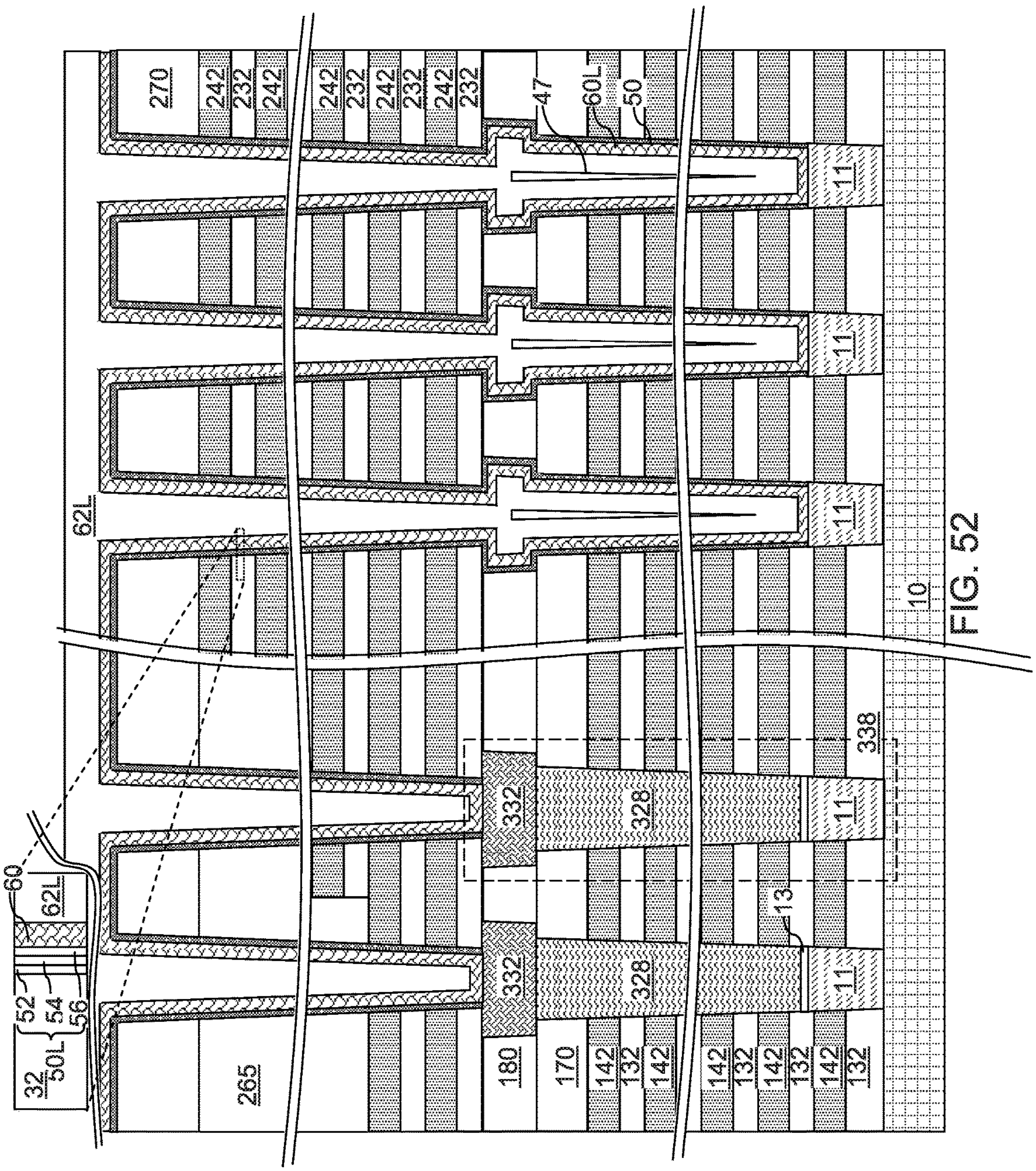
FIG. 52 is a vertical cross-sectional view of a region of the fourth exemplary structure after formation of a dielectric core material layer according to the fourth embodiment of the present disclosure.

Referring to FIG. 52, the processing steps of FIG. 11 can be performed to anisotropically etch the optional first semiconductor channel layer 601, the tunneling dielectric layer 56, the charge storage layer 54, and the blocking dielectric layer 52, and to physically expose top surfaces of the pedestal channel portions 11 (or the top surfaces of the planar semiconductor material layer in case the pedestal channel portions 11 are not present).

A second semiconductor channel layer can be deposited as in the processing steps of FIG. 11. In one embodiment, the first semiconductor channel layer 601 may be optionally removed isotropically, for example, by a wet etch process employing hot TMY. The second semiconductor channel layer, or the set of first semiconductor channel layer 601 and the second semiconductor channel layer in case the first semiconductor channel layer 601 is not removed, is referred to as a semiconductor channel material layer 60L. In case the memory cavity in each memory opening is not completely filled by the second semiconductor channel layer, a dielectric core layer 62L can be deposited in the memory cavity to fill any remaining portion of the memory cavity within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

An encapsulated memory cavity 47 may, or may not, be formed in each inter-tier memory opening 49 within the first alternating stack (132, 142). The encapsulated memory cavities 47 are volumes of the inter-tier memory openings 49 that are not filled with the materials of the memory film layer 50L, the semiconductor channel material layer 60L, and the dielectric core layer 62L. The memory film layer 50L and the optional first semiconductor channel layer 601 do not extend below the topmost surface of the first alternating stack (132, 142) in the contact region 200.

Figure 53A:
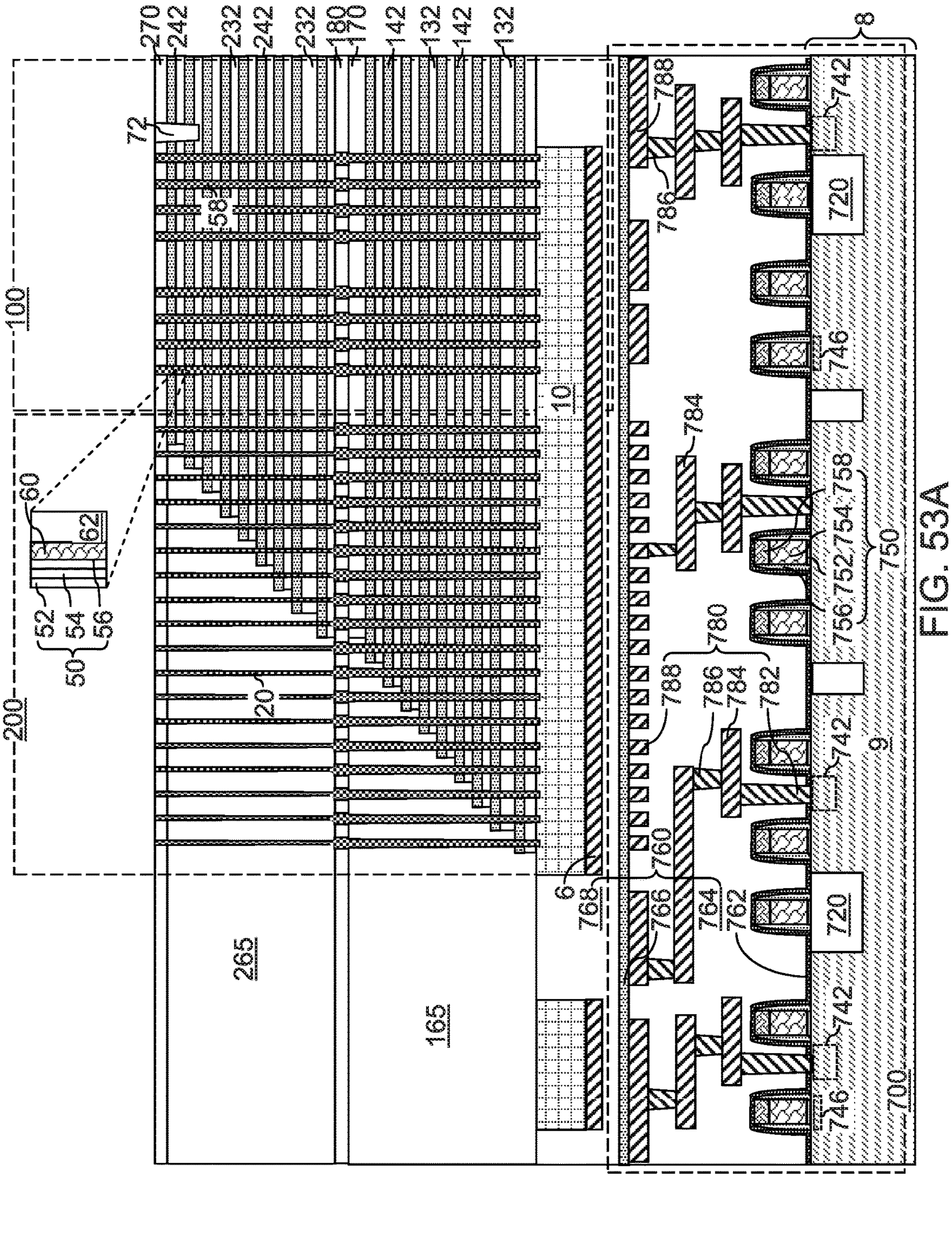
FIG. 53A is a vertical cross-sectional view of the fourth exemplary structure after formation of memory opening fill structures and support pillar structures according to the fourth embodiment of the present disclosure.
Figure 53B:
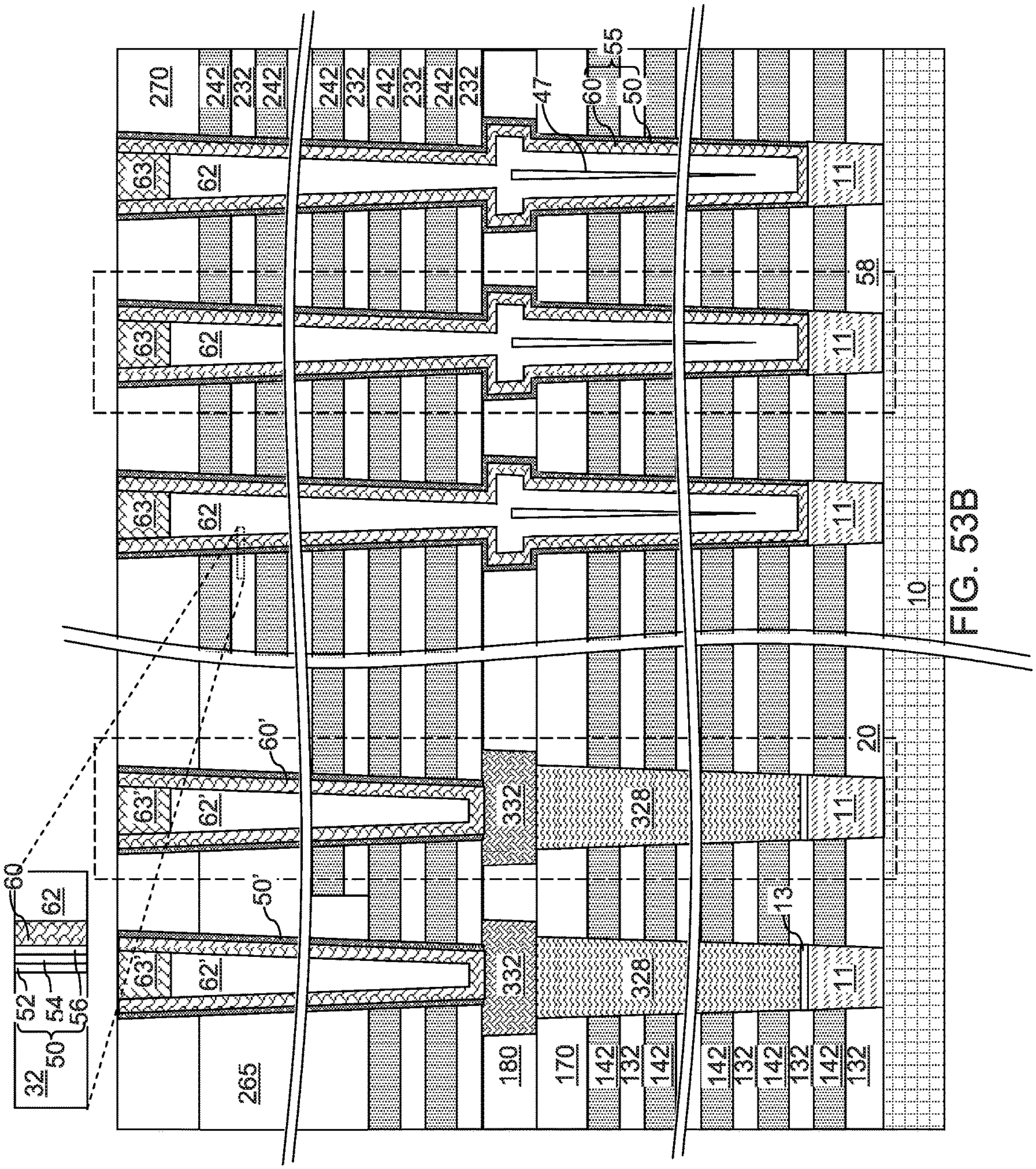
FIG. 53B is a vertical cross-sectional view of a region of the fourth exemplary structure of FIG. 53A.
Figure 53C:
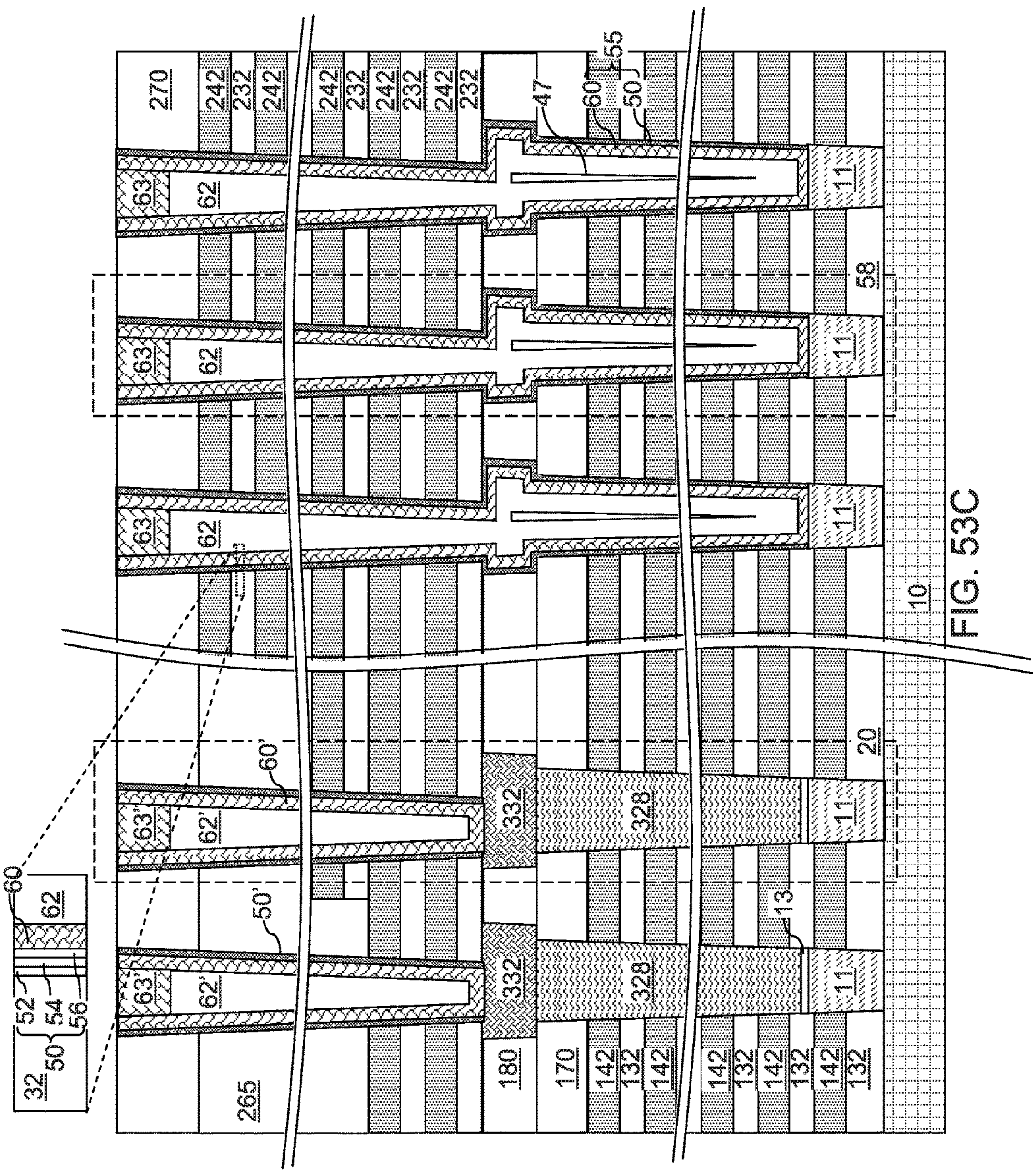
FIG. 53C is a vertical cross-sectional view of an alternative configuration of a region of the fourth exemplary structure of FIG. 53A in case of a non-zero overlay misalignment.

Referring to FIGS. 53A-53C, the fourth exemplary structure is illustrated after formation of memory opening fill structures 58 and support pillar structures 20. FIG. 53B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 53C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Specifically, horizontal portion of the dielectric core layer 62L overlying the second insulating cap layer 270 can be removed, for example, by a recess etch from above the top surface of the second insulating cap layer 270. The material of the dielectric core layer 62L can be further recessed within each inter-tier memory opening 49, for example, by a recess etch to a height between the horizontal plane including the top surface of the second insulating cap layer 270 and the horizontal plane including the bottom surface of the second insulating cap layer 270. Recessed top surfaces of the remaining portions of the dielectric core layer 62 is formed between the horizontal plane including the top surface of the second insulating cap layer 270 and the horizontal plane including the bottom surface of the second insulating cap layer 270. Each remaining portion of the dielectric core layer 62L constitutes a dielectric core 62.

Horizontal portion of the second semiconductor channel layer located above the top surfaces of the dielectric cores 62 can be removed by an etch process, which may be an isotropic etch process such as a wet etch process or an anisotropic etch process such as a reactive ion etch process. Each remaining portion of the second semiconductor channel layer, or each contiguous pair of a remaining portion of the second semiconductor channel layer and a remaining portion of the first semiconductor channel layer 601 in case any portion of the first semiconductor channel layer remains, constitutes a vertical semiconductor channel 60, through which electrical current can flow when a vertical NAND device including the vertical semiconductor channel 60 is turned on. Alternatively, the first semiconductor channel layer 601 can be removed, for example, by a wet etch employing hot TMY, and each vertical semiconductor channel 60 can consist of remaining portions of the second semiconductor channel layer. In this case, the semiconductor oxide plate 13 can prevent, or minimize, collateral etching of the pedestal channel portions 11.

Horizontal portions of the memory film layer 50L overlying the second insulating cap layer 270 can be subsequently removed, for example, by an anisotropic etch process. Each remaining portion of the memory film layer 50L located within the inter-tier memory openings 49 and the second-tier support openings 229 constitutes a memory film 50 or a dummy memory film 50'. Each memory film 50 and each dummy memory film 50' can include a layer stack of a blocking dielectric layer 52, a charge storage layer 54, and a tunneling dielectric layer 56. Each tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 in an inter-tier memory opening 49 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within each inter-tier memory opening 49 is herein referred to as a memory opening fill structure 58. Each combination of a pedestal channel portion 11, a semiconductor oxide plate 13 (if present), a first-tier support opening fill portions 328, a doped semiconductor material portion 332, a dummy memory film 50', a dummy semiconductor channel 60' (that has the same composition as the vertical semiconductor channels 60), a support dielectric core 62' (that has the same composition as the dielectric cores 62), and a dummy drain region 63' (that has the same composition as the drain regions 63) constitutes a support pillar structure 20.

Generally, each of the inter-tier memory openings 49 and cavities in the contact region 200 (i.e., the second-tier support openings 229) is filled with fill material portions (50L, 60L, 62L). The fill material portions (50L, 60L, 62L) are formed on remaining portions of the first-tier support opening fill structures 338. Regions of the fill material portions (50L, 60L, 62L) are removed from above a horizontal plane overlying the second alternating stack (232, 242), such as the horizontal plane including the top surface of the second insulating cap layer 270, by a planarization process. Remaining portions of the fill material portions (50L, 60L, 62L) in the inter-tier memory openings 49 comprise the memory stack structures 55 after the planarization process. Support pillar structures 20 are formed in the contact region 200. Each support pillar structure 20 includes a first-tier support opening fill structure 338 and a contiguous set of remaining portions of the fill material portions (50L, 60L, 62L). Each support pillar structure 20 can extend through the second retro-stepped dielectric material portion 265 and the first alternating stack (132, 142). In one embodiment, a top surface of each support pillar structure 20 can be formed within a same horizontal plane as the top surfaces of the memory opening fill structures 58. In one embodiment, a bottom surface of each support pillar structure 20 can be formed within a same horizontal plane as the bottom surfaces of the memory opening fill structures 58.

Each memory film 50 can comprise a layer stack including a tunneling dielectric layer 56, a charge storage layer 54, and a blocking dielectric layer 52. Each support pillar structure 20 can comprise a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

The dummy semiconductor channel 60' and the dummy memory film 50' within each support pillar structure 20 overlie the first alternating stack (132, 142), and do not extend through any of the first sacrificial material layers 142 within the first alternating stack (132, 142). The first-tier support opening fill portions 328 may include a semiconductor material (such as amorphous silicon or polysilicon). In one embodiment, the first-tier support pillar structure 338 comprises a semiconductor material portion (such as a first-tier support opening fill portions 328) that contacts sidewalls of a subset of the first insulating layers 132 of the first alternating stack (132, 142).

Figure 54A:
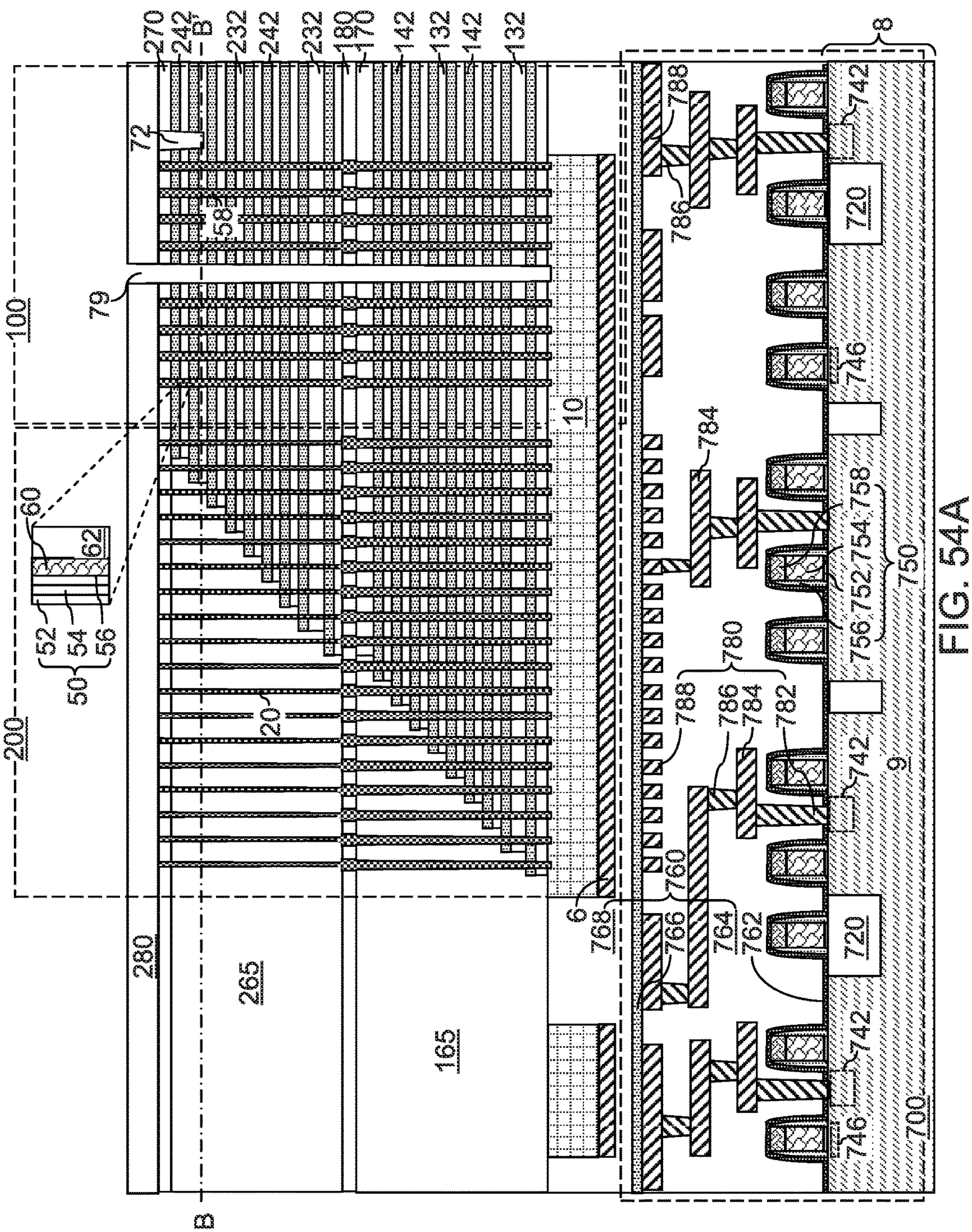
FIG. 54A is a vertical cross-sectional view of the fourth exemplary structure after formation of backside trenches according to the fourth embodiment of the present disclosure.
Figure 54B:
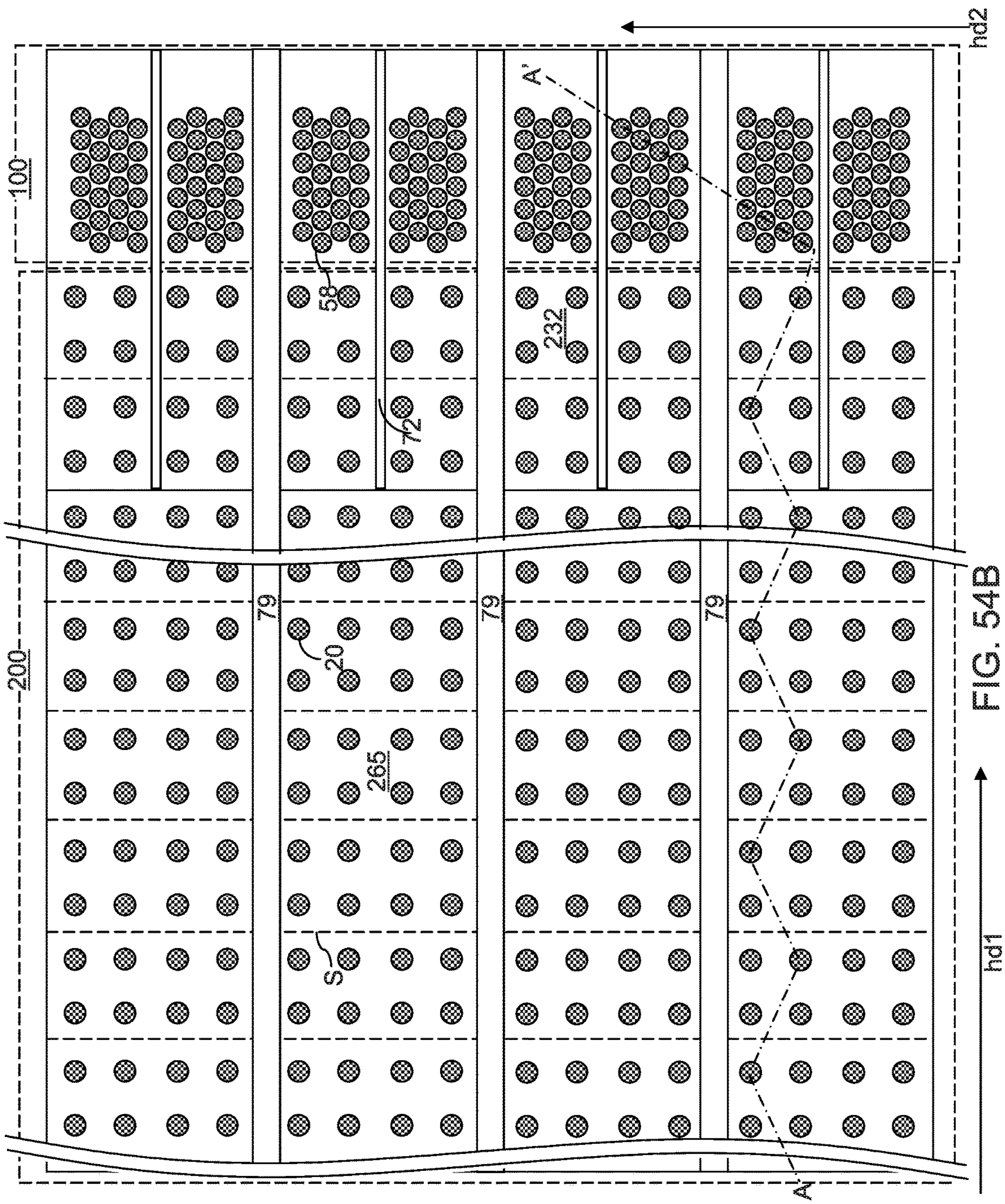
FIG. 54B is a horizontal cross-sectional view of the fourth exemplary structure along the horizontal plane B-B' of FIG. 54A. The zig-zag vertical plane A-A' is the plane of the vertical cross-sectional view of FIG. 54A.

Referring to FIGS. 54A and 54B, the processing steps of FIGS. 13A and 13B can be performed to form a planarization dielectric layer 280 and backside trenches 79.

Figure 55A:
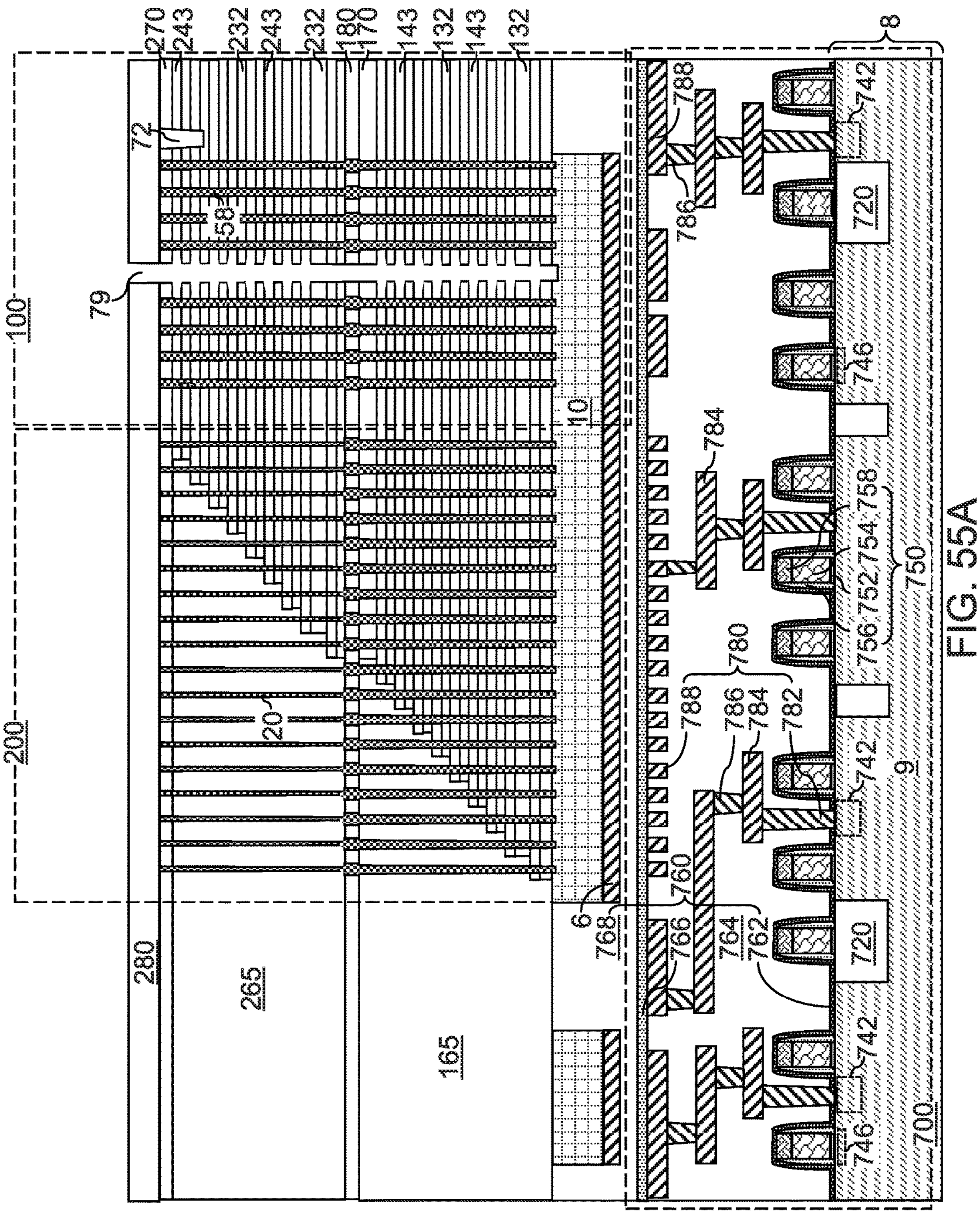
FIG. 55A is a vertical cross-sectional view of the fourth exemplary structure after formation of backside recesses by removal of the sacrificial material layers according to the fourth embodiment of the present disclosure.
Figure 55B:
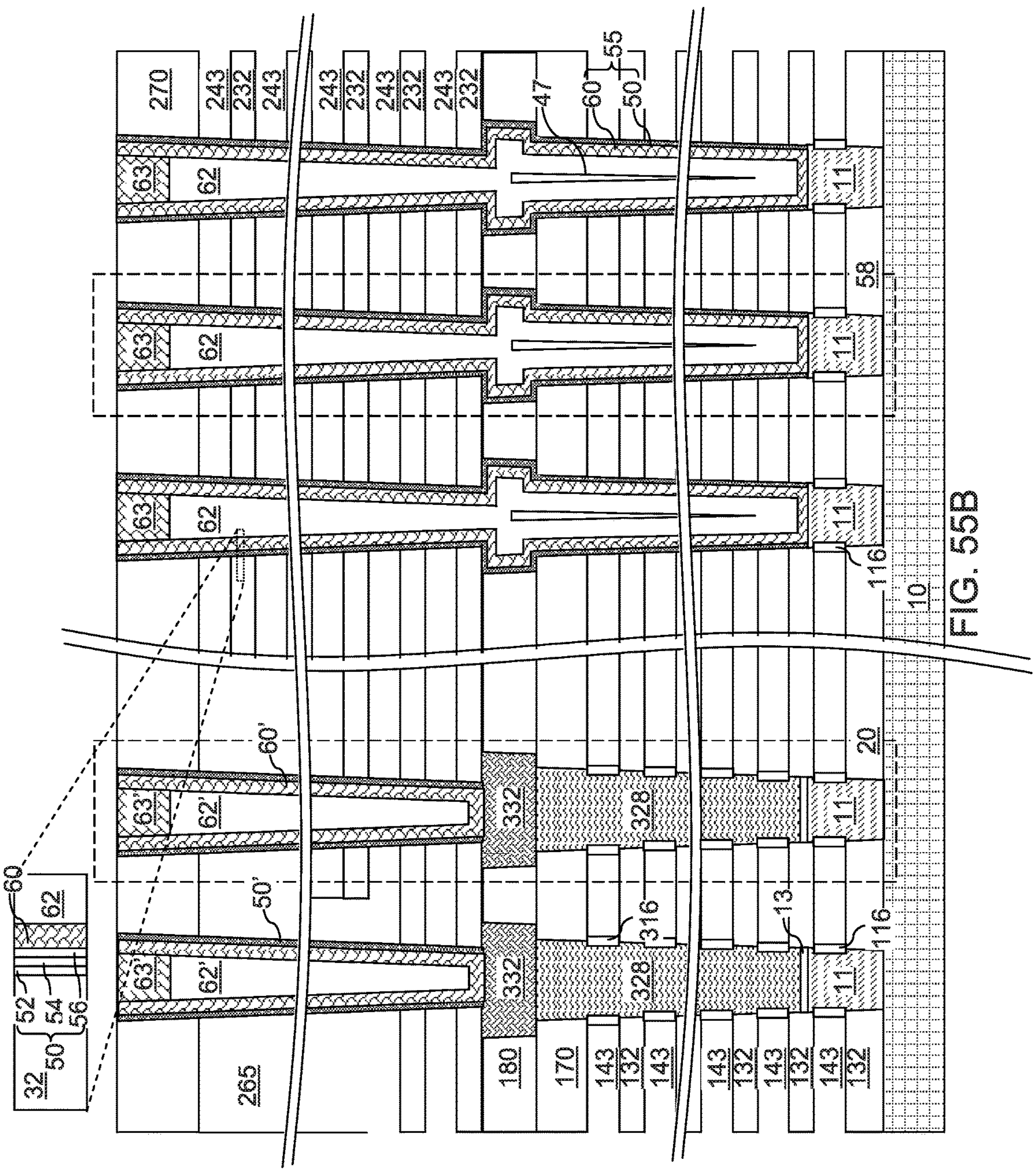
FIG. 55B is a vertical cross-sectional view of a region of the fourth exemplary structure of FIG. 55A.

Referring to FIGS. 55A and 55B, the processing steps of FIGS. 14A and 14B can be performed to remove the first and second sacrificial material layers (142, 242). Specifically, an isotropic etchant comprises an etchant etches the materials of the first and second sacrificial material layers (142, 242) selective to the materials of the first and second insulating layers (132, 232), the first and second insulating cap layers (170, 270), the inter-tier dielectric layer 180, the outermost material of the memory films 50 and the dummy memory films 50', the first-tier support opening fill portions 328, and the pedestal semiconductor portions 11. For example, if the first and second sacrificial material layers (142, 242) comprise silicon nitride, a wet etch employing hot phosphoric acid can be employed to remove the first and second sacrificial material layers (142, 242). Sidewalls of the first-tier support opening fill portions 328 and the pedestal semiconductor portions 11 are physically exposed at the levels of the first backside recesses 143. As discussed above, each first-tier support opening fill portion 328 is remaining portion of a semiconductor material including electrical dopants at a dopant concentration less than $1.0\times10^{17}/cm^3$.

Physically exposed surface portions of the optional pedestal channel portions 11, the first-tier support opening fill portions 328, and the planar semiconductor material layer 10 can be converted into dielectric material portions by thermal conversion and/or plasma conversion of the semiconductor materials into dielectric materials. For example, thermal conversion and/or plasma conversion can be employed to convert each physically exposed surface portion of the first-tier support opening fill portions 328 into a annular dielectric spacer 316, to convert a surface portion of each pedestal channel portion 11 into a tubular dielectric spacer 116, and to convert each physically exposed surface portion of the planar semiconductor material layer 10 into a planar dielectric portion (not expressly shown). In one embodiment, each annular dielectric spacer 316 and each tubular dielectric spacer 116 can be topologically homeomorphic to a torus, i.e., generally ring-shaped. The annular dielectric spacer 316 include a dielectric material that includes the same semiconductor element as the first-tier support opening fill portions 328 and additionally includes at least one non-metallic element such as oxygen and/or nitrogen. In one embodiment, the annular dielectric spacers 316 can include a dielectric oxide, a dielectric nitride, or a dielectric oxynitride of the semiconductor material of the pedestal channel portions 11. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion includes a dielectric material that includes the same semiconductor element as the semiconductor material layer and additionally includes at least one non-metallic element such as oxygen and/or nitrogen such that the material of the planar dielectric portions is a dielectric material.

Figure 56A:
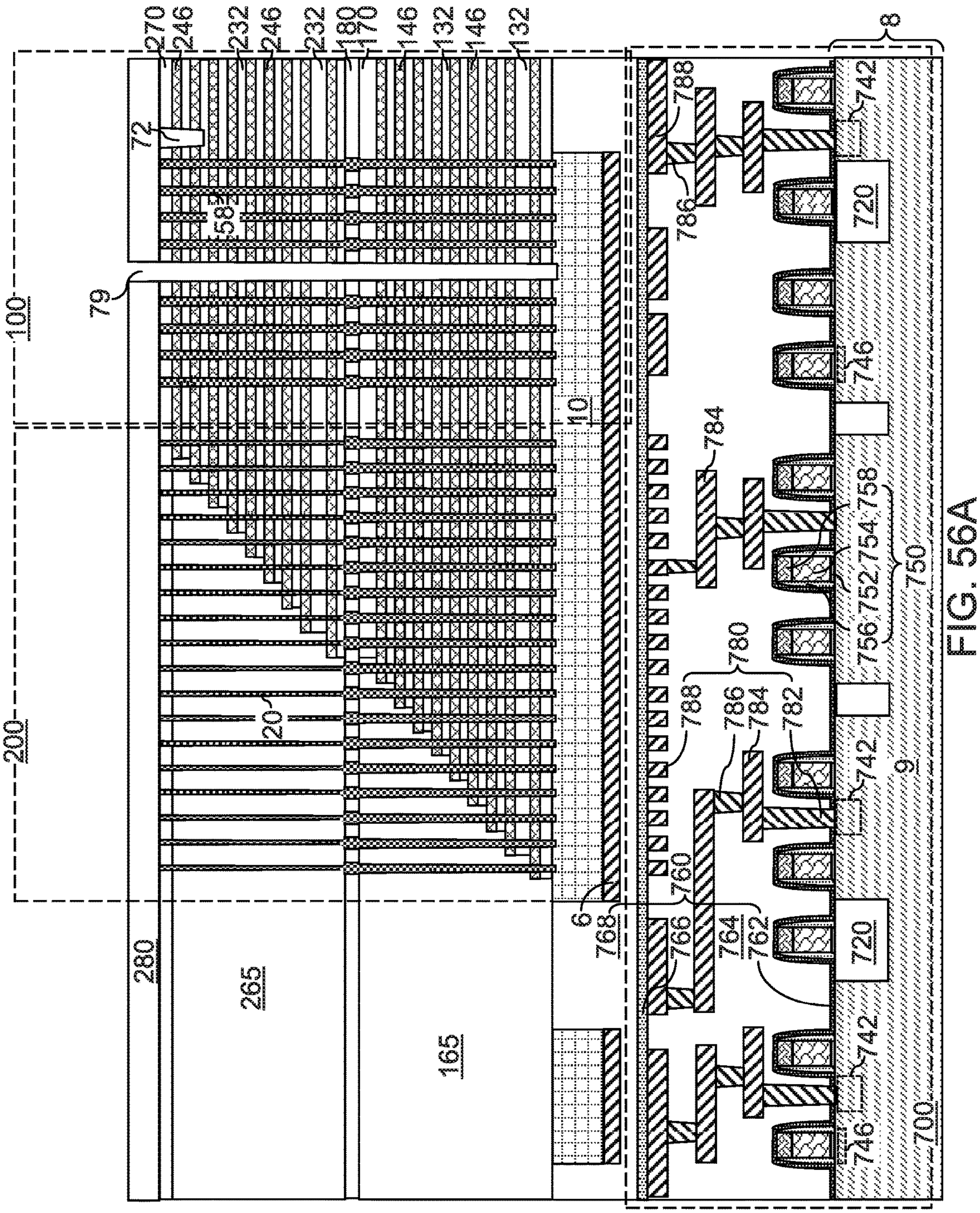
FIG. 56A is a vertical cross-sectional view of the fourth exemplary structure after formation of electrically conductive layers in the backside recesses according to the fourth embodiment of the present disclosure.
Figure 56B:
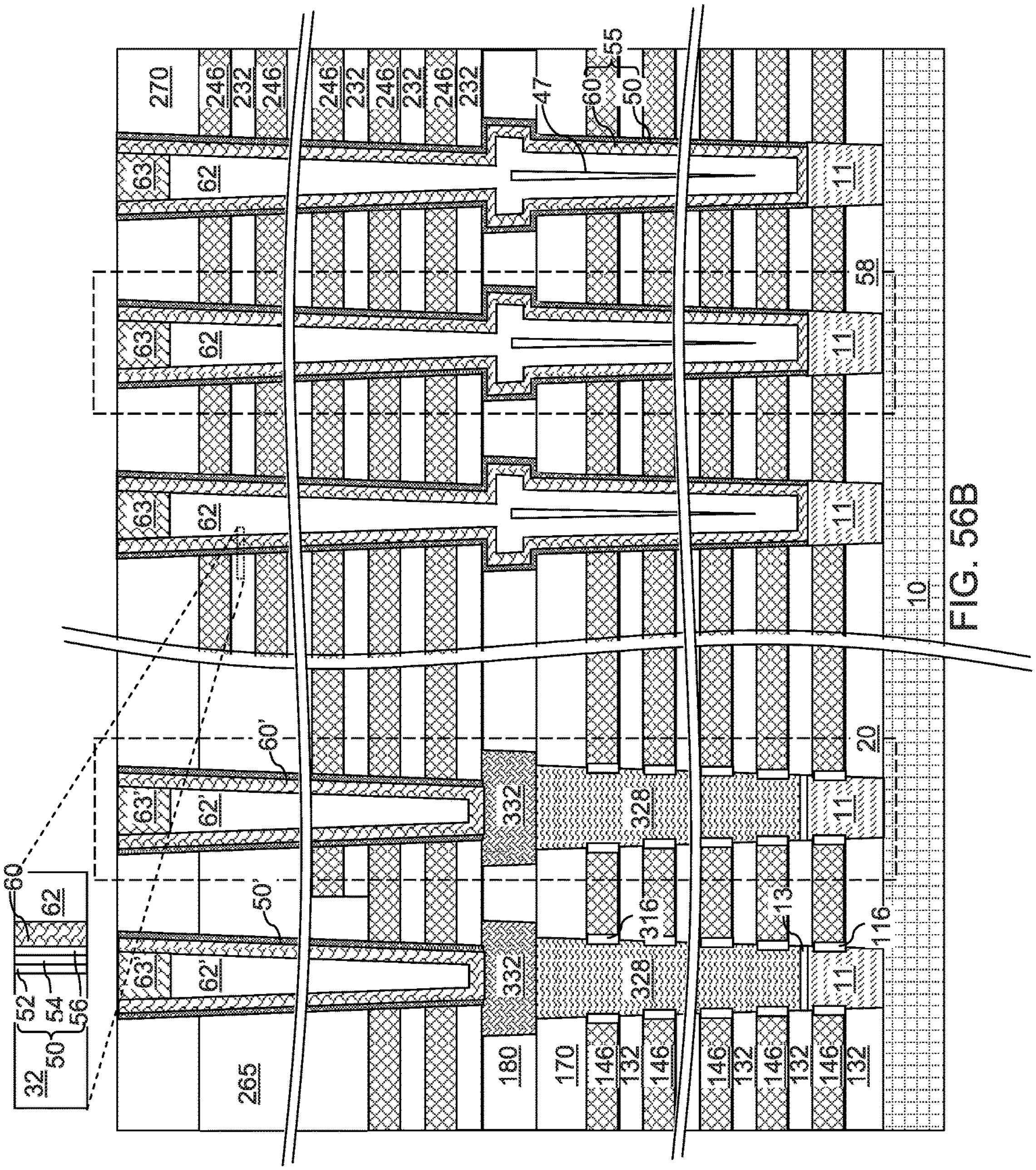
FIG. 56B is a vertical cross-sectional view of a region of the fourth exemplary structure of FIG. 56A.
Figure 56C:
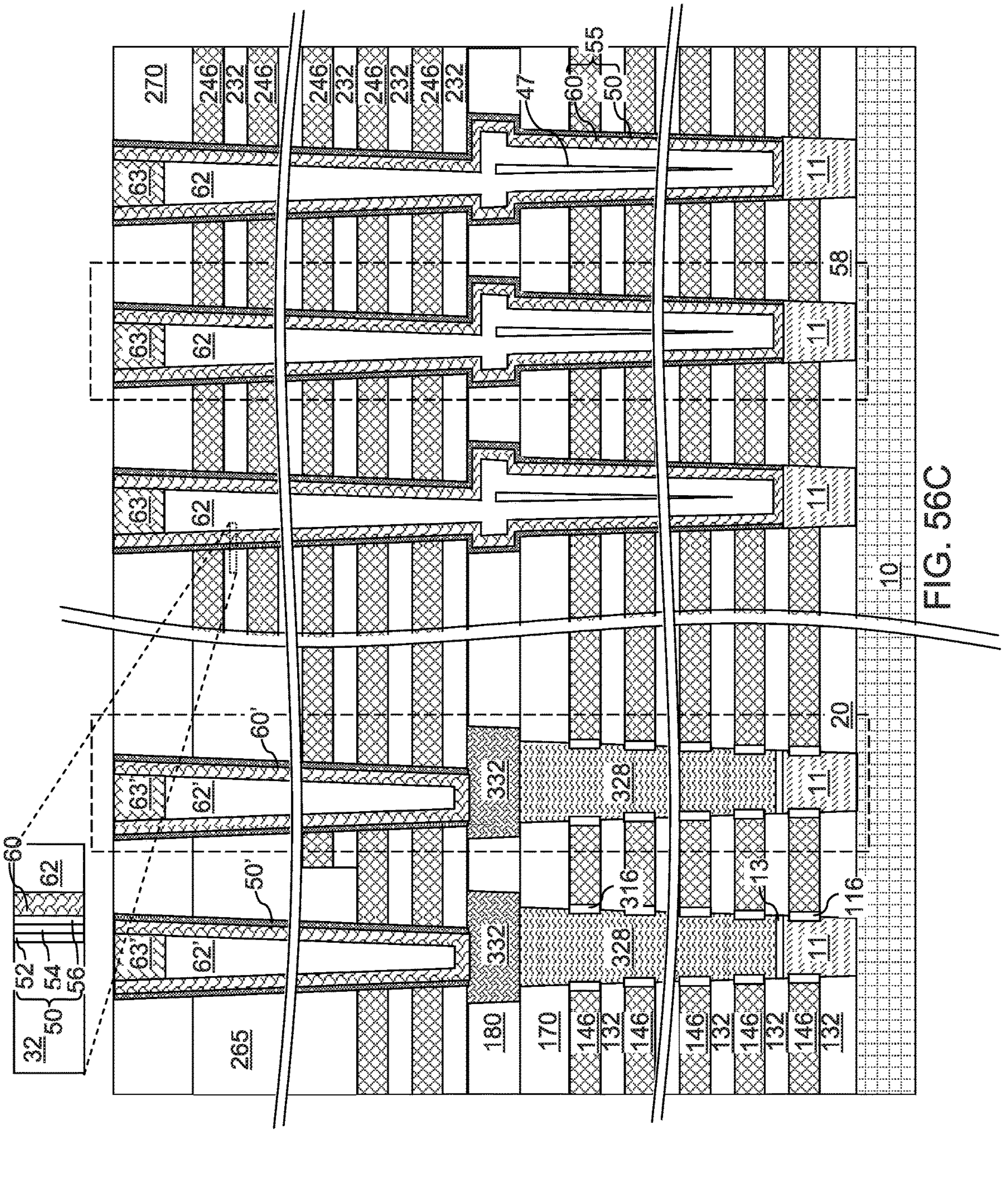
FIG. 56C is a vertical cross-sectional view of an alternative configuration of a region of the fourth exemplary structure of FIG. 56A in case of a non-zero overlay misalignment.

Referring to FIGS. 56A-56C, the processing steps of FIGS. 15A-15C can be performed to form an optional backside blocking dielectric layer and first and second electrically conductive layers (146, 246). FIG. 56B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 56C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Figure 57:
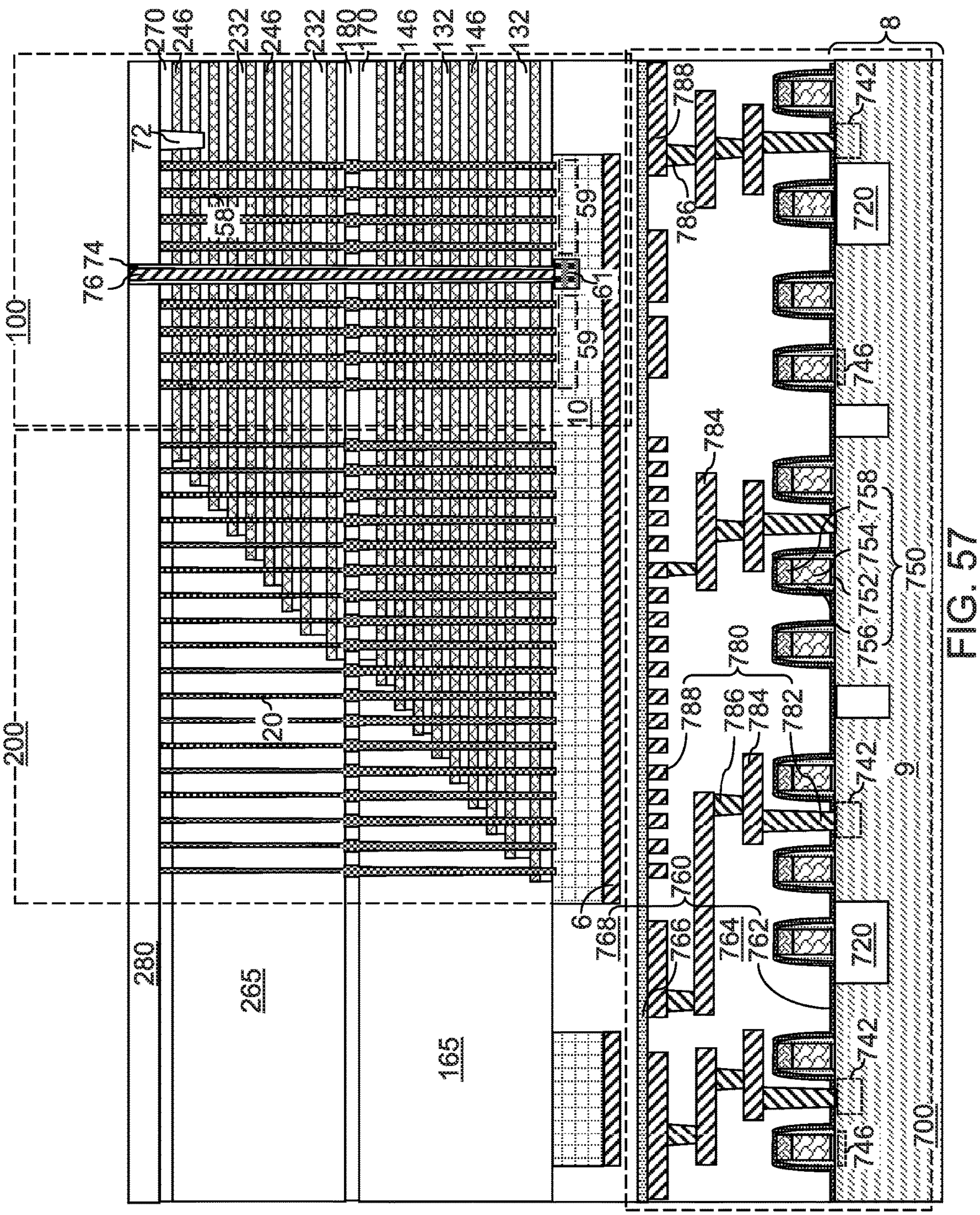
FIG. 57 is a vertical cross-sectional view of the fourth exemplary structure after formation of source regions and backside contact structures according to the fourth embodiment of the present disclosure.

Referring to FIG. 57, the processing steps of FIG. 16 can be performed to form source regions 61, insulating spacers 74, and backside contact via structures 76.

Figure 58A:
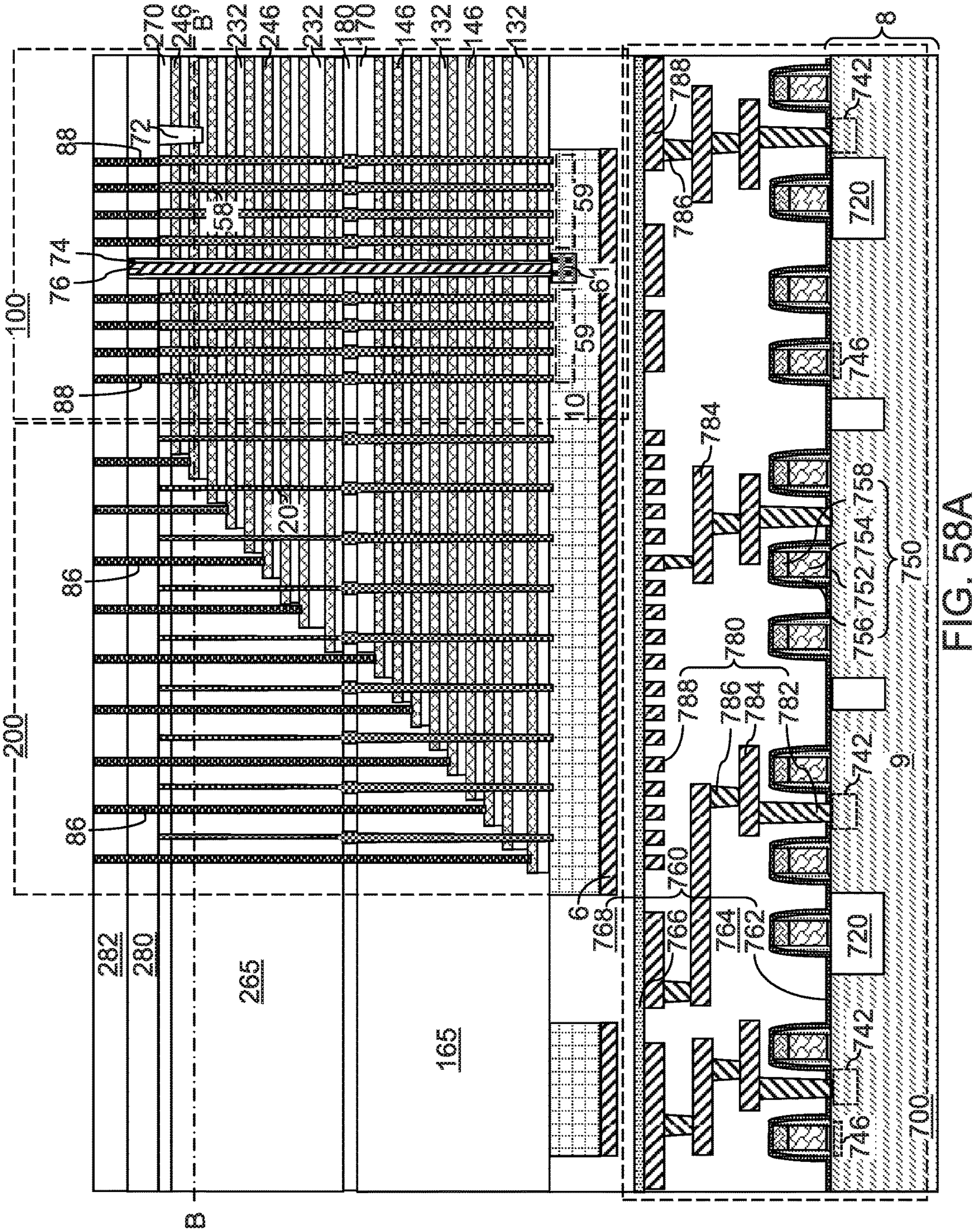
FIG. 58A is a vertical cross-sectional view of the fourth exemplary structure after formation of conductive layer contact via structures and drain contact via structures according to the fourth embodiment of the present disclosure.
Figure 58B:
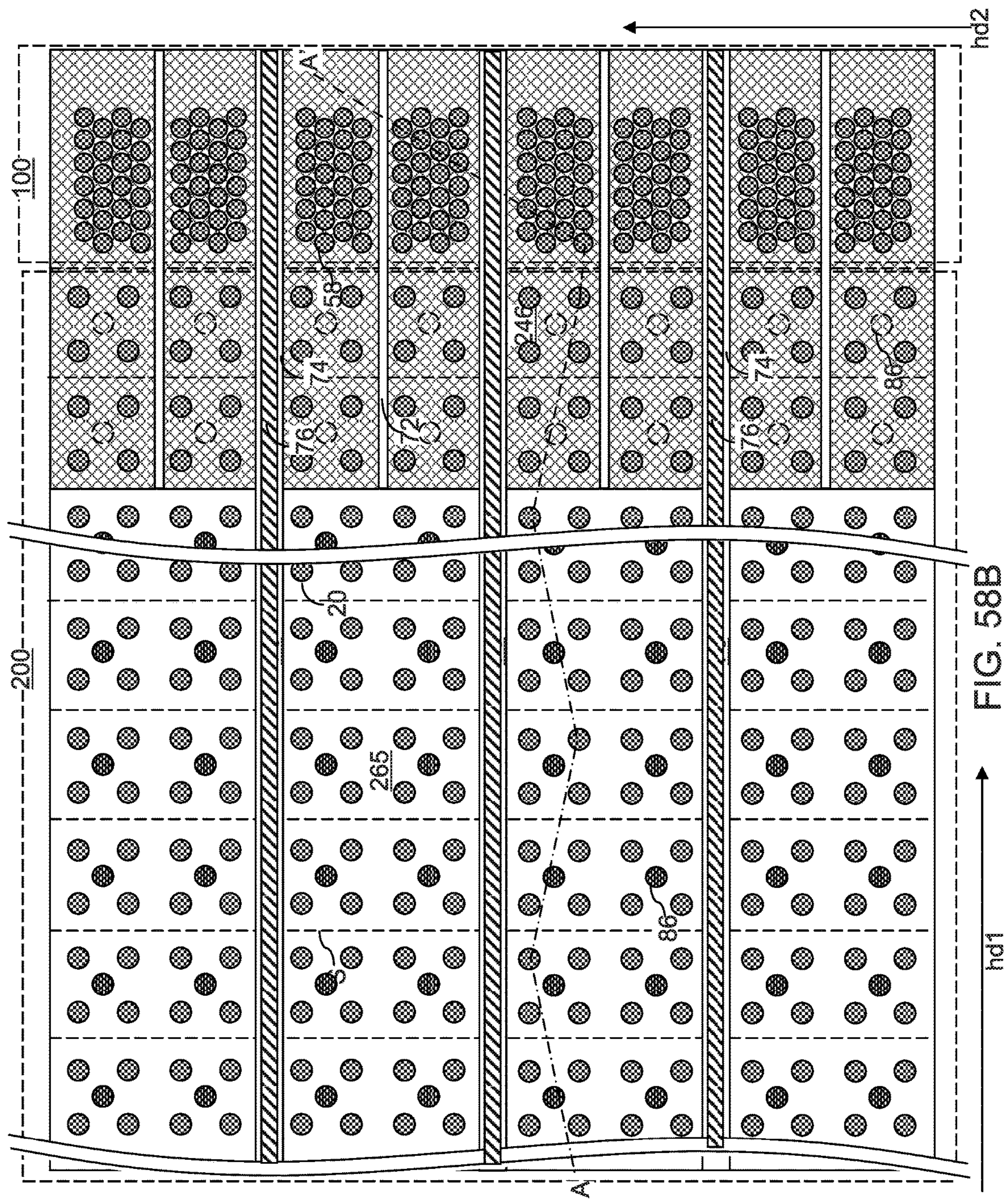
FIG. 58B is a horizontal cross-sectional view of the fourth exemplary structure along the vertical plane B-B' of FIG. 58A.

Referring to FIGS. 58A and 58B, the processing steps of FIGS. 17A and 17B can be performed to form a contact level dielectric layer 282, a drain contact via structures 88, and conductive layer contact via structures 86.

Figure 59:
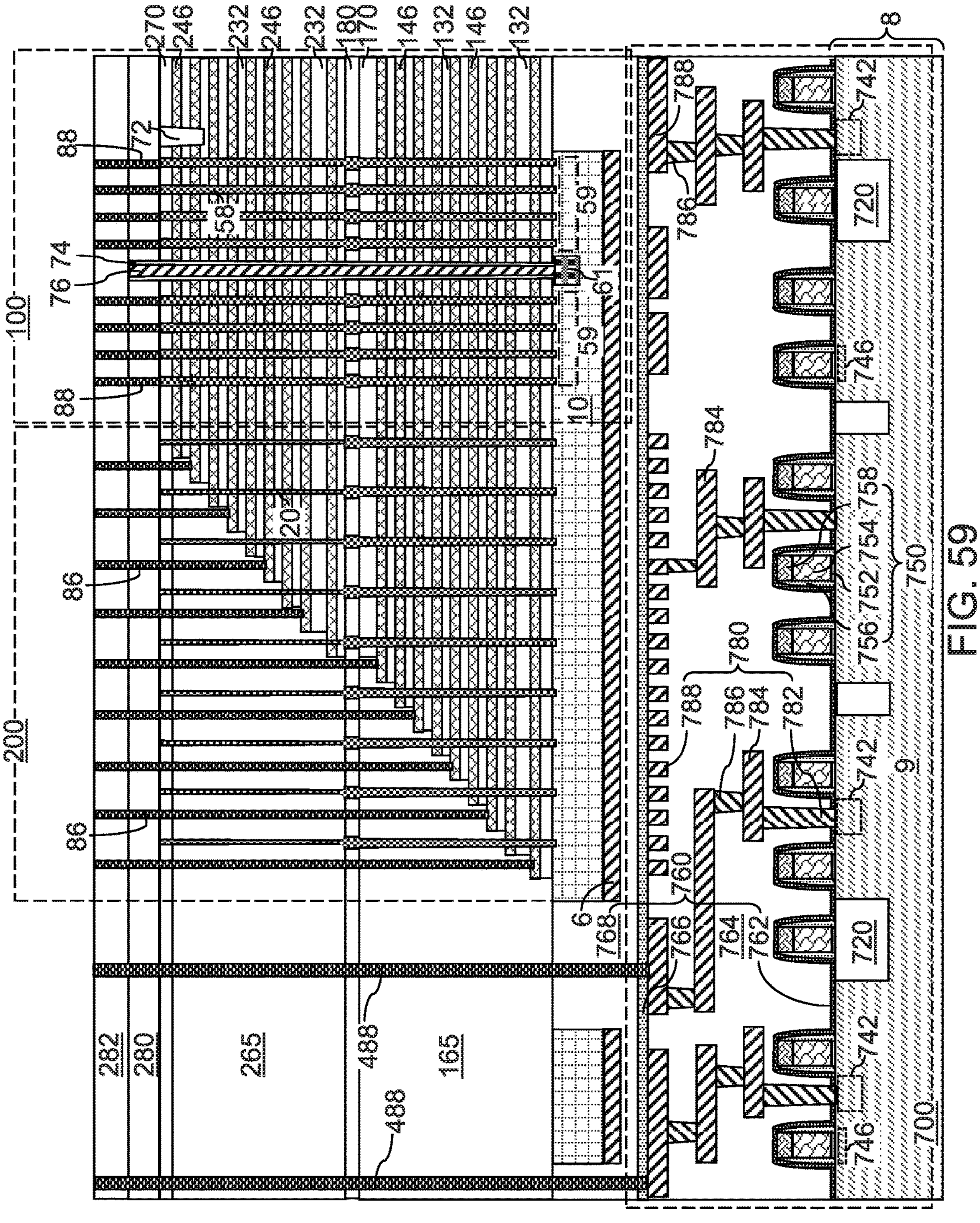
FIG. 59 is a vertical cross-sectional view of the fourth exemplary structure after formation of through-memory-level contact via structures according to the fourth embodiment of the present disclosure.

Referring to FIG. 59, the processing steps of FIG. 18 can be performed to form peripheral-region contact via structures 488.

Figure 60:
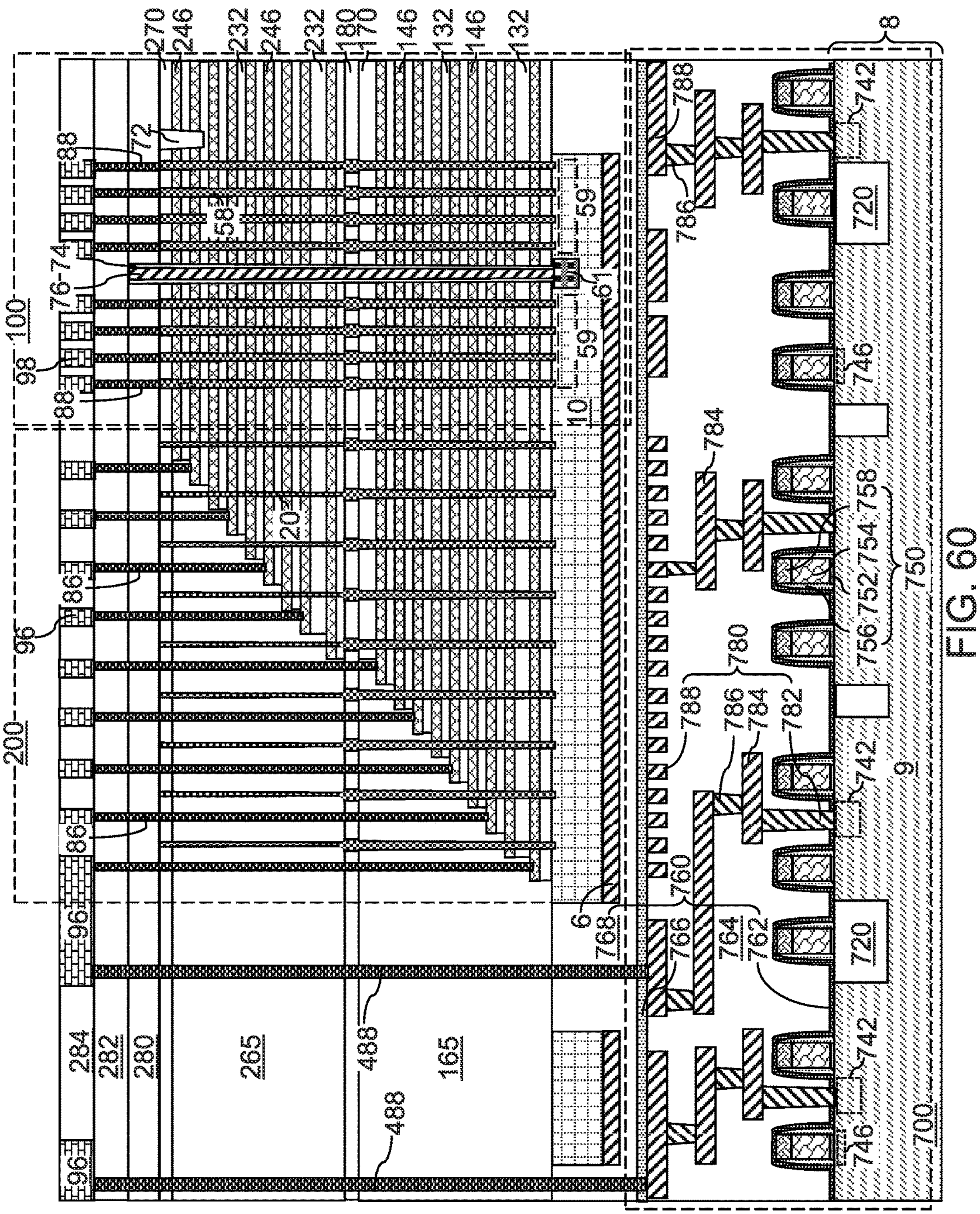
FIG. 60 is a vertical cross-sectional view of the fourth exemplary structure after formation of a line level dielectric layer and metal interconnect line structures according to the fourth embodiment of the present disclosure.

Referring to FIG. 60, the processing steps of FIG. 19 can be performed to form at least one additional dielectric layer over the contact level dielectric layer 282. Additional metal interconnect structures (herein referred to as upper-level metal interconnect structures) can be formed in the at least one additional dielectric layer. For example, the at least one additional dielectric layer can include a line-level dielectric layer 284 that is formed over the contact level dielectric layer 282. The upper-level metal interconnect structures can include bit lines 98 contacting, or electrically shorted to, a respective one of the drain contact via structures 88, and interconnection line structures 96 contacting, and/or electrically shorted to, at least one of the conductive layer contact via structures 86 and/or the peripheral region contact via structures 488.

Figure 61:
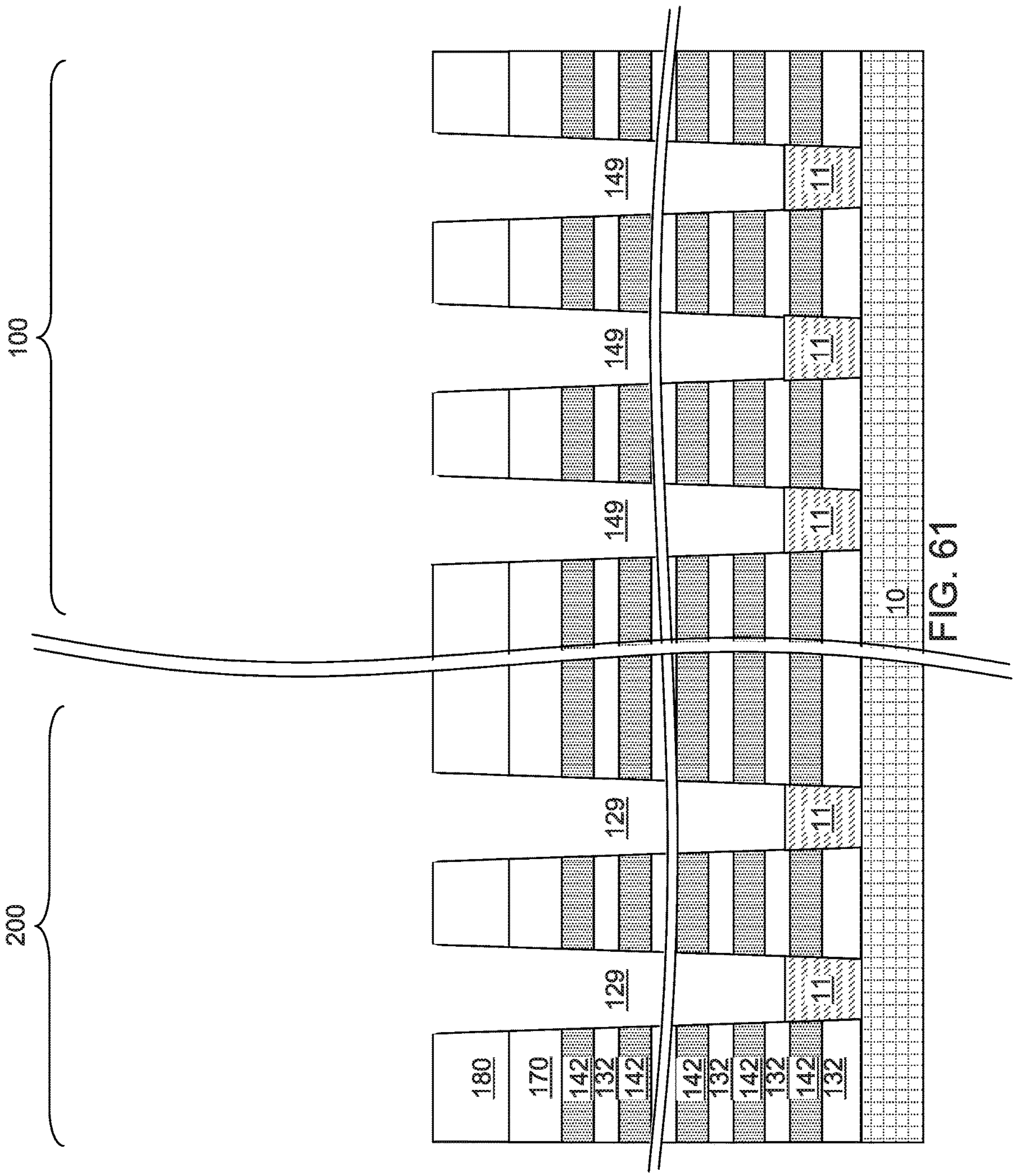
FIG. 61 is a vertical cross-sectional view of the fifth exemplary structure after formation of first memory openings and first support openings and pillar channel portions according to the fifth embodiment of the present disclosure.

Referring to FIG. 61, a fifth exemplary structure according to a fifth embodiment of the present disclosure is illustrated after formation of pedestal channel portions 11. The fifth exemplary structure at the step of FIG. 61 can be derived from the first exemplary structure of FIGS. 4A-4C by omitting expansion of the first-tier memory openings 149 and the first-tier support openings 129 at the level of the inter-tier dielectric layer 180, and by performing a selective semiconductor deposition process to form the pedestal channel portions 11 at the bottom of each first-tier opening (149, 129).

Figure 62:
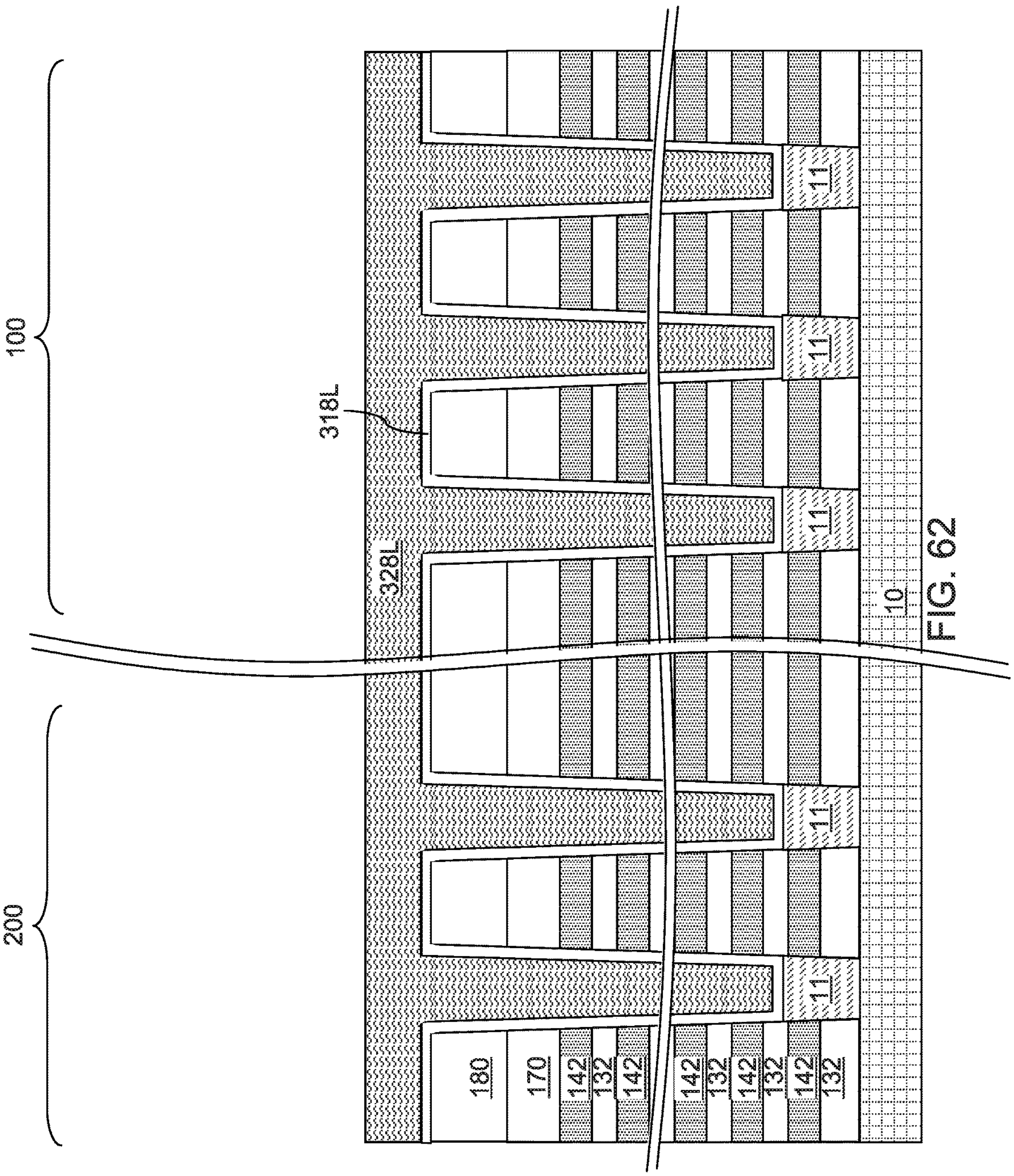
FIG. 62 is a vertical cross-sectional view of the fifth exemplary structure after formation of a continuous conformal dielectric liner and a semiconductor fill material layer according to the fifth embodiment of the present disclosure.

Referring to FIG. 62, a continuous conformal dielectric liner 318L and a semiconductor fill material layer 328L can be formed in the first-tier openings (149, 129). The continuous conformal dielectric liner 318L includes a dielectric material, which can be a semiconductor oxide material (such as silicon oxide), a semiconductor nitride material (such as silicon nitride), a semiconductor oxynitride material (such as silicon oxynitride), or a dielectric metal oxide (such as aluminum oxide). The continuous conformal dielectric liner 318L can be deposited by a conformal deposition process such as chemical vapor deposition or atomic layer deposition. The thickness of the continuous conformal dielectric liner 318L can be in a range from 1 nm to 10 nm, such as from 1.5 nm to 5 nm, although lesser and greater thicknesses can also be employed.

The semiconductor fill material layer 328L includes a first-tier fill material, which can be any material that can be employed for the first-tier opening fill portions (348, 328) of the fourth embodiment. For example, the semiconductor fill material layer 328L can include a semiconductor material such as silicon (e.g., amorphous silicon or polysilicon), a silicon-germanium alloy, germanium, a III-V compound semiconductor material, or a combination thereof. In one embodiment, the first-tier fill material can comprise amorphous semiconductor material including silicon at an atomic concentration greater than 80%. In one embodiment, a semiconductor material including electrical dopants at a dopant concentration less than $1.0\times10^{17}/cm^3$, and/or less than $3.0\times10^{15}/cm^3$ and/or less than $1.0\times10^{14}/cm^3$, can be deposited in the first-tier memory openings 149 and the first-tier support openings 129. In one embodiment, the semiconductor fill material layer 328L can comprise amorphous silicon. The first-tier fill material may be formed by a non-conformal deposition or a conformal deposition method.

Figure 63:
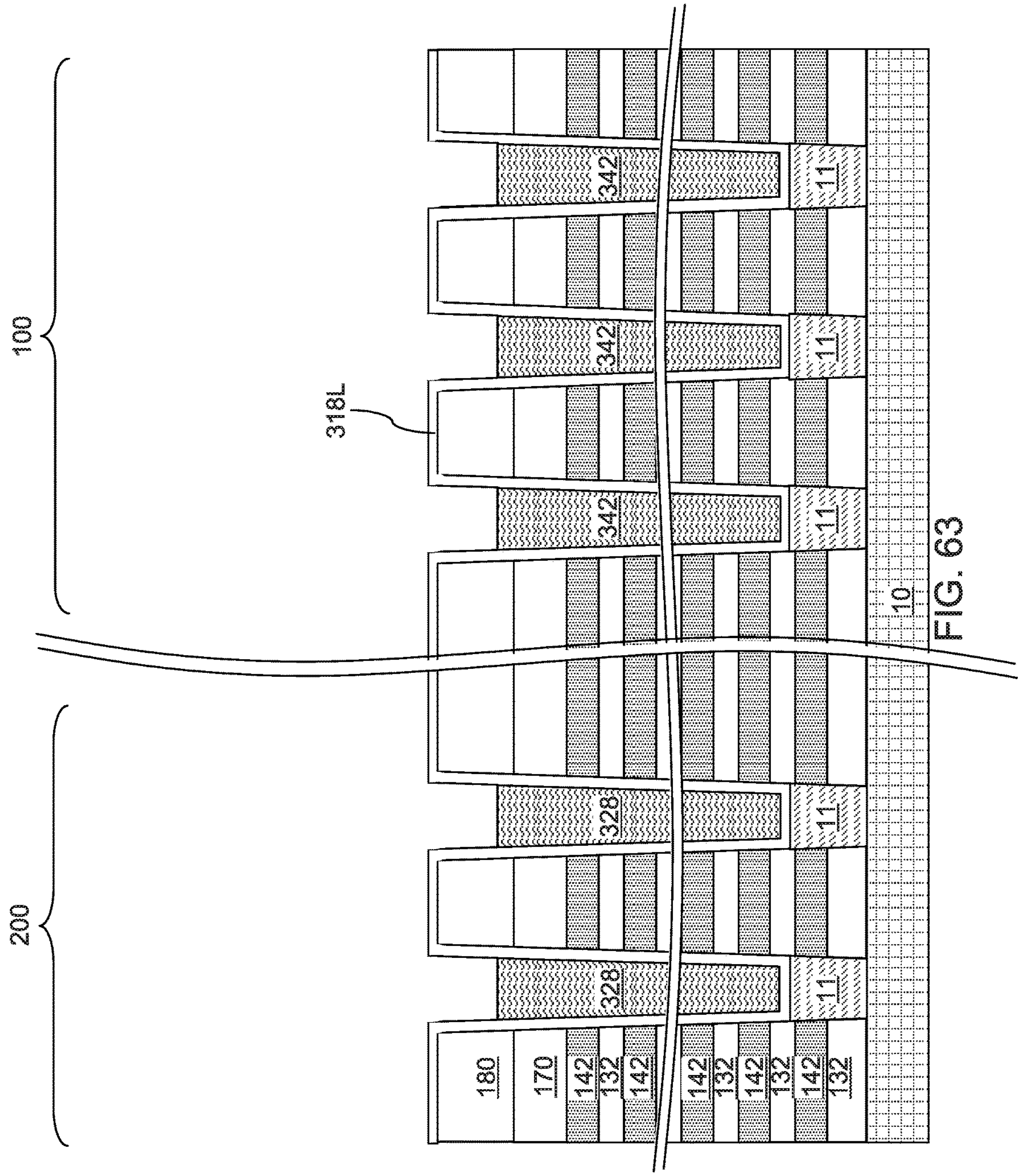
FIG. 63 is a vertical cross-sectional view of the fifth exemplary structure after recessing the semiconductor fill material layer according to the fifth embodiment of the present disclosure.

Referring to FIG. 63, the semiconductor fill material layer 328L can be recessed such that remaining portions of the semiconductor fill material layer 328L in the first-tier openings (149, 129) have top surfaces below the horizontal plane including the top surface of the inter-tier dielectric layer 180. The recessing of the semiconductor fill material layer 328L can be performed by an isotropic etch such as a wet etch or chemical dry etch (CDE), or by an anisotropic etch such as a reactive ion etch. For example, a wet etch process employing hot trimethyl-2 hydroxyethyl ammonium hydroxide ("hot TMY") or tetramethyl ammonium hydroxide (TMAH) can be employed to recess the semiconductor fill material layer 328L. Alternatively, a reactive ion etch process may be performed to recess the semiconductor fill material layer 328L.

Remaining portions of the first-tier fill material comprise first-tier opening fill portions (348, 328). Specifically, each remaining portion of the first-tier fill material in a first-tier memory opening 149 constitutes a first-tier lower memory opening fill portion 342. Each remaining portion of the first-tier fill material in a first-tier support opening 129 constitutes a first-tier support opening fill portion 328. The first-tier lower memory opening fill portions 342 and the first-tier support opening fill portions 328 are concurrently formed, i.e., during a same set of processes including the deposition process that deposits the first-tier fill material and the recess process that recesses the first-tier fill material. The top surfaces of the first-tier lower memory opening fill portions 342 and the first-tier support opening fill portions 328 can be located below the horizontal plane including the top surface of the inter-tier dielectric layer 180. In one embodiment, the top surfaces of the first-tier lower memory opening fill portions 342 and the first-tier support opening fill portions 328 can be located above the horizontal plane including the topmost surface of the first alternating stack (132, 142). Each of the first-tier lower memory opening fill portions 342 and the first-tier support opening fill portions 328 may, or may not, include cavities therein.

Figure 64:
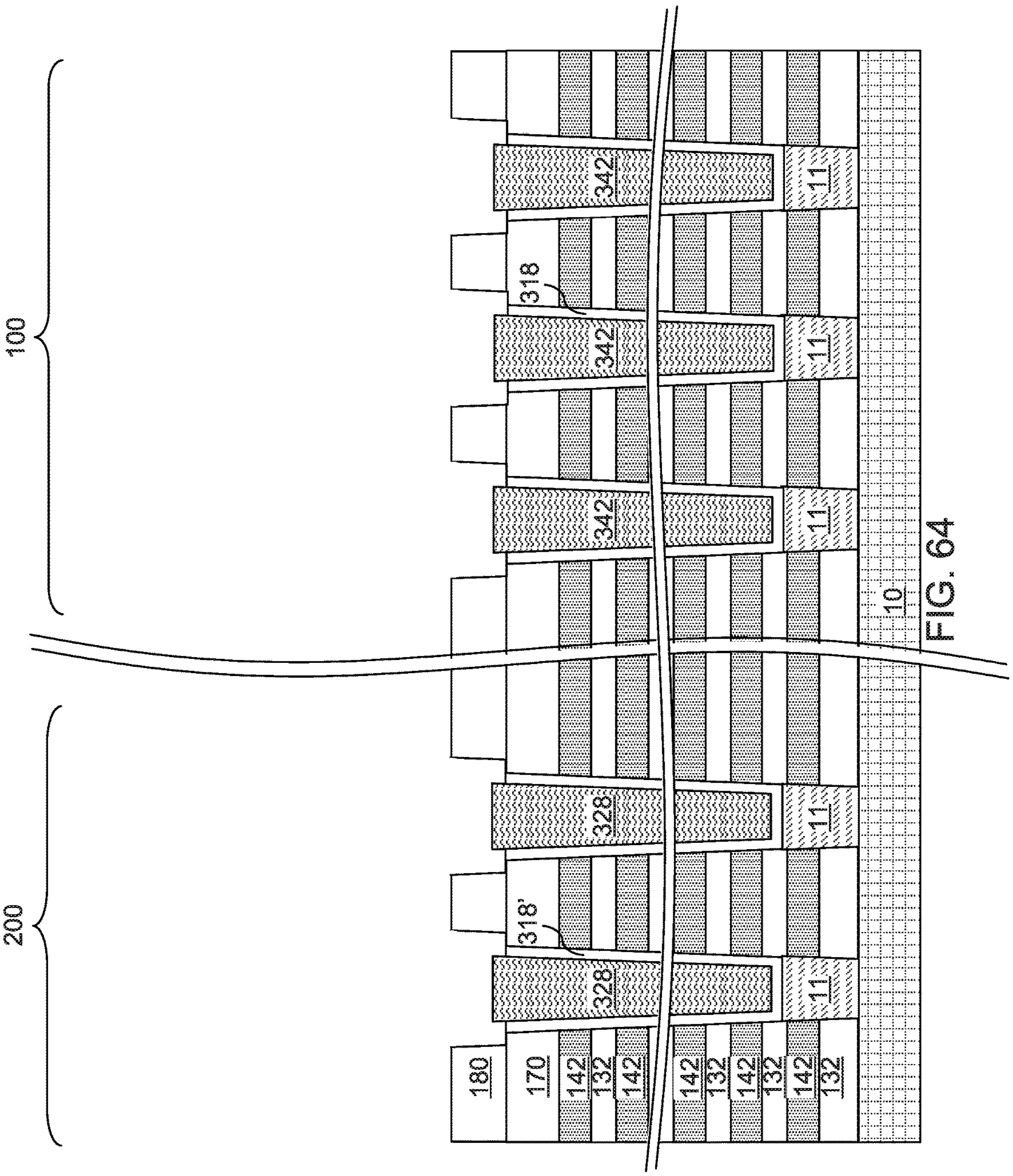
FIG. 64 is a vertical cross-sectional view of the fifth exemplary structure after etching physically exposed portions of the continuous conformal dielectric liner and isotropically etching an inter-tier dielectric layer according to the fifth embodiment of the present disclosure.

Referring to FIG. 64, physically exposed portions of the continuous conformal dielectric liner 318L can be etched by an isotropic etch process. For example, if the continuous conformal dielectric liner 318L includes silicon oxide, a wet etch process employing dilute hydrofluoric acid can be performed to remove the physically exposed portions of the continuous conformal dielectric liner 318. Subsequently, physically exposed portions of the inter-tier dielectric layer 180 can be isotropically etched. The top surfaces and the sidewalls of the inter-tier dielectric layer 180 can be isotropically recessed to widen the upper region of each first-tier opening (149, 129). Each remaining portion of the continuous conformal dielectric liner 318L constitutes a conformal dielectric liner (318, 318'). The conformal dielectric liners (318, 318') include first conformal dielectric liners 318 formed in the first-tier memory openings 149 and second conformal dielectric liners 318' formed in the first-tier support openings 129.

Figure 65:
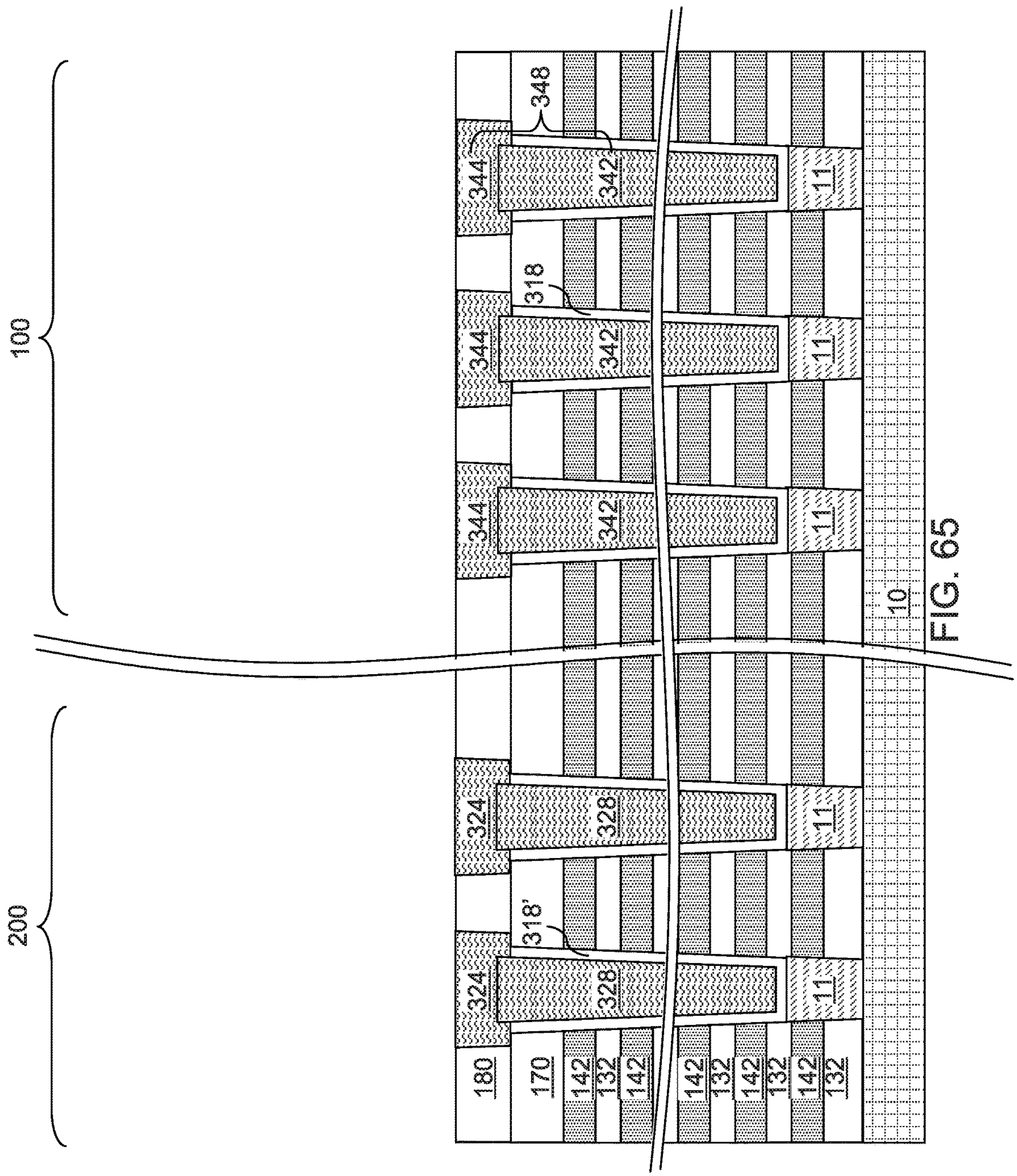
FIG. 65 is a vertical cross-sectional view of the fifth exemplary structure after formation of upper semiconductor material portions according to the fifth embodiment of the present disclosure.

Referring to FIG. 65, an additional semiconductor material is deposited in the recessed volumes overlying the first-tier lower memory opening fill portions 342 and the first-tier support opening fill portions 328. The additional semiconductor material can be any material that can be employed for the semiconductor fill material layer 328L. In one embodiment, the additional semiconductor material can include electrical dopants at a dopant concentration less than $1.0\times10^{17}/cm^3$, and/or less than $3.0\times10^{15}/cm^3$ and/or less than $1.0\times10^{14}/cm^3$. In one embodiment, the additional semiconductor material can comprise amorphous silicon.

Portions of the additional semiconductor material overlying the horizontal plane including the top surface of the inter-tier dielectric layer 180 can be removed by a planarization process. The planarization process can employ chemical mechanical planarization or a recess etch. Each remaining portion of the additional semiconductor material overlying a first-tier lower memory opening fill portion 342 is herein referred to as a first-tier upper memory opening fill portion 344. Each vertical stack of a first-tier lower memory opening fill portion 342 and a first-tier upper memory opening fill portion 344 constitutes a first-tier memory opening fill portion 348. Each remaining portion of the additional semiconductor material overlying a first-tier support opening fill portion 328 constitutes a cap semiconductor material portion 324. The atomic concentration of electrical dopants in the first-tier upper memory opening fill portions 344 and the cap semiconductor material portions 324 is less than $1.0\times10^{17}/cm^3$, and/or less than $3.0\times10^{15}/cm^3$ and/or less than $1.0\times10^{14}/cm^3$.

Figure 66:
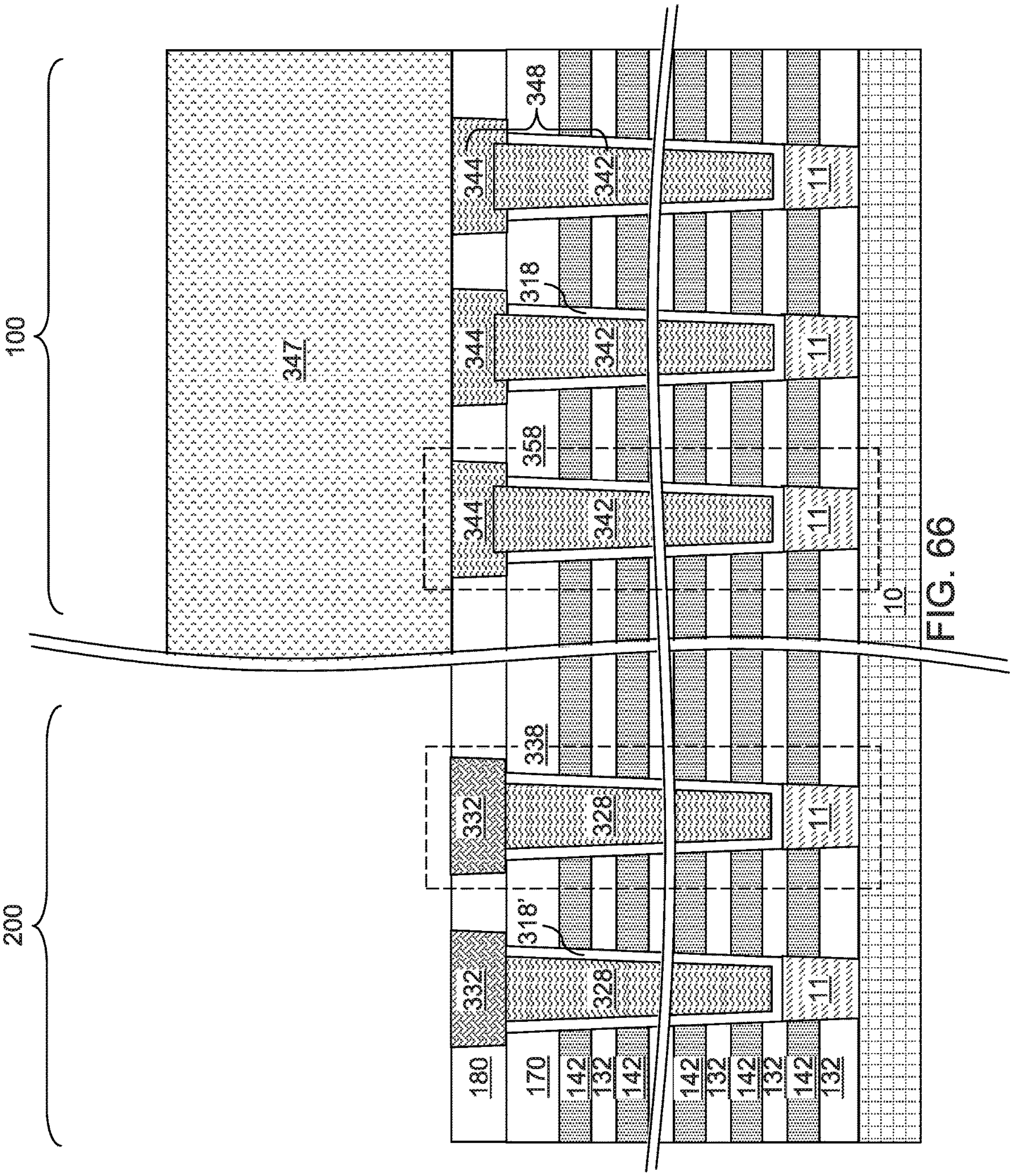
FIG. 66 is a vertical cross-sectional view of the fifth exemplary structure after formation of doped semiconductor material portions according to the fifth embodiment of the present disclosure.

Referring to FIG. 66, the processing steps of FIG. 47 can be performed to form a patterned photoresist layer 347, and to implant electrical dopants into the cap semiconductor material portions 324 while blocking implantation of the electrical dopants into the first-tier memory opening fill portions 348. Each cap semiconductor material portions 324 is converted into a doped semiconductor material portion 332. Upon conversion of the cap semiconductor material portions 324 into doped semiconductor material portions 332, each contiguous set of a doped semiconductor material portion 332, a first-tier support opening fill portion 328, a second conformal dielectric liner 318', and a pedestal channel portion 11 constitutes a first-tier support opening fill structure 338. Each contiguous set of a first-tier memory opening fill portions 348, a first conformal dielectric liner 318, and a pedestal channel portion 11 constitutes a first-tier memory opening fill structure 358.

In one embodiment, the dose and the implantation depth of the electrical dopants implanted into the upper regions of the cap semiconductor material portions 324 can be selected such that each doped semiconductor material portion 332 includes electrical dopants at a dopant concentration in a range from $5.0\times10^{19}/cm^3$ and $2.0\times10^{21}/cm^3$. The first-tier memory opening fill portions 348 and the first-tier support opening fill portions 328 can include electrical dopants at dopant concentrations less than $1.0\times10^{17}/cm^3$, such as less than $3.0\times10^{15}/cm^3$, and/or less than $1.0\times10^{14}/cm^3$. The photoresist layer 347 can be subsequently removed, for example, by ashing.

Figure 67A:
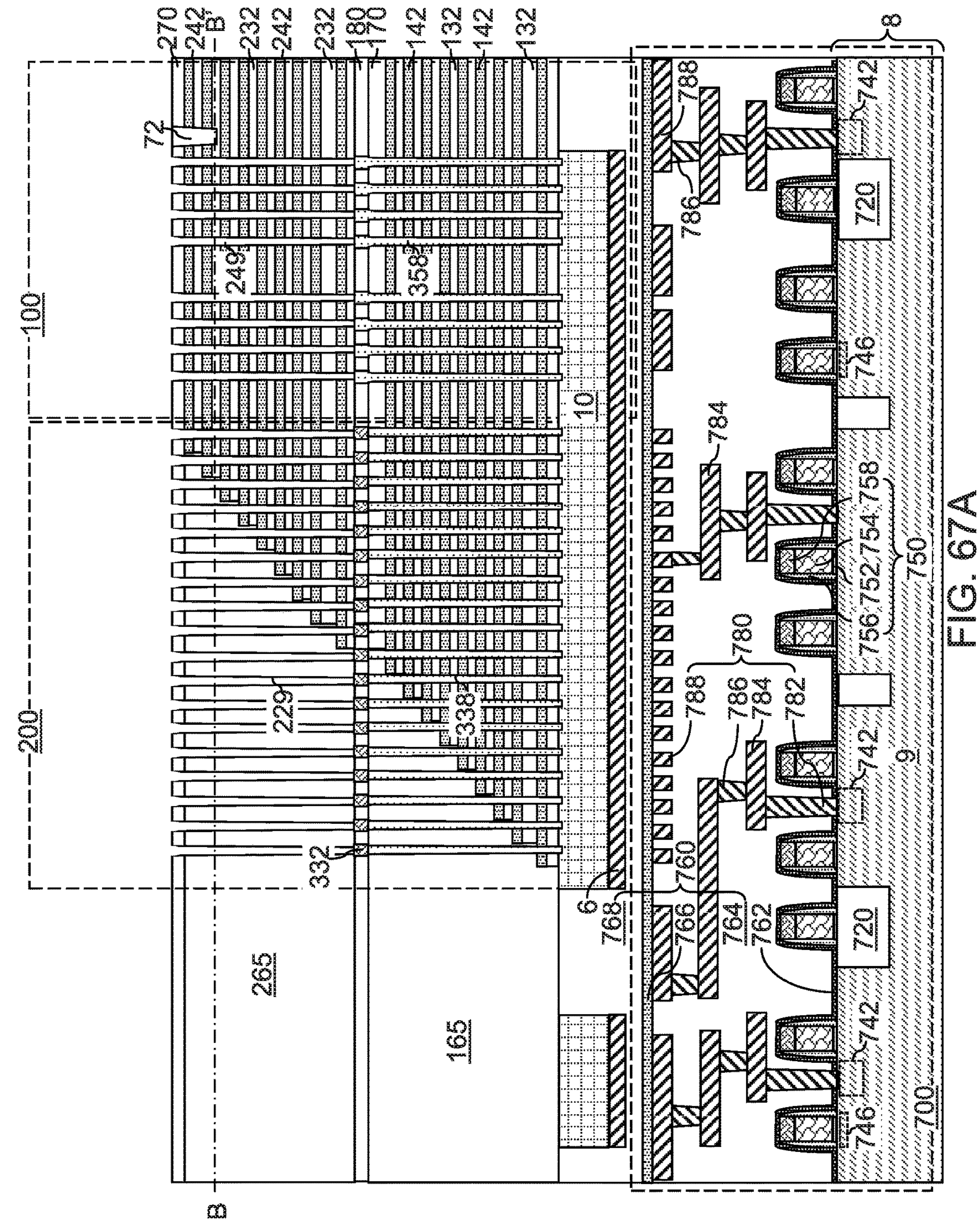
FIG. 67A is a vertical cross-sectional view of the fifth exemplary structure after formation of a second alternating stack of second insulating layers and second sacrificial material layers, a second retro-stepped dielectric material portion, a second insulating cap layer, dielectric isolation structures, second-tier memory openings, and second-tier support openings according to the fifth embodiment of the present disclosure.
Figure 67B:
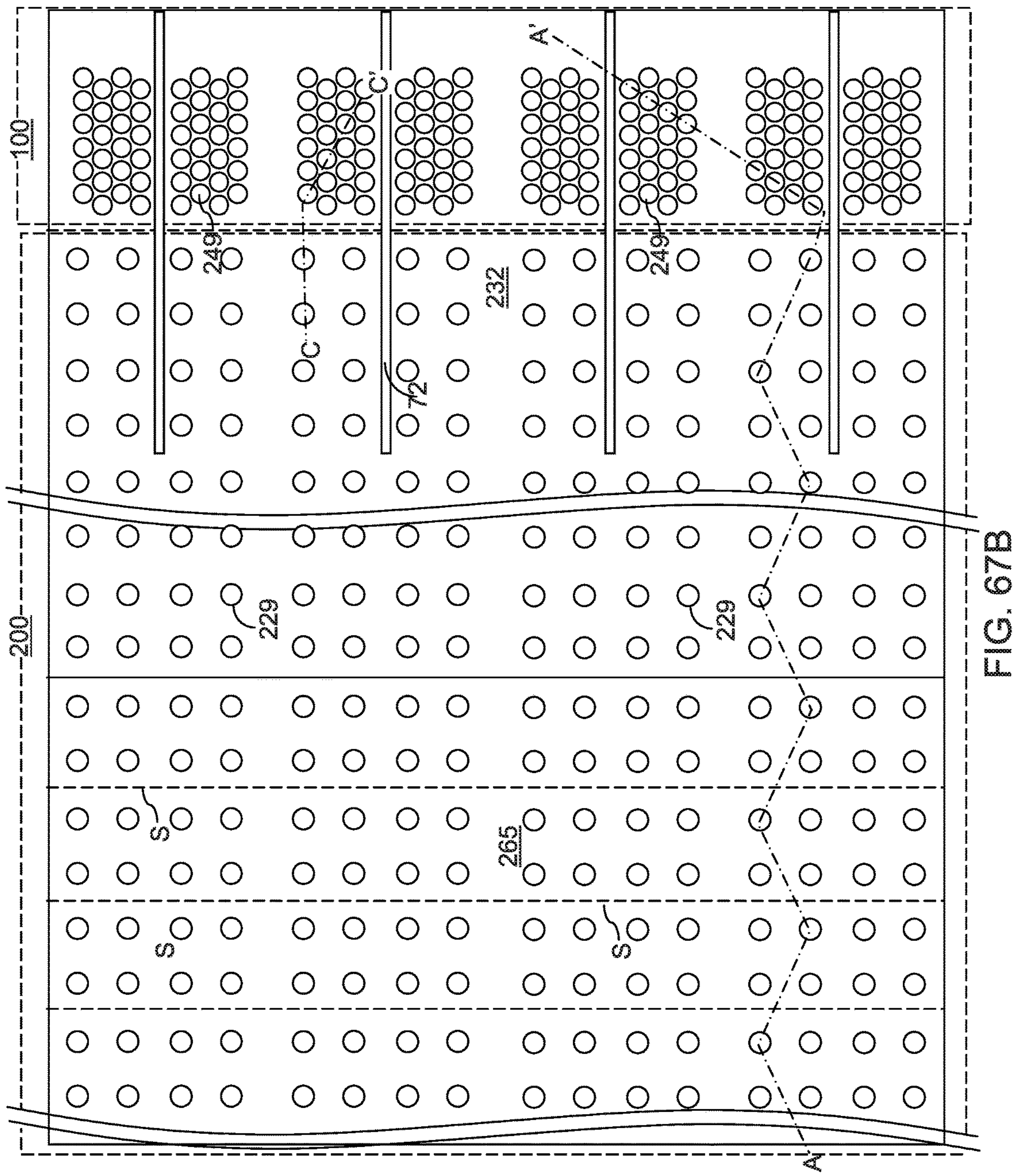
FIG. 67B is a horizontal cross-sectional view of the fifth exemplary structure along the horizontal plane B-B' of FIG. 67A. The zig-zag vertical plane A-A' is the plane of the vertical cross-sectional view of FIG. 67A.
Figure 67C:
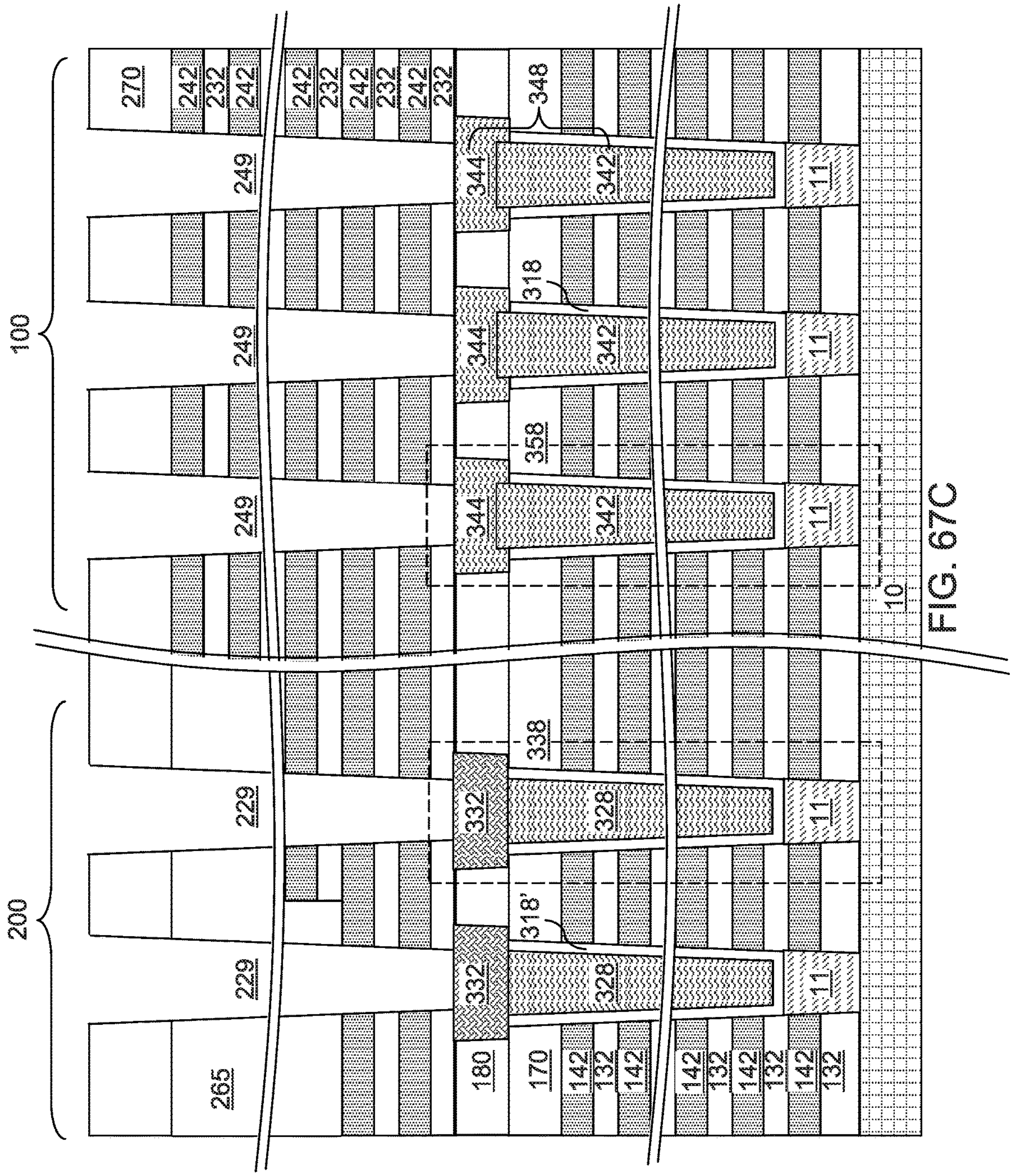
FIG. 67C is a vertical cross-sectional view of the fifth exemplary structure along the vertical plane C-C' of FIG. 67B.

Referring to FIGS. 67A-67C, the processing steps of FIG. 7 can be performed to form a second-tier structure over the first-tier structure (132, 142, 170, 358, 338) and the inter-tier dielectric layer 180. The second-tier structure can include a second alternating stack of second insulating layers 232 and second sacrificial material layers 242 having second stepped surfaces, a second retro-stepped dielectric material portion 265, a second insulating cap layer 270, and drain-select-level isolation structures 72.

Subsequently, the processing steps of FIGS. 49A-49C can be performed to form various second-tier openings (249, 229) through the second-tier structure (232, 242, 265, 270, 72). A photoresist layer (not shown) can be applied over the second insulating cap layer 270, and can be lithographically patterned to form various openings therethrough. The pattern of the openings in the patterned photoresist layer can be the same as the pattern of the various first-tier openings (149, 129). Thus, the lithographic mask employed to pattern the first-tier openings (149, 129) can be employed for pattern the photoresist layer, which is subsequently employed as an etch mask for forming the second-tier openings (249, 229).

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the first-tier memory opening fill structures 358. The second-tier support openings 229 are formed directly on a top surface of a respective one of the first-tier support opening fill structures 338. Further, a subset of the second-tier support openings 229 can be formed through the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 67B.

The second-tier memory opening 249 and the second-tier support opening 229 are formed through the second alternating stack (232, 242) by the anisotropic etch process. The second-tier memory openings 249 are formed over, and directly on, a respective one of the first-tier memory opening fill structures 358. The second-tier support openings 229 are formed over, and directly on, a respective one of the first-tier support opening fill structures 338.

Figure 68:
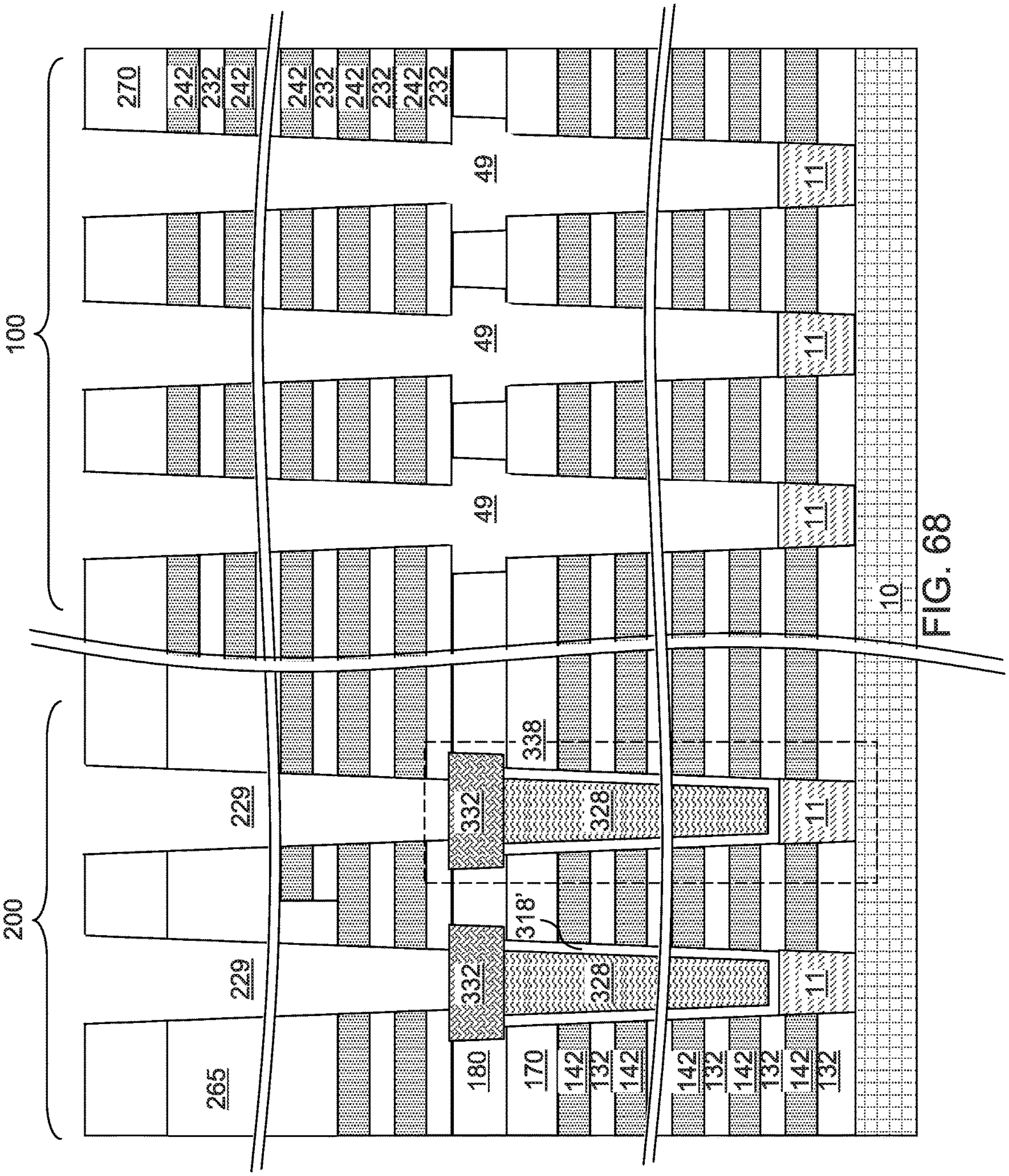
FIG. 68 is a vertical cross-sectional view of a region of the fifth exemplary structure after formation of inter-tier memory openings according to the fifth embodiment of the present disclosure.

Referring to FIG. 68, the processing steps of FIG. 50 can be performed to form inter-tier memory openings 49. A cavity, which is a second-tier opening 229 that extends down to a top surface of a respective doped semiconductor material portion 332, is formed in the contact region 200. Each inter-tier memory opening 49 can be formed in the memory array region 100 by removing portions of a respective first-tier memory opening fill structure 358 from underneath a respective second-tier memory opening 249. Each inter-tier memory opening 49 includes an entire volume of a respective second-tier memory opening 249 and a predominant portion (i.e., more than 50%, which may be more than 80% and/or more than 90%) of an entire volume of a respective underlying first-tier memory opening fill structure 358. The bottommost surface of the second-tier support openings 229 can be located above the horizontal plane including the topmost surface of the first alternating stack (132, 142). Thus, each cavity in the contact region 200, i.e., each second-tier support opening 229, can be formed without removing an underlying first-tier support opening fill structure 338. The inter-tier memory openings 49 and the cavities (i.e., the second-tier support openings 229) are simultaneously formed by the anisotropic etch process.

Figure 69:
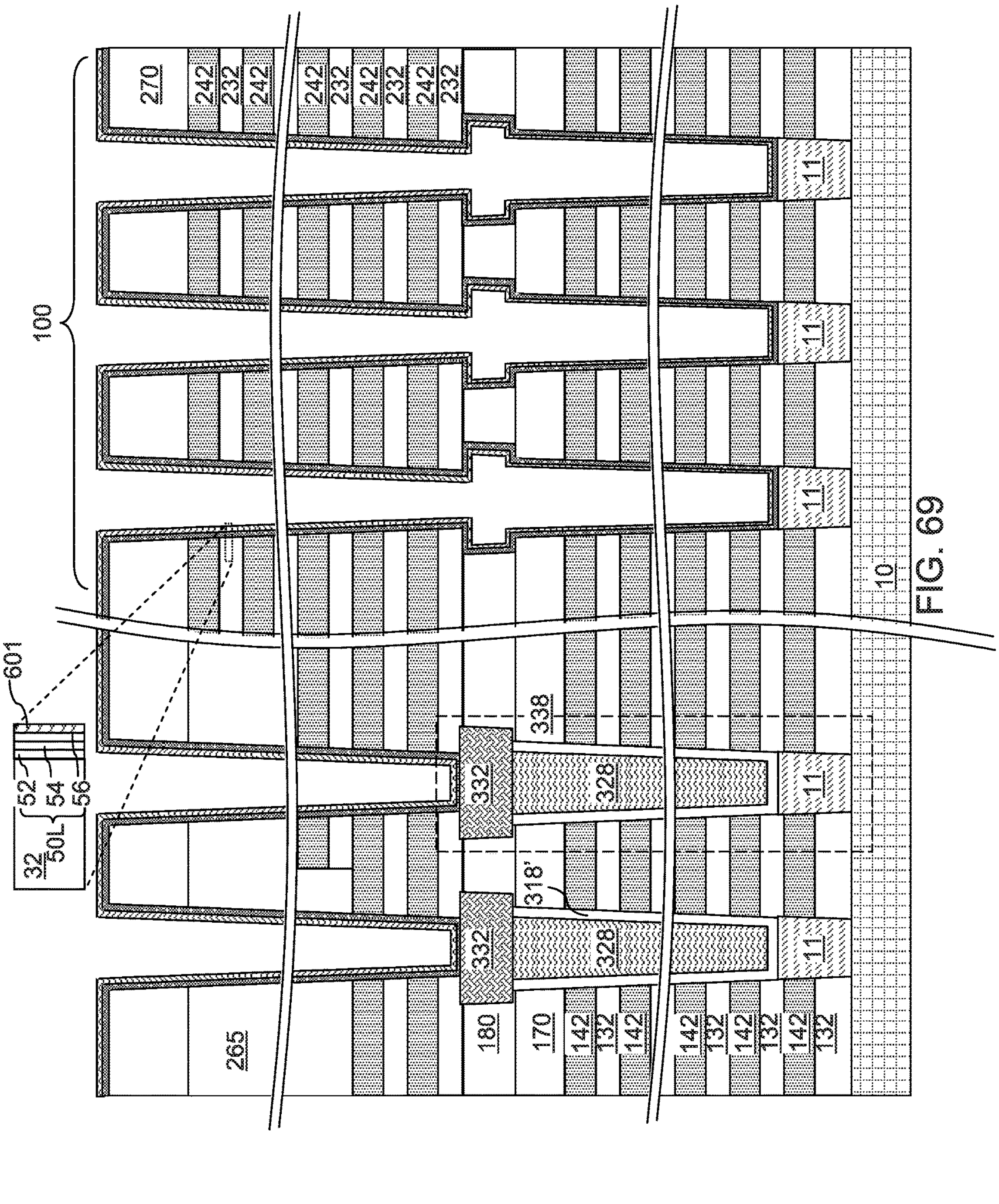
FIG. 69 is a vertical cross-sectional view of a region of the fifth exemplary structure after formation of a memory film layer and a semiconductor channel material layer according to the fifth embodiment of the present disclosure.

Referring to FIG. 69, the processing steps of FIG. 10 can be performed to form a memory film layer 50L and an optional first semiconductor channel layer 601 in the inter-tier memory openings 49 and the second-tier support openings 229 and over the second insulating cap layer 270. The memory film layer 50L and the optional first semiconductor channel layer 601 do not extend below the bottom surface of the inter-tier dielectric layer 180 in the contact region 200.

Figure 70:
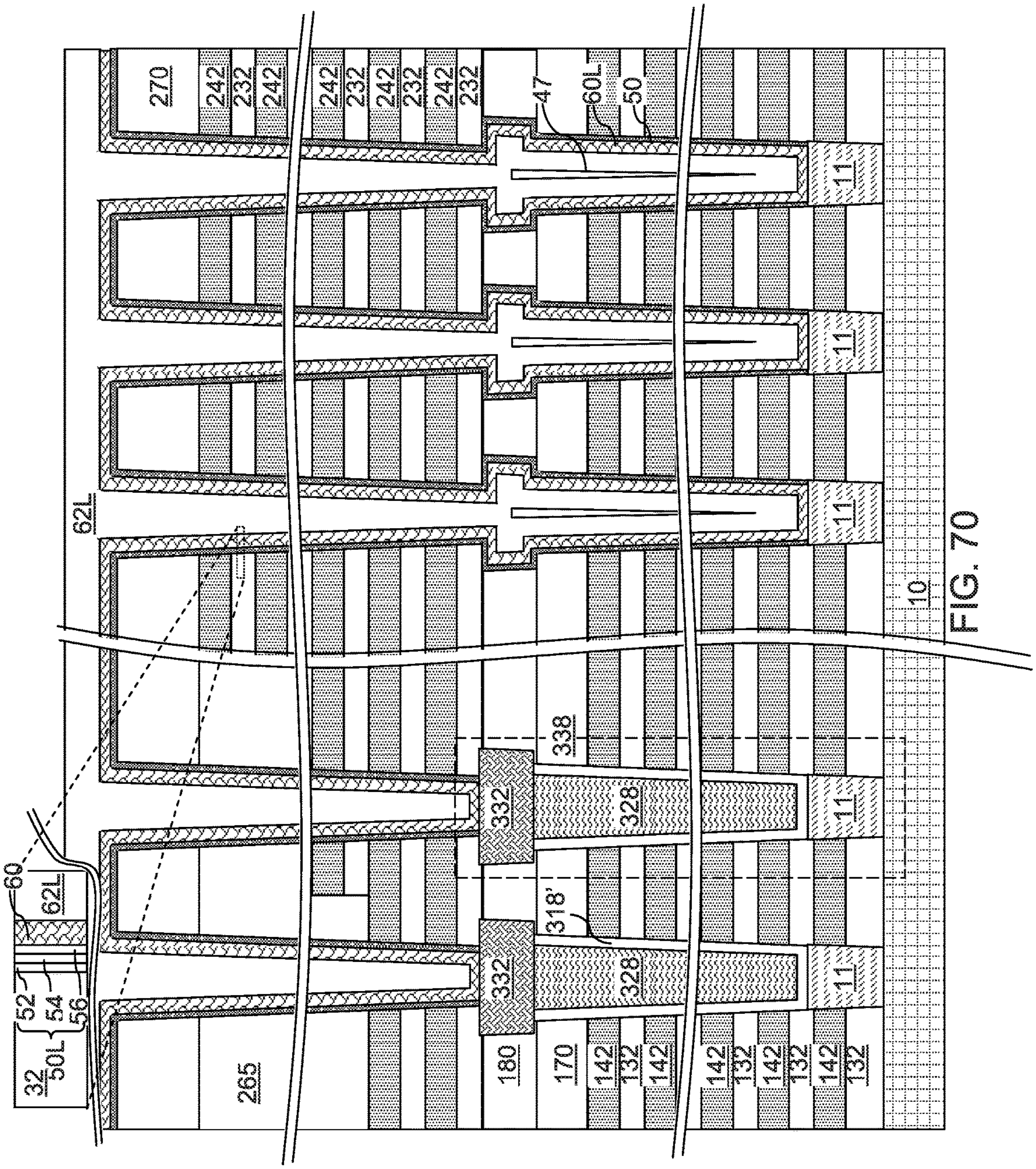
FIG. 70 is a vertical cross-sectional view of a region of the fifth exemplary structure after formation of a dielectric core material layer according to the fifth embodiment of the present disclosure.

Referring to FIG. 70, the processing steps of FIG. 11 can be performed to anisotropically etch the optional first semiconductor channel layer 601, the tunneling dielectric layer 56, the charge storage layer 54, and the blocking dielectric layer 52, and to physically expose top surfaces of the pedestal channel portions 11 (or the top surfaces of the planar semiconductor material layer in case the pedestal channel portions 11 are not present).

A second semiconductor channel layer can be deposited as in the processing steps of FIG. 11. In one embodiment, the first semiconductor channel layer 601 may be optionally removed isotropically, for example, by a wet etch process employing hot TMY prior to deposition of the second semiconductor channel layer. The second semiconductor channel layer, or the set of first semiconductor channel layer 601 and the second semiconductor channel layer in case the first semiconductor channel layer 601 is not removed, is referred to as a semiconductor channel material layer 60L. In case the memory cavity in each memory opening is not completely filled by the second semiconductor channel layer, a dielectric core layer 62L can be deposited in the memory cavity to fill any remaining portion of the memory cavity within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

An encapsulated memory cavity 47 may, or may not, be formed in each inter-tier memory opening 49 within the first alternating stack (132, 142). The encapsulated memory cavities 47 are volumes of the inter-tier memory openings 49 that are not filled with the materials of the memory film layer 50L, the semiconductor channel material layer 60L, and the dielectric core layer 62L. The memory film layer 50L and the optional first semiconductor channel layer 601 do not extend below the topmost surface of the first alternating stack (132, 142) in the contact region 200.

Figure 71A:
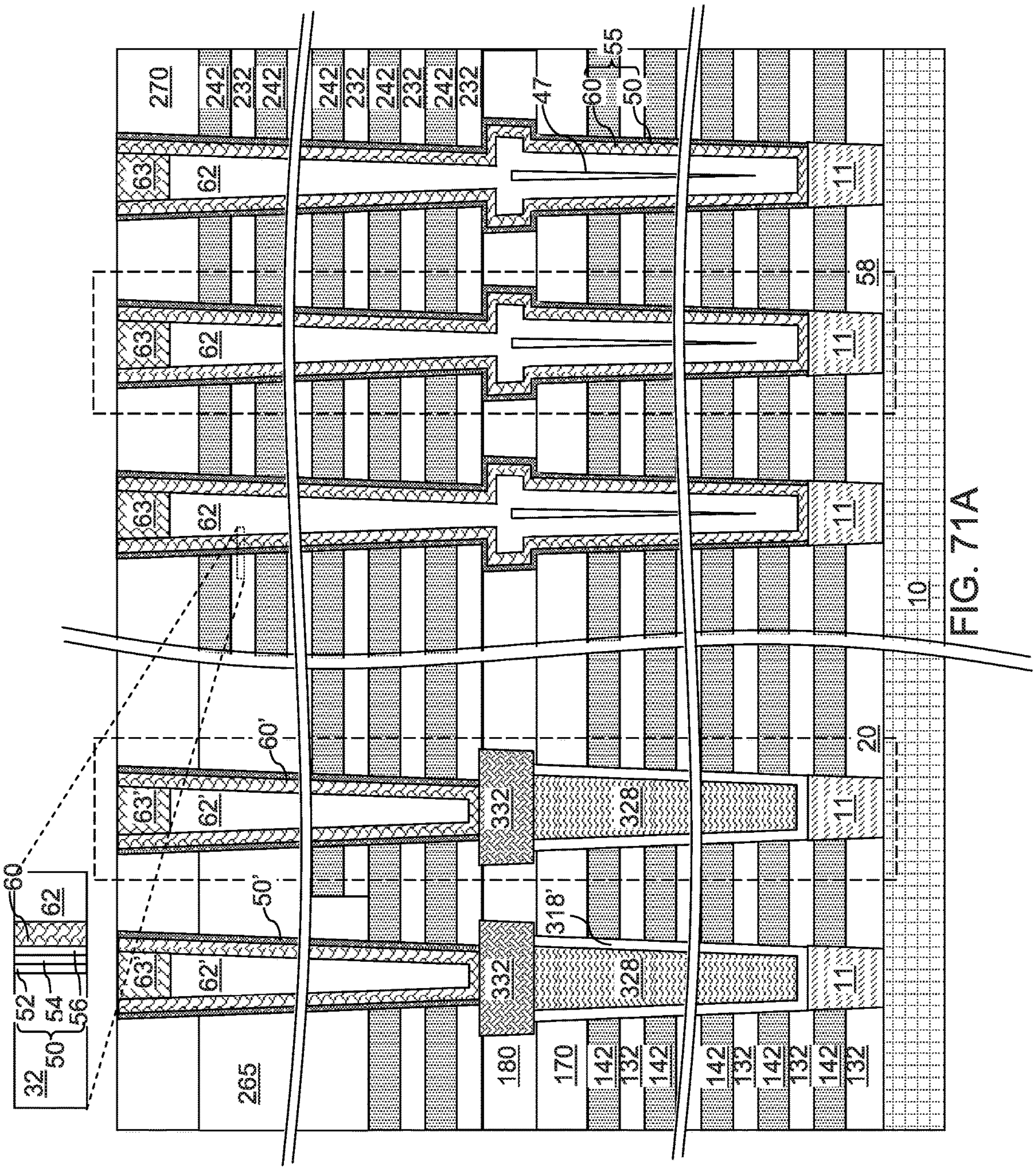
FIG. 71A is a vertical cross-sectional view of a region of the fifth exemplary structure after formation of memory opening fill structures and support pillar structures according to the fifth embodiment of the present disclosure.
Figure 71B:
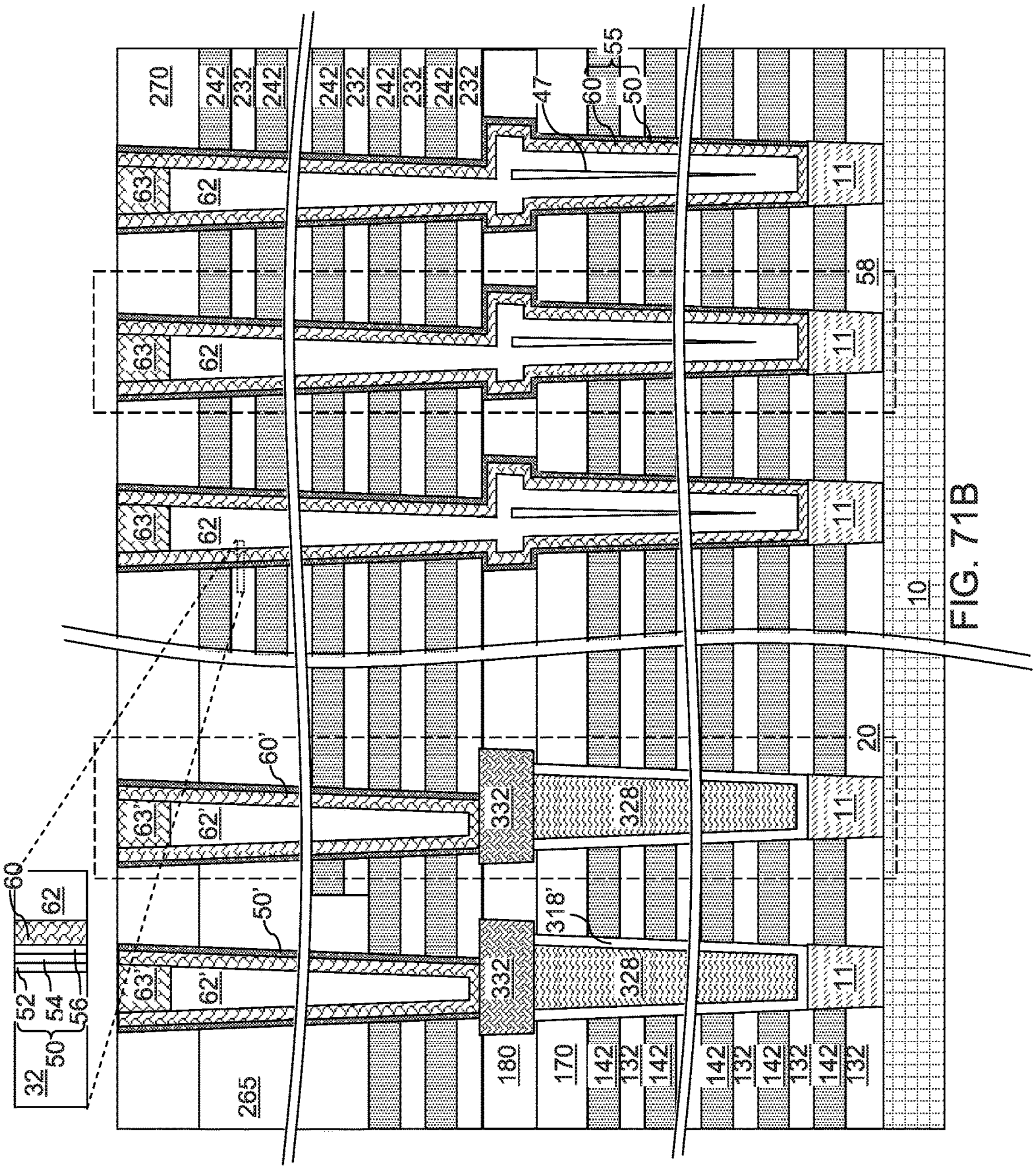
FIG. 71B is a vertical cross-sectional view of an alternative configuration of a region of the fifth exemplary structure of FIG. 71A in case of a non-zero overlay misalignment.

Referring to FIGS. 71A and 71B, the fifth exemplary structure is illustrated after formation of memory opening fill structures 58 and support pillar structures 20. FIG. 71A illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 71B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Specifically, horizontal portion of the dielectric core layer 62L overlying the second insulating cap layer 270 can be removed, for example, by a recess etch from above the top surface of the second insulating cap layer 270. The material of the dielectric core layer 62L can be further recessed within each inter-tier memory opening 49, for example, by a recess etch to a height between the horizontal plane including the top surface of the second insulating cap layer 270 and the horizontal plane including the bottom surface of the second insulating cap layer 270. Recessed top surfaces of the remaining portions of the dielectric core layer 62 is formed between the horizontal plane including the top surface of the second insulating cap layer 270 and the horizontal plane including the bottom surface of the second insulating cap layer 270. Each remaining portion of the dielectric core layer 62L constitutes a dielectric core 62.

Horizontal portion of the second semiconductor channel layer located above the top surfaces of the dielectric cores 62 can be removed by an etch process, which may be an isotropic etch process such as a wet etch process or an anisotropic etch process such as a reactive ion etch process, Each remaining portion of the second semiconductor channel layer, or each contiguous pair of a remaining portion of the second semiconductor channel layer and a remaining portion of the first semiconductor channel layer 601 in case any portion of the first semiconductor channel layer remains, constitutes a vertical semiconductor channel 60, through which electrical current can flow when a vertical NAND device including the vertical semiconductor channel 60 is turned on. Alternatively, the first semiconductor channel layer 601 can be removed, for example, by a wet etch employing hot TMY, and each vertical semiconductor channel 60 can consist of remaining portions of the second semiconductor channel layer. In this case, the semiconductor oxide plate 13 can prevent, or minimize, collateral etching of the pedestal channel portions 11.

Horizontal portions of the memory film layer 50L overlying the second insulating cap layer 270 can be subsequently removed, for example, by an anisotropic etch process. Each remaining portion of the memory film layer 50L located within the inter-tier memory openings 49 and the second-tier support openings 229 constitutes a memory film 50 or a dummy memory film 50'. Each memory film 50 and each dummy memory film 50' can include a layer stack of a blocking dielectric layer 52, a charge storage layer 54, and a tunneling dielectric layer 56. Each tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 in an inter-tier memory opening 49 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within each inter-tier memory opening 49 is herein referred to as a memory opening fill structure 58. Each combination of a pedestal channel portion 11, a second conformal dielectric liners 318', a first-tier support opening fill portions 328, a doped semiconductor material portion 332, a dummy memory film 50', a dummy semiconductor channel 60' (that has the same composition as the vertical semiconductor channels 60), a support dielectric core 62' (that has the same composition as the dielectric cores 62), and a dummy drain region 63' (that has the same composition as the drain regions 63) constitutes a support pillar structure 20.

Generally, each of the inter-tier memory openings 49 and cavities in the contact region 200 (i.e., the second-tier support openings 229) is filled with fill material portions (50L, 60L, 62L). The fill material portions (50L, 60L, 62L) are formed on remaining portions of the first-tier support opening fill structures 338. Regions of the fill material portions (50L, 60L, 62L) are removed from above a horizontal plane overlying the second alternating stack (232, 242), such as the horizontal plane including the top surface of the second insulating cap layer 270, by a planarization process. Remaining portions of the fill material portions (50L, 60L, 62L) in the inter-tier memory openings 49 comprise the memory stack structures 55 after the planarization process. Support pillar structures 20 are formed in the contact region 200. Each support pillar structure 20 includes a first-tier support opening fill structure 338 and a contiguous set of remaining portions of the fill material portions (50L, 60L, 62L). Each support pillar structure 20 can extend through the second retro-stepped dielectric material portion 265 and the first alternating stack (132, 142). In one embodiment, a top surface of each support pillar structure 20 can be formed within a same horizontal plane as the top surfaces of the memory opening fill structures 58. In one embodiment, a bottom surface of each support pillar structure 20 can be formed within a same horizontal plane as the bottom surfaces of the memory opening fill structures 58.

Each memory film 50 can comprise a layer stack including a tunneling dielectric layer 56, a charge storage layer 54, and a blocking dielectric layer 52. Each support pillar structure 20 can comprise a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

The dummy semiconductor channel 60' and the dummy memory film 50' within each support pillar structure 20 overlie the first alternating stack (132, 142), and do not extend through any of the first sacrificial material layers 142 within the first alternating stack (132, 142). The first-tier support opening fill portions 328 may include a semiconductor material (such as amorphous silicon or polysilicon).

Figure 72A:
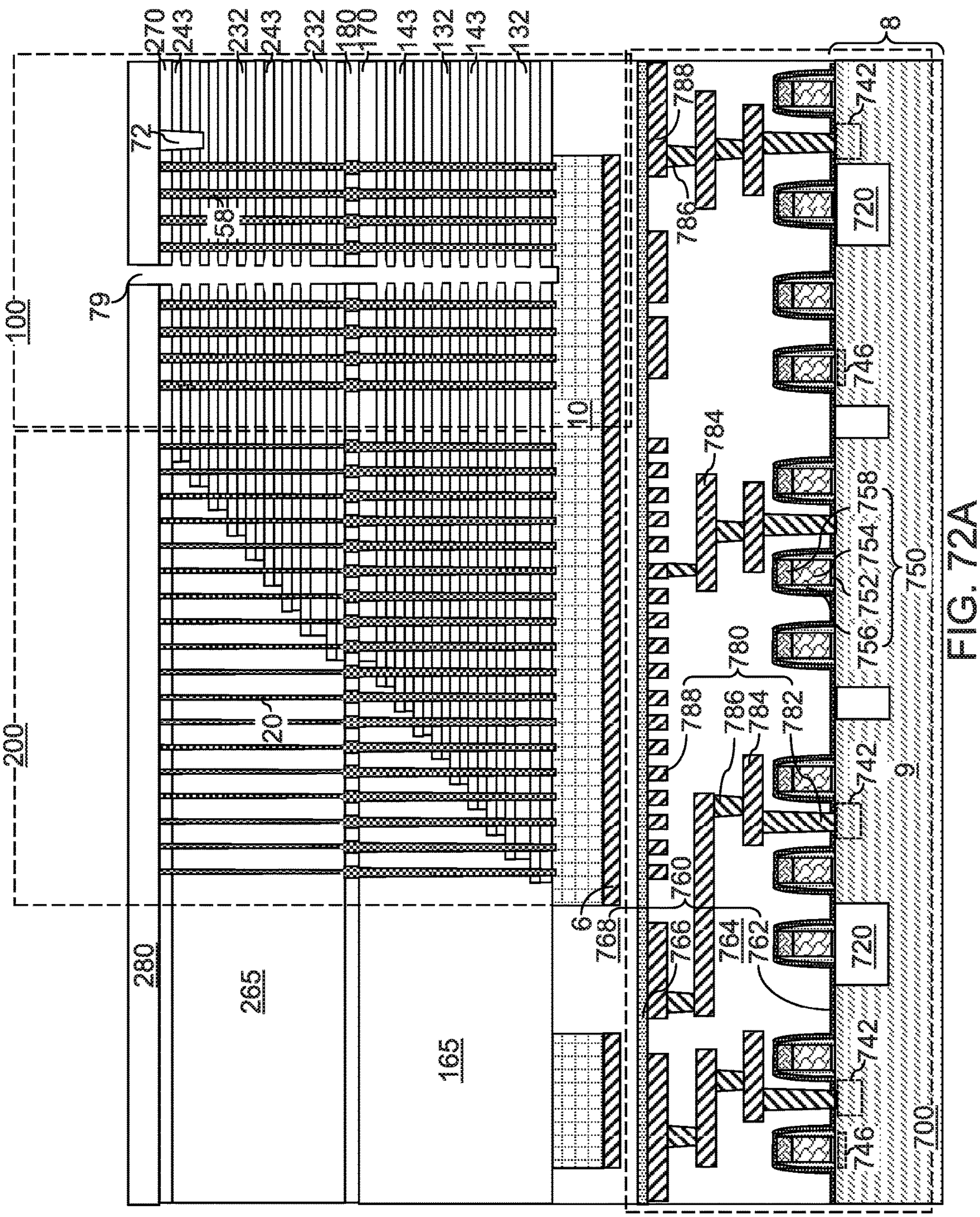
FIG. 72A is a vertical cross-sectional view of the fifth exemplary structure after formation of backside trenches according to the fifth embodiment of the present disclosure.
Figure 72B:
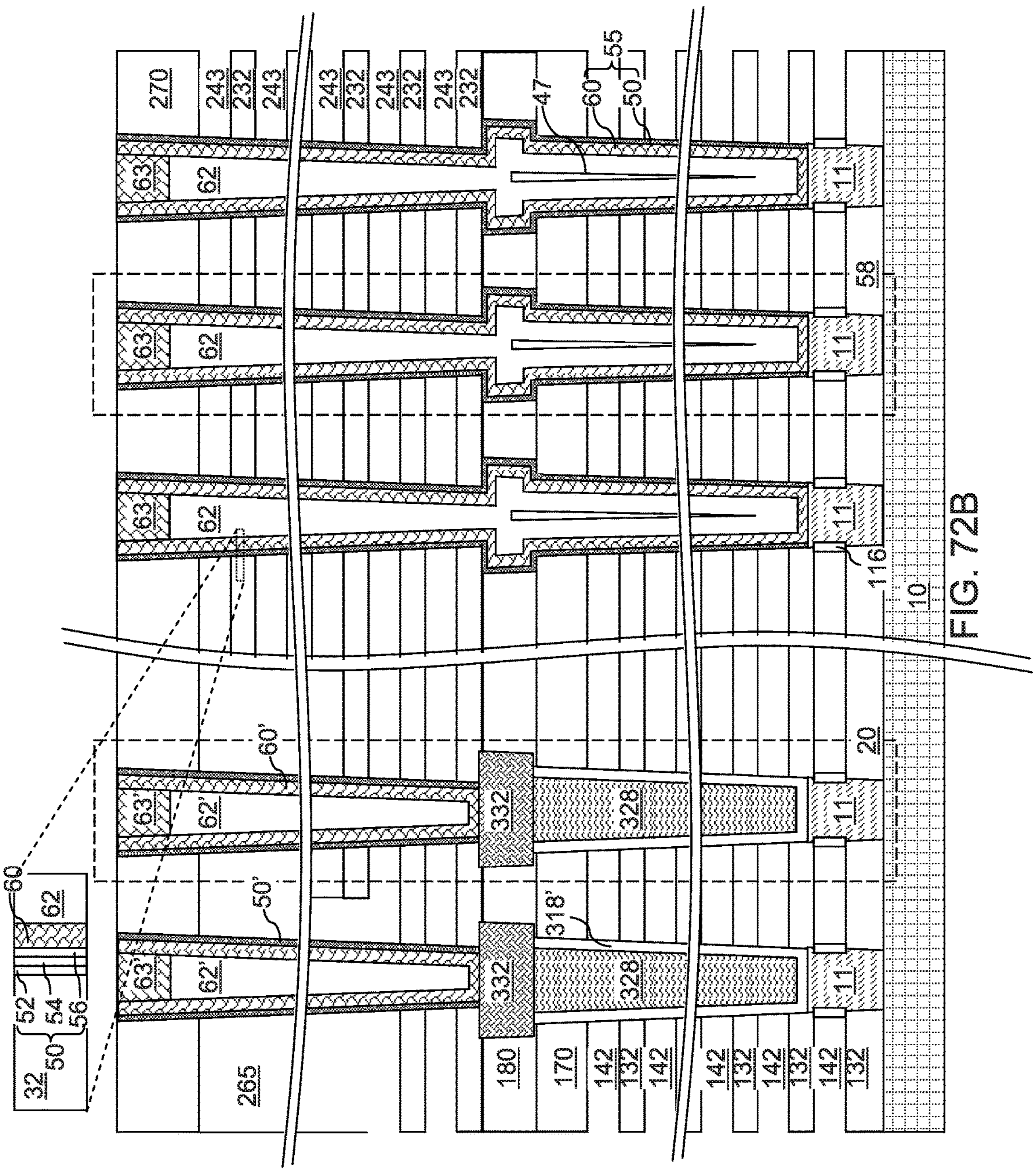
FIG. 72B is a vertical cross-sectional view of a region of the fifth exemplary structure of FIG. 72A.

Referring to FIGS. 72A and 72B, the processing steps of FIGS. 14A and 14B can be performed to remove the first and second sacrificial material layers (142, 242) and to form first and second backside recesses (143, 243).

Figure 73A:
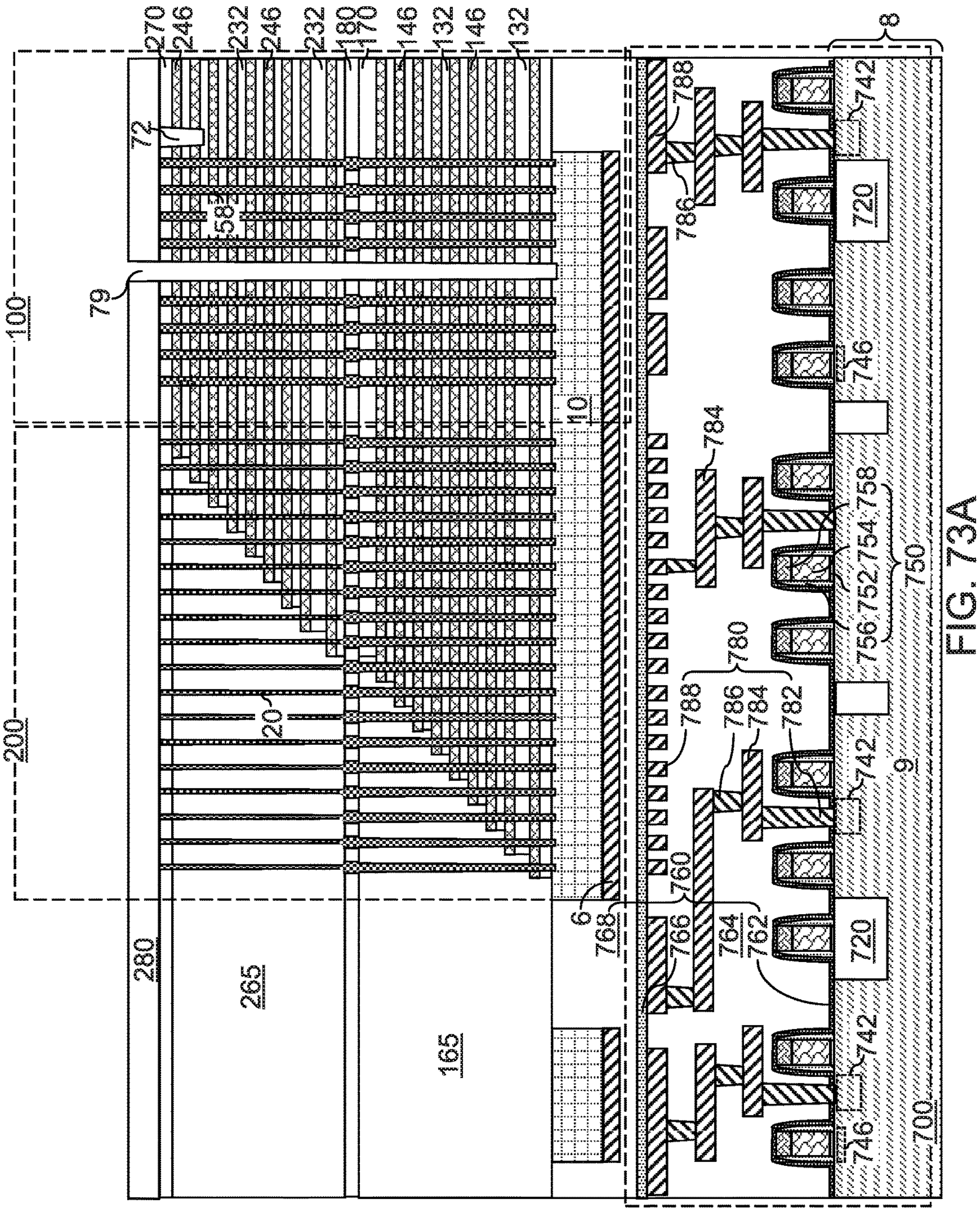
FIG. 73A is a vertical cross-sectional view of the fifth exemplary structure after formation of electrically conductive layers in the backside recesses according to the fifth embodiment of the present disclosure.
Figure 73B:
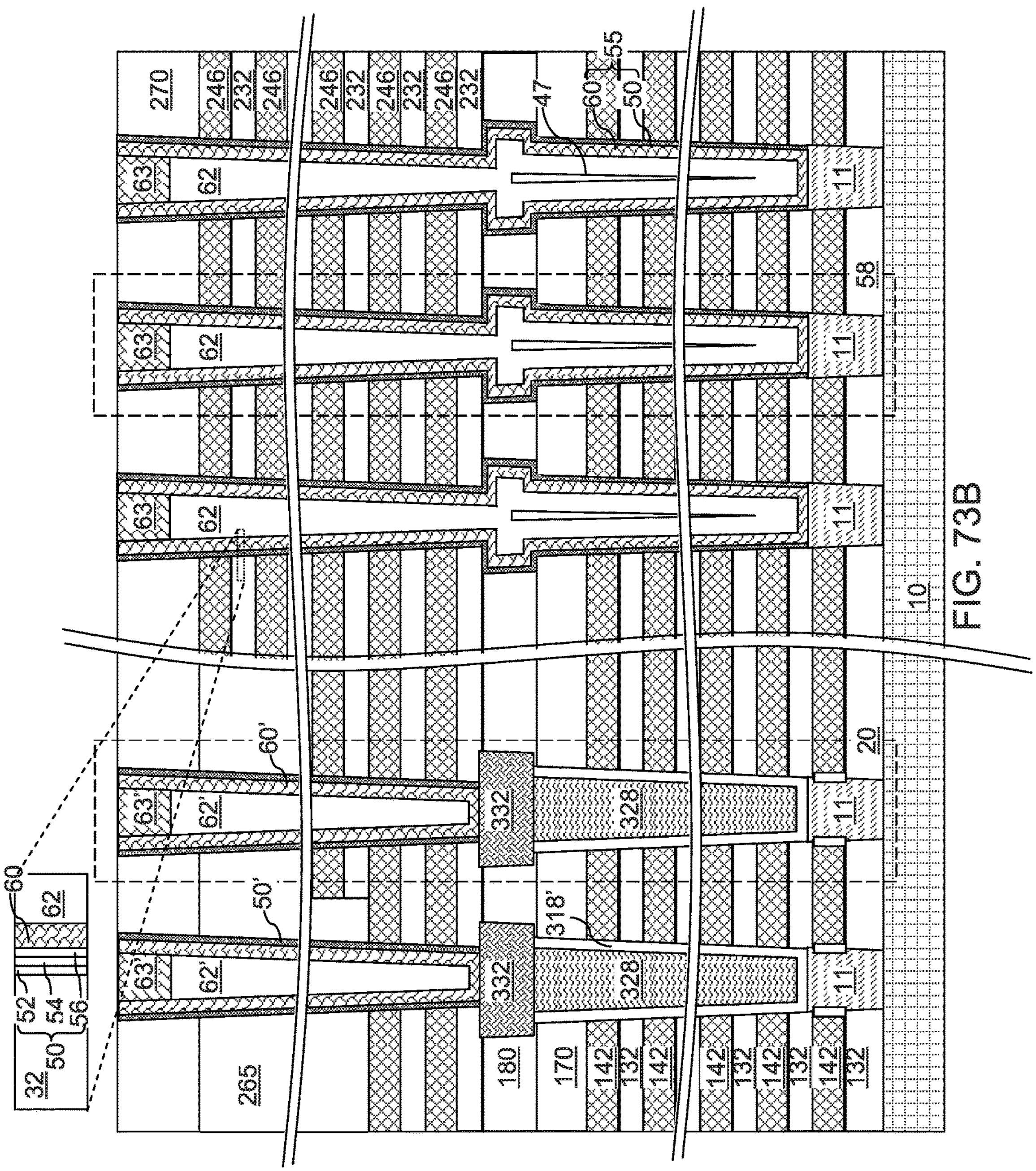
FIG. 73B is a vertical cross-sectional view of a region of the fifth exemplary structure of FIG. 73A.
Figure 73C:
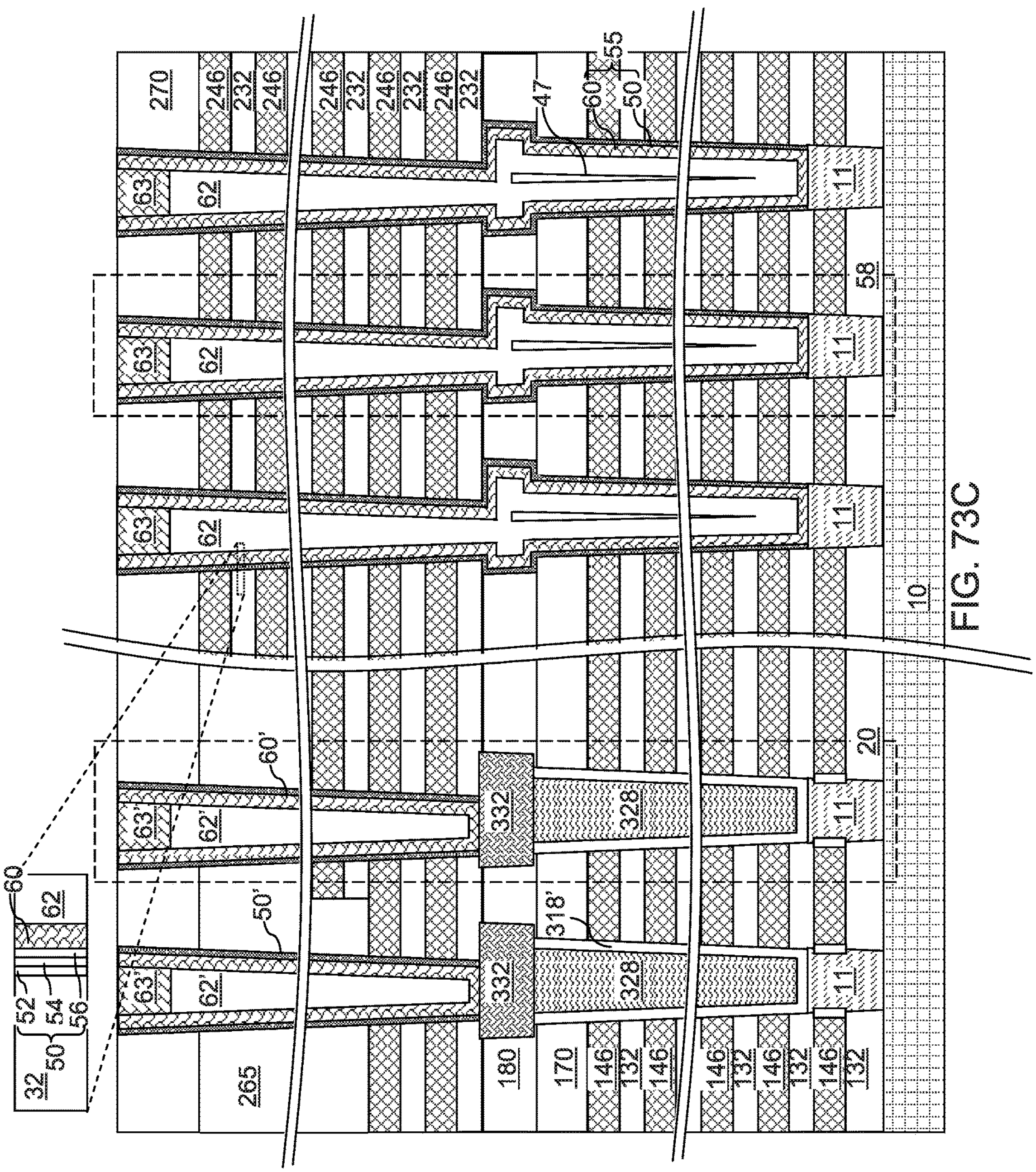
FIG. 73C is a vertical cross-sectional view of an alternative configuration of a region of the fifth exemplary structure of FIG. 73A in case of a non-zero overlay misalignment.

Referring to FIGS. 73A-73C, the processing steps of FIGS. 15A-15C can be performed to form an optional backside blocking dielectric layer and first and second electrically conductive layers (146, 246). FIG. 73B illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is zero, i.e., under an ideal lithographic alignment condition. FIG. 73C illustrates a configuration in which the overlay deviation between the lithographic patterning step that forms the pattern of the second-tier memory openings 249 and the second-tier support openings 229 relative to the lithographic patterning step that forms the pattern of the first-tier memory openings 149 and the first-tier support openings 129 is at a maximum value allowed under process specifications, i.e., under a worst lithographic alignment condition that is allowed during manufacturing.

Figure 74:
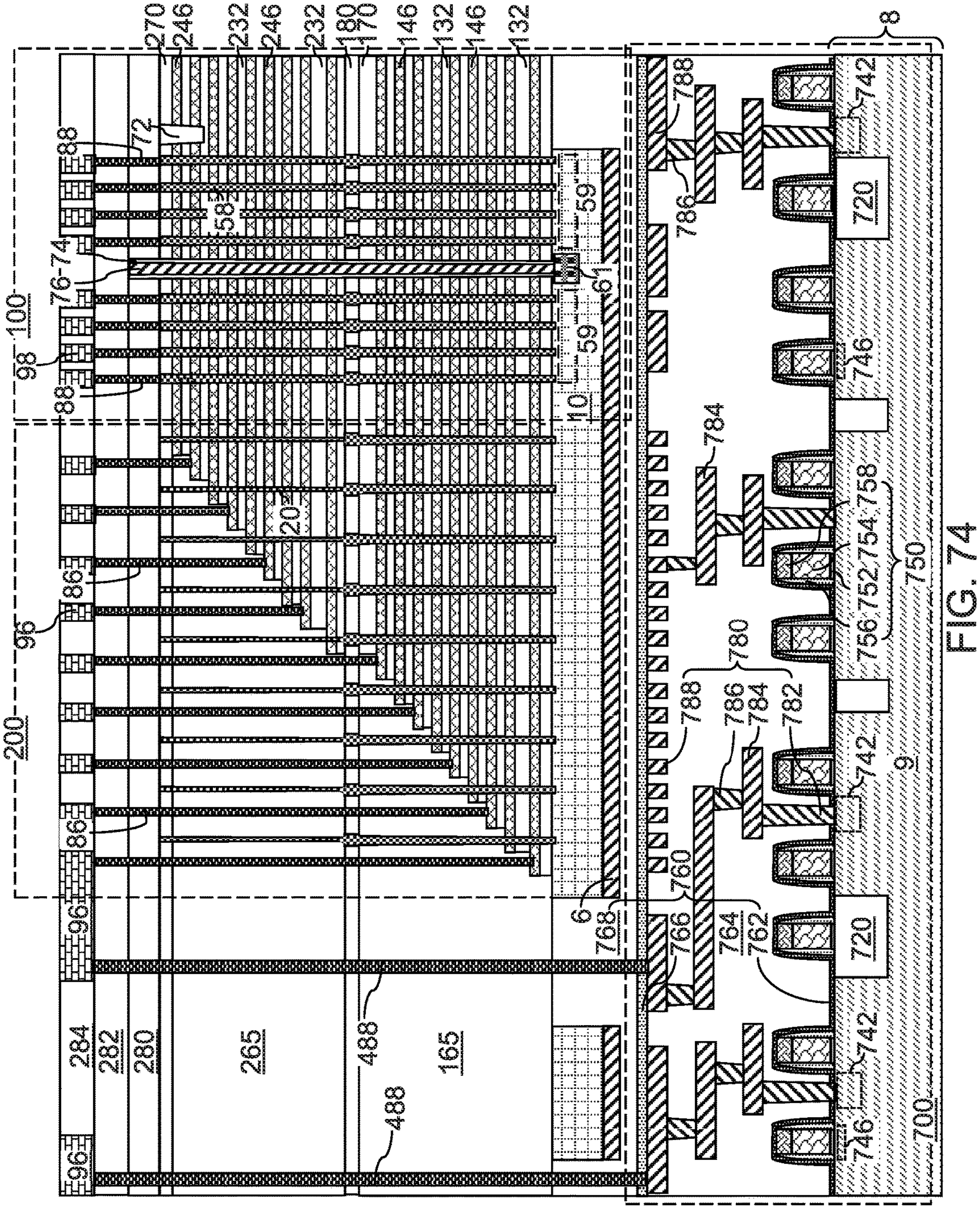
FIG. 74 is a vertical cross-sectional view of the fifth exemplary structure after formation of a line level dielectric layer and metal interconnect line structures according to the fifth embodiment of the present disclosure.

Referring to FIG. 74, the processing steps of FIGS. 16, 17A and 17B, 18, and 19 can be performed in the same manner as in the first embodiment to provide various additional structural components.

Referring to all drawings and according to various embodiments of the present disclosure, a three-dimensional memory device is provided. The three-dimensional memory device comprises: a first-tier structure located over a top surface of a substrate 8, wherein the first-tier structure comprises a first alternating stack of first insulating layers 132 and first electrically conductive layers 146 and a first retro-stepped dielectric material portion 165 overlying first stepped surfaces of the first alternating stack (132, 146); a second-tier structure overlying the first-tier structure, wherein the second-tier structure comprises a second alternating stack of second insulating layers 232 and second electrically conductive layers 246 and a second retro-stepped dielectric material portion 265 overlying second stepped surfaces of the second alternating stack (232, 246); a memory opening fill structure 58 extending through all layers within the second alternating stack (232, 246) and the first alternating stack (132, 146), wherein the memory opening fill structure 58 comprises a vertical semiconductor channel 60 and a memory film 50, and has a first width w1 that is a maximum lateral dimension of the memory opening fill structure 58 at a horizontal plane including a bottom surface of a bottommost layer of the second alternating stack (232, 246); and a support pillar structure (20 or 238) extending at least through each layer within the second alternating stack (232, 246), including a dummy semiconductor channel 60' having a same material composition as the semiconductor channel 60, and having a second width w2 that is a maximum lateral dimension of the support pillar structure (20 or 238) at the horizontal plane including the bottom surface of the bottommost layer of the second alternating stack (232, 246), wherein the second width w2 is less than the first width w1 as illustrated in the first, second, and third exemplary structures.

In some embodiments, the support pillar structure (20 or 238) extends through the second retro-stepped dielectric material portion 265; and a top surface of the support pillar structure (20 or 238) is located within a same horizontal plane as a top surface of the memory opening fill structure 58.

In some embodiments, the second width w2 is in a range from 10% to 90% of the first width w1.

In some embodiments, the support pillar structure 20 extends from the second-tier structure to a bottommost layer within the first alternating stack (132, 146).

In some embodiments, the memory film 50 comprises a layer stack including a tunneling dielectric layer 56, a charge storage layer 54, and a blocking dielectric layer 52; and the support pillar structure (20 or 238) further comprises a dummy memory film 50' including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

In some embodiments, the dummy semiconductor channel 60' and the dummy memory film 50' vertically extend through a subset of the first electrically conductive layers 146 within the first alternating stack (132, 146). In some embodiments, the dummy memory film 50' contacts sidewalls of a subset of the first insulating layers 132 within the first alternating stack (132, 146).

In some embodiments, the dummy semiconductor channel 60' and the dummy memory film 50' overlie the first alternating stack (132, 146), and do not extend through any of the first electrically conductive layers 146 within the first alternating stack (132, 146).

In some embodiments, the support pillar structure 20 further comprises a dielectric pillar structure (which can be embodied as a first-tier support opening fill portion 128 in case the first-tier support opening fill portion 128 includes a dielectric material) contacting a bottom surface and a sidewall of the dummy memory film 50' and extending through, and contacting sidewalls of, a subset of the first insulating layers within the first alternating stack as illustrated in FIG. 40B.

In some embodiments, the memory opening fill structure 58 has a third width w3 that is a maximum lateral dimension of the memory opening fill structure 58 at a horizontal plane including a bottom surface of a bottommost layer of the first alternating stack (132, 146); the support pillar structure 20 has a fourth width that is a maximum lateral dimension of the support pillar structure 20 at the horizontal plane including the bottom surface of the bottommost layer of the first alternating stack (132, 146); and a ratio of the second width w2 to the fourth width w4 is less than a ratio of the first width w1 to the third width w3.

In some embodiments, a bottommost surface of the support pillar structure 238 is located above a horizontal plane including a topmost surface of the first alternating stack (132, 146). In some embodiments, the three-dimensional memory device comprises a first-tier support pillar structure 138 underlying the support pillar structure 238, extending through the first alternating stack (132, 146), having a partial areal overlap with the support pillar structure 238 in a plan view (i.e., a see-through view along a direction perpendicular to the top surface of the substrate 8), and not in direct contact with the support pillar structure 238. In some embodiments, the three-dimensional memory device further comprises an inter-tier dielectric layer 180 located between the support pillar structure 238 and the first-tier support pillar structure 128, wherein the first-tier support pillar structure 138 comprises a dielectric material portion (which can be embodied as a first-tier support opening fill portion 128 in case the first-tier support opening fill portion 128 includes a dielectric material) that contacts sidewalls of a subset of the first insulating layers 132 of the first alternating stack (132, 146) and contacts a bottom surface of the inter-tier dielectric layer 180.

Referring to all drawings and according to various embodiments of the present disclosure, another three-dimensional memory device is provided. The three-dimensional memory device comprises: a first-tier structure located over a top surface of a substrate 8, wherein the first-tier structure comprises a first alternating stack of first insulating layers 132 and first electrically conductive layers 146 and a first retro-stepped dielectric material portion 165 overlying first stepped surfaces of the first alternating stack (132, 146); a second-tier structure overlying the first-tier structure, wherein the second-tier structure comprises a second alternating stack of second insulating layers 232 and second electrically conductive layers 246 and a second retro-stepped dielectric material portion 265 overlying second stepped surfaces of the second alternating stack (232, 246); a memory opening fill structure 58 extending through all layers within the second alternating stack (232, 246) and the first alternating stack (132, 146), wherein the memory opening fill structure 58 comprises a vertical semiconductor channel 60 and a memory film 50 that extend through the second alternating stack (232, 246) and a subset of layers within the first alternating stack (132, 146); and a support pillar structure (20 or 238) extending through all layers within the second alternating stack (232, 246) and including a dummy semiconductor channel 60' having a same material composition as the semiconductor channel 60 and including a dummy memory film 50' having a same material composition as the memory film 50, wherein a bottommost surface of the dummy memory film 50' is located above a horizontal plane including a topmost surface of the first alternating stack (132, 146) as illustrated in the second, third, fourth, and fifth exemplary structures.

In some embodiments, the support pillar structure 20 extends through the subset of layers within the first alternating stack (132, 146).

In some embodiments, the support pillar structure 20 comprises a doped semiconductor material portion 332 contacting a bottom surface of the dummy memory film 50'.

In some embodiments, the three-dimensional memory device comprises an inter-tier dielectric material layer 180 overlying the first-tier structure (132, 146) and underlying the second-tier structure (232, 246) and laterally surrounding, and contacting, the doped semiconductor material portion 332.

In some embodiments, the support pillar structure 20 comprises at least one dielectric material portion (128, 316, 318') that contacts sidewalls of the subset of layers within the first alternating stack (132, 146). For example, the dielectric material portion can comprise a first-tier support opening fill portion 128 in case the first-tier support opening fill portion 128 includes a dielectric material, an annular dielectric spacer 316, or a second conformal dielectric liner 318'.

In some embodiments, the at least one dielectric material portion (316, 318') laterally surrounds a semiconductor material portion (such as a first-tier support opening fill portion 328) vertically extending through a plurality of first insulating layers 132 and including electrical dopants at a dopant concentration less than $1.0\times10^{17}/cm^3$.

In some embodiments, the at least one dielectric material portion 318' comprises a conformal dielectric liner 318' having a uniform thickness and continuously extending over the sidewalls of the plurality of first insulating layers 132.

In some embodiments, the at least one dielectric material portion 316 comprises a plurality of annular dielectric spacers 316 comprising a dielectric oxide of a semiconductor material of the semiconductor material portion (such as a first-tier support opening fill portion 328).

In some embodiments, the three-dimensional memory device comprises a doped semiconductor material portion 332 contacting a bottom surface of the dummy memory film 50' and contacting a top surface of the semiconductor material portion (such as a first-tier support opening fill portion 328) and including electrical dopants at a dopant concentration in a range from $5.0\times10^{19}/cm^3$ and $2.0\times10^{21}/cm^3$.

In some embodiments, the at least one dielectric material portion 128 comprises a dielectric pillar structure 128 contacting a bottom surface and a sidewall of the dummy memory film 50' and extending through, and contacting sidewalls of, a plurality of first insulating layers 132 within the first alternating stack (132, 146).

In some embodiments, the three-dimensional memory device comprises a first-tier support pillar structure 138 underlying the support pillar structure 238, extending through the first alternating stack (132, 146), having a partial areal overlap with the support pillar structure 238 in a plan view, and not in direct contact with the support pillar structure 238.

In some embodiments, the memory film 50 comprises a first layer stack including a tunneling dielectric layer 56, a charge storage layer 54, and a blocking dielectric layer 52; and the dummy memory film 50' comprises a second layer stack including a dummy tunneling dielectric layer having a same thickness and a same composition as the tunneling dielectric layer 56, a dummy charge storage layer having a same thickness and a same composition as the charge storage layer 54, and a dummy blocking dielectric layer having a same thickness and a same composition as the blocking dielectric layer 52.

In some embodiments, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The planar semiconductor material layer 10 can be located above the substrate 8. The monolithic three-dimensional NAND memory device can comprise an array of monolithic three-dimensional NAND strings located over the substrate 8. At least one memory cell in a first device level of the array of monolithic three-dimensional NAND strings can be located over another memory cell in a second device level of the array of monolithic three-dimensional NAND strings. The substrate 8 can contain an integrated circuit comprising a driver circuit for the memory device located thereon. The array of monolithic three-dimensional NAND strings can comprise a plurality of semiconductor channels (59, 11, 60). At least one end portion of each of the plurality of semiconductor channels (59, 11, 60) extends substantially perpendicular to a top surface of the planar semiconductor material layer 10. The array of monolithic three-dimensional NAND strings can comprise a plurality of charge storage elements. Each charge storage element can be located adjacent to a respective one of the plurality of semiconductor channels (59, 11, 60). The array of monolithic three-dimensional NAND strings can comprise a plurality of control gate electrodes having a strip shape extending substantially parallel to the top surface of the substrate 8. The plurality of control gate electrodes can comprise at least a first control gate electrode located in the first device level and a second control gate electrode located in the second device level.

The various support pillar structures 20 and combinations of a first-tier support opening fill structure 138 (that is a first-tier support pillar structure) and an overlying support pillar structure 238 (that is a second-tier support pillar structure) provide structural support in the contact region 200 during replacement of the first and second sacrificial material layers (142, 242) with first and second electrically conductive layers (146, 246). Further, through reduction of a reactive ion etch damage, use of at least one dielectric material portion (128, 316, 318'), and/or vertical separation of each pair of a first-tier support pillar structure and a second-tier support pillar structure, leakage current in the various support pillar structures 20 and combinations of a first-tier support opening fill structure 138 and an overlying support pillar structure 238 can be reduced to provide enhanced performance to a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

a first-tier structure located over a top surface of a substrate, wherein the first-tier structure comprises a first alternating stack of first insulating layers and first electrically conductive layers and a first retro-stepped dielectric material portion overlying first stepped surfaces of the first alternating stack;

a second-tier structure overlying the first-tier structure, wherein the second-tier structure comprises a second alternating stack of second insulating layers and second electrically conductive layers and a second retro-stepped dielectric material portion overlying second stepped surfaces of the second alternating stack;

a memory opening fill structure extending through all layers within the second alternating stack and the first alternating stack, wherein the memory opening fill structure comprises a vertical semiconductor channel and a memory film that extend through the second alternating stack and a subset of layers within the first alternating stack; and a support pillar structure extending through all layers within the second alternating stack and including a dummy semiconductor channel having a same material composition as the semiconductor channel and including a dummy memory film having a same material composition as the memory film, wherein a bottommost surface of the dummy memory film is located above a horizontal plane including a topmost surface of the first alternating stack.

2. The three-dimensional memory device of claim 1, wherein the support pillar structure extends through the subset of layers within the first alternating stack.

3. The three-dimensional memory device of claim 2, wherein the support pillar structure comprises a doped semiconductor material portion contacting a bottom surface of the dummy memory film.

4. The three-dimensional memory device of claim 3, further comprising an inter-tier dielectric material layer overlying the first-tier structure and underlying the second-tier structure and laterally surrounding, and contacting, the doped semiconductor material portion.

5. The three-dimensional memory device of claim 2, wherein the support pillar structure comprises at least one dielectric material portion that contacts sidewalls of the subset of layers within the first alternating stack.

6. The three-dimensional memory device of claim 5, wherein the at least one dielectric material portion laterally surrounds a semiconductor material portion vertically extending through a plurality of first insulating layers and including electrical dopants at a dopant concentration less than $1.0\times10^{17}/cm^3$.

7. The three-dimensional memory device of claim 6, wherein the at least one dielectric material portion comprises a conformal dielectric liner having a uniform thickness and continuously extending over the sidewalls of the plurality of first insulating layers.

8. The three-dimensional memory device of claim 6, wherein the at least one dielectric material portion comprises a plurality of annular dielectric spacers comprising a dielectric oxide of a semiconductor material of the semiconductor material portion.

9. The three-dimensional memory device of claim 6, further comprising a doped semiconductor material portion contacting a bottom surface of the dummy memory film and contacting a top surface of the semiconductor material portion and including electrical dopants at a dopant concentration in a range from $5.0\times10^{19}/cm^3$ and $2.0\times10^{21}/cm^3$.

10. The three-dimensional memory device of claim 5, wherein the at least one dielectric material portion comprises a dielectric pillar structure contacting a bottom surface and a sidewall of the dummy memory film and extending through, and contacting sidewalls of, a plurality of first insulating layers within the first alternating stack.

11. The three-dimensional memory device of claim 1, further comprising a first-tier support pillar structure underlying the support pillar structure, extending through the first alternating stack, having a partial areal overlap with the support pillar structure in a plan view, and not in direct contact with the support pillar structure.

12. The three-dimensional memory device of claim 1, wherein:

the memory film comprises a first layer stack including a tunneling dielectric layer, a charge storage layer, and a blocking dielectric layer; and the dummy memory film comprises a second layer stack including a dummy tunneling dielectric layer having a same thickness and a same composition as the tunneling dielectric layer, a dummy charge storage layer having a same thickness and a same composition as the charge storage layer, and a dummy blocking dielectric layer having a same thickness and a same composition as the blocking dielectric layer.

* * * * *